(12) United States Patent
Snyder

(10) Patent No.: US 8,176,296 B2
(45) Date of Patent: *May 8, 2012

(54) PROGRAMMABLE MICROCONTROLLER ARCHITECTURE

(75) Inventor: Warren Snyder, Snohomish, WA (US)

(73) Assignee: Cypress Semiconductor Corporation, San Jose, CA (US)

(*) Notice: Subject to any disclaimer, the term of this patent is extended or adjusted under 35 U.S.C. 154(b) by 962 days.

This patent is subject to a terminal disclaimer.

(21) Appl. No.: 10/033,027

(22) Filed: Oct. 22, 2001

(65) Prior Publication Data

US 2002/0108006 A1    Aug. 8, 2002

Related U.S. Application Data

(60) Provisional application No. 60/243,708, filed on Oct. 26, 2000.

(51) Int. Cl.
*G06F 15/76* (2006.01)

(52) U.S. Cl. .......... 712/32; 712/15; 712/35; 712/36; 716/17

(58) Field of Classification Search .......... 712/15, 712/17, 18, 35, 36, 37, 38, 32; 716/13, 14, 716/17
See application file for complete search history.

(56) References Cited

U.S. PATENT DOCUMENTS

| | | |
|---|---|---|
| 3,600,690 A | 8/1971 | White |
| 3,725,804 A | 4/1973 | Langan |
| 3,740,588 A | 6/1973 | Stratton et al. |
| 3,805,245 A | 4/1974 | Brooks et al. |
| 3,810,036 A | 5/1974 | Bloedorn |
| 3,831,113 A | 8/1974 | Ahmed |
| 3,845,328 A | 10/1974 | Hollingsworth |
| 3,940,760 A | 2/1976 | Brokaw |
| 4,061,987 A | 12/1977 | Nagahama |
| 4,134,073 A | 1/1979 | MacGregor |
| 4,138,671 A | 2/1979 | Comer et al. .......... 340/347 |
| 4,176,258 A | 11/1979 | Jackson |
| 4,250,464 A | 2/1981 | Schade, Jr. |
| 4,272,760 A | 6/1981 | Prazak et al. |
| 4,283,713 A | 8/1981 | Philipp |

(Continued)

FOREIGN PATENT DOCUMENTS

DE    19710829 A1    9/1998

(Continued)

OTHER PUBLICATIONS

Goodenough, F. "Analog Counterparts of FPGAS Ease System Design" Electronic Design, Penton Publishing Cleveland, OH, US vol. 42, No. 21, Oct. 14, 1994, pp. 63-64, 66,68,7 XP000477345 ISSN: 0013-4872 the whole document.

(Continued)

*Primary Examiner* — Idriss N Alrobaye

(57) ABSTRACT

Embodiments of the present invention are directed to a microcontroller device having a microprocessor, programmable memory components, and programmable analog and digital blocks. The programmable analog and digital blocks are configurable based on programming information stored in the memory components. Programmable interconnect logic, also programmable from the memory components, is used to couple the programmable analog and digital blocks as needed. The advanced microcontroller design also includes programmable input/output blocks for coupling selected signals to external pins. The memory components also include user programs that the embedded microprocessor executes. These programs may include instructions for programming the digital and analog blocks "on-the-fly," e.g., dynamically. In one implementation, there are a plurality of programmable digital blocks and a plurality of programmable analog blocks.

21 Claims, 39 Drawing Sheets

U.S. PATENT DOCUMENTS

| | | | |
|---|---|---|---|
| 4,326,135 A | 4/1982 | Jarrett et al. | |
| 4,344,067 A | 8/1982 | Lee | |
| 4,380,083 A | 4/1983 | Andersson et al. | |
| 4,438,404 A | 3/1984 | Philipp | |
| 4,475,151 A | 10/1984 | Philipp | |
| 4,497,575 A | 2/1985 | Philipp | |
| 4,604,363 A | 8/1986 | Newhouse et al. | |
| 4,608,502 A | 8/1986 | Dijkmans et al. | |
| 4,656,603 A | 4/1987 | Dunn | |
| 4,670,838 A | 6/1987 | Kawata | |
| 4,689,740 A | 8/1987 | Moelands et al. | |
| 4,692,718 A | 9/1987 | Roza et al. | |
| 4,701,907 A | 10/1987 | Collins | |
| 4,727,541 A | 2/1988 | Mori et al. | |
| 4,736,097 A | 4/1988 | Philipp | |
| 4,740,966 A | 4/1988 | Goad | |
| 4,755,766 A | 7/1988 | Metz | |
| 4,773,024 A | 9/1988 | Faggin et al. | |
| 4,794,558 A * | 12/1988 | Thompson | 712/37 |
| 4,802,103 A | 1/1989 | Faggin et al. | |
| 4,802,119 A * | 1/1989 | Heene et al. | 714/7 |
| 4,807,183 A | 2/1989 | Kung et al. | |
| 4,809,345 A | 2/1989 | Tabata et al. | |
| 4,812,684 A | 3/1989 | Yamagiwa et al. | |
| 4,813,013 A | 3/1989 | Dunn | |
| 4,827,401 A | 5/1989 | Hrustich et al. | |
| 4,831,546 A | 5/1989 | Mitsuta et al. | |
| 4,833,418 A | 5/1989 | Quintus et al. | |
| 4,868,525 A | 9/1989 | Dias | |
| 4,876,466 A | 10/1989 | Kondou et al. | |
| 4,876,534 A | 10/1989 | Mead et al. | |
| 4,878,200 A | 10/1989 | Asghar et al. | |
| 4,879,461 A | 11/1989 | Philipp | |
| 4,879,688 A | 11/1989 | Turner et al. | |
| 4,885,484 A | 12/1989 | Gray | |
| 4,907,121 A | 3/1990 | Hrassky | |
| 4,935,702 A | 6/1990 | Mead et al. | |
| 4,939,637 A | 7/1990 | Pawloski | |
| 4,942,540 A | 7/1990 | Black et al. | |
| 4,947,169 A | 8/1990 | Smith et al. | |
| 4,953,928 A | 9/1990 | Anderson et al. | |
| 4,962,342 A | 10/1990 | Mead et al. | |
| 4,964,074 A | 10/1990 | Suzuki et al. | |
| 4,969,087 A | 11/1990 | Tanagawa et al. | |
| 4,970,408 A | 11/1990 | Hanke et al. | |
| 4,972,372 A | 11/1990 | Ueno | |
| 4,977,381 A | 12/1990 | Main | |
| 4,980,652 A | 12/1990 | Tarusawa et al. | |
| 4,999,519 A | 3/1991 | Kitsukawa et al. | |
| 5,043,674 A | 8/1991 | Bonaccio et al. | |
| 5,049,758 A | 9/1991 | Mead et al. | |
| 5,050,168 A | 9/1991 | Paterson | |
| 5,053,949 A | 10/1991 | Allison et al. | |
| 5,055,827 A | 10/1991 | Philipp | |
| 5,059,920 A | 10/1991 | Anderson et al. | |
| 5,068,622 A | 11/1991 | Mead et al. | |
| 5,073,759 A | 12/1991 | Mead et al. | |
| 5,083,044 A | 1/1992 | Mead et al. | |
| 5,095,284 A | 3/1992 | Mead | |
| 5,097,305 A | 3/1992 | Mead et al. | |
| 5,099,191 A | 3/1992 | Galler et al. | |
| 5,107,146 A | 4/1992 | El-Ayat | |
| 5,107,149 A | 4/1992 | Platt et al. | |
| 5,109,261 A | 4/1992 | Mead et al. | |
| 5,119,038 A | 6/1992 | Anderson et al. | |
| 5,120,996 A | 6/1992 | Mead et al. | |
| 5,122,800 A | 6/1992 | Philipp | |
| 5,126,685 A | 6/1992 | Platt et al. | |
| 5,127,103 A | 6/1992 | Hill et al. | |
| 5,128,871 A | 7/1992 | Schmitz | |
| 5,136,188 A | 8/1992 | Ha et al. | |
| 5,140,197 A | 8/1992 | Grider | |
| 5,142,247 A | 8/1992 | Lada et al. | |
| 5,144,582 A | 9/1992 | Steele | |
| 5,146,106 A | 9/1992 | Anderson et al. | |
| 5,150,079 A | 9/1992 | Williams et al. | |
| 5,155,836 A | 10/1992 | Jordan et al. | |
| 5,159,292 A | 10/1992 | Canfield et al. | |
| 5,159,335 A | 10/1992 | Veneruso | |
| 5,160,899 A | 11/1992 | Anderson et al. | |
| 5,161,124 A | 11/1992 | Love | |
| 5,165,054 A | 11/1992 | Platt et al. | |
| 5,166,562 A | 11/1992 | Allen et al. | |
| 5,175,884 A | 12/1992 | Suarez | |
| 5,179,531 A | 1/1993 | Yamaki | |
| 5,184,061 A | 2/1993 | Lee et al. | |
| 5,196,740 A | 3/1993 | Austin | |
| 5,198,817 A | 3/1993 | Walden et al. | |
| 5,200,751 A | 4/1993 | Smith | |
| 5,202,687 A | 4/1993 | Distinti | 341/158 |
| 5,204,549 A | 4/1993 | Platt et al. | |
| 5,206,582 A | 4/1993 | Ekstedt et al. | |
| 5,220,512 A | 6/1993 | Watkins et al. | |
| 5,225,991 A | 7/1993 | Dougherty | |
| 5,230,000 A | 7/1993 | Mozingo et al. | |
| 5,235,617 A | 8/1993 | Mallard, Jr. | |
| 5,241,492 A | 8/1993 | Girardeau, Jr. | |
| 5,243,554 A | 9/1993 | Allen et al. | |
| 5,245,262 A | 9/1993 | Moody et al. | |
| 5,248,843 A | 9/1993 | Billings | |
| 5,248,873 A | 9/1993 | Allen et al. | |
| 5,258,760 A | 11/1993 | Moody et al. | 341/166 |
| 5,260,592 A | 11/1993 | Mead et al. | |
| 5,260,979 A | 11/1993 | Parker et al. | |
| 5,270,963 A | 12/1993 | Allen et al. | |
| 5,276,407 A | 1/1994 | Mead et al. | |
| 5,276,890 A * | 1/1994 | Arai | 713/323 |
| 5,280,199 A | 1/1994 | Itakura | |
| 5,280,202 A | 1/1994 | Chan et al. | |
| 5,289,023 A | 2/1994 | Mead | |
| 5,303,329 A | 4/1994 | Mead et al. | |
| 5,304,955 A | 4/1994 | Atriss et al. | |
| 5,305,017 A | 4/1994 | Gerpheide | |
| 5,305,312 A | 4/1994 | Fornek et al. | |
| 5,307,381 A | 4/1994 | Ahuja | |
| 5,313,618 A | 5/1994 | Pawloski | |
| 5,317,202 A | 5/1994 | Waizman | |
| 5,319,370 A | 6/1994 | Signore et al. | |
| 5,319,771 A | 6/1994 | Takeda | |
| 5,321,828 A | 6/1994 | Phillips et al. | |
| 5,324,958 A | 6/1994 | Mead et al. | |
| 5,325,512 A | 6/1994 | Takahashi | |
| 5,329,471 A | 7/1994 | Swoboda et al. | |
| 5,331,215 A | 7/1994 | Allen et al. | |
| 5,331,315 A | 7/1994 | Crosetto | |
| 5,331,571 A | 7/1994 | Aronoff et al. | |
| 5,334,952 A | 8/1994 | Maddy et al. | |
| 5,335,342 A | 8/1994 | Pope et al. | |
| 5,336,936 A | 8/1994 | Allen et al. | |
| 5,339,213 A | 8/1994 | O'Callaghan | |
| 5,339,262 A | 8/1994 | Rostoker et al. | |
| 5,341,044 A | 8/1994 | Ahanin et al. | |
| 5,341,267 A | 8/1994 | Whitten et al. | |
| 5,345,195 A | 9/1994 | Cordoba et al. | |
| 5,349,303 A | 9/1994 | Gerpheide | |
| 5,355,097 A | 10/1994 | Scott et al. | |
| 5,357,626 A | 10/1994 | Johnson et al. | |
| 5,361,290 A | 11/1994 | Akiyama | |
| 5,371,524 A | 12/1994 | Herczeg et al. | |
| 5,371,860 A | 12/1994 | Mura et al. | |
| 5,371,878 A | 12/1994 | Coker | |
| 5,371,883 A | 12/1994 | Gross et al. | |
| 5,374,787 A | 12/1994 | Miller et al. | |
| 5,377,333 A | 12/1994 | Nakagoshi et al. | |
| 5,378,935 A | 1/1995 | Korhonen et al. | |
| 5,381,515 A | 1/1995 | Platt et al. | |
| 5,384,467 A | 1/1995 | Plimon et al. | |
| 5,384,745 A | 1/1995 | Konishi et al. | |
| 5,384,910 A | 1/1995 | Torres | |
| 5,390,173 A | 2/1995 | Spinney et al. | |
| 5,392,784 A | 2/1995 | Gudaitis | |
| 5,394,522 A | 2/1995 | Sanchez-Frank et al. | |
| 5,396,245 A | 3/1995 | Rempfer | |
| 5,398,261 A | 3/1995 | Marbot | |
| 5,399,922 A | 3/1995 | Kiani et al. | 326/40 |
| 5,408,194 A | 4/1995 | Steinbach et al. | |
| 5,414,308 A | 5/1995 | Lee et al. | 327/293 |

| Patent | Date | Name |
|---|---|---|
| 5,414,380 A | 5/1995 | Floyd et al. |
| 5,416,895 A | 5/1995 | Anderson et al. |
| 5,422,823 A | 6/1995 | Agrawal et al. |
| 5,424,689 A | 6/1995 | Gillig et al. |
| 5,426,378 A | 6/1995 | Ong .................................. 326/39 |
| 5,426,384 A | 6/1995 | May |
| 5,428,319 A | 6/1995 | Marvin et al. |
| 5,430,395 A | 7/1995 | Ichimaru |
| 5,430,687 A | 7/1995 | Hung et al. |
| 5,430,734 A | 7/1995 | Gilson |
| 5,432,476 A | 7/1995 | Tran |
| 5,438,672 A | 8/1995 | Dey |
| 5,440,305 A | 8/1995 | Signore et al. |
| 5,451,887 A | 9/1995 | El-Ayat et al. |
| 5,453,904 A | 9/1995 | Higashiyama et al. |
| 5,455,525 A | 10/1995 | Ho et al. |
| 5,455,731 A | 10/1995 | Parkinson |
| 5,455,927 A | 10/1995 | Huang |
| 5,457,410 A * | 10/1995 | Ting .................................. 326/41 |
| 5,457,479 A | 10/1995 | Cheng |
| 5,463,591 A | 10/1995 | Aimoto et al. |
| 5,466,480 A | 12/1995 | Stone et al. |
| 5,479,603 A | 12/1995 | Bhaskar et al. |
| 5,479,643 A | 12/1995 | Dreyer et al. |
| 5,479,652 A | 12/1995 | Dreyer et al. |
| 5,481,471 A * | 1/1996 | Naglestad et al. ................. 716/4 |
| 5,488,204 A | 1/1996 | Mead et al. |
| 5,491,458 A | 2/1996 | McCune |
| 5,493,246 A | 2/1996 | Anderson |
| 5,493,723 A | 2/1996 | Beck et al. |
| 5,495,077 A | 2/1996 | Miller et al. |
| 5,495,593 A | 2/1996 | Elmer et al. |
| 5,495,594 A | 2/1996 | MacKenna et al. |
| 5,497,119 A | 3/1996 | Tedrow et al. |
| 5,499,192 A | 3/1996 | Knapp et al. |
| 5,500,823 A | 3/1996 | Martin et al. |
| 5,517,198 A | 5/1996 | McEwan |
| 5,519,854 A | 5/1996 | Watt |
| 5,521,529 A | 5/1996 | Agrawal et al. |
| 5,530,444 A | 6/1996 | Tice et al. |
| 5,530,673 A | 6/1996 | Tobita et al. |
| 5,530,813 A | 6/1996 | Paulsen et al. |
| 5,537,057 A | 7/1996 | Leong et al. |
| 5,541,878 A | 7/1996 | LeMoncheck et al. |
| 5,542,055 A | 7/1996 | Amini et al. |
| 5,543,588 A | 8/1996 | Bisset et al. |
| 5,543,590 A | 8/1996 | Gillespie et al. |
| 5,543,591 A | 8/1996 | Gillespie et al. |
| 5,544,067 A | 8/1996 | Rostoker et al. |
| 5,544,311 A | 8/1996 | Harenberg et al. |
| 5,546,433 A | 8/1996 | Tran et al. |
| 5,546,562 A | 8/1996 | Patel |
| 5,552,725 A | 9/1996 | Ray et al. |
| 5,552,748 A | 9/1996 | O'Shaughnessy |
| 5,554,951 A | 9/1996 | Gough |
| 5,555,452 A | 9/1996 | Callaway, Jr. et al. |
| 5,555,907 A | 9/1996 | Philipp |
| 5,557,762 A | 9/1996 | Okuaki et al. |
| 5,559,502 A | 9/1996 | Schutte |
| 5,559,996 A | 9/1996 | Fujioka |
| 5,563,526 A | 10/1996 | Hastings et al. ................. 326/37 |
| 5,563,529 A | 10/1996 | Seltzer et al. |
| 5,564,010 A | 10/1996 | Henry et al. |
| 5,564,108 A | 10/1996 | Hunsaker et al. |
| 5,565,658 A | 10/1996 | Gerpheide et al. |
| 5,566,702 A | 10/1996 | Philipp |
| 5,572,665 A | 11/1996 | Nakabayashi et al. |
| 5,572,719 A | 11/1996 | Biesterfeldt |
| 5,574,678 A | 11/1996 | Gorecki |
| 5,574,852 A | 11/1996 | Bakker et al. |
| 5,574,892 A | 11/1996 | Christensen |
| 5,579,353 A | 11/1996 | Parmenter et al. |
| 5,587,945 A | 12/1996 | Lin et al. |
| 5,587,957 A | 12/1996 | Kowalczyk et al. |
| 5,590,354 A | 12/1996 | Klapproth et al. |
| 5,594,388 A | 1/1997 | O'Shaughnessy et al. |
| 5,594,734 A | 1/1997 | Worsley et al. |
| 5,594,876 A | 1/1997 | Getzlaff et al. |
| 5,594,890 A | 1/1997 | Yamaura et al. |
| 5,600,262 A | 2/1997 | Kolze .................................. 326/38 |
| 5,604,466 A | 2/1997 | Dreps et al. |
| 5,608,892 A | 3/1997 | Wakerly |
| 5,614,861 A | 3/1997 | Harada |
| 5,625,316 A | 4/1997 | Chambers et al. |
| 5,629,857 A | 5/1997 | Brennan |
| 5,629,891 A | 5/1997 | LeMoncheck et al. |
| 5,630,052 A | 5/1997 | Shah |
| 5,630,057 A | 5/1997 | Hait |
| 5,630,102 A | 5/1997 | Johnson et al. |
| 5,631,577 A | 5/1997 | Freidin et al. |
| 5,633,766 A | 5/1997 | Hase et al. ........................ 360/51 |
| 5,642,295 A * | 6/1997 | Smayling ...................... 702/182 |
| 5,646,544 A | 7/1997 | Iadanza |
| 5,646,901 A | 7/1997 | Sharpe-Geisler et al. |
| 5,648,642 A | 7/1997 | Miller et al. |
| 5,651,035 A | 7/1997 | Tozun |
| 5,652,893 A | 7/1997 | Ben-Meir et al. |
| 5,663,900 A | 9/1997 | Bhandari et al. |
| 5,663,965 A | 9/1997 | Seymour |
| 5,664,199 A | 9/1997 | Kuwahara |
| 5,666,480 A | 9/1997 | Leung et al. |
| 5,670,915 A | 9/1997 | Cooper et al. |
| 5,673,198 A | 9/1997 | Lawman et al. |
| 5,675,825 A | 10/1997 | Dreyer et al. |
| 5,677,691 A | 10/1997 | Hosticka et al. |
| 5,680,070 A | 10/1997 | Anderson et al. ............. 327/336 |
| 5,682,032 A | 10/1997 | Philipp |
| 5,684,434 A | 11/1997 | Mann et al. |
| 5,684,952 A | 11/1997 | Stein |
| 5,686,844 A | 11/1997 | Hull et al. |
| 5,687,325 A | 11/1997 | Chang |
| 5,689,195 A | 11/1997 | Cliff et al. |
| 5,689,196 A | 11/1997 | Schutte |
| 5,691,664 A | 11/1997 | Anderson et al. |
| 5,691,898 A | 11/1997 | Rosenberg et al. |
| 5,694,063 A | 12/1997 | Burlison et al. |
| 5,696,952 A | 12/1997 | Pontarelli |
| 5,699,024 A | 12/1997 | Manlove et al. |
| 5,703,871 A | 12/1997 | Pope et al. ...................... 370/248 |
| 5,706,453 A | 1/1998 | Cheng et al. |
| 5,708,589 A | 1/1998 | Beauvais |
| 5,708,798 A | 1/1998 | Lynch et al. |
| 5,710,906 A | 1/1998 | Ghosh et al. |
| 5,712,969 A * | 1/1998 | Zimmermann et al. .......... 714/5 |
| 5,721,931 A | 2/1998 | Gephardt et al. |
| 5,724,009 A | 3/1998 | Collins et al. |
| 5,727,170 A | 3/1998 | Mitchell et al. |
| 5,729,704 A | 3/1998 | Stone et al. |
| 5,730,165 A | 3/1998 | Philipp |
| 5,732,277 A | 3/1998 | Kodosky et al. |
| 5,734,272 A | 3/1998 | Belot et al. |
| 5,734,334 A | 3/1998 | Hsieh et al. |
| 5,737,557 A | 4/1998 | Sullivan |
| 5,737,760 A | 4/1998 | Grimmer et al. |
| 5,745,011 A | 4/1998 | Scott |
| 5,748,048 A | 5/1998 | Moyal |
| 5,748,875 A * | 5/1998 | Tzori ............................... 714/29 |
| 5,752,013 A | 5/1998 | Christensen et al. |
| 5,754,552 A | 5/1998 | Allmond et al. |
| 5,754,826 A * | 5/1998 | Gamal et al. ..................... 703/14 |
| 5,757,368 A | 5/1998 | Gerpheide et al. |
| 5,758,058 A | 5/1998 | Milburn |
| 5,761,128 A | 6/1998 | Watanabe |
| 5,763,909 A | 6/1998 | Mead et al. |
| 5,764,714 A | 6/1998 | Stansell et al. |
| 5,767,457 A | 6/1998 | Gerpheide et al. |
| 5,774,704 A | 6/1998 | Williams |
| 5,777,399 A | 7/1998 | Shibuya |
| 5,781,030 A | 7/1998 | Agrawal et al. |
| 5,781,747 A | 7/1998 | Smith et al. |
| 5,784,545 A | 7/1998 | Anderson et al. |
| 5,790,957 A | 8/1998 | Heidari |
| 5,796,183 A | 8/1998 | Hourmand |
| 5,799,176 A | 8/1998 | Kapusta et al. |
| 5,802,073 A | 9/1998 | Platt |
| 5,802,290 A | 9/1998 | Casselman |
| 5,805,792 A | 9/1998 | Swoboda et al. |
| 5,805,897 A | 9/1998 | Glowny |
| 5,808,883 A | 9/1998 | Hawkes |

| | | | | | | |
|---|---|---|---|---|---|---|
| 5,811,987 A | 9/1998 | Ashmore, Jr. et al. | | 5,956,279 A | 9/1999 | Mo et al. |
| 5,812,698 A | 9/1998 | Platt et al. | | 5,959,871 A | 9/1999 | Pierzchala et al. |
| 5,818,254 A | 10/1998 | Agrawal et al. | | 5,963,075 A | 10/1999 | Hiiragizawa |
| 5,818,444 A | 10/1998 | Alimpich et al. | | 5,963,105 A | 10/1999 | Nguyen |
| 5,819,028 A | 10/1998 | Manghirmalani et al. | | 5,963,503 A | 10/1999 | Lee |
| 5,822,387 A | 10/1998 | Mar | | 5,964,893 A | 10/1999 | Circello et al. |
| 5,822,531 A | 10/1998 | Gorczyca et al. | | 5,966,027 A | 10/1999 | Kapusta et al. |
| 5,828,693 A | 10/1998 | Mays et al. .................. 375/202 | | 5,966,532 A | 10/1999 | McDonald et al. |
| 5,838,583 A | 11/1998 | Varadarajan et al. | | 5,968,135 A | 10/1999 | Teramoto et al. |
| 5,841,078 A | 11/1998 | Miller et al. | | 5,969,513 A | 10/1999 | Clark |
| 5,841,996 A | 11/1998 | Nolan et al. | | 5,969,632 A | 10/1999 | Diamant et al. |
| 5,844,256 A | 12/1998 | Higashino | | 5,973,368 A | 10/1999 | Pearce et al. |
| 5,844,404 A | 12/1998 | Caser et al. | | 5,974,235 A | 10/1999 | Nunally et al. |
| 5,848,285 A | 12/1998 | Kapusta et al. | | 5,977,791 A | 11/1999 | Veenstra |
| 5,850,156 A | 12/1998 | Wittman | | 5,978,584 A | 11/1999 | Nishibata et al. |
| 5,852,733 A | 12/1998 | Chien et al. | | 5,978,937 A | 11/1999 | Miyamori et al. |
| 5,854,625 A | 12/1998 | Frisch et al. | | 5,982,105 A | 11/1999 | Masters |
| 5,857,109 A | 1/1999 | Taylor | | 5,982,229 A | 11/1999 | Wong et al. |
| 5,861,583 A | 1/1999 | Schediwy et al. | | 5,982,241 A | 11/1999 | Nguyen et al. |
| 5,861,875 A | 1/1999 | Gerpheide | | 5,983,277 A | 11/1999 | Heile et al. |
| 5,864,242 A | 1/1999 | Allen et al. | | 5,986,479 A | 11/1999 | Mohan |
| 5,864,392 A | 1/1999 | Winklhofer et al. | | 5,987,246 A | 11/1999 | Thomsen et al. |
| 5,867,046 A | 2/1999 | Sugasawa | | 5,988,902 A | 11/1999 | Holehan |
| 5,867,399 A | 2/1999 | Rostoker et al. | | 5,994,939 A | 11/1999 | Johnson et al. |
| 5,869,979 A | 2/1999 | Bocchino | | 5,996,032 A | 11/1999 | Baker |
| 5,870,004 A | 2/1999 | Lu | | 5,999,725 A | 12/1999 | Barbier et al. |
| 5,870,309 A | 2/1999 | Lawman | | 6,002,268 A | 12/1999 | Sasaki et al. |
| 5,870,345 A | 2/1999 | Stecker | | 6,002,398 A | 12/1999 | Wilson |
| 5,872,464 A | 2/1999 | Gradinariu | | 6,003,054 A | 12/1999 | Oshima et al. |
| 5,874,958 A | 2/1999 | Ludolph | | 6,003,107 A | 12/1999 | Ranson et al. |
| 5,875,293 A | 2/1999 | Bell et al. | | 6,003,133 A | 12/1999 | Moughanni et al. |
| 5,877,656 A | 3/1999 | Mann et al. | | 6,005,814 A | 12/1999 | Mulholland et al. |
| 5,878,425 A | 3/1999 | Redpath | | 6,005,904 A | 12/1999 | Knapp et al. |
| 5,880,411 A | 3/1999 | Gillespie et al. | | 6,008,685 A | 12/1999 | Kunst |
| 5,880,598 A | 3/1999 | Duong ............................ 326/41 | | 6,008,703 A | 12/1999 | Perrott et al. |
| 5,883,623 A | 3/1999 | Cseri | | 6,009,270 A | 12/1999 | Mann |
| 5,886,582 A | 3/1999 | Stansell | | 6,009,496 A | 12/1999 | Tsai |
| 5,887,189 A | 3/1999 | Birns et al. | | 6,011,407 A | 1/2000 | New |
| 5,889,236 A | 3/1999 | Gillespie et al. | | 6,012,835 A | 1/2000 | Thompson et al. |
| 5,889,723 A | 3/1999 | Pascucci | | 6,014,135 A | 1/2000 | Fernandes |
| 5,889,936 A | 3/1999 | Chan | | 6,014,509 A | 1/2000 | Furtek et al. |
| 5,889,988 A | 3/1999 | Held | | 6,014,723 A | 1/2000 | Tremblay et al. |
| 5,894,226 A | 4/1999 | Koyama | | 6,016,554 A | 1/2000 | Skrovan et al. |
| 5,894,243 A | 4/1999 | Hwang | | 6,016,563 A | 1/2000 | Fleisher |
| 5,894,565 A * | 4/1999 | Furtek et al. ..................... 326/38 | | 6,018,559 A | 1/2000 | Azegami et al. ................. 377/79 |
| 5,895,494 A | 4/1999 | Scalzi et al. | | 6,023,422 A | 2/2000 | Allen et al. |
| 5,896,068 A | 4/1999 | Moyal | | 6,023,565 A | 2/2000 | Lawman et al. |
| 5,896,330 A | 4/1999 | Gibson | | 6,026,134 A | 2/2000 | Duffy et al. |
| 5,898,345 A | 4/1999 | Namura et al. | | 6,026,501 A | 2/2000 | Hohl et al. |
| 5,900,780 A | 5/1999 | Hirose et al. | | 6,028,271 A | 2/2000 | Gillespie et al. |
| 5,901,062 A | 5/1999 | Burch et al. | | 6,028,959 A | 2/2000 | Wang et al. |
| 5,903,718 A | 5/1999 | Marik | | 6,031,365 A | 2/2000 | Sharpe-Geisler |
| 5,905,398 A | 5/1999 | Todsen et al. | | 6,032,268 A | 2/2000 | Swoboda et al. |
| 5,909,544 A | 6/1999 | Anderson, II et al. | | 6,034,538 A | 3/2000 | Abramovici |
| 5,911,059 A | 6/1999 | Profit, Jr. | | 6,037,807 A | 3/2000 | Wu et al. |
| 5,914,465 A | 6/1999 | Allen et al. | | 6,038,551 A | 3/2000 | Barlow et al. |
| 5,914,633 A | 6/1999 | Comino et al. | | 6,041,406 A | 3/2000 | Mann |
| 5,914,708 A | 6/1999 | LaGrange et al. | | 6,043,695 A | 3/2000 | O'Sullivan |
| 5,917,356 A | 6/1999 | Casal et al. | | 6,043,719 A | 3/2000 | Lin et al. |
| 5,920,310 A | 7/1999 | Faggin et al. | | 6,049,223 A | 4/2000 | Lytle et al. |
| 5,923,264 A | 7/1999 | Lavelle et al. | | 6,049,225 A | 4/2000 | Huang et al. |
| 5,926,566 A | 7/1999 | Wang et al. | | 6,051,772 A | 4/2000 | Cameron et al. |
| 5,929,710 A | 7/1999 | Bien | | 6,052,035 A | 4/2000 | Nolan et al. |
| 5,930,148 A | 7/1999 | Bjorksten et al. | | 6,052,524 A | 4/2000 | Pauna |
| 5,930,150 A | 7/1999 | Cohen et al. | | 6,055,584 A | 4/2000 | Bridges et al. |
| 5,931,959 A | 8/1999 | Kwiat | | 6,057,705 A | 5/2000 | Wojewoda et al. |
| 5,933,023 A | 8/1999 | Young | | 6,058,263 A | 5/2000 | Voth |
| 5,933,356 A | 8/1999 | Rostoker et al. | | 6,058,452 A | 5/2000 | Rangasayee et al. |
| 5,933,816 A | 8/1999 | Zeanah et al. | | 6,061,511 A | 5/2000 | Marantz et al. |
| 5,935,233 A | 8/1999 | Jeddeloh | | 6,066,961 A | 5/2000 | Lee et al. |
| 5,935,266 A | 8/1999 | Thurnhofer et al. | | 6,070,003 A | 5/2000 | Gove et al. |
| 5,939,904 A | 8/1999 | Fetterman et al. | | 6,072,803 A | 6/2000 | Allmond et al. |
| 5,939,949 A | 8/1999 | Olgaard et al. ................... 331/17 | | 6,075,941 A | 6/2000 | Itoh et al. |
| 5,941,991 A | 8/1999 | Kageshima | | 6,079,985 A | 6/2000 | Wohl et al. |
| 5,942,733 A | 8/1999 | Allen et al. | | 6,081,140 A | 6/2000 | King |
| 5,943,052 A | 8/1999 | Allen et al. | | 6,088,822 A | 7/2000 | Warren |
| 5,945,878 A | 8/1999 | Westwick et al. | | 6,094,730 A | 7/2000 | Lopez et al. |
| 5,949,632 A | 9/1999 | Barreras, Sr. et al. | | 6,097,211 A | 8/2000 | Couts-Martin et al. |
| 5,952,888 A | 9/1999 | Scott | | 6,097,432 A | 8/2000 | Mead et al. |

| | | | |
|---|---|---|---|
| 6,101,457 A | 8/2000 | Barch et al. |
| 6,101,617 A | 8/2000 | Burckhartt et al. |
| 6,104,217 A | 8/2000 | Magana |
| 6,104,325 A | 8/2000 | Liaw et al. |
| 6,107,769 A | 8/2000 | Saylor et al. |
| 6,107,826 A | 8/2000 | Young et al. |
| 6,107,882 A | 8/2000 | Gabara et al. |
| 6,110,223 A | 8/2000 | Southgate et al. |
| 6,111,431 A | 8/2000 | Estrada |
| 6,112,264 A | 8/2000 | Beasley et al. |
| 6,121,791 A | 9/2000 | Abbott |
| 6,121,805 A | 9/2000 | Thamsirianunt et al. |
| 6,121,965 A | 9/2000 | Kenney et al. |
| 6,125,416 A | 9/2000 | Warren |
| 6,130,548 A | 10/2000 | Koifman |
| 6,130,551 A | 10/2000 | Agrawal et al. |
| 6,130,552 A | 10/2000 | Jefferson et al. |
| 6,133,773 A | 10/2000 | Garlepp et al. |
| 6,134,181 A | 10/2000 | Landry |
| 6,134,516 A | 10/2000 | Wang et al. |
| 6,137,308 A | 10/2000 | Nayak |
| 6,140,853 A | 10/2000 | Lo |
| 6,141,376 A | 10/2000 | Shaw |
| 6,141,764 A | 10/2000 | Ezell |
| 6,144,327 A | 11/2000 | Distinti et al. ............. 341/126 |
| 6,148,104 A | 11/2000 | Wang et al. |
| 6,148,441 A * | 11/2000 | Woodward ............. 717/168 |
| 6,149,299 A | 11/2000 | Aslan et al. |
| 6,150,866 A | 11/2000 | Eto et al. |
| 6,154,064 A | 11/2000 | Proebsting |
| 6,157,024 A | 12/2000 | Chapdelaine et al. |
| 6,157,270 A | 12/2000 | Tso ............. 331/176 |
| 6,161,199 A | 12/2000 | Szeto et al. |
| 6,166,367 A | 12/2000 | Cho ............. 250/208.1 |
| 6,166,960 A | 12/2000 | Marneweck et al. |
| 6,167,077 A | 12/2000 | Ducaroir et al. |
| 6,167,559 A | 12/2000 | Furtek et al. |
| 6,169,383 B1 | 1/2001 | Johnson |
| 6,172,571 B1 | 1/2001 | Moyal et al. |
| 6,173,419 B1 | 1/2001 | Barnett |
| 6,175,914 B1 | 1/2001 | Mann |
| 6,175,949 B1 | 1/2001 | Gristede et al. |
| 6,181,163 B1 | 1/2001 | Agrawal et al. |
| 6,183,131 B1 | 2/2001 | Holloway et al. |
| 6,185,127 B1 | 2/2001 | Myers et al. |
| 6,185,450 B1 | 2/2001 | Seguine et al. |
| 6,185,522 B1 | 2/2001 | Bakker |
| 6,185,703 B1 | 2/2001 | Guddat et al. |
| 6,185,732 B1 | 2/2001 | Mann et al. |
| 6,188,228 B1 | 2/2001 | Philipp |
| 6,188,241 B1 | 2/2001 | Gauthier et al. |
| 6,188,381 B1 * | 2/2001 | van der Wal et al. ......... 345/581 |
| 6,188,391 B1 | 2/2001 | Seely et al. |
| 6,188,975 B1 | 2/2001 | Gay |
| 6,191,603 B1 | 2/2001 | Muradali et al. |
| 6,191,660 B1 | 2/2001 | Mar et al. ............. 331/111 |
| 6,191,998 B1 | 2/2001 | Reddy et al. |
| 6,192,431 B1 | 2/2001 | Dabral et al. |
| 6,198,303 B1 | 3/2001 | Rangasayee |
| 6,201,407 B1 | 3/2001 | Kapusta et al. |
| 6,201,829 B1 | 3/2001 | Schneider |
| 6,202,044 B1 | 3/2001 | Tzori |
| 6,204,687 B1 | 3/2001 | Schultz et al. |
| 6,205,574 B1 | 3/2001 | Dellinger et al. |
| 6,208,572 B1 | 3/2001 | Adams et al. |
| 6,211,708 B1 | 4/2001 | Kemmer |
| 6,211,715 B1 | 4/2001 | Terauchi |
| 6,211,741 B1 | 4/2001 | Dalmia |
| 6,215,352 B1 | 4/2001 | Sudo |
| 6,219,729 B1 | 4/2001 | Keats et al. |
| 6,222,528 B1 | 4/2001 | Gerpheide et al. |
| 6,223,144 B1 | 4/2001 | Barnett et al. |
| 6,223,147 B1 | 4/2001 | Bowers |
| 6,223,272 B1 | 4/2001 | Coehlo et al. |
| RE37,195 E | 5/2001 | Kean |
| 6,225,866 B1 | 5/2001 | Kubota et al. ............. 330/295 |
| 6,236,242 B1 | 5/2001 | Hedberg |
| 6,236,275 B1 | 5/2001 | Dent |
| 6,236,278 B1 | 5/2001 | Olgaard |
| 6,236,593 B1 | 5/2001 | Hong et al. |
| 6,239,389 B1 | 5/2001 | Allen et al. |
| 6,239,798 B1 | 5/2001 | Ludolph et al. |
| 6,240,375 B1 | 5/2001 | Sonoda |
| 6,246,258 B1 | 6/2001 | Lesea |
| 6,246,410 B1 | 6/2001 | Bergeron et al. |
| 6,249,167 B1 | 6/2001 | Oguchi et al. |
| 6,249,447 B1 | 6/2001 | Boylan et al. |
| 6,253,250 B1 | 6/2001 | Evans et al. |
| 6,256,754 B1 | 7/2001 | Roohparvar |
| 6,262,717 B1 | 7/2001 | Donohue et al. |
| 6,263,302 B1 | 7/2001 | Hellestrand et al. |
| 6,263,339 B1 | 7/2001 | Hirsh |
| 6,263,484 B1 | 7/2001 | Yang |
| 6,271,679 B1 | 8/2001 | McClintock et al. |
| 6,272,646 B1 | 8/2001 | Rangasayee et al. |
| 6,275,117 B1 | 8/2001 | Abugharbieh et al. |
| 6,278,568 B1 | 8/2001 | Cloke et al. |
| 6,280,391 B1 | 8/2001 | Olson et al. |
| 6,281,753 B1 | 8/2001 | Corsi et al. |
| 6,282,547 B1 | 8/2001 | Hirsh |
| 6,282,551 B1 | 8/2001 | Anderson et al. |
| 6,286,127 B1 | 9/2001 | King et al. |
| 6,288,707 B1 | 9/2001 | Philipp |
| 6,289,300 B1 | 9/2001 | Brannick et al. |
| 6,289,478 B1 | 9/2001 | Kitagaki |
| 6,289,489 B1 | 9/2001 | Bold et al. |
| 6,292,028 B1 | 9/2001 | Tomita |
| 6,294,932 B1 | 9/2001 | Watarai |
| 6,294,962 B1 | 9/2001 | Mar |
| 6,298,320 B1 | 10/2001 | Buckmaster et al. |
| 6,304,014 B1 | 10/2001 | England et al. |
| 6,304,101 B1 | 10/2001 | Nishihara ............. 326/41 |
| 6,304,790 B1 | 10/2001 | Nakamura et al. |
| 6,307,413 B1 | 10/2001 | Dalmia et al. |
| 6,310,521 B1 | 10/2001 | Dalmia |
| 6,310,611 B1 | 10/2001 | Caldwell |
| 6,311,149 B1 | 10/2001 | Ryan et al. |
| 6,314,530 B1 | 11/2001 | Mann |
| 6,320,184 B1 | 11/2001 | Winklhofer et al. |
| 6,320,282 B1 | 11/2001 | Caldwell |
| 6,321,369 B1 | 11/2001 | Heile et al. |
| 6,323,846 B1 | 11/2001 | Westerman et al. |
| 6,324,628 B1 | 11/2001 | Chan |
| 6,326,859 B1 | 12/2001 | Goldman et al. |
| 6,332,137 B1 | 12/2001 | Hori et al. |
| 6,332,201 B1 | 12/2001 | Chin et al. |
| 6,337,579 B1 | 1/2002 | Mochida |
| 6,338,109 B1 | 1/2002 | Snyder et al. |
| 6,339,815 B1 | 1/2002 | Feng et al. |
| 6,342,907 B1 | 1/2002 | Petty et al. |
| 6,345,383 B1 | 2/2002 | Ueki |
| 6,347,395 B1 | 2/2002 | Payne et al. |
| 6,351,789 B1 | 2/2002 | Green |
| 6,353,452 B1 | 3/2002 | Hamada et al. |
| 6,355,980 B1 | 3/2002 | Callahan |
| 6,356,862 B2 | 3/2002 | Bailey |
| 6,356,958 B1 | 3/2002 | Lin |
| 6,356,960 B1 | 3/2002 | Jones et al. |
| 6,359,950 B2 | 3/2002 | Gossmann et al. |
| 6,362,697 B1 | 3/2002 | Pulvirenti |
| 6,366,174 B1 | 4/2002 | Berry et al. |
| 6,366,300 B1 | 4/2002 | Ohara et al. |
| 6,366,874 B1 | 4/2002 | Lee et al. |
| 6,366,878 B1 | 4/2002 | Grunert |
| 6,369,660 B1 | 4/2002 | Wei et al. |
| 6,371,878 B1 | 4/2002 | Bowen |
| 6,373,954 B1 | 4/2002 | Malcolm et al. |
| 6,374,370 B1 | 4/2002 | Bockhaus et al. |
| 6,377,009 B1 | 4/2002 | Philipp |
| 6,377,575 B1 | 4/2002 | Mullaney et al. |
| 6,377,646 B1 | 4/2002 | Sha |
| 6,380,811 B1 | 4/2002 | Zarubinsky et al. |
| 6,380,929 B1 | 4/2002 | Platt |
| 6,380,931 B1 | 4/2002 | Gillespie et al. |
| 6,384,947 B1 | 5/2002 | Ackerman et al. |
| 6,385,742 B1 | 5/2002 | Kirsch et al. |
| 6,388,109 B1 | 5/2002 | Schwarz et al. |
| 6,388,464 B1 | 5/2002 | Lacey et al. |

| | | | | | | |
|---|---|---|---|---|---|---|
| 6,396,302 B2 | 5/2002 | New et al. | | 6,563,391 B1 | 5/2003 | Mar |
| 6,396,687 B1 | 5/2002 | Sun et al. | | 6,564,179 B1 | 5/2003 | Belhaj |
| 6,397,232 B1 | 5/2002 | Cheng-Hung et al. | | 6,566,961 B2 | 5/2003 | Dasgupta et al. |
| 6,404,204 B1 | 6/2002 | Farruggia et al. | | 6,567,426 B1 | 5/2003 | van Hook et al. |
| 6,404,445 B1 | 6/2002 | Galea et al. | | 6,567,932 B2 | 5/2003 | Edwards et al. |
| 6,407,953 B1 | 6/2002 | Cleeves | | 6,570,557 B1 | 5/2003 | Westerman et al. |
| 6,408,432 B1 | 6/2002 | Herrmann et al. | | 6,571,331 B1 | 5/2003 | Henry et al. |
| 6,411,665 B1 | 6/2002 | Chan et al. | | 6,571,373 B1 | 5/2003 | Devins et al. |
| 6,411,974 B1 | 6/2002 | Graham et al. | | 6,574,590 B1 | 6/2003 | Kershaw et al. |
| 6,414,671 B1 | 7/2002 | Gillespie et al. | | 6,574,739 B1 | 6/2003 | Kung et al. |
| 6,421,698 B1 | 7/2002 | Hong | | 6,575,373 B1 | 6/2003 | Nakano |
| 6,425,109 B1 | 7/2002 | Choukalos et al. | | 6,577,258 B2 | 6/2003 | Ruha et al. |
| 6,429,882 B1 | 8/2002 | Abdelnur et al. | | 6,578,174 B2 | 6/2003 | Zizzo |
| 6,430,305 B1 | 8/2002 | Decker | | 6,580,329 B2 | 6/2003 | Sander |
| 6,433,645 B1 | 8/2002 | Mann et al. | | 6,581,191 B1 | 6/2003 | Schubert et al. |
| 6,434,187 B1 | 8/2002 | Beard et al. | | 6,587,093 B1 | 7/2003 | Shaw et al. |
| 6,437,805 B1 | 8/2002 | Sojoodi et al. | | 6,587,995 B1 | 7/2003 | Duboc et al. |
| 6,438,565 B1 | 8/2002 | Ammirato et al. | | 6,588,004 B1 | 7/2003 | Southgate et al. |
| 6,438,735 B1 | 8/2002 | McElvain et al. | | 6,590,422 B1 | 7/2003 | Dillon |
| 6,438,738 B1 | 8/2002 | Elayda | | 6,590,517 B1 | 7/2003 | Swanson |
| 6,441,073 B1 | 8/2002 | Tanaka et al. | | 6,591,369 B1 | 7/2003 | Edwards et al. |
| 6,445,211 B1 | 9/2002 | Saripella | | 6,592,626 B1 | 7/2003 | Bauchot et al. |
| 6,449,628 B1 | 9/2002 | Wasson | | 6,594,799 B1 | 7/2003 | Robertson et al. |
| 6,449,755 B1 | 9/2002 | Beausang et al. | | 6,597,212 B1 | 7/2003 | Wang et al. |
| 6,449,761 B1 | 9/2002 | Greidinger et al. | | 6,597,824 B2 | 7/2003 | Newberg et al. |
| 6,452,437 B1 | 9/2002 | Takeuchi et al. | | 6,598,178 B1 | 7/2003 | Yee et al. |
| 6,452,514 B1 | 9/2002 | Philipp | | 6,600,346 B1 | 7/2003 | Macaluso |
| 6,453,175 B2 | 9/2002 | Mizell et al. | | 6,600,351 B2 | 7/2003 | Bisanti et al. |
| 6,453,461 B1 | 9/2002 | Chaiken | | 6,600,575 B1 | 7/2003 | Kohara |
| 6,456,304 B1 | 9/2002 | Angiulo et al. | | 6,601,189 B1 | 7/2003 | Edwards et al. |
| 6,457,355 B1 | 10/2002 | Philipp | | 6,601,236 B1 | 7/2003 | Curtis |
| 6,457,479 B1 | 10/2002 | Zhuang et al. | | 6,603,330 B1 | 8/2003 | Snyder |
| 6,460,172 B1 * | 10/2002 | Insenser Farre et al. ........ 716/17 | | 6,603,348 B1 | 8/2003 | Preuss et al. |
| 6,463,488 B1 | 10/2002 | San Juan | | 6,604,179 B2 | 8/2003 | Volk et al. |
| 6,466,036 B1 | 10/2002 | Philipp | | 6,606,731 B1 | 8/2003 | Baum et al. |
| 6,466,078 B1 | 10/2002 | Stiff | | 6,608,472 B1 | 8/2003 | Kutz et al. |
| 6,466,898 B1 | 10/2002 | Chan | | 6,610,936 B2 | 8/2003 | Gillespie et al. |
| 6,473,069 B1 | 10/2002 | Gerpheide | | 6,611,220 B1 | 8/2003 | Snyder |
| 6,473,825 B1 | 10/2002 | Worley et al. | | 6,611,276 B1 | 8/2003 | Muratori et al. |
| 6,477,691 B1 | 11/2002 | Bergamashi/Rab et al. | | 6,611,856 B1 | 8/2003 | Liao et al. |
| 6,480,921 B1 | 11/2002 | Mansoorian et al. | | 6,611,952 B1 | 8/2003 | Prakash et al. |
| 6,483,343 B1 | 11/2002 | Faith et al. | | 6,613,098 B1 | 9/2003 | Sorge et al. |
| 6,487,700 B1 | 11/2002 | Fukushima | | 6,614,260 B1 | 9/2003 | Welch et al. |
| 6,489,899 B1 | 12/2002 | Ely et al. | | 6,614,320 B1 | 9/2003 | Sullam et al. |
| 6,490,213 B1 | 12/2002 | Mu et al. | | 6,614,374 B1 | 9/2003 | Gustavsson et al. |
| 6,492,834 B1 | 12/2002 | Lytle et al. | | 6,614,458 B1 | 9/2003 | Lambert et al. |
| 6,496,971 B1 | 12/2002 | Lesea et al. | | 6,615,167 B1 | 9/2003 | Herzl et al. |
| 6,498,720 B2 | 12/2002 | Glad | | 6,617,888 B2 | 9/2003 | Volk |
| 6,499,134 B1 | 12/2002 | Buffet et al. | | 6,618,854 B1 | 9/2003 | Mann |
| 6,499,359 B1 | 12/2002 | Washeleski et al. | | 6,621,356 B2 | 9/2003 | Gotz et al. |
| 6,504,403 B2 | 1/2003 | Bangs et al. | | 6,624,640 B2 | 9/2003 | Lund et al. |
| 6,507,214 B1 | 1/2003 | Snyder | | 6,625,765 B1 | 9/2003 | Krishnan |
| 6,507,215 B1 | 1/2003 | Piasecki et al. | | 6,628,163 B2 | 9/2003 | Dathe et al. |
| 6,507,857 B1 | 1/2003 | Yalcinalp | | 6,628,311 B1 | 9/2003 | Fang |
| 6,509,758 B2 | 1/2003 | Piasecki et al. | | 6,631,508 B1 | 10/2003 | Williams |
| 6,512,395 B1 | 1/2003 | Lacey et al. | | 6,634,008 B1 | 10/2003 | Dole |
| 6,516,428 B2 | 2/2003 | Wenzel et al. | | 6,636,096 B2 | 10/2003 | Schaffer et al. |
| 6,522,128 B1 | 2/2003 | Ely et al. | | 6,637,015 B1 | 10/2003 | Ogami et al. |
| 6,523,416 B2 | 2/2003 | Takagi et al. | | 6,639,586 B2 | 10/2003 | Gerpheide |
| 6,525,593 B1 | 2/2003 | Mar | | 6,642,857 B1 | 11/2003 | Schediwy et al. |
| 6,526,556 B1 | 2/2003 | Stoica et al. | | 6,643,151 B1 | 11/2003 | Nebrigic et al. |
| 6,529,791 B1 | 3/2003 | Takagi | | 6,643,810 B1 | 11/2003 | Whetsel |
| 6,530,065 B1 | 3/2003 | McDonald et al. | | 6,649,924 B1 | 11/2003 | Philipp et al. |
| 6,534,970 B1 | 3/2003 | Ely et al. | | 6,650,581 B2 | 11/2003 | Hong et al. |
| 6,535,061 B2 | 3/2003 | Darmawaskita et al. | | 6,658,498 B1 | 12/2003 | Carney et al. |
| 6,535,200 B2 | 3/2003 | Philipp | | 6,658,633 B2 | 12/2003 | Devins et al. |
| 6,535,946 B1 | 3/2003 | Bryant et al. | | 6,661,288 B2 | 12/2003 | Morgan et al. |
| 6,536,028 B1 | 3/2003 | Katsioulas et al. | | 6,661,410 B2 | 12/2003 | Casebolt et al. |
| 6,539,534 B1 | 3/2003 | Bennett | | 6,661,724 B1 | 12/2003 | Snyder et al. |
| 6,542,025 B1 | 4/2003 | Kutz et al. | | 6,664,978 B1 | 12/2003 | Kekic et al. |
| 6,542,844 B1 | 4/2003 | Hanna | | 6,664,991 B1 | 12/2003 | Chew et al. |
| 6,542,845 B1 | 4/2003 | Grucci et al. | | 6,667,642 B1 | 12/2003 | Moyal |
| 6,552,933 B2 | 4/2003 | Roohparvar | | 6,667,740 B2 | 12/2003 | Ely et al. |
| 6,553,057 B1 | 4/2003 | Sha et al. | | 6,670,852 B1 | 12/2003 | Hauck |
| 6,554,469 B1 | 4/2003 | Thomson et al. | | 6,671,869 B2 | 12/2003 | Davidson et al. |
| 6,557,164 B1 | 4/2003 | Faustini | | 3,378,877 A1 | 1/2004 | Perry et al. |
| 6,559,685 B2 | 5/2003 | Green | | 6,673,308 B2 | 1/2004 | Hino et al. |
| 6,560,306 B1 | 5/2003 | Duffy et al. | | 6,677,814 B2 | 1/2004 | Low et al. |
| 6,560,699 B1 | 5/2003 | Konkle | | 6,677,932 B1 | 1/2004 | Westerman |

| | | |
|---|---|---|
| 6,678,645 B1 | 1/2004 | Rajsuman et al. |
| 6,680,632 B1 | 1/2004 | Meyers et al. |
| 6,680,731 B2 | 1/2004 | Gerpheide et al. |
| 6,681,280 B1 | 1/2004 | Miyake et al. |
| 6,681,359 B1 | 1/2004 | Au et al. |
| 6,683,462 B2 | 1/2004 | Shimizu |
| 6,683,930 B1 | 1/2004 | Dalmia |
| 6,686,787 B2 | 2/2004 | Ling |
| 6,686,860 B2 | 2/2004 | Gulati et al. |
| 6,690,224 B1 | 2/2004 | Moore |
| 6,691,193 B1 | 2/2004 | Wang et al. |
| 6,691,301 B2 | 2/2004 | Bowen |
| 6,697,754 B1 | 2/2004 | Alexander |
| 6,701,340 B1 | 3/2004 | Gorecki |
| 6,701,487 B1 | 3/2004 | Ogami et al. |
| 6,701,508 B1 | 3/2004 | Bartz et al. |
| 6,704,381 B1 | 3/2004 | Moyal et al. |
| 6,704,879 B1 | 3/2004 | Parrish |
| 6,704,889 B2 | 3/2004 | Veenstra et al. |
| 6,704,893 B1 | 3/2004 | Bauwens et al. |
| 6,705,511 B1 | 3/2004 | Dames et al. |
| 6,711,226 B1 | 3/2004 | Williams et al. |
| 6,711,731 B2 | 3/2004 | Weiss |
| 6,713,897 B2 | 3/2004 | Caldwell |
| 6,714,066 B1 | 3/2004 | Gorecki et al. |
| 6,714,817 B2 | 3/2004 | Daynes et al. |
| 6,715,132 B1 | 3/2004 | Bartz et al. |
| 6,717,474 B2 | 4/2004 | Chen et al. |
| 6,718,294 B1 | 4/2004 | Bortfeld |
| 6,718,520 B1 | 4/2004 | Merryman et al. |
| 6,718,533 B1 | 4/2004 | Schneider et al. |
| 6,724,220 B1 * | 4/2004 | Snyder et al. .................. 326/39 |
| 6,728,900 B1 | 4/2004 | Meli |
| 6,728,902 B2 | 4/2004 | Kaiser et al. |
| 6,730,863 B1 | 5/2004 | Gerpheide et al. |
| 6,731,552 B2 | 5/2004 | Perner |
| 6,732,068 B2 | 5/2004 | Sample et al. |
| 6,732,347 B1 | 5/2004 | Camilleri et al. |
| 6,738,858 B1 | 5/2004 | Fernald et al. |
| 6,744,323 B1 | 6/2004 | Moyal et al. |
| 6,745,369 B1 | 6/2004 | May et al. |
| 6,748,569 B1 | 6/2004 | Brooke et al. |
| 6,750,852 B2 | 6/2004 | Gillespie et al. |
| 6,750,889 B1 | 6/2004 | Livingston |
| 6,754,101 B2 | 6/2004 | Terzioglu et al. |
| 6,754,723 B2 | 6/2004 | Kato |
| 6,754,765 B1 | 6/2004 | Chang et al. |
| 6,754,849 B2 | 6/2004 | Tamura |
| 6,757,882 B2 | 6/2004 | Chen et al. |
| 6,765,407 B1 | 7/2004 | Snyder |
| 6,768,337 B2 | 7/2004 | Kohno et al. |
| 6,768,352 B1 | 7/2004 | Maher et al. |
| 6,769,622 B1 | 8/2004 | Tournemille et al. |
| 6,771,552 B2 | 8/2004 | Fujisawa |
| 6,774,644 B2 | 8/2004 | Eberlein |
| 6,781,456 B2 | 8/2004 | Pradhan |
| 6,782,068 B1 | 8/2004 | Wilson et al. |
| 6,784,821 B1 | 8/2004 | Lee |
| 6,785,881 B1 | 8/2004 | Bartz et al. |
| 6,788,116 B1 | 9/2004 | Cook et al. |
| 6,788,221 B1 | 9/2004 | Ely et al. |
| 6,788,521 B2 | 9/2004 | Nishi |
| 6,791,377 B2 | 9/2004 | Ilchmann et al. |
| 6,792,584 B1 | 9/2004 | Eneboe et al. |
| 6,798,218 B2 | 9/2004 | Kasperkovitz |
| 6,798,299 B1 | 9/2004 | Mar et al. |
| 6,799,198 B1 | 9/2004 | Huboi et al. |
| 6,806,771 B1 | 10/2004 | Hildebrant et al. |
| 6,806,782 B2 | 10/2004 | Motoyoshi et al. |
| 6,809,275 B1 | 10/2004 | Cheng et al. |
| 6,809,566 B1 | 10/2004 | Xin-LeBlanc |
| 6,810,442 B1 | 10/2004 | Lin et al. |
| 6,815,979 B2 | 11/2004 | Ooshita |
| 6,816,544 B1 | 11/2004 | Bailey et al. |
| 6,817,005 B2 | 11/2004 | Mason et al. |
| 6,819,142 B2 | 11/2004 | Viehmann et al. |
| 6,823,282 B1 | 11/2004 | Snyder |
| 6,823,497 B2 | 11/2004 | Schubert et al. |
| 6,825,689 B1 | 11/2004 | Snyder |
| 6,825,869 B2 | 11/2004 | Bang |
| 6,828,824 B2 | 12/2004 | Betz et al. |
| 6,829,727 B1 | 12/2004 | Pawloski |
| 6,834,384 B2 | 12/2004 | Fiorella, II et al. |
| 6,836,169 B2 | 12/2004 | Richmond et al. |
| 6,839,774 B1 | 1/2005 | Ahn et al. |
| 6,842,710 B1 | 1/2005 | Gehring et al. |
| 6,847,203 B1 | 1/2005 | Conti et al. |
| 6,850,117 B2 | 2/2005 | Weber et al. |
| 6,850,554 B1 | 2/2005 | Sha |
| 6,853,598 B2 | 2/2005 | Chevallier |
| 6,854,067 B1 | 2/2005 | Kutz et al. |
| 6,856,433 B2 | 2/2005 | Hatano et al. |
| 6,859,884 B1 | 2/2005 | Sullam |
| 6,862,240 B2 | 3/2005 | Burgan |
| 6,864,710 B1 | 3/2005 | Lacey et al. |
| 6,865,429 B1 | 3/2005 | Schneider et al. |
| 6,865,504 B2 | 3/2005 | Larson et al. |
| 6,868,500 B1 | 3/2005 | Kutz et al. |
| 6,871,253 B2 | 3/2005 | Greeff et al. |
| 6,871,331 B1 | 3/2005 | Bloom et al. |
| 6,873,203 B1 | 3/2005 | Latham, II et al. |
| 6,873,210 B2 | 3/2005 | Mulder et al. |
| 6,876,941 B2 | 4/2005 | Nightingale |
| 6,880,086 B2 | 4/2005 | Kidder et al. |
| 6,888,453 B2 | 5/2005 | Lutz et al. |
| 6,888,538 B2 | 5/2005 | Ely et al. |
| 6,892,310 B1 | 5/2005 | Kutz et al. |
| 6,892,322 B1 | 5/2005 | Snyder |
| 6,893,724 B2 | 5/2005 | Lin et al. |
| 6,894,928 B2 | 5/2005 | Owen |
| 6,897,390 B2 | 5/2005 | Caldwell et al. |
| 6,898,703 B1 | 5/2005 | Ogami et al. |
| 6,900,663 B1 | 5/2005 | Roper et al. |
| 6,901,014 B2 | 5/2005 | Son et al. |
| 6,901,563 B1 | 5/2005 | Ogami et al. |
| 6,903,402 B2 | 6/2005 | Miyazawa |
| 6,903,613 B1 | 6/2005 | Mitchell et al. |
| 6,904,570 B2 | 6/2005 | Foote et al. |
| 6,910,126 B1 | 6/2005 | Mar et al. |
| 6,911,857 B1 | 6/2005 | Stiff |
| 6,917,661 B1 | 7/2005 | Scott et al. |
| 6,922,821 B1 | 7/2005 | Nemecek |
| 6,924,668 B2 | 8/2005 | Muller et al. |
| 6,934,674 B1 | 8/2005 | Douezy et al. |
| 6,937,075 B2 | 8/2005 | Lim et al. |
| 6,940,356 B2 | 9/2005 | McDonald, II et al. |
| 6,941,336 B1 | 9/2005 | Mar |
| 6,941,538 B2 | 9/2005 | Hwang et al. |
| 6,944,018 B2 | 9/2005 | Caldwell |
| 6,949,811 B2 | 9/2005 | Miyazawa |
| 6,949,984 B2 | 9/2005 | Siniscalchi |
| 6,950,954 B1 | 9/2005 | Sullam et al. |
| 6,950,990 B2 | 9/2005 | Rajarajan et al. |
| 6,952,778 B1 | 10/2005 | Snyder |
| 6,954,511 B2 | 10/2005 | Tachimori |
| 6,954,904 B2 | 10/2005 | White |
| 6,956,419 B1 | 10/2005 | Mann et al. |
| 6,957,180 B1 | 10/2005 | Nemecek |
| 6,957,242 B1 | 10/2005 | Snyder |
| 6,963,233 B2 | 11/2005 | Puccio et al. |
| 6,963,908 B1 | 11/2005 | Lynch et al. |
| 6,966,039 B1 | 11/2005 | Bartz et al. |
| 6,967,511 B1 | 11/2005 | Sullam |
| 6,967,960 B1 | 11/2005 | Bross et al. |
| 6,968,346 B2 | 11/2005 | Hekmatpour |
| 6,969,978 B1 | 11/2005 | Dening |
| 6,970,844 B1 | 11/2005 | Bierenbaum |
| 6,971,004 B1 | 11/2005 | Pleis et al. |
| 1,132,244 A1 | 12/2005 | Stiff |
| 6,973,400 B2 | 12/2005 | Cahill-O'Brien et al. |
| 6,975,123 B1 | 12/2005 | Malang et al. |
| 6,980,060 B2 | 12/2005 | Boerstler et al. |
| 6,981,090 B1 | 12/2005 | Kutz et al. |
| 6,988,192 B2 | 1/2006 | Snider |
| 6,996,799 B1 | 2/2006 | Cismas et al. |
| 7,005,933 B1 | 2/2006 | Shutt |
| 7,009,444 B1 | 3/2006 | Scott |
| 7,010,773 B1 | 3/2006 | Bartz et al. |

| Patent | Kind | Date | Inventor |
|---|---|---|---|
| 7,015,735 | B2 | 3/2006 | Kimura et al. |
| 7,017,145 | B2 | 3/2006 | Taylor |
| 7,017,409 | B2 | 3/2006 | Zielinski et al. |
| 7,020,854 | B2 | 3/2006 | Killian et al. |
| 7,023,215 | B2 | 4/2006 | Steenwyk |
| 7,023,257 | B1 | 4/2006 | Sullam |
| 7,024,636 | B2 | 4/2006 | Weed |
| 7,024,654 | B2 | 4/2006 | Bersch et al. |
| 7,026,861 | B2 | 4/2006 | Steenwyk |
| 7,030,513 | B2 | 4/2006 | Caldwell |
| 7,030,656 | B2 | 4/2006 | Lo et al. |
| 7,030,688 | B2 | 4/2006 | Dosho et al. |
| 7,030,782 | B2 | 4/2006 | Ely et al. |
| 7,034,603 | B2 | 4/2006 | Brady et al. |
| 7,042,301 | B2 | 5/2006 | Sutardja |
| 7,047,166 | B2 | 5/2006 | Dancea |
| 7,055,035 | B2 | 5/2006 | Allison et al. |
| 7,058,921 | B1 | 6/2006 | Hwang et al. |
| 7,073,158 | B2 | 7/2006 | McCubbrey |
| 7,076,420 | B1 | 7/2006 | Snyder et al. |
| 7,079,166 | B1 | 7/2006 | Hong |
| 7,086,014 | B1 | 8/2006 | Bartz et al. |
| 7,088,166 | B1 | 8/2006 | Reinschmidt et al. |
| 7,089,175 | B1 | 8/2006 | Nemecek et al. |
| 7,091,713 | B2 | 8/2006 | Erdelyi et al. |
| 7,092,980 | B1 | 8/2006 | Mar et al. |
| 7,098,414 | B2 | 8/2006 | Caldwell |
| 7,099,818 | B1 | 8/2006 | Nemecek et al. |
| 7,100,133 | B1 | 8/2006 | Melyappan et al. |
| 7,103,108 | B1 | 9/2006 | Beard |
| 7,109,978 | B2 | 9/2006 | Gillespie et al. |
| 7,117,485 | B2 | 10/2006 | Wilkinson et al. |
| 7,119,550 | B2 | 10/2006 | Kitano et al. |
| 7,119,602 | B2 | 10/2006 | Davis |
| 7,124,376 | B2 | 10/2006 | Zaidi et al. |
| 7,127,630 | B1 | 10/2006 | Snyder |
| 7,129,793 | B2 | 10/2006 | Gramegna |
| 7,129,873 | B2 | 10/2006 | Kawamura |
| 7,132,835 | B1 | 11/2006 | Arcus |
| 7,133,140 | B2 | 11/2006 | Lukacs et al. |
| 7,133,793 | B2 | 11/2006 | Ely et al. |
| 7,138,841 | B1 | 11/2006 | Li |
| 7,138,868 | B2 | 11/2006 | Sanchez et al. |
| 7,139,530 | B2 | 11/2006 | Kusbel |
| 7,141,968 | B2 | 11/2006 | Hibbs et al. |
| 7,141,987 | B2 | 11/2006 | Hibbs et al. |
| 7,149,316 | B1 | 12/2006 | Kutz et al. |
| 7,150,002 | B1 | 12/2006 | Anderson et al. |
| 7,151,528 | B2 | 12/2006 | Taylor et al. |
| 7,152,027 | B2 | 12/2006 | Andrade et al. |
| 7,154,294 | B2 | 12/2006 | Liu et al. |
| 7,161,936 | B1 | 1/2007 | Barrass et al. |
| 7,162,410 | B1 | 1/2007 | Nemecek et al. |
| 7,171,455 | B1 | 1/2007 | Gupta et al. |
| 7,176,701 | B2 | 2/2007 | Wachi et al. |
| 7,178,096 | B2 | 2/2007 | Rangan et al. |
| 7,180,342 | B1 | 2/2007 | Shutt et al. |
| 7,185,162 | B1 | 2/2007 | Snyder |
| 7,185,321 | B1 | 2/2007 | Roe et al. |
| 7,188,063 | B1 | 3/2007 | Snyder |
| 7,193,901 | B2 | 3/2007 | Ruby et al. |
| 7,199,783 | B2 | 4/2007 | Wenstrand et al. |
| 7,200,507 | B2 | 4/2007 | Chen et al. |
| 7,206,733 | B1 | 4/2007 | Nemecek |
| 7,212,189 | B2 | 5/2007 | Shaw et al |
| 7,221,187 | B1 | 5/2007 | Snyder et al. |
| 7,227,389 | B2 | 6/2007 | Gong et al. |
| 7,236,921 | B1 | 6/2007 | Nemecek et al. |
| 7,250,825 | B2 | 7/2007 | Wilson et al. |
| 7,256,588 | B2 | 8/2007 | Howard et al. |
| 7,265,633 | B1 | 9/2007 | Stiff |
| 7,266,768 | B2 | 9/2007 | Ferlitsch et al. |
| 7,281,846 | B2 | 10/2007 | McLeod |
| 7,282,905 | B2 | 10/2007 | Chen et al. |
| 7,283,151 | B2 | 10/2007 | Nihei et al. |
| 7,283,410 | B2 | 10/2007 | Hsu et al. |
| 7,287,112 | B1 | 10/2007 | Pleis et al. |
| 7,288,977 | B2 | 10/2007 | Stanley |
| 7,290,244 | B2 | 10/2007 | Peck et al. |
| 7,295,049 | B1 | 11/2007 | Moyal et al. |
| 7,298,124 | B2 | 11/2007 | Kan et al. |
| 7,301,835 | B2 | 11/2007 | Joshi et al. |
| 7,305,510 | B2 | 12/2007 | Miller |
| 7,307,485 | B1 | 12/2007 | Snyder et al. |
| 7,308,608 | B1 | 12/2007 | Pleis et al. |
| 7,312,616 | B2 | 12/2007 | Snyder |
| 7,323,879 | B2 | 1/2008 | Kuo et al. |
| 7,324,380 | B2 | 1/2008 | Negut et al. |
| 7,332,976 | B1 | 2/2008 | Brennan |
| 7,342,405 | B2 | 3/2008 | Eldridge et al. |
| 7,358,714 | B2 | 4/2008 | Watanabe et al. |
| 7,367,017 | B2 | 4/2008 | Maddocks et al. |
| 7,373,437 | B2 | 5/2008 | Seigneret et al. |
| 7,376,001 | B2 | 5/2008 | Joshi et al. |
| 7,376,904 | B2 | 5/2008 | Cifra et al. |
| 7,386,740 | B2 | 6/2008 | Kutz et al. |
| 7,392,011 | B1 | 6/2008 | Jacomb-Hood |
| 7,400,183 | B1 | 7/2008 | Sivadasan et al. |
| 7,406,674 | B1 | 7/2008 | Ogami et al. |
| 7,421,251 | B2 | 9/2008 | Westwick et al. |
| 7,461,274 | B2 | 12/2008 | Merkin |
| 7,466,307 | B2 | 12/2008 | Trent, Jr. et al. |
| 7,542,533 | B2 | 6/2009 | Jasa et al. |
| 7,554,847 | B2 | 6/2009 | Lee |
| 7,616,509 | B2 | 11/2009 | Qureshi et al. |
| 2001/0002129 | A1 | 5/2001 | Zimmerman et al. |
| 2001/0010083 | A1 | 7/2001 | Satoh |
| 2001/0038392 | A1 | 11/2001 | Humpleman et al. |
| 2001/0043081 | A1 | 11/2001 | Rees |
| 2001/0044927 | A1 | 11/2001 | Karniewicz |
| 2001/0045861 | A1 | 11/2001 | Bloodworth et al. |
| 2001/0047509 | A1 | 11/2001 | Mason et al. |
| 2002/0010716 | A1 | 1/2002 | McCartney et al. |
| 2002/0016706 | A1 | 2/2002 | Cooke et al. |
| 2002/0023110 | A1 | 2/2002 | Fortin et al. |
| 2002/0042696 | A1 | 4/2002 | Garcia et al. |
| 2002/0052729 | A1 | 5/2002 | Kyung et al. |
| 2002/0059543 | A1 | 5/2002 | Cheng et al. |
| 2002/0063688 | A1 | 5/2002 | Shaw et al. |
| 2002/0065646 | A1 | 5/2002 | Waldie et al. |
| 2002/0068989 | A1 | 6/2002 | Ebisawa et al. |
| 2002/0073119 | A1 | 6/2002 | Richard |
| 2002/0073380 | A1 | 6/2002 | Cooke |
| 2002/0080186 | A1 | 6/2002 | Frederiksen |
| 2002/0085020 | A1 | 7/2002 | Carroll, Jr. |
| 2002/0099863 | A1 | 7/2002 | Comeau et al. |
| 2002/0109722 | A1 | 8/2002 | Rogers et al. |
| 2002/0116168 | A1 | 8/2002 | Kim |
| 2002/0121679 | A1 | 9/2002 | Bazarjani et al. |
| 2002/0122060 | A1 | 9/2002 | Markel |
| 2002/0129334 | A1 | 9/2002 | Dane et al. |
| 2002/0133771 | A1 | 9/2002 | Barnett |
| 2002/0133794 | A1 | 9/2002 | Kanapathippillai et al. |
| 2002/0138516 | A1 | 9/2002 | Igra |
| 2002/0144099 | A1 | 10/2002 | Muro, Jr. et al. |
| 2002/0145433 | A1 | 10/2002 | Morrise et al. |
| 2002/0152234 | A1 | 10/2002 | Estrada et al. |
| 2002/0152449 | A1 | 10/2002 | Lin |
| 2002/0156885 | A1 | 10/2002 | Thakkar |
| 2002/0156998 | A1 | 10/2002 | Casselman |
| 2002/0161802 | A1 | 10/2002 | Gabrick et al. |
| 2002/0166100 | A1 | 11/2002 | Meding |
| 2002/0174134 | A1 | 11/2002 | Goykhman |
| 2002/0174411 | A1 | 11/2002 | Feng et al. |
| 2002/0191029 | A1 | 12/2002 | Gillespie et al. |
| 2003/0011639 | A1 | 1/2003 | Webb |
| 2003/0014447 | A1 | 1/2003 | White |
| 2003/0025734 | A1 | 2/2003 | Boose et al. |
| 2003/0033588 | A1 | 2/2003 | Alexander |
| 2003/0041235 | A1 | 2/2003 | Meyer |
| 2003/0056071 | A1 | 3/2003 | Triece et al. |
| 2003/0058469 | A1 | 3/2003 | Buis et al. |
| 2003/0061572 | A1 | 3/2003 | McClannahan et al. |
| 2003/0062889 | A1 | 4/2003 | Ely et al. |
| 2003/0066057 | A1 | 4/2003 | RuDusky |
| 2003/0080755 | A1 | 5/2003 | Kobayashi |
| 2003/0097640 | A1 | 5/2003 | Abrams et al. |
| 2003/0105620 | A1 | 6/2003 | Bowen |

| | | | |
|---|---|---|---|
| 2003/0126947 | A1 | 7/2003 | Moore et al. |
| 2003/0135842 | A1 | 7/2003 | Frey et al. |
| 2003/0149961 | A1 | 8/2003 | Kawai et al. |
| 2003/0229482 | A1 | 12/2003 | Cook et al. |
| 2004/0018711 | A1 | 1/2004 | Madurawe |
| 2004/0054821 | A1 | 3/2004 | Warren et al. |
| 2004/0153802 | A1 | 8/2004 | Kudo et al. |
| 2004/0205553 | A1 | 10/2004 | Hall et al. |
| 2004/0205617 | A1 | 10/2004 | Light |
| 2005/0024341 | A1 | 2/2005 | Gillespie et al. |
| 2005/0066152 | A1 | 3/2005 | Garey |
| 2005/0143968 | A9 | 6/2005 | Odom et al. |
| 2005/0240917 | A1 | 10/2005 | Wu |
| 2005/0248534 | A1 | 11/2005 | Kehlstadt |
| 2005/0280453 | A1 | 12/2005 | Hsieh |
| 2006/0015862 | A1 | 1/2006 | Odom et al. |
| 2006/0031768 | A1 | 2/2006 | Shah et al. |
| 2006/0032680 | A1 | 2/2006 | Elias et al. |
| 2006/0097991 | A1 | 5/2006 | Hotelling et al. |
| 2006/0273804 | A1 | 12/2006 | Delorme et al. |
| 2007/0139074 | A1 | 6/2007 | Reblewski |
| 2007/0258458 | A1 | 11/2007 | Kapoor |
| 2008/0095213 | A1 | 4/2008 | Lin et al. |
| 2008/0186052 | A1 | 8/2008 | Needham et al. |
| 2008/0259998 | A1 | 10/2008 | Venkataraman et al. |
| 2008/0294806 | A1 | 11/2008 | Swindle et al. |
| 2009/0066427 | A1 | 3/2009 | Brennan |
| 2009/0322305 | A1 | 12/2009 | De Cremoux |

FOREIGN PATENT DOCUMENTS

| | | |
|---|---|---|
| EP | 0 308 583 A2 | 3/1989 |
| EP | 0308583 A2 | 3/1989 |
| EP | 368398 A1 | 5/1990 |
| EP | 0 450 863 A2 | 10/1991 |
| EP | 0450863 A2 | 10/1991 |
| EP | 0 499 383 A2 | 8/1992 |
| EP | 0499383 A2 | 8/1992 |
| EP | 0 639 816 A2 | 2/1995 |
| EP | 069816 A2 | 2/1995 |
| EP | 1 170 671 A1 | 1/2002 |
| EP | 1170671 A1 | 1/2002 |
| EP | 1205848 A1 | 5/2002 |
| EP | 1191423A2 A1 | 2/2003 |
| JP | 404083405 A1 | 3/1992 |
| JP | 405055842 A1 | 3/1993 |
| JP | 06021732 A1 | 1/1994 |
| JP | 404095408 A1 | 3/2002 |
| WO | 95/32478 | 11/1995 |
| WO | 9532478 A1 | 11/1995 |
| WO | 9532481 A1 | 11/1995 |
| WO | WO 95/32478 | 11/1995 |
| WO | PCT/US96/17305 A1 | 6/1996 |
| WO | PCT/US98/34376 A1 | 8/1998 |
| WO | PCT/US99/09712 A1 | 2/1999 |

OTHER PUBLICATIONS

"Programmable Microcontroller Architecture (MixedAnalog/Digital)"; Aug. 7, 2001; U.S. Appl. No. 09/924,734; Snyder et al.

"Digital Configurable Macro Architecture"; Jul. 18, 2001; U.S. Appl. No. 09/909,045; W. Snyder.

"Configuring Digital Functions in a Digital Configurable Macro Architecture"; Jul. 18, 2001, U.S. Appl. No. 09/909,109; W. Snyder.

"A Programmable Analog System Architecture (as Amended)"; Jul. 18, 2001; U.S. Appl. No. 09/909,047; M. Mar.

"Programming Methodology and Architecture for a Programmable Analog System (as Amended)"; Aug. 14, 2001; U.S. Appl. No. 09/930,021; Mar et al.

"Method for Synchronizing and Resetting Clock Signals Supplied to Multiple Programmable Analog Blocks (as Amended)"; Oct. 1, 2001; U.S. Appl. No. 09/969,311; B. Sullam.

"Method and Apparatus for Programming a Flash Memory"; Jun. 5, 2001; U.S. Appl. No. 09/875,599; W. Snyder.

"In-System Chip Emulator Architecture"; Oct. 10, 2001; U.S. Appl. No. 09/975,115; Snyder et al.

"A Configurable Input/Output Interface for a Microcontroller"; Sep. 14, 2001; U.S. Appl. No. 09/953,423; Kutz et al.

"Multiple Use of Microcontroller Pad"; Jun. 26, 2001; U.S. Appl. No. 09/893,050; Kutz et al.

"Programming Architecture for a Programmable Analog System"; Aug. 14, 2001; U.S. Appl. No. 09/929,891; Mar et al.

"Architecture for Synchronizing and Resetting Clock Signals Supplied to Multiple Analog Programmable Analog Blocks"; Oct. 1, 2001; U.S. Appl. No. 09/969,313; B. Sullam.

Harbaum T. El. Al: "Design of a Flexible Coprocessor Unit" Proceedings of the Euromicro Conference, XX XX, Sep. 1999, pp. 335-342, XP000879556, p. 337, right-hand column, line 13-p. 338, left hand column, line 4; figure 1.

USPTO Notice of Allowance for U.S. Appl. No. 10/238,966 dated Jan. 27, 2009; 4 pages.

USPTO Non-Final Rejection for U.S. Appl. No. 10/238,966 dated Jun. 30, 2008; 12 pages.

USPTO Non-Final Rejection for 10/238,966 dated Dec. 26, 2007; 12 pages.

USPTO Final Rejection for U.S. Appl. No. 10/238,966 dated Sep. 27, 2007; 9 pages.

USPTO Non-Final Rejection for U.S. Appl. No. 10/238,966 dated Apr. 19, 2007; 7 pages.

USPTO Non-Final Rejection for U.S. Appl. No. 10/238,966 dated Oct. 20, 2006; 8 pages.

USPTO Non-Final Rejection for U.S. Appl. No. 10/238,966 dated Apr. 6, 2008; 8 pages.

U.S. Appl. No. 09/964,991: "A Novel Band-Gap Circuit for Providing an Accurate Reference Voltage Compensated for Process State, Process Variations and Temperature," Kutz et al.; 25 pages.

U.S. Appl. No. 09/842,966: "Precision Crystal Oscillator Circuit Used in Microcontroller," Mar; 28 pages.

"An Analog PPL-Based Clock and Data Recovery Circuit with High Input Jitter Tolerance;" Sun, Reprinted from IEEE Journal of Solid-State Circuits, 1989; 4 pages.

"WP 3.5: An Integrated Time Reference;" Blauschild, Digest of Technical Papers, 1994; 4 pages.

"Micropower CMOS Temperature Sensor with Digital Output;" Bakker et at., IEEE Journal of Solid-State Circuits, 1996; 3 pages.

USPTO Non-Final Rejection for U.S. Appl. No. 10/001,477 dated May 11, 2005; 10 pages.

USPTO Final Rejection for U.S. Appl. No. 10/001,477 dated Oct. 11, 2005; 13 pages.

USPTO Non-Final Rejection for U.S. Appl. No. 10/001,477 dated Mar. 2, 2006; 14 pages.

USPTO Final Rejection for U.S. Appl. No. 10/001,477 dated Aug. 24, 2006; 13 pages.

USPTO Non-Final Rejection for U.S. Appl. No. 10/001,478 dated Oct. 20, 2008; 18 pages.

USPTO Final Rejection for U.S. Appl. No. 10/001,478 dated Jun. 4, 2008; 18 pages.

USPTO Non-Final Rejection for U.S. Appl. No. 10/001,478 dated Jan. 30, 2008; 19 pages.

USPTO Final Rejection for U.S. Appl. No. 10/001,478 dated Sep. 17, 2007; 15 pages.

USPTO Non-Final Rejection for U.S. Appl. No. 10/001,478 dated Apr. 2, 2007; 17 pages.

USPTO Final Rejection for 10/001,478 dated Sep. 5, 2006; 19 pages.

USPTO Non-Final Rejection for U.S. Appl. No. 10/001,478 dated Mar. 15, 2006; 19 pages.

USPTO Final Rejection for U.S. Appl. No. 10/001,478 dated Oct. 24, 2005; 15 pages.

USPTO Non-Final Rejection for U.S. Appl. No. 10/001,478 dated May 16, 2005; 13 pages.

USPTO Notice of Allowance for U.S. Appl. No. 10/002,217 dated Jan. 28, 2009; 4 pages.

USPTO Notice of Allowance for U.S. Appl. No. 10/002,217 dated Oct. 14, 2008; 6 pages.

USPTO Notice of Allowance for U.S. Appl. No. 10/002,217 dated Jun. 6, 2008; 7 pages.

USPTO Final Rejection for U.S. Appl. No. 10/002,217 dated Feb. 6, 2008; 10 pages.

USPTO Non-Final Rejection for U.S. Appl. No. 10/002,217 dated Aug. 3, 2007; 10 pages USPTO Final Rejection for U.S. Appl. No. 10/002,217 dated Mar. 7, 2007; 12 pages.
USPTO Non-Final Rejection for U.S. Appl. No. 10/002,217 dated Oct. 2, 2006; 21 pages.
USPTO Non-Final Rejection for U.S. Appl. No. 10/002,217 dated Apr. 3, 2006; 12 pages.
USPTO Final Rejection for U.S. Appl. No. 10/002,217 dated Nov. 17, 2005; 17 pages.
USPTO Non-Final Rejection for U.S. Appl. No. 10/002,217 dated May 19, 2005; 15 pages.
USPTO Notice of Allowance for U.S. Appl. No. 10/001,477 dated Nov. 10, 2008; 7 pages.
USPTO Advisory Action for U.S. Appl. No. 10/001,477 dated Oct. 10, 2008; 3 pages.
USPTO Final Rejection for U.S. Appl. No. 10/001,477 dated Jun. 30, 2008; 15 pages.
USPTO Non-Final Rejection for U.S. Appl. No. 10/001,477 dated Dec. 6, 2007; 13 pages.
USPTO Final Rejection for U.S. Appl. No. 10/001,477 dated Jul. 23, 2007; 16 pages.
USPTO Non-Final Rejection for U.S. Appl. No. 10/001,477 dated Jan. 22, 2007; 15 pages.
USPTO Non-Final Rejection for U.S. Appl. No. 09/975,115 dated Oct. 9, 2008; 34 pages.
USPTO Final Rejection for U.S. Appl. No. 09/975,115 dated May 12, 2008; 33 pages.
USPTO Non-Final Rejection for U.S. Appl. No. 09/975,115 dated Jan. 7, 2008; 30 pages.
USPTO Non-Final Rejection for U.S. Appl. No. 09/975,115 dated Jul. 31, 2007; 28 pages.
USPTO Final Rejection for U.S. Appl. No. 09/975,115 dated Feb. 21, 2007; 25 pages
USPTO Non-Final Rejection for U.S. Appl. No. 09/975,115 dated Oct. 31, 2006; 19 pages
USPTO Final Rejection for U.S. Appl. No. 09/975,115 dated Jun. 23, 2006; 20 pages.
USPTO Non-Final Rejection for U.S. Appl. No. 09/975,115 dated Jan. 11, 2006; 15 pages.
USPTO Non-Final Rejection for U.S. Appl. No. 09/975,115 dated Jul. 27, 2005; 11 pages.
USPTO Non-Final Rejection for U.S. Appl. No. 09/975,115 dated Feb. 11, 2005; 86 pages.
USPTO Final Rejection for U.S. Appl. No. 09/975,338 dated Jan. 31, 2008; 21 pages.
USPTO Non-Final Rejection for U.S. Appl. No. 09/975,338 dated Aug. 14, 2007; 19 pages.
USPTO Final Rejection for U.S. Appl. No. 09/975,338 dated Feb. 27, 2007; 23 pages.
USPTO Non-Final Rejection for U.S. Appl. No. 09/975,338 dated Sep. 6, 2006; 11 pages.
USPTO Advisory Action for U.S. Appl. No. 09/975,338 dated May 15, 2006; 4 pages.
USPTO Final Rejection for U.S. Appl. No. 09/975,338 dated Jan. 18, 2006; 12 pages.
USPTO Non-Final Rejection for U.S. Appl. No. 09/975,338 dated Apr. 5, 2005; 13 pages.
USPTO Final Rejection for U.S. Appl. No. 10/008,096 dated Feb. 10, 2005; 15 pages.
USPTO Final Rejection for U.S. Appl. No. 10/008,096 dated Jun. 16, 2008; 23 pages.
USPTO Final Rejection for U.S. Appl. No. 10/008,096 dated Sep. 4, 2007; 19 pages.
USPTO Final Rejection for U.S. Appl. No. 10/008,096 dated Oct. 13, 2006; 17 pages.
USPTO Final Rejection for U.S. Appl. No. 10/008,096 dated Nov. 25, 2005; 17 pages.
USPTO Non-Final Rejection for U.S. Appl. No. 10/008,096 dated Mar. 7, 2007; 19 pages.
USPTO Non-Final Rejection for U.S. Appl. No. 10/008,096 dated Apr. 17, 2006; 18 pages.
USPTO Non-Final Rejection for U.S. Appl. No. 10/008,096 dated Jun. 14, 2004; 24 pages.
USPTO Non-Final Rejection for U.S. Appl. No. 10/008,096 dated Jun. 24, 2005; 15 pages.
USPTO Non-Final Rejection for U.S. Appl. No. 10/008,096 dated Dec. 12, 2007; 14 pages.
USPTO Notice of Allowance for U.S. Appl. No. 10/008,096 dated Dec. 22, 2008; 24 pages.
USPTO Notice of Allowance for U.S. Appl. No. 09/975,105 dated Dec. 4, 2006; 4 pages.
USPTO Final Rejection for U.S. Appl. No. 09/975,105 dated Jul. 13, 2006; 7 pages.
USPTO Non-Final Rejection for U.S. Appl. No. 09/975,105 dated Jan. 19, 2006; 5 pages.
USPTO Non-Final Rejection for U.S. Appl. No. 09/975,105 dated Apr. 19, 2005; 9 pages.
U.S. Appl. No. 09/943,062: "Apparatus and Method for Programmable Power Management in a Programmable Analog Circuit Block;" Mar.; 46 pages.
U.S. Appl. No. 10/238,966: "Method for Parameterizing a User Module;" Perrin; 41 pages.
USPTO Notice of Allowance for U.S. Appl. No. 10/324,455 dated Feb. 12, 2004; 4 pages.
USPTO Non-Final Rejection for U.S. Appl. No. 10/324,455 dated Nov. 6, 2003; 4 pages.
USPTO Non-Final Rejection for U.S. Appl. No. 10/324,455 dated Aug. 21, 2003; 4 pages.
USPTO Notice of Allowance for U.S. Appl. No. 09/998,859 dated Mar. 14, 2005; 6 pages.
USPTO Non-Final Rejection for U.S. Appl. No. 09/998,859 dated Nov. 4, 2004; 6 pages.
USPTO Final Rejection for U.S. Appl. No. 09/998,859 dated Nov. 19, 2003; 5 pages.
USPTO Non-Final Rejection for U.S. Appl. No. 09/998,859 dated May 28, 2003; 6 pages.
USPTO Non-Final Rejection for U.S. Appl. No. 09/998,859 dated May 15, 2003; 6 pages.
USPTO Notice of Allowance for U.S. Appl. No. 09/998,834 dated May 19, 2005; 7 pages.
USPTO Non-Final Rejection for U.S. Appl. No. 09/998,834 dated Sep. 20, 2004; 11 pages.
USPTO Notice of Allowance for U.S. Appl. No. 10/113,065 dated Apr. 6, 2006; 8 pages.
USPTO Final Rejection for U.S. Appl. No. 10/113,065 dated Oct. 26, 2005; 17 pages.
USPTO Non-Final Rejection for U.S. Appl. No. 10/113,065 dated May 20, 2005; 14 pages.
U.S. Appl. No. 09/207,912: "Circuit(s), Architecture and Method(s) for Operating and/or Tuning a Ring Oscillator;" Mar.; 23 pages.
USPTO Notice of Allowance for U.S. Appl. No. 10/001,477 dated May 8, 2009; 6 pages.
Bursky, "FPGA Combines Multiple Interfaces and Logic," Electronic Design, vol. 48 No. 20, pp. 74-78 (Oct. 2, 2000); 5 pages.
Anonymous, "Warp Nine Engineering—The IEEE 1284 Experts-F/Port Product Sheet," undated web page found at http://www.fapo.com/fport.htm; 2 pages.
Anonymous, "F/Port;Fast Parallel Port for the PC" Installation Manual Release 7.1, circa 1997, available for download from http://www.fapo.com/fport.htm; 25 pages.
Nam et al.; "Fast Development of Source-Level Debugging System Using Hardware Emulation"; IEEE 2000; 4 pages.
Huang et al.; "Iceberg: An Embedded In-Cicuit Emulator Synthesizer for Microcontrollers"; ACM 1999; 6 pages.
Khan et al.; "FPGA Architectures for Asic Hardware Emulators"; IEEE 1993; 5 pages.
Oh et al.; Emulator Environment Based on an FPGA Prototyping Board; IEEE 21-23; Jun. 2000; 6 pages.
Hong et al,; "An FPGA-Based Hardware Emulator for Fast Fault Emulation"; IEEE 1997; 4 pages.
Ching et al.; "An In-Curcuit-Emulator for TMS320C25"; IEEE 1994; 6 pages.
Pasternak; "In-Circuit-Emulation in ASIC Architecture Cor Designs"; IEEE 1989; 4 pages.
Melear; "Using Background Modes for Testing, Debugging and Emulation of Microcontrollers"; IEEE 1997; 8 pages.

Walters, Stephen; "Computer-Aided Prototyping for ASIC-Based Systems", 1991, IEEE Design & Test of Computers; vol. 8, Issue 2; 8 pages.

Anonymous; "JEEN JTAG Embedded Ice Ethernet Interface"; Aug. 1999; Embedded Performance, Inc.; 3 pages.

Sedory; "A Guide to Debug"; 2004; retrieved on May 20, 2005; 7 pages.

"Microsoft Files Summary Judgement Motions"; Feb. 1999; Microsoft PressPass; retrieved on May 20, 2005 from http://www.microsoft.com/presspass/press/1999/feb99/Feb99/Calderapr.asp; 3 pages.

Xerox; "Mesa Debugger Documentation"; Apr. 1979; Xerox Systems Development Department; Version 5.0; 33 pages.

Staliman et al.; "Debugging with the GNU Source-Level Debugger"; Jan. 1994; retrieved on May 2, 2005 from http://www.cs.utah.edu; 4 pages.

Wikipedia.org; "Von Neumann architecture"; retrieved from httplien.wikipedia.org/wikiNon_Neumann_architecture on Jan. 22, 2007; 4 pages.

Stan Augarten; "The Chip Collection—Introduction—Smithsonian Institute"; "State of the Art"; "The First 256-Bit Static RAM"; retrieved on Nov. 14, 2005 from http://smithsonianchips.si.edu/augarten/p24.htm; 2 pages.

"POD—Piece of Data, Plain Old Documentation, Plain Old Dos . . ."; retrieved on Nov. 14, 2005 from http://www.auditmypc.com/acronym/POD,asp; 2 pages.

USPTO Non-Final Rejection for U.S. Appl. No. 09/989,767 dated Oct. 6, 2004; 15 pages.

USPTO Final Rejection for U.S. Appl. No. 09/989,771 dated Feb. 27, 2007; 8 pages.

USPTO Final Rejection for U.S. Appl. No. 09/989,771 dated Mar. 28, 2006; 9 pages.

USPTO Final Rejection for U.S. Appl. No. 09/989,771 dated Apr. 6, 2005; 7 pages.

USPTO Final Rejection for U.S. Appl. No. 09/989,771 dated Dec. 10, 2008; 12 pages.

USPTO Final Rejection for U.S. Appl. No. 09/989,771 dated Dec. 27, 2007; 15 pages.

USPTO Non-Final Rejection for U.S. Appl. No. 09/989,771 dated May 28, 2008; 14 pages.

USPTO Non-Final Rejection for U.S. Appl. No. 09/989,771 dated Jul. 16, 2007; 14 pages.

USPTO Non-Final Rejection for U.S. Appl. No. 09/989,771 dated Aug. 23, 2006; 7 pages.

USPTO Non-Final Rejection for U.S. Appl. No. 09/989,771 dated Sep. 12, 2005; 7 pages.

USPTO Non-Final Rejection for U.S. Appl. No. 09/989,771 dated Sep. 22, 2004; 7 pages.

USPTO Final Rejection for U.S. Appl. No. 09/989,765 dated Apr. 3, 2007; 12 pages.

USPTO Final Rejection for U.S. Appl. No. 09/989,765 dated Apr. 4, 2008; 16 pages USPTO Final Rejection for U.S. Appl. No. 09/989,765 dated Apr. 17, 2006; 12 pages.

USPTO Non-Final Rejection for U.S. Appl. No. 09/989,765 dated Sep. 19, 2007; 14 pages.

USPTO Non-Final Rejection for U.S. Appl. No. 09/989,765 dated Sep. 26, 2008; 17 pages.

USPTO Non-Final Rejection for U.S. Appl. No. 09/989,765 dated Oct. 2, 2006; 13 pages.

USPTO Non-Final Rejection for U.S. Appl. No. 09/989,765 dated Oct. 5, 2005; 9 pages.

USPTO Final Rejection for U.S. Appl. No. 09/989,782 dated Jul. 9, 2008; 10 pages.

USPTO Final Rejection for U.S. Appl. No. 09/989,782 dated Jul. 24, 2007; 9 pages.

USPTO Final Rejection for U.S. Appl. No. 09/989,782 dated Sep. 21, 2006; 10 pages.

USPTO Final Rejection for U.S. Appl. No. 09/989,782 dated Nov. 3, 2005; 11 pages.

USPTO Non-Final Rejection for U.S. Appl. No. 09/989,782 dated Jan. 29, 2007; 9 pages.

USPTO Non-Final Rejection for U.S. Appl. No. 09/989,782 dated Mar. 28, 2006; 8 pages.

USPTO Non-Final Rejection for U.S. Appl. No. 09/989,782 dated Apr. 29, 2005; 11 pages.

USPTO Non-Final Rejection for U.S. Appl. No. 09/989,782 dated Oct. 6, 2004; 11 pages.

USPTO Non-Final Rejection for U.S. Appl. No. 09/989,782 dated Nov. 26, 2008; 10 pages.

USPTO Non-Final Rejection for U.S. Appl. No. 09/989,782 dated Dec. 14, 2007; 8 pages.

USPTO Final Rejection for U.S. Appl. No. 09/989,765 dated Mar. 31, 2009; 18 pages.

USPTO Final Rejection for U.S. Appl. No. 09/989,778 dated Mar. 16, 2009; 26 pages.

"Pod-Wikipedia, the free encyclopedia"; retrieved on Nov. 14, 2005 from http://en.wikipedia.org/wiki/Pod; 3 pages.

"pod-defintion by dict.die.net"; retrieved on Nov. 14,2005 from http://dict.die.net/pod; 2 pages.

"In-Curcuit Emulators—descriptions of the major ICEs around"; retrieved on Nov. 14, 2005 from http://www.algonet.se/—staffann/cieveloper/emulator.htm; 6 pages.

CD00183; "Capturing Test/Emulation and Enabling Real-Time Debugging Using FPGA for In-Circuit Emulation;" Oct. 10,2001; U.S. Appl. No. 09/975,104; Snyder; 35 pages.

USPTO Non-Final Rejection for U.S. Appl. No. 09/989,767 dated Jul. 24, 2008; 21 pages.

Anonymous; "Using Debug"; 1999; Prentice-Hall Publishing; 20 pages.

Harrison et al.; "Xilinx FPGA Design in a Group Environment Using VHDS and Synthesis Tools"; Colloquium on Digital System Design Using Synthesis Techniques; Feb. 15, 1996; 4 pages.

Microsoft Press Computer User's Dictionary; 1998; 3 pages.

Sreeram Duvvuru and Siamak Arya, "Evaluation of a Branch Target Address Cache," 1995; IEEE; 8 pages.

Andrew S. Tanenbaum with contributions from James R. Goodman, "Structured Computer Organization," 1999, Prentice Hall, Fourth Edition; 32 pages.

CD00186; "Method for Breaking Execution of a Test Code in DUT and Emulator Chip Essentially Simultaneously and Handling Complex Breakpoint Events;" Oct. 10, 2001; U.S. Appl. No. 09/975,338; Nemecek et al.; 34 pages.

CD00185; "Emulator Chip-Board Architecture for Interface;" Oct. 10, 2001; U.S. Appl. No. 09/975,030; Snyder et al.; 37 pages.

Wikipedia—Main Page, retrieved on Mar. 8, 2006 from http://en.wikipedia.org/wiki/Main_Page and http://en.wikipedia.org/wiki/Wikipedia:Introduction; 5 pages.

Wikipedia—Processor register, retrieved on Mar. 7, 2006 from http://en.wikipedia.org/wiki/Processor_register; 4 pages.

Jonathan B. Rosenburg, "How Debuggers Work" John Wiley & Sons, Inc, 1996; 259 pages.

Dahl, et al.; "Emulation of the Sparcle Microprocessor with the MIT Virtual Wires Emulation System"; 1994; IEEE; 9 pages.

Bauer et al.; "A Reconfigurable Logic Machine for Fast Event-Driven Simulation"; 1998; Design Automation Conference Proceedings; 8 pages.

CD00184; "Host to FPGA Interface in an In-Circuit Emulation System;" Oct. 10, 2001; U.S. Appl. No. 09/975,105; Nemecek; 44 pages.

USPTO Advisory Action for U.S. Appl. No. 09/994,601 dated May 23, 2006; 3 pages.

USPTO Non-Final Rejection for U.S. Appl. No. 09/994,601 dated Jul. 29, 2004; 10 pages.

USPTO Ex Parte Qualyle Action for U.S. Appl. No. 09/992,076 dated Jun. 18, 2007; 6 pages.

USPTO Non-Final Rejection for U.S. Appl. No. 09/992,076 dated Aug. 10, 2006; 19 pages.

USPTO Notice of Allowance for U.S. Appl. No. 09/992,076 dated Mar. 26, 2008; 23 pages.

USPTO Notice of Allowance for U.S. Appl. No. 09/992,076 dated Jul. 29, 2008; 6 pages.

UPSTO Advisory Action for U.S. Appl. No. 09/989,778 dated May 15, 2006; 4 pages.

USPTO Final Rejection for U.S. Appl. No. 09/989,778 dated Jan. 8, 2009; 25 pages.

USPTO Final Rejection for U.S. Appl. No. 09/989,778 dated Feb. 5, 2007; 17 pages.
USPTO Final Rejection for U.S. Appl. No. 09/989,778 dated Feb. 15, 2006; 9 pages.
USPTO Final Rejection for U.S. Appl. No. 09/989,778 dated Dec. 20, 2007; 14 pages.
USPTO Non-Final Rejection for U.S. Appl. No. 09/989,778 dated Mar. 29, 2005; 14 pages.
USPTO Non-Final Rejection for U.S. Appl. No. 09/989,778 dated Jul. 14, 2008; 24 pages.
USPTO Non-Final Rejection for U.S. Appl. No. 09/989,778 dated Jul. 19, 2007; 18 pages.
USPTO Non-Final Rejection for U.S. Appl. No. 09/989,778 dated Sep. 1, 2005; 10 pages.
USPTO Non-Final Rejection for U.S. Appl. No. 09/989,778 dated Sep. 18, 2006; 11 pages.
USPTO Final Rejection for U.S. Appl. No. 09/998,848 dated Jun. 14, 2005; 17 pages.
USPTO Final Rejection for U.S. Appl. No. 09/998,848 dated Jul. 25, 2006; 16 pages.
USPTO Final Rejection for U.S. Appl. No. 09/998,848 dated Aug. 10, 2007; 14 pages.
USPTO Final Rejection for U.S. Appl. No. 09/998,848 dated Nov. 24, 2008; 15 pages.
USPTO Non-Final Rejection for U.S. Appl. No. 09/998,848 dated Jan. 26, 2006; 17 pages.
USPTO Non-Final Rejection for U.S. Appl. No. 09/998,848 dated Jan. 29, 2007; 13 pages.
USPTO Non-Final Rejection for U.S. Appl. No. 09/998,848 dated Feb. 22, 2008; 15 pages.
USPTO Non-Final Rejection for U.S. Appl. No. 09/998,848 dated Dec. 21, 2004; 14 pages.
USPTO Final Rejection for U.S. Appl. No. 09/989,767 dated Jan. 11, 2007; 12 pages.
USPTO Final Rejection for U.S. Appl. No. 09/989,767 dated Jan. 15, 2009; 21 pages.
USPTO Final Rejection for U.S. Appl. No. 09/989,767 dated Mar. 6, 2006; 15 pages.
USPTO Final Rejection for U.S. Appl. No. 09/989,767 dated Apr. 6, 2005; 13 pages.
USPTO Final Rejection for U.S. Appl. No. 09/989,767 dated Dec. 27, 2007; 21 pages.
USPTO Non-Final Rejection for U.S. Appl. No. 09/989,767 dated Jul. 17, 2006; 12 pages.
USPTO Non-Final Rejection for U.S. Appl. No. 09/989,767 dated Jul. 2, 2007; 22 pages.
USPTO Notice of Allowance for U.S. Appl. No. 09/992,076 dated Nov. 13, 2008; 15 pages.
USPTO Final Rejection for U.S. Appl. No. 09/994,601 dated May 18, 2007; 17 pages.
USPTO Notice of Allowance for U.S. Appl. No. 09/992,076 dated Nov. 29, 2007; 8 pages.
USPTO Final Rejection for U.S Appl. No. 09/992,076 dated Jan. 30, 2007; 32 pages.
USPTO Non-Final Rejection for U.S. Appl. No. 09/992,076 dated Aug. 10, 2006; 19 pages.
USPTO Final Rejection for U.S. Appl. No. 09/992,076 dated Mar. 17, 2006; 16 pages.
USPTO Non-Final Rejection for U.S. Appl. No. 09/992,076 dated Nov. 21, 2005; 29 pages.
USPTO Non-Final Rejection for U.S. Appl. No. 09/992,076 dated Jun. 1, 2005; 20 pages.
USPTO Notice of Allowance for U.S. Appl. No. 09/994,600 dated Nov. 12, 2008; 35 pages.
USPTO Notice of Allowance for U.S. Appl. No. 09/994,600 dated May 14, 2008; 22 pages.
USPTO Final Rejection for U.S. Appl. No. 09/994,600 dated Oct. 17, 2007; 13 pages.
USPTO Non-Final Rejection for U.S. Appl. No. 09/994,600 dated May 15, 2007; 14 pages.
USPTO Final Rejection for U.S. Appl. No. 09/994,600 dated Dec. 8, 2006; 14 pages.
USPTO Non-Final Rejection for U.S. Appl. No. 09/994,600 dated Jul. 17, 2006; 14 pages.
USPTO Final Rejection for U.S. Appl. No. 09/994,600 dated Feb. 13, 2006; 13 pages.
USPTO Non-Final Rejection for U.S. Appl. No. 09/994,600 dated Aug. 23, 2005; 13 pages.
USPTO Final Rejection for U.S. Appl. No. 09/994,600 dated May 4, 2005; 16 pages.
USPTO Non-Final Rejection for U.S. Appl. No. 09/994,600 dated Oct. 21, 2004; 37 pages.
USPTO Notice of Allowance for U.S. Appl. No. 10/001,477 dated Nov. 10, 2008; 13 pages.
USPTO Final Rejection for U.S. Appl. No. 10/001,477 dated Jun. 30, 2008; 19 pages.
USPTO Non-Final Rejection for U.S. Appl. No. 10/001,477 dated Dec. 6, 2007; 17 pages.
USPTO Final Rejection for U.S. Appl. No. 10/001,477 dated Jul. 23, 2007; 19 pages.
USPTO Non-Final Rejection for U.S. Appl. No. 10/001,477 dated Jan. 22, 2007; 17 pages.
USPTO Final Rejection for U.S. Appl. No. 10/001,477 dated Aug. 24, 2006; 15 pages.
USPTO Non-Final Rejection for U.S. Appl. No. 10/001,477 dated Mar. 2, 2006; 17 pages.
USPTO Final Rejection for U.S. Appl. No. 10/001,477 dated Oct. 24, 2005; 18 pages.
USPTO Non-Final Rejection for U.S. Appl. No. 10/001,477 dated May 11, 2005; 31 pages.
Ito, Sergio Akira and Carro, Luigi; "A Comparison of Microcontrollers Targeted to FPGA-Based Embedded Applications", Sep. 2000, Proceedings of 13th Symposium on Integrated Circuits and Systems Design, Sep. 18-24, 2000; 6 pages.
Julio Faura at al.; "A Novel Mixed Signal Programmable Device With On-Chip Microprocessor", 1997, IEEE 1997 Custom Integrated Circuits Conference; 4 pages.
Monte Mar, Bert Sullam, Eric Blom; "An architecture for a configurable Mixed-signal device", 2003, IEEE Journal of Solid-State Circuits, vol. 3; 4 pages.
Robinson, Gordon D; "Why 1149.1 (JTAG) Really Works", May 1994, Conference Proceedings Electro/94 International, May 10-12, 1994, Combined Volumes; 6 pages.
USPTO Non-Final Rejection for U.S. Appl. No. 09/994,601 dated Oct. 4, 2007; 20 pages.
"PSoC designer: Integrated development environment, getting started 25-minute tutorial, version 1.0", Cypress Microsystems. Cypress Microsystems, Inc., Jul. 3, 2001; 25 pages.
"PSoC technology complete changes 8-bit MCU system design", Cypress Microsystems, Inc. retrieved from <http>:// www.archive.org/web/20010219005250/http://cypressmicro.com- /t . . .>, Feb. 19, 2001; 21 pages.
Specks et al., "A Mixed Digital-Analog 16B Microcontroller with 0.5MB Flash Memory, On-Chip Power Supply, Physical Nework Interface, and 40V I/O for Automotive Single-Chip Mechatronics," IEEE, Feb. 9, 2000; 1 page.
Hsieh et al., "Modeling Micro-Controller Peripherals for High-Level Co-Simulation and Synthesis," IEEE, 1997; 4 pages.
USPTO Notice of Allowance for U.S. Appl. No. 09/989,777 dated Nov. 4, 2008: 3 pages.
USPTO Notice of Allowance for U.S. Appl. No. 09/989,777 dated Sep. 15, 2008; 28 pages.
USPTO Notice of Allowance for U.S. Appl. No. 09/989,777 dated Jul. 7, 2008; 23 pages.
USPTO Final Rejection for U.S. Appl. No. 09/989,777 dated Jan. 30, 2008; 14 pages.
USPTO Non-Final Rejection for U.S. Appl. No. 09/989,777 dated Sep. 11, 2007; 18 pages.
USPTO Final Rejection for U.S. Appl. No. 09/989,777 dated Mar. 13, 2007; 24 pages.
USPTO Non-Final Rejection for U.S. Appl. No. 09/989,777 dated Sep. 13, 2006; 18 pages.
USPTO Non-Final Rejection for U.S. Appl. No. 09/989,777 dated Apr. 11, 2006; 21 pages.

USPTO Final Rejection for U.S. Appl. No. 09/989,777 dated Dec. 21, 2005; 29 pages.
USPTO Non-Final Rejection for U.S. Appl. No. 09/989,777 dated Jul. 5, 2005; 36 pages.
USPTO Notice of Allowance for U.S. Appl. No. 09/994,601 dated Dec. 22, 2008; 15 pages.
USPTO Final Rejection for U.S. Appl. No. 09/994,601 dated Apr. 17, 2008; 24 pages.
U.S. Appl. No. 10/803,030: "Programmable Microcontrollable Architecture (Mixed Analog/Digital);" Snyder; 13 pages.
USPTO Non-Final Rejection for U.S. Appl. No. 09/994,601 dated Nov. 14, 2006; 15 pages.
USPTO Final Rejection for U.S. Appl. No. 09/994,601 dated Mar. 8, 2006; 11 pages.
USPTO Non-Final Rejection for U.S. Appl. No. 09/994,601 dated Sep. 21, 2005; 12 pages.
USPTO Final Rejection for U.S. Appl. No. 09/994,601 dated Mar. 24, 2005; 10 pages.
Hintz et al.; "Microcontrollers", 1992, McGraw-Hill; 11 pages
Ganapathy, Gopi, and Narayan, Ram, and Jorden, Glen, and Fernandez, Denzil, and Wang, Ming, and Nishimura, Jim; "Hardware Emulation for Functional Verification of K5", Jun. 1996, 33rd Design Automation Conference Proceedings, Jun. 3-7, 1996; 4 pages.
The Provisional U.S. Appl. No. 60/243,708 "Advanced Programmable Microcontroller Device"; 277 pages.
"Webster's Third New International Dictionary", 1996, G. & C. Merriam Company; 3 pages.
USPTO Advisory Action for U.S. Appl. No. 09/998,848 dated Sep. 7, 2005; 3 pages.
U.S. Appl. No. 09/957,084: "A Crystal-Less Oscillator with Trimmable Analog Current Control for Increased Stability;" Mar; 28 pages.
U.S. Appl. No. 09/969,313: "Architecture for Synchronizing and Resetting Clock Signals Supplied to Multiple Analog Programmable System on a Chip Block;" Sullam; 50 pages.
U.S. Appl. No. 09/972,319: "Method for Applying Instructions to Microprocessor in Test Mode;" Snyder; 31 pages.
U.S. Appl. No. 09/972,003: "Test Architecture for Microcontroller Providing for a Serial Communication Interface;" Snyder; 32 pages.
U.S. Appl. No. 09/972,133: "Method for Entering Circuit Test Mode;" Snyder; 30 pages.
U.S. Appl. No. 09/973,535: "Architecture for Decimation Algorithm;" Snyder; 26 pages.
U.S. Appl. No. 09/977,111: A Frequency Doubler Circuit with Trimmable Current Control; Shutt; 35 pages.
U.S. Appl. No. 10/272,231; "Digital Configurable Macro Architecture;" Snyder; 36 pages.
U.S. Appl. No. 11/125,554: "A Method for a Efficient Supply to a Microcontroller;" Kutz; 1 page.
U.S. Appl. No. 09/855,868; "Protecting Access to Microcontroller Memory Blocks;" Snyder; 28 pages.
U.S. Appl. No. 09/887,923: "Novel Method and System for Interacting between a Processor and a Power on Reset to Dynamically Control Power States in a Microcontroller;" Kutz; 44 pages.
U.S. Appl. No. 10/000,383: "System and Method of Providing a Programmable Clock Architecture for an Advanced Microcontroller;" Sullam; 34 pages.
U.S. Appl. No. 10/001,477: "Breakpoint Control in an In-Circuit Emulation System;" Roe; 43 pages.
U.S. Appl. No. 10/004,197: "In-Circuit Emulator with Gatekeeper Based Halt Control;" Nemecek; 47 pages.
U.S. Appl. No. 10/004,039: "In-Circuit Emulator with Gatekeeper for Watchdog Timer;" Nemecek; 46 pages.
U.S. Appl. No. 10/002,217: "Conditional Branching in an In-Circuit Emulation System;" Nemecek; 43 pages.
U.S. Appl. No. 10/001,568: "Combined In-Circuit Emulator and Programmer;" Nemecek; 47 pages.
U.S. Appl. No. 10/001,478: "In-Circuit Emulator and POD Synchronized Boot;" Nemecek; 44 pages.
U.S. Appl. No. 09/887,955: "Novel Power on Reset Circuit for Microcontroller" Kutz; 42 pages.
U.S. Appl. No. 09/826,397: "Method and Circuit for Allowing a Microprocessor to Change its Operating Frequency on-the-fly;" Sullam; 24 pages.
U.S. Appl. No. 09/893,048: "A Microcontroller having an On-Chip High Gain Amplifier;" Kutz; 22 pages.
U.S. Appl. No. 09/912,768: "A Microcontroller having a Dual Mode Relax Oscillator that is Trimmable;" Shutt; 33 pages.
U.S. Appl. No. 09/922,419: "A Power Supply Pump Circuit for a Microcontroller" Kutz; 38 pages.
U.S. Appl. No. 09/922,579: "A Method for a Efficient Supply to a Microcontroller;" Kutz; 37 pages.
U.S. Appl. No. 09/923,461: "Non-Interfering Multiply-Mac (Multiply Accumulate) Circuit;" Snyder; 25 pages.
U.S. Appl. No. 09/935,454: "Method and Apparatus for Local and Global Power Management in a Programmable Analog Circuit;" Mar; 51 pages.
U.S. Appl. No. 10/011,214: "Method and Circuit for Synchronizing a Write Operation between an On-Chip Microprocessor and an On-Chip Programmable Analog Device Operating at Different Frequencies;" Sullam; 49 pages.
"New Object Domain R3 Beta Now Available (Build 134)1" Mar. 13, 2001; <http://web.archive.org/ web/200100331202605/www.objectdomain.com/domain30/index.html>; 2 pages.
"Omg XML Metadata Interchange (XMl) Specifications" 2000; 17 pages.
Electronic Tools Company; E-Studio User Manuel; 2000; retrieved from http://web.archive.org for site http://e-tools.com on Mar. 23, 2005; 77 pages.
Cover pp. Technology Reports; XML and Electronic Design Automation (EDA); Aug. 2000; retrieved from http://xml.coverpages.org on Mar. 23, 2005; 5 pages.
Microsoft Computer Dictionary "ActiveX" 2002; Microsoft Press; 5th Edition; 3 pages.
Wikipedia "XLM" retrieved on Jan. 29, 2007 from http://en.wikipedia.org/wiki/XML; 16 pages.
"VHDL Samples" retrieved on Jan. 29, 2007 from http://www.csee.umbc.edu/helpNHDL/samples/samples.shtml; 10 pages.
Anonymous, "Lotus Notes FAQ—How do you generate unique document numbers?" Sep. 19, 1999; retrieved from www.keysolutions.com on Jul. 9, 2008; 1 page.
Ashok Bindra, "Programmable SoC Delivers a New Level of System Flexibility"; Electronic Design; Nov. 6, 2000; 11 pages.
Cypress MicroSystem, Inc. "Cypres Customer Forums" retrieved from <http://wwvv.cypress.com/forums/messageview>: 1 page.
Cypress MicroSystem, Inc. "PsoC Designer: Integrated Development Environment User Guide"; Rev. 1.18; Sep. 8, 2003; 193 pages.
Hamblen, "Rapid Prototyping Using Field-Programmable Logic Devices" Jun. 2000, IEEE; 9 pages.
USPTO Final Rejection for U.S. Appl. No. 09/943,062 dated Apr. 30, 2004; 9 pages.
Snyder et al., "Xilinx's A-to-Z Systems Platform" Cahners Microprocessor, The Insider's Guide to Microprocessor Hardware, Feb. 6, 2001; 6 pages.
"PSoC Technology Completely Changes 8-bit MCU System Design" Cypress MicroSystem, Inc. Feb. 19, 2001; 21 pages.
USPTO Non-Final Rejection for U.S. Appl. No. 09/943,062 dated Dec. 8, 2003; 9 pages.
USPTO Advisory Action for U.S. Appl. No. 09/943,062 dated Sep. 25, 2003; 3 pages.
USPTO Final Rejection for U.S. Appl. No. 09/943,062 dated Jun. 27, 2003; 8 pages.
USPTO Non-Final Rejection for U.S. Appl. No. 09/943,062 dated Jan. 27, 2003; 7 pages.
USPTO Non-Final Rejection for U.S. Appl. No. 09/943,062 dated Sep. 11, 2002; 9 pages.
"PSoC Designer: Integrated Development Environment" User Guide; Revision 1.11; Last Revised Jul. 17, 2001 ; 109 pages.
Cypress Microsystems, "Cypress Microsystems Unveils Programmable System-on-a-Chip for Embedded Internet, Communications and Consumer Systems;" 2000, <http://www.cypressmicro.com/corporate/CY_Announrices_nov_13_2000.html>; 3 pages.

Huang et al., Iceberg, An Embedded In-Circuit Emulator Synthesizer for Microcontrollers, Proceedings of the 36th Design Automation Conference 1999; 6 pages.

Yoo et al., "Fast Hardware-Software Co-verification by Optimistic Execution of Real Processor," Proceedings of Design, Automation and Test in Europe Conference and Exhibition 2000; 6 pages.

USPTO Advisory Action for U.S. Appl. No. 09/943,062 dated Mar. 27, 2008; 3 pages.

USPTO Final Rejection for U.S. Appl. No. 09/943,062 dated Jan. 18, 2008; 8 pages.

USPTO Non-Final Rejection for U.S. Appl. No. 09/943,062 dated Jun. 22, 2007; 12 pages.

USPTO Miscellaneous Action for U.S. Appl. No. 09/943,062 dated Jan. 30, 2006; 2 pages.

USPTO Notice of Allowance for U.S. Appl. No. 10/113,064 dated Sep. 21, 2006; 7 pages.

USPTO Non-Final Rejection for U.S. Appl. No. 10/113,064 dated Apr. 6, 2006: 19 pages.

USPTO Final Rejection for U.S. Appl. No. 10/113,084 dated Oct. 18, 2005; 22 pages.

USPTO Non-Final Rejection for U.S. Appl. No. 10/113,064 dated Apr. 25, 2005; 15 pages.

U.S. Appl. No. 10/113,064: "Method and System for Debugging through Supervisory Operating Codes and Self Modifying Codes," Roe et al.; 36 pages.

USPTO Notice of Allowance for U.S. Appl. No. 09/930,021 dated Nov. 26, 2004; 4 pages.

USPTO Final Rejection for U.S. Appl. No. 09/930,021 dated Aug. 31, 2004; 8 pages.

USPTO Non-Final Rejection for U.S. Appl. No. 09/930,021 dated Apr. 26, 2004; 6 pages USPTO Miscellaneous Action with SSP for U.S. Appl. No. 09/930,021 dated Oct. 1, 2001; 1 page.

USPTO Notice of Allowance for U.S. Appl. No. 09/953,423 dated Jul. 12, 2004. 6 pages.

USPTO Non-Final Rejection for U.S. Appl. No. 09/953,423 dated Feb. 6, 2004; 5 pages.

USPTO Notice of Allowance for U.S. Appl. No. 09/957,084 dated May 18, 2004; 5 pages.

USPTO Final Rejection for U.S. Appl. No. 09/957,084 dated Jan. 29, 2004; 8 pages.

USPTO Non-Final Rejection for U.S. Appl. No. 09/957,084 dated Aug. 27, 2003; 8 pages USPTO Final Rejection for U.S. Appl. No. 09/957,084 dated Apr. 23, 2003; 8 pages.

USPTO Non-Final Rejection for U.S. Appl. No. 09/957,084 dated Aug. 23, 2002; 6 pages USPTO Notice of Allowance for U.S. Appl. No. 09/969,313 dated Oct. 4, 2005; 6 pages.

USPTO Non-Final Rejection for U.S. Appl. No. 09/969,313 dated May 6, 2005; 9 pages.

USPTO Requirement for Restriction/Election for U.S. Appl. No. 09/969,313 dated Mar. 18, 2005; 6 pages.

USPTO Notice of Allowance for U.S. Appl. No. 09/969,311 dated Mar. 1, 2005; 4 pages.

USPTO Non-Final Rejection for U.S. Appl. No. 09/969,311 dated Sep. 21, 2004; 4 pages.

USPTO Advisory Action for U.S. Appl. No. 09/969,311 dated Jul. 21, 2003; 2 pages.

USPTO Final Rejection for U.S. Appl. No. 09/969,311 dated Apr. 7, 2003; 7 pages.

USPTO Non-Final Rejection for U.S. Appl. No. 09/969,311 dated Nov. 6, 2002; 8 pages.

USPTO Notice of Allowance for U.S. Appl. No. 09/972,319 dated Dec. 30, 2004; 4 pages.

USPTO Non-Final Rejection for U.S. Appl. No. 09/972,319 dated Sep. 16, 2004; 9 pages.

USPTO Notice of Allowance for U.S. Appl. No. 09/972,003 dated Jul. 14, 2004; 4 pages.

USPTO Requirement for Restriction/Election for U.S. Appl. No. 09/972,003 dated May 6, 2004; 4 pages.

USPTO Non-Final Rejection for U.S. Appl. No. 09/972,003 dated Feb. 2, 2004; 10 pages.

USPTO Non-Final Rejection for U.S. Appl. No. 09/972,003 dated Aug. 19, 2003; 11 pages.

USPTO Notice of Allowance for U.S. Appl. No. 09/972,133 dated Jun. 9, 2006; 6 pages.

USPTO Final Rejection for U.S. Appl. No. 09/972,133 dated Mar. 30, 2006; 8 pages.

USPTO Non-Final Rejection for U.S. Appl. No. 09/972.133 dated Nov. 25, 2005; 9 pages.

USPTO Advisory Action for U.S. Appl. No. 09/972,133 dated Aug. 31, 2005; 3 pages.

USPTO Final Rejection for U.S. Appl. No. 09/972,133 dated Jun. 29, 2005; 10 pages.

USPTO Non-Final Rejection for U.S. Appl. No. 09/972,133 dated Mar. 8, 2005; 9 pages.

USPTO Notice of Allowance for U.S. Appl. No. 09/975,104 dated Oct. 19, 2006; 6 pages.

USPTO Non-Final Rejection for U.S. Appl. No. 09/975,104 dated Jun. 16, 2006; 8 pages.

USPTO Final Rejection for U.S. Appl. No. 09/975,104 dated Feb. 15, 2006; 7 pages.

USPTO Non-Final Rejection for U.S. Appl. No. 09/975,104 dated Aug. 16, 2005; 6 pages.

USPTO Non-Final Rejection for U.S. Appl. No. 09/975,104 dated Mar. 21, 2005; 7 pages.

USPTO Notice of Allowance for U.S. Appl. No. 09/975,030 dated Feb. 6, 2006; 7 pages.

USPTO Non-Final Rejection for U.S. Appl. No. 09/975,030 dated Oct. 20, 2005; 7 pages.

USPTO Non-Final Rejection for U.S. Appl. No. 09/975,030 dated Mar. 29, 2005; 13 pages.

USPTO Notice of Allowance for U.S. Appl. No. 09/977,111 dated Sep. 28, 2006; 6 pages.

USPTO Notice of Allowance for U.S. Appl. No. 10/272,231 dated Mar. 8, 2004; 6 pages.

USPTO Final Rejection for U.S. Appl. No. 10/272,231 dated Nov. 5, 2003; 5 pages.

USPTO Non-Final Rejection for U.S. Appl. No. 10/272,231 dated Jul. 14, 2003; 6 pages.

USPTO Notice of Allowance for U.S. Appl. No. 11/125,554 dated Feb. 7, 2008; 4 pages.

USPTO Notice of Allowance for U.S. Appl. No. 11/125,554 dated Apr. 24, 2007; 7 pages.

USPTO Non-Final Rejection for U.S. Appl. No. 11/125,554 dated Dec. 11, 2006; 9 pages.

USPTO Notice of Allowance for U.S. Appl. No. 09/855,868 dated Apr. 25, 2005; 6 pages.

USPTO Non-Final Rejection for U.S. Appl. No. 09/855,868 dated Aug. 26, 2004; 7 pages.

USPTO Notice of Allowance for U.S. Appl. No. 09/887,923 dated Sep. 27, 2004; 5 pages.

USPTO Non-Final Rejection for U.S. Appl. No. 09/887,923 dated May 25, 2004; 7 pages.

USPTO Notice of Allowance for U.S. Appl. No. 09/875,599 dated Oct. 17, 2006; 4 pages.

USPTO Non-Final Rejection for U.S. Appl. No. 09/875,599 dated May 31, 2006; 18 pages.

USPTO Final Rejection for Appl. No. 09/875,599 dated Feb. 15, 2006; 18 pages.

USPTO Final Rejection for Appl. No. 09/875,599 dated Nov. 21, 2005; 16 pages.

USPTO Advisory Action for U.S. Appl. No. 09/875,599 dated Jun. 8, 2005; 3 pages.

USPTO Final Rejection for U.S. Appl. No. 09/875,599 dated Mar. 29, 2005; 20 pages.

USPTO Non-Final Rejection for U.S. Appl. No. 09/875,599 dated Dec. 3, 2404; 16 pages.

USPTO Final Rejection for U.S. Appl. No. 09/875,599 dated Aug. 25, 2004; 17 pages.

USPTO Final Rejection for U.S. Appl. No. 09/875,599 dated Apr. 26, 2004; 15 pages.

USPTO Non-Final Rejection for U.S. Appl. No. 09/875,599 dated Oct. 27, 2003; 13 pages.

USPTO Notice of Allowance far U.S. Appl. No. 10/004,197 dated Feb. 9, 2007; 7 pages.
USPTO Notice of Allowance for U.S. Appl. No. 10/004,197 dated Oct. 6, 2006; 7 pages.
USPTO Non-Final Rejection for U.S. Appl. No. 10/004,197 dated Apr. 3, 2006; 13 pages.
USPTO Final Rejection for U.S. Appl. No. 10/004,197 dated Nov. 23, 2005; 17 pages.
USPTO Non-Final Rejection for U.S. Appl. No. 10/004,197 dated Jun. 6, 2005; 21 pages.
USPTO Notice of Allowance for U.S. Appl. No. 10/004,039 dated Aug. 15, 2006; 7 pages.
USPTO Non-Final Rejection for U.S. Appl. No. 10/004,039 dated Apr. 11, 2006; 14 pages.
USPTO Final Rejection for U.S. Appl. No. 10/004,039 dated Nov. 22, 2005; 19 pages.
USPTO Non-Final Rejection for U.S. Appl. No. 10/004,039 dated Jun. 6, 2005; 17 pages.
USPTO Notice of Allowance for U.S. Appl. No. 10/001,568 dated Mar. 17, 2006; 9 pages.
USPTO Final Rejection for Appl. No. 10/001,568 dated Oct. 26, 2005; 16 pages.
USPTO Non-Final Rejection for U.S. Appl. No. 10/001,568 dated May 19, 2005; 16 pages.
USPTO Notice of Allowance for U.S. Appl. No. 09/887,955 dated Oct. 12, 2004; 5 pages.
USPTO Non-Final Rejection for U.S. Appl. No. 09/887,955 dated May 26, 2004; 5 pages.
USPTO Notice of Allowance for U.S. Appl. No. 09/826,397 dated Oct. 7, 2004; 8 pages.
USPTO Non-Final Rejection for U.S. Appl. No. 09/826,397 dated Apr. 21, 2004; 6 pages.
USPTO Notice of Allowance for U.S. Appl. No. 09/893,048 dated Jul. 25, 2006; 4 pages.
USPTO Non-Final Rejection for U.S. Appl. No. 09/893,048 dated Jan. 12, 2006; 6 pages.
USPTO Non-Final Rejection for U.S. Appl. No. 09/893,048 dated Jul. 27, 2005; 6 pages.
USPTO Non-Final Rejection for U.S. Appl. No. 09/893,048 dated Oct. 6, 2004; 5 pages.
USPTO Notice of Allowance for U.S. Appl. No. 091893,050 dated Jul. 5, 2005; 6 pages.
USPTO Non-Final Rejection for U.S. Appl. No. 09/893,050 dated Jan. 5, 2005; 13 pages.
USPTO Final Rejection for U.S. Appl. No. 09/893,050 dated Aug. 30, 2004; 13 pages.
USPTO Non-Final Rejection for U.S. Appl. No. 09/893,050 dated Jan. 15, 2004; 9 pages.
USPTO Notice of Allowance for U.S. Appl. No. 09/909,047 dated May 11, 2005; 25 pages.
USPTO Notice of Allowance for U.S. Appl. No. 09/909,047 dated Feb. 15, 2005; 6 pages.
USPTO Non-Final Rejection for Appl. No. 09/909,047 dated Jul. 6, 2004; 9 pages.
USPTO Notice of Allowance for U.S. Appl. No. 09/912,768 dated Sep. 13, 2005; 5 pages.
USPTO Non-Final Rejection for U.S. Appl. No. 09/912,768 dated Apr. 11, 2005; 14 pages.
USPTO Final Rejection for U.S. Appl. No. 09/912,768 dated Nov. 17, 2004; 13 pages.
USPTO Non-Final Rejection for U.S. Appl. No. 09/912,768 dated Jun. 22, 2004; 11 pages.
USPTO Notice of Allowance for U.S. Appl. No. 09/922,579 dated Dec. 28, 2004; 6 pages.
USPTO Non-Final Rejection for U.S. Appl. No. 09/922,579 dated Aug. 18, 2004; 6 pages.
USPTO Notice of Allowance for U.S. Appl. No. 09/923,461 dated May 12, 2005; 6 pages.
USPTO Non-Final Rejection for U.S. Appl. No. 09/923,461 dated Jul. 16, 2004; 6 pages.
USPTO Notice of Allowance for U.S. Appl. No. 09/929,891 dated Dec. 23, 2005; 4 pages.
USPTO Notice of Allowance for U.S. Appl. No. 09/929,891 dated Jun. 15, 2005; 6 pages.
USPTO Non-Final Rejection for U.S. Appl. No. 09/929,891 dated Sep. 13, 2004; 6 pages.
USPTO Notice of Allowance for U.S. Appl. No. 10/803,030 dated Jan. 8, 2007; 6 pages.
USPTO Non-Final Rejection for U.S. Appl. No. 10/803,030 dated Jun. 8, 2005; 4 pages.
USPTO Notice of Allowance for U.S. Appl. No. 10/011,214 dated Apr. 11, 2005; 4 pages.
USPTO Final Rejection for U.S. Appl. No. 10/011,214 dated Jan. 21, 2005; 8 pages.
USPTO Non-Final Rejection for U.S. Appl. No. 10/011,214 dated Aug. 13, 2004; 10 pages.
Hong et al., "Hierarchial System Test by an IEEE 1149.5 MTM-Bus Slave-Module Interface Core," IEEE, 2000; 14 pages.
Haberl et al., "Self Testable Boards with Standard IEEE 1149.5 Module Test and Maintenance (MTM) Bus Interface," IEEE, 1994; 6 pages.
Varma et al., "A Structured Test Re-Use Methodology for Core-Based System Chips," IEEE, 1998; 9 pages.
Andrews, "Roadmap for Extending IEEE 1149.1 for Hierarchical Control of Locally-Stored, Standardized command Set, Test Programs," IEEE, 1994; 7 pages.
Adham et al., "Preliminary Outline of the IEEE P1500 Scalable Architecture for Testing Embedded Cores, "IEEE; 6 pages.
Ghosh et al., "A Low Overhead Design for Testability Generation Technique for Core-based Systems," IEEE, 1997; 10 pages.
Zorian, "Testing Embedded-Core Based System Chips," IEEE, 1998; 14 pages.
Papachristou et al., "Microprocessor Based testing for Core-Based System Chips, " IEEE, 1998; 6 pages.
Maroufi et al., "Solving the I/O Bandwith Problem in System on a Chip Testing," IEEE, 2000; 6 pages.
Marsh, "Smart Tools Illuminate Deeply Embedded Systems,"EDN, 2000; 7 pages.
York et al., "On-chip Support Needed for SOC Debug, "Electronic Engineering Times, 1999, 2 pages.
Atmel Corporation: AT90SC Summary: "Secure Microcontrollers for Smart Cards," 1999; 7 pages.
Hwang et al., "Integrated circuit for automatically varying resistance in computer system, has pair of transistors connected in parallel with respective resistors such that resistors are bypassed when corresponding transistors are enabled, " Derwent Information LTD; 2002; 2 pages.
Morrison, "IBM Eyes Merchant Packaging Services, " Jul. 13, 1998; Electronic News <http://www.findarticles.com>; 4 pages.
Charles, Jr. et al, "Wirebonding: Reinventing the Process for MCMs," Apr. 1998; IEEE 7th International Conference on Multichip Modules and High Density Packaging; 3 pages
Iran et al., "Fine Pitch and Wirebonding and Reliability of Aluminum Capped Copper Bond Pads," May 2000, IEEE Electronic Components and Technology Conference; 8 pages.
Song et al., "A 50% Power Reduction Scheme for Cmos Relaxation Oscillator," IEEE, 1999; 4 pages.
"Electronic Circuit Protector-Circuit Breaker;" IBM Technical Disclosure Bulletin; vol. 36, Issue 8, Aug. 1, 1993; 1 page.
USPTO Final Rejection for U.S. Appl. No. 10/001,478 dated Apr. 20, 2009: 16 pages.
USPTO Notice of Allowance for U.S. Appl. No. 09/994,600 dated Apr. 3, 2009; 5 pages.
USPTO Notice of Allowance for U.S. Appl. No. 09/989,777 dated Mar. 9, 2009; 7 pages.
USPTO Notice of Allowance for U.S. Appl. No. 09/992,076 dated Feb. 27, 2009; 6 pages.
USPTO Non-Final Rejection for U.S. Appl. No. 09/989,771 dated Apr. 30, 2009; 11 pages.
USPTO Notice of Allowance for U.S. Appl. No. 09/989,762 dated Mar. 25, 2009; 7 pages.
USPTO Notice of Allowance for U.S. Appl. No. 09/989,762 dated Oct. 24, 2008; 7 pages.

U.S. Appl. No. 09/989,815: "A Data Driven Method and System for Monitoring Hardware Resource Usage for Programming an Electric Device;" Bartz et al.; 36 pages.
USPTO Notice of Allowance for U.S. Appl. No. 09/989,762 dated Jun. 2, 2008; 6 pages.
USPTO Notice of Allowance for U.S. Appl. No. 09/989,762 dated Jan. 2, 2008; 6 pages.
USPTO Non-Final Rejection for U.S. Appl. No. 09/989,762 dated Jul. 23, 2007; 15 pages.
USPTO Final Rejection for U.S. Appl. No. 091989,762 dated Jan. 26, 2007; 13 pages.
USPTO Non-Final Rejection for U.S. Appl.No. 09/989,762 dated Aug. 10, 2006; 18 pages.
USPTO Final Rejection for U.S. Appl. No. 09/989,762 dated Mar. 14, 2006; 19 pages.
USPTO Non-Final Rejection for U.S. Appl. No. 09/989,762 dated Jul. 27, 2005; 15 pages.
U.S. Appl. No. 09/275,336: "Programmable Oscillator Scheme;" Mar et al.; 25 pages.
U.S. Appl. No. 09/721,316: "Programmable Oscillator Scheme;" Mar et al.; 26 pages.
U.S. Appl. No. 10/324,455: "Programmable Oscillator Scheme;" Mar et al.; 23 pages.
U.S. Appl. No. 09/998,859; "A System and a Method for Checking Lock Step Consistency between in Circuit Emulation and a Microcontroller while Debugging Process is in Progress;" Nemecek; 33 pages.
U.S. Appl. No. 09/998,834: "A System and a Method for Communication between an Ice and a Production Microcontroller while in a Halt State;" Nemecek; 33 pages.
U.S. Appl. No. 10/113,065: "System and Method for Automatically Matching Components in a Debugging System;" Nemecek et al.; 32 pages.
U.S. Appl. No. 09/989,574: "Method and System for using a Graphics user Interface for Programming an Electronic Device;" Bartz et al.; 43 pages.
U.S. Appl. No. 09/989,816: "Datasheet Browsing and Creation with Data-Driven Datasheet Tabs within a Microcontroller Design Tool;" Bath et al.; 55 pages.
U.S. Appl. No. 11/850,260: "Circuit and Method for Improving the Accuracy of a Crystal-less Oscillator Having Dual-Frequency Modes;" Wright at al.; 33 pages.
USPTO Non-Final Rejection for Appl. No. 11/850,260 dated Mar. 6, 2009; 7 pages.
USPTO Non-Final Rejection for U.S. Appl. No. 11/644,100 dated Mar. 09, 2009; 11 pages.
USPTO Advisory Action for U.S. Appl. No. 11/644,100 dated Feb. 9,2009; 3 pages.
USPTO Final Rejection for U.S. Appl. No. 11/644,100 dated Nov. 18, 2008; 12 pages.
USPTO Non-Final Rejection for U.S. Appl. No. 11/644,100 dated Apr. 14, 2008; 10 pages.
USPTO Notice of Allowance for Appl. No. 11/415,588 dated Mar. 11, 2008; 6 pages.
USPTO Advisory Action for U.S. Appl. No. 11/415,588 dated Jan. 14, 2008; 3 pages.
USPTO Final Rejection for U.S. Appl. No. 11/415,588 dated Oct. 19, 2007; 8 pages.
USPTO Non-Final Rejection for U.S. Appl. No. 11/415,588 dated Jun. 13, 2007; 8 pages.
USPTO Notice of Allowance for U.S. Appl. No. 12/218,404 dated Mar. 19, 2009; 7 pages.
USPTO Non-Final Rejection for U.S. Appl. No. 12/218,404 dated Sep. 30, 2008; 8 pages.
U.S. Appl. No. 11/644,100: "Differential-to-single ended signal converter circuit and method," Stiff; 33 pages.
U.S. Appl. No. 11/415,588: "Voltage Controlled Oscillator Delay Cell and Method," Sivadasan; 24 pages.
U.S. Appl. No. 12/218,404: "Voltage Controlled Oscillator Delay Cell and Method," Sivadasan; 23 pages.
USPTO Notice of Allowance for U.S. Appl. No. 11/132,894 dated Apr. 26, 2007; 4 pages.

USPTO Non-Final Rejection for U.S. Appl. No. 11/132,894 dated Dec. 19, 2006; 12 pages.
U.S. Appl. No. 11/132,894: "Open Loop Bandwidth Test Architecture and Method for Phase Locked Loop (PLL)," Stiff; 38 pages.
USPTO Non-Final Rejection for U.S. Appl. No. 11/322,044 dated May 4, 2009; 18 pages.
USPTO Non-Final Rejection for U.S. Appl. No. 11/322,044 dated Nov. 25, 2008; 15 pages.
USPTO Non-Final Rejection for U.S. Appl. No. 11/322,044 dated Apr. 11, 2008; 11 pages.
USPTO Advisory Action for U.S. Appl. No. 11/322,044 dated Nov. 30, 2007; 2 pages.
USPTO Final Rejection for U.S. Appl. No. 11/322,044 dated Sep. 21, 2007; 14 pages.
USPTO Non-Final Rejection for U.S. Appl. No. 11/322,044 dated Apr. 24, 2007; 13 pages.
U.S. Appl. No. 11/322,044: "Split charge pump PLL architecture," Stiff; 19 pages.
USPTO Notice of Allowance for U.S. Appl. No. 10/305,589 dated Feb. 4, 2005; 5 pages.
USPTO Final Rejection for U.S. Appl. No. 10/305,589 dated Oct. 21, 2004; 7 pages.
USPTO Non-Final Rejection for U.S. Appl. No. 10/305,589 dated Oct. 7, 2003; 6 pages.
U.S. Appl. No. 101305,589: "Current Controlled Delay Circuit," Stiff; 18 pages.
U.S. Appl. No. 09/849,164: "Reduced Static Phase Error CMOS PLL Charge Pump," Stiff; 30 pages.
Maneatis, "Low-Jitter Process-Independent DLL and PLL Based on Self-Biased Techniques," IEEE Journal of Solid- State Circuits, Vol, 31, No. 11, Nov. 1996; 10 pages.
Larsson, "A 2-1600-MHz CMOS Clock Recovery PLL with Low-V dd Capability," IEEE Journal of Solid-State Circuits, vol. 34, No. 12, Dec. 1999; 10 pages.
USPTO Notice of Allowance for U.S. Appl. No. 10/327,217 dated Aug. 12, 2004; 6 pages.
USPTO Non-Final Rejection for U.S. Appl. No. 10/327,217 dated Apr. 30, 2004; 5 pages.
USPTO Miscellaneous Action for U.S. Appl. No. 10/327,217 dated Feb. 10, 2004; 1 page.
U.S. Appl. No. 10/327,217: "Single Ended Clock Signal Generator Having a Differential Output," Richmond et al.; 27 pages.
USPTO Notice of Allowance for U.S. Appl. No. 10/871,582 dated Mar. 30, 2006; 6 pages.
USPTO Final Rejection for U.S. Appl. No. 10/871,582 dated Feb. 1, 2006; 5 pages.
USPTO Non-Final Rejection for U.S. Appl. No. 10/871,582 dated Sep. 7, 2005; 7 pages.
U.S. Appl. No. 10/871,582: "LVDS Input Circuit with Extended Common Mode Range," Reinschmidt et al.; 25 pages.
USPTO Notice of Allowance for U.S. Appl. No. 09/404,891 dated Mar. 4, 2005; 6 pages.
USPTO Final Rejection for U.S. Appl. No. 09/404,891 dated Dec. 8, 2004; 7 pages.
USPTO Non-Final Rejection for U.S. Appl. No. 09/404,891 dated Jun. 25, 2004; 6 pages.
USPTO Non-Final Rejection for U.S. Appl. No. 09/404,891 dated Jan. 5, 2004; 5 pages.
USPTO Non-Final Rejection for U.S. Appl. No. 09/404,891 dated Jul. 10, 2003; 6 pages.
USPTO Non-Final Rejection for U.S. Appl. No. 09/404,891 dated Mar. 5, 2003; 6 pages.
USPTO Non-Final Rejection for U.S. Appl. No. 09/404,891 dated Oct. 11, 2002; 5 pages.
U.S. Appl. No. 09/404,891: "Method, Architecture and Circuitry for Controlling Pulse Width in a Phase and/or Frequency Detector," Scott et al.; 17 pages.
USPTO Notice of Allowance for U.S. Appl. No. 10/226,911 dated Aug. 20, 2004; 4 pages.
USPTO Non-Final Rejection for U.S. Appl. No. 10/226,911 dated Mar. 19, 2004: 6 pages.
U.S. Appl. No. 10/226,911: "Calibration of Integrated Circuit Time Constants," Gehring et al.; 32 pages.

USPTO Notice of Allowance for U.S. Appl. No. 09/943,149 dated Jan. 12, 2004; 7 pages.
USPTO Non-Final Rejection for U.S. Appl. No. 09/943,149 dated Aug. 28, 2003; 9 pages.
USPTO Final Rejection for U.S. Appl. No. 09/943,149 dated May 7, 2003; 10 pages.
USPTO Non-Final Rejection for U.S. Appl. No. 09/943,149 dated Nov. 20, 2002; 7 pages.
U.S. Appl. No. 09/943,149: "Method for Phase Locking in a Phase Lock Loop," Moyal et al.,; 21 pages.
Durham et al., "Integrated Continuous-Time Balanced Filters for 16-bit DSP Interfaces," IEEE, 1993; 6 pages.
Durham et al, "Circuit Architectures for High Linearity Monolithic Continuous-Time Filtering," IEEE, 1992; 7 pages.
Durham et al, "High-Linearity Conitnuous-Time Filter in 5-V VLSI CMOS," IEEE, 1992; 8 pages.
U.S. Appl. No. 09/047,595: "Roving Range Control to Limit Receive PLL Frequency of Operation," Scott; 35 pages.
U.S. Appl. No. 09/216,460: "Circuit and Method for Controlling an Output of a Ring Oscillator," Abugharbieh et al.; 21 pages.
U.S. Appl. No. 09/471,914: "Reference-Free Clock Generator and Data Recovery PLL," Dalmia et al.; 32 pages.
U.S. Appl. No. 09/471,576: "Reference-Free Clock Generation and Data Recovery PLL," Dalmia; 30 pages.
U.S. Appl. No. 10/083,442: "Method/Architecture for a Low Gain PLL with Wide Frequency Range," Meyers et al.; 28 pages.
U.S. Appl. No. 09/470,665: "Digital Phase/Frequency Detector, and Clock Generator and Data Recovery PLL Containing the Same," Dalmia; 26 pages.
U.S. Appl. No. 09/893,161: "Architecture of a Pll with Dynamic Frequency Control on a Pld," Moore; 32 pages.
U.S. Appl. No. 09/608,753: "PLL Lockout Watchdog," Wilson et al; 24 pages.
U.S. Appl. No. 09/398,956: "Frequency Acquisition Rate Control in Phase Lock Loop Circuits," Moyai et al.; 35 pages.
U.S. Appl. No. 09/747,262: "Linearized Digital Phase-Locked Loop," Williams et al.; 9 pages.
U.S. Appl. No. 09/981,448: "Oscillator Tuning Method," Hauck; 28 pages.
U.S. Appl. No. 09/538,989: "Memory Based Phase Locked Loop," Krishnan; 27 pages.
U.S. Appl. No. 09/048,905: "Programmable Clock Generator," Mann et al.; 42 pages.
U.S. Appl. No. 08/865,342: "Programmable Clock Generator," Mann et al.; 41 pages.
USPTO Notice of Allowance for U.S. Appl. No. 10/293,392 dated Mar. 10, 2004; 6 pages.
USPTO Non-Final Rejection for U.S. Appl. No. 10/293,392 dated Oct. 16, 2003; 6 pages.
U.S. Appl. No. 10/293,392: "Low Voltage Receiver Circuit and Method for Shifting the Differential Input Signals of the Receiver Depending on a Common Mode Voltage of the Input Signals," Maher et al.; 20 pages.
USPTO Notice of Allowance for U.S. Appl. No. 10/288,003 dated Jan. 14, 2005; 6 pages.
USPTO Final Rejection for U.S. Appl. No. 10/288,003 dated Oct. 6, 2004; 6 pages.
USPTO Non-Final Rejection for U.S. Appl. No. 10/288,003 dated Apr. 7, 2004; 9 pages.
U.S. Appl. No. 10/288,003: "Low Voltage Differential Signal Driver Circuit and Method," Roper et al.: 30 pages.
USPTO Notice of Allowance for U.S. Appl. No. 09/989,777 dated Jun. 9, 2009; 7 pages.
USPTO Advisory Action for U.S. Appl. No. 11/200,619 dated May 11, 2009; 3 pages.
USPTO Final Rejection for U.S. Appl. No. 11/200,619 dated Mar. 3, 2009; 14 pages.
USPTO Non-Final Rejection for U.S. Appl. No. 11/200,619 dated Aug. 27, 2008; 13 pages.
U.S. Appl. No. 11/200,619: "Providing hardware independence to automate code generation of processing device firmware," Snyder et al.; 41 pages.

USPTO Notice of Allowance for U.S. Appl. No. 11/201,922 dated Apr. 9, 2009; 4 pages.
USPTO Non-Final Rejection for U.S. Appl. No. 11/201,922 dated Oct. 21, 2008; 12 pages.
USPTO Final Rejection for Appl. No. 11/201,922 dated Apr. 30, 2008; 10 pages.
USPTO Non-Final Rejection for U.S. Appl. No. 11/201,922 dated Oct. 15, 2007; 10 pages.
U.S. Appl. No. 11/201,922: "Design model for a hardware device-independent method of defining embedded firmware for programmable systems," McDonald et al.; 31 pages.
USPTO Non-Final Rejection for U.S. Appl. No. 11/201,627 dated Dec. 12, 2008; 17 pages.
USPTO Final Rejection for U.S. Appl. No. 11/201,627 dated Apr. 29, 2008; 21 pages.
USPTO Non-Final Rejection for U.S. Appl. No. 11/201,627 dated Nov. 16, 2007; 16 pages.
U.S. Appl. No. 11/201,627: "Method and an apparatus to design a processing system using a graphical user interface," Ogami et al.; 37 pages.
USPTO Notice of Allowance for U.S. Appl. No. 09/989,808 dated Feb. 13, 2006; 4 pages.
USPTO Non-Final Rejection for U.S. Appl. No. 09/989,808 dated Oct. 19, 2005; 8 pages.
USPTO Non-Final Rejection for U.S. Appl. No. 09/989,808 dated Apr. 14, 2005; 8 pages.
U.S. Appl. No. 09/989,808: "Automatic generation of application program interfaces, source code, interrupts, and data sheets for microcontroller programming," Bartz et al.; 67 pages.
USPTO Notice of Allowance for U.S. Appl. No. 10/109,979 dated Mar. 14, 2006; 6 pages.
USPTO Non-Final Rejection for U.S. Appl. No. 10/109,979 dated Jun. 30, 2005; 6 pages.
U.S. Appl. No. 10/109,979: "Graphical user interface with logic unifying functions," Anderson et al.; 100 pages.
U.S. Appl. No. 09/979,781: "System and method for decoupling and iterating resources associated with a module," Ogami et al.; 40 pages.
U.S. Appl. No. 09/989,775: "User defined names for registers in memory banks derived from configurations," Ogami et al.; 29 pages.
USPTO Notice of Allowance for Application No. 09/989,819 dated Jan. 11, 2005; 7 pages.
USPTO Non-Final Rejection for U.S. Appl. No. 09/989,819 dated Jul. 13, 2004; 4 pages.
USPTO Miscellaneous Action for U.S. Appl. No. 09/989,819 dated Dec. 14, 2001; 1 page.
U.S. Appl. No. 09/989,819: "System and method for creating a boot file utilizing a boot template," Ogami et al.; 43 pages.
USPTO Notice of Allowance for U.S. Appl. No. 09/989,761 dated Jan. 14, 2005; 6 pages.
USPTO Final Rejection for U.S. Appl. No. 09/989,761 dated Aug. 26, 2004; 7 pages.
USPTO Non-Final Rejection for U.S. Appl. No. 09/989,761 dated Mar. 10, 2004; 6 pages.
USPTO Final Rejection for U.S. Appl. No. 09/989,761 dated Oct. 3, 2003; 7 pages.
USPTO Non-Final Rejection for U.S. Appl. No. 09/989,761 dated Apr. 18, 2003; 5 pages.
U.S. Appl. No. 09/989,761: "Storing of global parameter defaults and using them over two or more design projects," Ogami et al.; 37 pages.
Wang, et al. "Synthesizing Operating System Based Device Drivers in Embedded Systems," 2003, ACM; 8 pages.
Lutovac et al. "Symbolic Computation of Digital Filter Transfer Function Using MATLAB," Proceedings of 23rd International Conference on Microelectronics (MIEL 2002), vol. 2 NIS, Yugoslavia; 4 pages.
Nauta et al. "Design and FPGA-Implementation of Wave Digital Bandpass Filters with Arbitrary Amplitude Transfer Characteristics," Proceedings of IEEE International Symposium on Industrial Electronics; 1998, vol. 2; 5 pages.
Xilinx, Virtex-II Pro Platform FPGA Developers Kit, "How Data2BRAM Fits in with Hardware and Software Flows," Chapter 2: Using Data2BRAM; Jan. 2003 Release; 2 pages.

PCT Preliminary Report on Patentability (Chapter 1 of the Patent Cooperation Treaty), PCT/US2005/028793, filed Aug. 12, 2005, mailed Dec. 21, 2007; 2 pages.
PCT Written Opinion of the International Searching Authority for PCT/US2005/028793, filed Aug. 12, 2005, mailed Nov. 19, 2007; 7 pages.
PCT International Search Report of the International Searching Authority for PCT/US05/28793, filed Aug. 12, 2005, mailed Nov. 19, 2007; 5 pages.
International Search Report and Written Opinion of the International Searching Authority for PCT/US05/28898, filed Aug. 12, 2005, mailed Mar. 6, 2007; 6 pages.
Burogs et al., "Power Converter Analysis and Design using Matlab: a Transfer Function Approach," Proceedings of IEEE International Symposium on Industrial Electronics 1998, vol. 2; 6 pages.
Efstathiou, "Analog Electronics: Basic Circuits of Operational Amplifiers," <http://web.archive.org/web/20021231045232> Dec. 31, 2002, version, retrieved from the Internet Archives; 10 pages.
PCT International Search Report for PCT/US05/28791, filed Aug. 12, 2005, mailed Mar. 31, 2008; 4 pages.
PCT International Written Opinion for PCT/US05/28791, filed Aug. 12, 2005, mailed Mar. 31, 2008; 8 pages.
Kory Hopkins, "Definition:" Jan. 16, 1997; <http://www.cs.sfu.ca/cs/peopie/GradStudent.html>; 1 page.
Ebeling et al., "Validating VLSI Circuit Layout by Wirelist Comparison;" Sep. 1983: in proceedings of the IEEE International Conference on Computer Aided Design (ICCAD-83); 2 pages.
"The Gemini Netlist Comparison Project:" <http://www.cs.washington.edu/researchiprojects/lis/www/gemini/gemini.html> larry@cs.washington.edu: 2 pages.
Ohlrich et al., "Sub-Gemini: Identifying Subcircuits using a Fast Subgraph Isomorphism Algorithm;" Jun. 1993; in proceedings of the 30th IEEE/ACM Design Automation Conference; 7 pages.
Ebling, "Gemini II: A Second Generation Layout Validation Program;" 1988; in proceedings of the IEEE International Conference on Computer Aided Design (ICCAD-88); 4 pages.
U.S. Appl. No. 12/132,527: "System and Method for Performing Next Placements and Pruning of Disallowed Placements for Programming an Integrated Circuit" Ogami et al.; 44 pages.
U.S. Appl. No. 12/356,468: "System and Method for Dynamically Generating a Configuration Datasheet," Anderson et al.; filed on Jan. 20, 2009; 27 pages.
USPTO U.S. Appl. No. 10/002,726: "Method and Apparatus for Generating Microcontroller Configuration Information," Ogami et al., filed on Oct. 24, 2001; 54 pages.
USPTO Notice of Allowance for U.S. Appl. No. 10/002,726 dated Feb. 6, 2007; 7 pages.
USPTO Non-Final Rejection for U.S. Appl. No. 10/002,726 dated Aug. 28, 2006; 10 pages.
USPTO Final Rejection for U.S. Appl. No. 10/002,726 dated Mar. 27, 2006; 8 pages.
USPTO Final Rejection for U.S. Appl. No. 10/002,726 dated Nov. 30, 2005; 10 pages.
USPTO Non-Final Rejection for U.S. Appl. No. 10/002,726 dated Jun. 10, 2005; 10 pages.
USPTO Non-Final Rejection for U.S. Appl. No. 10/002,726 dated Dec. 13, 2004; 7 pages.
USPTO U.S. Appl. No. 11/818,005: "Techniques for Generating Microcontroller Configuration information," Ogami et al., filed on Jun. 12, 2007; 61 pages.
USPTO Requirement for Restriction/Election for U.S. Appl. No. 11/818,005 dated Jul. 14, 2009; 5 pages.
USPTO Notice of Allowance for U.S. Appl. No. 11/986,338 dated May 7, 2009; 1 page.
USPTO Appl. No. 11/965,291: "Universal Digital Block Interconnection and Channel Routing," Snyder et al, filed on Dec. 27, 2007; 31 pages.
USPTO Non-Final Rejection for Appl. No. 11/965,291 dated Dec. 17, 2008; 8 pages.
USPTO Notice of Allowance for U.S. Appl. No. 11/965,291 dated May 5, 2009; 7 pages.
USPTO U.S. Appl. No. 11/986,338: Reconfigurable Testing System and Method, Pleis et al., filed on Nov. 20, 2007; 41 pages.

USPTO Appl. No. 10/172,670: "Method and System for Programming a Memory Device," Snyder et al.; filed on Jun. 13, 2002; 66 pages.
USPTO Notice of Allowance for Appl. No. 10/653,050 dated Jul. 29, 2004; 3 pages.
Written Opinion of the International Search Authority for international Application No. PCT/US08/60680 dated Aug. 15, 2008; 4 pages.
USPTO Notice of Allowance for U.S. Appl. No. 09/475,879 dated Oct. 22, 2004; 7 pages.
USPTO Advisory Action for U.S. Appl. No. 09/475,879 dated Mar. 4, 2002; 3 pages.
USPTO Advisory Action for U.S. Appl. No. 09/475,879 dated Dec. 31, 2001; 3 pages.
USPTO Final Rejection for U.S. Appl. No. 09/475,879 dated Oct. 11, 2001; 10 pages.
USPTO Non-Final Rejection for U.S. Appl. No. 09/475,879 dated Mar. 8, 2001; 6 pages.
USPTO Appl. No. 091475,879: "Programmable Logic Device," Lacey et al.; filed on Dec. 30, 1999; 50 pages.
USPTO U.S. Appl. No. 09/475,808: "Configurable Memory for Programmable Logic Circuits," Lacey et al., filed on Dec. 30, 1999; 24 pages.
USPTO Non-Final Rejection for U.S. Appl. No. 09/475,808 dated Jun. 6, 2001; 8 pages.
USPTO Notice of Allowance for U.S. Appl. No. 09/475,808 dated Nov. 6, 2001; 8 pages.
USPTO U.S. Appl. No. 10/137,497: "Reconligurable Testing System and Method," Pleis et al.; filed on May 1, 2002; 40 pages.
USPTO Non-Final Rejection for U.S. Appl. No. 10/137,497 dated Nov. 5, 2004; 17 pages.
USPTO Final Rejection for U.S. Appl. No. 10/137,497 dated May 5, 2005; 13 pages.
USPTO Non-Final Rejection for U.S. Appl. No. 10/137,497 dated Sep. 22, 2005; 21 pages.
USPTO Final Rejection for U.S. Appl. No. 10/137,497 dated Mar. 13, 2006; 15 pages.
USPTO Non-Final Rejection for U.S. Appl. No. 10/137,497 dated Aug. 2, 2006; 21 pages.
USPTO Notice of Allowance for Appl. No. 10/137,497 dated Jan. 24, 2007; 12 pages.
USPTO Notice of Allowance for U.S. Appl. No. 10/137,497 dated Jul. 20, 2007; 4 pages.
USPTO U.S. Appl. No. 10/653,050: "Method and System for Programming a Memory Device," Snyder et al.; filed on Aug. 29, 2003; 69 pages.
USPTO Non-Final Rejection for U.S. Appl. No. 10/653,050 dated Apr. 6, 2004; 7 pages.
USPTO U.S. Appl. No. 11/273,708: "Capacitance Sensor Using Relaxation Oscillators," Snyder et al., filed on Nov. 14, 2005; 33 pages.
UUSPTO U.S. Non-Final Rejection for Appl. No. 11/273,708 dated Mar. 19, 2007; 16 pages.
USPTO Final Rejection for U.S. Appl. No. 11/273,708 dated Jul. 5, 2007; 8 pages.
USPTO Notice of Allowance for U.S. Appl. No. 11/273,708 dated Aug. 9, 2007; 4 pages.
USPTO Appl. No. 11/337,272: "Successive Approximate Capacitance Measurement Circuit;" Warren Snyder, filed on Jan. 20, 2006 29 pages.
USPTO Requirement for Restriction/Election for U.S. Appl. No. 11/337,272 dated Sep. 11, 2006; 5 pages.
USPTO Non-Final Rejection for U.S. Appl. No. 11/337,272 dated Oct. 24, 2006; 9 pages.
USPTO Final Rejection for U.S. Appl. No. 111337,272 dated Feb. 2, 2007; 11 pages.
USPTO Advisory Action for U.S. Appl. No. 11/337,272 dated Apr. 3, 2007; 3 pages.
USPTO Non-Final Rejection for U.S. Appl. No. 11/337,272 dated May 17, 2007; 11 pages.
USPTO Notice of Allowance for U.S. Appl. No. 11/337,272 dated Aug. 15, 2007; 9 pages.

USPTO U.S. Appl. No. 11/983,291: "Successive Approximate Capacitance Measurement Circuit," Warren Snyder, filed on Nov. 7, 2007; 26 pages.
USPTO Non-Final Rejection for U.S. Appl. No. 11/983,291 dated Mar. 9, 2009; 9 pages.
USPTO Appl. No. 11/698,660: "Configurable Bus," Kutz et al., filed on Jan. 25, 2007; 35 pages.
USPTO Non-Final Rejection for U.S. Appl. No. 11/698,660 dated Dec. 2, 2008; 12 pages.
USPTO Final Rejection for U.S. Appl. No. 11/698,660 dated May 28, 2009; 12 pages.
USPTO Appl. No. 11/709,866; "Input/Output Multiplexer Bus," Dennis Sequine, filed on Feb. 21, 2007; 33 pages.
USPTO Non-Final Rejection for U.S. Appl. No. 11/709,866 dated Nov. 7, 2008; 14 pages.
USPTO Notice of Allowance for U.S. Appl. No. 11/709,866 dated Apr. 7, 2009; 8 pages.
Sedra et al., "Microelectronic Circuits," 3rd Edition, Oxford University Press, Feb. 5, 2007; 20 pages.
Van Ess, David; "Simulating a 555 Timer with PSoC," Cypress Semiconductor Corporation, Application Note AN2286, May 19, 2005; 10 pages.
Cypress Semiconductor Corporation, "Fan Controller CG6457AM and CG6462AM," PSoC Mixed Signal Array Preliminary Data Sheet; May 24, 2005; 25 pages.
Cypress Semiconductor Corporation, "PSoC Mixed-Signal Controllers," Production Description; <http://wvvw.cypress. corn/portal/server>; retrieved on Sep. 27, 2005; 2 pages.
Cypress Semiconductor Corporation, "CY8C21x34 Data Sheet," CSR User Module, CSR V.1.0; Oct. 6, 2005; 36 pages.
Chapweske, Adam; "The PS/2 Mouse Interface," PS/2 Mouse Interfacing, 2001, retrieved on May 18, 2006; 11 pages.
Cypress Semiconductor Corporation, "Cypress Introduces PSoC(TM)-Based Capacitive Touch Sensor Solution," Cypress Press Release; May 31, 2005; <http://www.cypress.com/portal/server>; retrieved on Feb. 5, 2007; 4 pages.
Seguine, Ryan; "Layout Guidelines for PSoC CapSense," Cypress Semiconductor Corporation, Application Note AN2292; Jul. 22, 2005; 13 pages.
Lee, Mark; "EMC Design Considerations for PSoC CapSense Applications," Cypress Semiconductor Corporation, Application Note AN2318; Sep. 16, 2005; 6 pages.
Cypress Semiconductor Corporation, "Release Notes srn017," Jan., 24, 2007; 3 pages.
Cypress Semiconductor Corporation, "PSoC CY8C20x34 Technical Reference Manual (TRM)," PSoC CY8C20x34 Trm, Version 1.0, 2006; 220 pages.
USPTO U.S. Application No. 11/166,622: "Touch wake for electronic devices," Beard at al., filed on Jun. 23, 2005; 22 pages.
International Written Opinion of the International Searching Authority for International Application No. PCT/ US2006/09572 dated Jan. 10, 2008; 5 pages.
International Search Report for International Application No. PCT/ US2006/09572 dated Jan. 10, 2008; 2 pages.
USPTO Notice of Allowance for U.S. Appl. No. 10/024,093dated Sep. 10, 2002; 7 pages.
USPTO U.S. Appl. No. 10/024,093: "Configurable Memory for Programmable Logic Circuits," Lacey et al., filed on Dec. 18, 2001; 25 pages.
USPTO U.S. Appl. No. 11/088,028: "Method and Circuit for Rapid Alignment of Signals," Moyal et al., filed on Nov. 13, 2007; 34 pages.
USPTO Notice of Allowance for U.S. Appl. No. 11/088,028 dated Jul. 2, 2007; 6 pages.
USPTO Notice of Allowance for U.S. Appl. No. 11/088,028) dated Jan. 26, 2007; 6 pages.
USPTO Non-Final Rejection for U.S. Appl. No. 11/088,028 dated Jun. 16, 2006; 8 pages.
USPTO Appl. No. 11/985,340: "Method and Circuit for Rapid Alignment of Signals," Moyal et al., filed on Nov. 13, 2007; 34 pages.
USPTO Notice of Allowance for U.S. Appl. No. 11/985,340 dated Jun. 2, 2009; 7 pages.
USPTO Requirement for Restriction for U.S. Appl. No. 11/985,340 dated Mar. 16, 2009; 7 pages.
USPTO Non-Final Rejection for U.S. Appl. No. 11/865,672 dated Jul. 17, 2009; 6 pages.
USPTO Non-Final Rejection for U.S. Appl. No. 11/859,547 dated Oct. 1, 2009; 9 pages.
USPTO Non-Final Rejection for U.S. Appl. No. 11/967,243 dated Sep. 17, 2009; 9 pages.
USPTO Non-Final Rejection for U.S. Appl. No. 11/967,240 dated Jun. 10, 2009; 7 pages.
USPTO Non-Final Rejection for U.S. Appl. No. 11/857,947 dated Mar. 30, 2009; 18 pages.
USPTO Non-Final Rejection for U.S. Appl. No. 12/104,672 dated Aug. 26, 2009; 11 pages.
USPTO Non-Final Rejection for U.S. Appl. No. 12/060,128 dated Apr. 29, 2009; 11 pages.
International Search Report of the International Searching Authority for International Application No. PCT/ US08/80695 dated Jul. 22, 2009; 3 pages.
Written Opinion of the International Searching Authority for International Application No. PCT/US08/60695 dated Jul. 22, 2009; 6 pages.
Azim et al', "A Custom DSP Chip to Implement a Robot Motion Controller Proceedings of the IEEE Custom Integrated Circuits Conference," May 1988, pp. 8.7.1-8.7.5; 6 pages.
Catthoor et al., "Architectural Strategies for an Application-Specific Synchronous Multiprocessor Environment," IEEE transactions on Acoustics, Speech, and Signal Processing; vol. 36, No. 2, Feb. 1988, pp. 265-284; 20 pages.
International Search Report of the International Searching Authority for International Application No. PCT/ US08160696 dated Sep. 22, 2008; 2 pages.
International Search Report of the international Searching Authority for International Application No. PCT/ US08/60698 dated Sep. 5, 2008; 2 pages.
Shahbahrami et al., "Matrix Register File and Extended Subwords: Two Techniques for Embedded Media Processors," ACM, May 2005; 9 pages.
Jung et al., "A Register File with Transposed Access Mode," 2000, IEEE; 2 pages.
International Search Report of the International Searching Authority for International Application No. PCT/ US08160681 dated Sep. 12, 2008; 2 pages.
Written Opinion of the international Searching Authority for International Application No. PCT/US08160681 dated Sep. 12, 2008; 4 pages.
USPTO Notice of Allowance for U.S. Appl. No. 11/965,677 dated Sep. 10, 2009; 6 pages.
USPTO Non-Final Rejection for U.S. Appl. No. 11/965,677 dated Mar. 10, 2009; 10 pages.
Written Opinion of the international Searching Authority for International Application No. PCT/US08/60696 dated Sep. 22, 2008; 4 pages.
USPTO Notice of Allowance for U.S. Appl. No. 10/238,966 dated Aug. 5, 2009; 5 pages.
USPTO Final Rejection for U.S. Appl. No. 09/989,767 dated Dec. 7, 2009; 22 pages.
USPTO Non-Final Rejection for U.S. Appl. No. 101001,478 dated Aug. 4, 2009; 17 pages.
USPTO Advisory Action for U.S. Appl. No. 10/001,478 dated Jun. 30, 2009; 3 pages.
USPTO Final Rejection for U.S. Appl. No. 10/001,478 dated Apr. 20, 2009; 16 pages.
USPTO Notice of Allowance for U.S. Appl. No. 10/002,217 dated Sep. 17, 2009; 6 pages.
USPTO Notice of Allowance for U.S. Appl. No. 10/002,217 dated Jun. 8, 2009; 8 pages.
USPTO Notice of Allowance for U.S. Appl. No. 10/001,477 dated Dec. 4, 2009; 7 pages.
USPTO Notice of Allowance for U.S. Appl. No. 10/001,477 dated Aug. 26, 2009; 6 pages
USPTO Ex Parte Quayle Action for U.S. Appl. No. 09/975,115 dated Aug. 20, 2009; 7 pages.
USPTO Non-Final Rejection for U.S. Appl. No. 09/994,601 dated Jul. 9, 2009; 11 pages.

USPTO Non-Final Rejection for U.S. Appl. No. 11/818,005 dated Nov. 23, 2009; 8 pages.
USPTO Requirement for Restriction/Election for U.S. Appl. No. 11/818,005 dated Jul. 14, 2009; 5 pages.
USPTO Advisory Action for U.S. Appl. No. 09/989,778 dated Jun. 17, 2009; 3 pages.
USPTO Notice of Allowance for U.S. Appl. No. 09/994,600 dated Aug. 25, 2009; 4 pages.
USPTO Notice of Allowance for U.S. Appl. No. 09/994,600 dated Apr. 3, 2009; 5 pages.
USPTO Notice of Allowance for U.S. Appl. No. 09/989,762 dated Oct. 30, 2009; 6 pages.
USPTO Notice of Allowance for U.S. Appl. No. 09/989,762 dated Jul. 16, 2009; 6 pages.
USPTO Non-Final Rejection for U.S. Appl. No. 09/998,848 dated May 12, 2009; 16 pages.
USPTO Non-Final Rejection for U.S. Appl. No. 09/989,767 dated May 12, 2009; 21 pages.
USPTO Final Rejection for U.S. Appl. No. 09/989,771 dated Nov. 25, 2009; 12 pages.
USPTO Notice of Allowance for U.S. Appl. No. 09/989,765 dated Sep. 3, 2009; 7 pages.
USPTO Non-Final Rejection for U.S. Appl. No. 09/989,782 dated Oct. 27, 2009; 9 pages.
USPTO Final Rejection for U.S. Appl. No. 09/989,782 dated May 15, 2009; 10 pages.
USPTO Notice of Allowance for U.S. Appl. No. 11/986,338 dated Oct. 19, 2009; 4 pages.
USPTO Notice of Allowance for U.S. Appl. No. 09/989,777 dated Aug. 6, 2009; 8 pages.
USPTO Notice of Allowance for U.S. Appl. No. 10/008,096 dated Oct. 21, 2009; 6 pages.
USPTO Notice of Allowance for U.S. Appl. No. 10/008,096 dated Jun. 5, 2009; 12 pages.
USPTO Notice of Allowance for U.S. Appl. No. 11/985,340 dated Nov. 9, 2009; 7 pages.
USPTO Advisory Action for U.S. Appl. No. 11/201,627 dated Sep. 21, 2009; 3 pages.
USPTO Final Rejection for U.S. Appl. No. 11/201,627 dated Jul. 7, 2009; 19 pages.
USPTO Miscellaneous Action for U.S. Appl. No. 11/201,922 dated Oct. 1, 2009; 2 pages.
USPTO Non-Final Rejection for U.S. Appl. No. 11/200,619 dated Jun. 17, 2009; 12 pages.
USPTO Non-Final Rejection for U.S. Appl. No. 11/166,622 dated Sep. 29, 2009; 11 pages.
USPTO Advisory Action for U.S. Appl. No. 11/166,622 dated May 27, 2009; 3 pages.
USPTO Final Rejection for U.S. Appl. No. 11/166,622 dated Mar. 10, 2009; 11 pages.
USPTO Notice of Allowance for U.S. Appl. No. 121218,404 (dated Nov. 3, 2009; 8 pages.
USPTO Notice of Allowance for U.S. Appl. No. 12/218,404 dated Jul. 10, 2009; 7 pages.
USPTO Notice of Allowance for U.S. Appl. No. 11/709,866 dated Aug. 4, 2009; 7 pages.
USPTO Non-Final Rejection for U.S. Appl. No. 11/698,660 dated Oct. 7, 2009; 12 pages.
USPTO Advisory Action for U.S. Appl. No. 11/698,660 dated Jul. 31, 2009; 3 pages.
USPTO Notice of Allowance for U.S. Appl. No. 11/983,291 dated Oct. 22, 2009; 7 pages.
USPTO Final Rejection for U.S. Appl. No. 11/983,291 dated Aug. 12, 2009; 10 pages.
USPTO Final Rejection for U.S. Appl. No. 11/322,044 dated Oct. 19, 2009; 10 pages.
USPTO Final Rejection for U.S. Appl. No. 11/644,100 dated Aug. 19, 2009; 12 pages.
USPTO Advisory Action for U.S. Appl. No. 11/850,260 dated Nov. 2, 2009; 3 pages.
USPTO Final Rejection for U.S. Appl. No. 11/850,260 dated Aug. 21, 2009; 9 pages.
USPTO Final Rejection for U.S. Appl. No. 11/698,660 dated Feb. 16, 2010; 14 pages.
USPTO Notice of Allowance for U.S. Appl. No. 09/989,765 dated Dec. 22, 2009; 8 pages.
USPTO Notice of Allowance for U.S. Appl. No. 09/994,600 dated Jan. 4, 2010; 4 pages.
USPTO Notice of Allowance for U.S. Appl. No. 10/002,217 dated Jan. 11, 2010; 7 pages.
USPTO Notice of Allowance for U.S. Appl. No. 09/989,777 dated Jan. 15, 2010; 8 pages.
USPTO Notice of Allowance for U.S. Appl. No. 11/965,291 dated Jan. 13, 2010; 4 pages.
USPTO Notice of Allowance for U.S. Appl. No. 09/975,115 dated Jan. 29, 2010; 9 pages.
USPTO Notice of Allowance for U.S. Appl. No. 10/238,966 dated Feb. 1, 2010; 4 pages.
USPTO Final Rejection for U.S. Appl. No. 09/994,601 dated Jan. 5, 2010; 13 pages.
USPTO Non-Final Rejection for U.S. Appl. No. 09/998,848 dated Dec. 10, 2009; 16 pages.
USPTO Notice of Allowance for U.S. Appl. No. 10/008,096 dated Feb. 1, 2010; 6 pages.
USPTO Non-Final Rejection for U.S. Appl. No. 11/201,627 dated Dec. 24, 2009; 22 pages.
USPTO Final Rejection for U.S. Appl. No. 11/200,619 dated Jan. 4, 2010; 18 pages.
USPTO Non-Final Rejection for U.S. Appl. No. 11/644,100 dated Dec. 16, 2009; 13 pages.
USPTO Non-Final Rejection for U.S. Appl. No. 11/850,260 dated Jan. 14, 2010; 8 pages.
USPTO Non-Final Rejection for U.S. Appl. No. 10/133,581 dated Feb. 24, 2006; 11 pages.
USPTO Notice of Allowance for U.S. Appl. No. 09/989,762 dated Feb. 22, 2010; 7 pages.
USPTO Notice of Allowance for U.S. Appl. No. 11/986,338 dated Feb. 16, 2010; 4 pages.
USPTO Non-Final Rejection for U.S. Appl. No. 12/136,557 dated Mar. 15, 2010; 10 pages.
USPTO Notice of Allowance for U.S. Appl. No. 11/965,677 dated Feb. 12, 2010; 4 pages.
USPTO Notice of Allowance for U.S. Appl. No. 11/985,340 dated Feb. 19, 2010; 8 pages.
USPTO Notice of Allowance for U.S. Appl. No. 12/218,404 dated Feb. 16, 2010; 7 pages.
USPTO Notice of Allowance for U.S. Appl. No. 111709,866 dated Feb. 16, 2010; 7 pages.
USPTO Non-Final Rejection for U.S. Appl. No. 10/133,581 dated Aug. 12, 2005; 12 pages.
USPTO Notice of Allowance for U.S. Appl. No. 10/133,581 dated Mar. 5, 2010; 9 pages.
USPTO Non-Final Rejection for U.S. Appl. No. 10/133,581 dated Sep. 1, 2009; 18 pages.
USPTO Final Rejection for U.S. Appl. No. 10/133,581 dated May 11, 2009; 21 pages.
USPTO Non-Final Rejection for U.S. Appl. No. 10/133,581 dated Nov. 26, 2008; 20 pages.
USPTO Final Rejection for U.S. Appl. No. 10/133,581 dated Jun. 11, 2008; 14 pages.
USPTO Non-Final Rejection for U.S. Appl. No. 10/133,581 dated Nov. 27, 2007; 15 pages.
USPTO Final Rejection for U.S. Appl. No. 10/133,581 dated Jul. 13, 2007; 15 pages.
USPTO Non-Final Rejection for U.S. Appl. No. 10/133,581 dated Jan. 10, 2007; 14 pages.
USPTO Final Rejection for U.S. Appl. No. 10/133,581 dated Aug. 10, 2006; 13 pages.
USPTO Notice of Allowance for U.S. Appl. No. 10/001,477 dated Mar. 23, 2010; 6 pages.
USPTO Notice of Allowance for U.S. Appl. No. 09/989,765 dated Mar. 31, 2010; 8 pages.
USPTO Notice of Allowance for U.S. Appl. No. 12/104,672 dated Jan. 11, 2010; 7 pages.

USPTO Non-Final Rejection for U.S. Appl. No. 11/799,439 dated Nov. 2, 2007; 7 pages.
USPTO Non-Final Rejection for U.S. Appl. No. 11/799,439 dated May 29, 2008; 8 pages.
USPTO Final Rejection for U.S. Appl. No. 11/799,439 dated Dec. 18, 2008; 6 pages.
USPTO Notice of Allowance for U.S. Appl. No. 11/799,439 dated Jun. 25, 2009; 6 pages.
USPTO Notice of Allowance for U.S. Appl. No. 11/799,439 dated Feb. 5, 2010; 4 pages.
USPTO Final Rejection for U.S. Appl. No. 11/698,660 dated Feb. 16, 2010; 14 pages.
USPTO Notice of Allowance for U.S. Appl. No. 09/989,765 dated Dec. 22, 2009; 8 pages.
USPTO Notice of Allowance for U.S. Appl. No. 09/994,600 dated Jan. 4, 2010; 4 pages.
USPTO Notice of Allowance for U.S. Appl. No. 10/002,217 dated Jan. 11, 2010; 7 pages.
USPTO Notice of Allowance for U.S. Appl. No. 09/989,777 dated Jan. 15, 2010; 8 pages.
USPTO Notice of Allowance for U.S. Appl. No. 11/965,291 dated Jan. 13, 2010; 4 pages.
USPTO Notice of Allowance for U.S. Appl. No. 09/975,115 dated Jan. 29, 2010; 9 pages.
USPTO Notice of Allowance for Appl. No. 10/238,966 dated Feb. 1, 2010; 4 pages.
USPTO Final Rejection for U.S. Appl. No. 09/994,601 dated Jan. 5, 2010; 13 pages.
USPTO Non-Final Rejection for U.S. Appl. No. 09/998,848 dated Dec. 10, 2009; 16 pages.
USPTO Notice of Allowance for U.S. Appl. No. 10/008,096 dated Feb. 1, 2010; 6 pages.
USPTO Non-Final Rejection for U.S. Appl. No. 11/201,627 dated Dec. 24, 2009; 22 pages.
USPTO Final Rejection for U.S. Appl. No. 11/200,619 dated Jan. 4, 2010; 18 pages.
USPTO Non-Final Rejection for U.S. Appl. No. 11/644,100 dated Dec. 16, 2009; 13 pages.
USPTO Non-Final Rejection for U.S. Appl. No. 11/850,260 dated Jan. 14, 2010; 8 pages.
USPTO NonFinal Rejection for U.S. Appl. No. 10/133,581 dated Feb. 24, 2006; 11 pages.
USPTO Notice of Allowance for U.S. Appl. No. 09/989,762 dated Feb. 22, 2010; 7 pages.
USPTO Notice of Allowance for U.S. Appl. No. 11/986,338 dated Feb. 16, 2010; 4 pages.
USPTO Non-Final Rejection for U.S. Appl. No. 12/136,557 dated Mar. 15, 2010; 10 pages.
USPTO Notice of Allowance for U.S. Appl. No. 11/965,677 dated Feb. 12, 2010; 4 pages.
USPTO Notice of Allowance for Appl. No. 11/985,340 dated Feb. 19, 2010; 8 pages.
USPTO Notice of Allowance for U.S. Appl. No. 12/218,404 dated Feb. 16, 2010; 7 pages.
USPTO Notice of Allowance for U.S. Appl. No. 111709,866 dated Feb. 16, 2010; 7 pages.
USPTO Non-Final Rejection for U.S. Appl. No. 10/133,581 dated Aug. 12, 2005; 12 pages.
USPTO Notice of Allowance for U.S. Appl. No. 10/133,581 dated Mar. 5, 2010; 9 pages.
USPTO Non-Final Rejection for U.S. Appl. No. 10/133,581 dated Sep. 1, 2009; 18 pages.
USPTO Final Rejection for U.S. Appl. No. 10/133,581 dated May 11, 2009; 21 pages.
USPTO Non-Final Rejection for U.S. Appl. No. 10/133,581 dated Nov. 26, 2008; 20 pages.
USPTO Final Rejection for U.S. Appl. No. 10/133,581 dated Jun. 11, 2008; 14 pages.
USPTO Non-Final Rejection for U.S. Appl. No. 10/133,581 dated Nov. 27, 2007; 15 pages.
USPTO Final Rejection for U.S. Appl. No. 10/133,581 dated Jul. 13, 2007; 15 pages.
USPTO Non-Final Rejection for U.S. Appl. No. 10/133,581 dated Jan. 10, 2007; 14 pages.
USPTO Final Rejection for U.S. Appl. No. 10/133,581 dated Aug. 10, 2006; 13 pages.
Uspto Notice of Allowance for Application No. 10/001,477 (CD01203) dated Mar. 23, 2010; 6 pages.
USPTO Notice of Allowance for U.S. Appl. No. 09/989,765 dated Mar. 31, 2010; 8 pages.
USPTO Notice of Allowance for U.S. Appl. No. 12/104,672 dated Jan. 11, 2010; 7 pages.
USPTO Non-Final Rejection for U.S. Appl. No. 11/799,439 dated Nov. 2, 2007; 7 pages.
USPTO Non-Final Rejection for U.S. Appl. No. 11/799,439 dated May 29, 2008; 8 pages.
USPTO Final Rejection for U.S. Appl. No. 11/799,439 dated Dec. 18, 2008; 6 pages.
USPTO Notice of Allowance for U.S. Appl. No. 11/799,439 dated Jun. 25, 2009; 6 pages.
USPTO Notice of Allowance for U.S. Appl. No. 11/799,439 dated Feb. 5, 2010; 4 pages.
USPTO Non-Final Rejection for U.S. Appl. No. 12/132,527 dated Apr. 29, 2010; 7 pages.
USPTO Final Rejection for U.S. Appl. No. 11/818,005 dated May 24, 2010; 8 pages.
USPTO Notice of Allowance for U.S. Appl. No. 09/943,062 dated Jun. 29, 2010; 4 pages.
USPTO Non-Final Rejection for U.S. Appl. No. 11/201,922 dated Jun. 11, 2010; 12 pages.
USPTO Non-Final Rejection for U.S. Appl. No. 12/070,547 dated Jun. 3, 2009; 6 pages.
USPTO Final Rejection for U.S. Appl. No. 12/070,547 dated Oct. 30, 2009; 5 pages.
USPTO Notice of Allowance for U.S. Appl. No. 12/070,547 dated Feb. 24, 2010; 4 pages.
USPTO Non-Final Rejection for U.S. Appl. No. 11/347,189 dated Jun. 8, 2007; 6 pages.
USPTO Notice of Allowance for U.S. Appl. No. 11/347,189 dated Sep. 27, 2007: 4 pages.
USPTO Notice of Allowance for U.S. Appl. No. 10/256,829 dated May 10, 2010; 4 pages.
USPTO Non-Final Rejection for U.S. Appl. No. 10/256,829 dated Oct. 26, 2009; 8 pages.
USPTO Final Rejection for U.S. Appl. No. 10/256,829 dated Jun. 23, 2009; 8 pages.
USPTO Non-Final Rejection for U.S. Appl. No. 10/256,829 dated Jan. 7, 2009; 7 pages.
USPTO Non-Final Rejection for U.S. Appl. No. 10/256,829 dated Jun. 26, 2008; 11 pages.
USPTO Notice of Allowance for U.S. Appl. No. 10/256,829 dated Oct. 29, 2007; 6 pages.
USPTO Final Rejection for U.S. Appl. No. 10/256,829 dated Jun. 1, 2007; 16 pages.
USPTO Non-Final Rejection for U.S. Appl. No. 10/256,829 dated Nov. 2, 2006; 13 pages.
USPTO Non-Final Rejection for U.S. Appl. No. 10/256,829 dated May 3, 2006; 16 pages.
USPTO Final Rejection for U.S. Appl. No. 10/256,829 dated Jan. 27, 2006; 24 pages.
USPTO Non-Final Rejection for U.S. Appl. No. 10/256,829 dated Jul. 28, 2005; 14 pages.
USPTO Notice of Allowance for U.S. Appl. No. 09/989,817 dated May 9, 2005; 6 pages.
USPTO Non-Final Rejection for U.S. Appl. No. 09/989,817 dated Jan. 12, 2005; 5 pages.
USPTO Non-Final Rejection for U.S. Appl. No. 09/989,817 dated Jun. 8, 2004; 7 pages.
USPTO Notice of Allowance for U.S. Appl. No. 10/327,207 dated Jun. 11, 2007; 4 pages.
USPTO Notice of Allowance for U.S. Appl. No. 10/327,207 dated Dec. 26, 2006; 5 pages.
USPTO Non-Final Rejection for U.S. Appl. No. 10/327,207 dated Jul. 21, 2006; 12 pages.

USPTO Final Rejection for U.S. Appl. No. 10/327,207 dated Mar. 2, 2006; 13 pages.
USPTO Non-Final Rejection for U.S. Appl. No. 10/327,207 dated Sep. 20, 2005; 11 pages.
USPTO Miscellaneous Action for U.S. Appl. No. 10/327,207 dated May 13, 2003; 1 page.
USPTO Notice of Allowance for U.S. Appl. No. 09/989,570 dated May 19, 2005; 4 pages.
USPTO Non-Final Rejection for U.S. Appl. No. 09/989,570 dated Jan. 26, 2005; 9 pages.
USPTO Notice of Allowance for U.S. Appl. No. 09/989,570 dated Sep. 10, 2004; 8 pages.
USPTO Non-Final Rejection for U.S. Appl. No. 09/989,570 dated Mar. 25, 2004; 8 pages.
USPTO Non-Final Rejection for U.S. Appl. No. 09/989,570 dated Oct. 7, 2003; 6 pages.
USPTO Advisory Action for U.S. Appl. No. 09/989,570 dated Aug. 14, 2003; 3 pages.
USPTO Final Rejection for U.S. Appl. No. 09/989,570 dated May 30, 2003; 9 pages.
USPTO Non-Final Rejection for U.S. Appl. No. 09/989,570 dated Jan. 2, 2003; 7 pages.
USPTO Notice of Allowance for U.S. Appl. No. 09/989,571 dated Sep. 13, 2005; 6 pages.
USPTO Non-Final Rejection for U.S. Appl. No. 09/989,571 dated May 23, 2005; 8 pages.
USPTO Final Rejection for U.S. Appl. No. 09/989,571 dated Jan. 26, 2005; 11 pages.
USPTO Non-Final Rejection for U.S. Appl. No. 09/989,571 dated Jul. 12, 2004; 9 pages.
M. Mooris Mano, "Computer-System Architecture," 1982, Prentice-Hall, 2nd Edition, pp. 261-264 and 435-440; 14 pages.
Dirk Killat, "A One-Chip Solution for Electronic Ballasts in Fluorescent Lamps," Power Electronics, <http://powerelectronics.com/mag/power_onechip_solution_electronic/>, dated Mar. 1, 2004, accessed Sep. 13, 2005; 4 pages.
Fred Eady, "PSoC 101," Circuit Cellar, Aug. 2004, accessed Sep. 13, 2005, <http://www.circuitcellar.com/library/print10804/eady169/2.htm>, 4 pages.
USPTO Notice of Allowance for U.S. Appl. No. 10/803,030 dated Jan. 8, 2007; 6 pages.
USPTO Non-Final Rejection for U.S. Appl. No. 10/803,030 dated Jun. 8, 2005; 4 pages.
U.S. Appl. No. 12/058,586: "System and Mehod for Monitoring a Target Device" Ogami et al., filed on Mar. 28, 2008; 41 pages.
U.S. Appl. No. 12058,534: "System and Method for Controlling a Target Device" Ogami et al., filed on Mar. 28, 2008; 40 pages.
U.S. Appl. No. 12/004,833: "Systems and Methods for Dynamically Reconfiguring a Programmable System on a Chip," Ogami et al., filed on Dec. 21, 2007; 40 pages.
U.S. Appl. No. 12/058,569: "Configuration of Programmable IC Design Elements," Best et al., filed on Mar. 28, 2008; 19 pages.
U.S. Appl. No. 12/057,149: "Power Management Architecture, Method and Configuration System," Kenneth Ogami, filed on Mar. 27, 2008; 34 pages.
U.S. Appl. No. 12/765,400: "Autonomous Control in a Programmable System," Sullam et al., filed on Apr. 22, 2010; 30 pages.
International Search Report for International Application No. PCT/US10/33626 mailed Jun. 24, 2010; 3 pages.
The Written Opinion of the International Search Report for International Application No. PCT/US10/33626 mailed Jun. 24, 2010; 5 pages.
USPTO Non-Final Rejection for U.S. Appl. No. 12/060,176 dated Mar. 30, 2010; 22 pages.
John Mangino, "Using DMA with High Performance Peripherals to Maximize System Performance," 2007, Texas Instruments, pp. 1-23; 23 pages.
Balough et al., "White Paper: Comparing IP Integration Approaches for FPGA Implementation," Feb. 2007, Version 1.1, Altera, pp. 1-7; 7 pages.
A.F. Harvey, "DMA Fundamentals on Various PC Platforms," 2001, 2004, National Instruments Corporation, pp. 1-19; 19 pages.
Vixel, "InSpeed SOC 320 Embedded Storage Switch," 2003, Vixel, pp. 1-5; 5 pages.
USPTO Non-Final Rejection for U.S. Appl. No. 12/058,569 dated Aug. 2, 2010; 9 pages.
USPTO Miscellaneous Action for U.S. Appl. No. 10/113,581 dated Jun. 23, 2010; 6 pages.
USPTO Miscellaneous Action for U.S. Appl. No. 10/001,478 dated Feb. 23, 2010; 5 pages.
USPTO Notice of Allowance for U.S. Appl. No. 10/001,478 dated Jun. 2, 2010; 11 pages.
USPTO Notice of Allowance for U.S. Appl. No. 11/985,340 dated Jun. 9, 2010; 8 pages.
USPTO Notice of Allowance for U.S. Appl. No. 11/850,260 dated Jul. 2, 2010; 8 pages.
USPTO Notice of Allowance for U.S. Appl. No. 12/060,128 dated Oct. 19, 2009; 8 pages.
USPTO Non-Final Rejection for U.S. Appl. No. 09/975,338 dated Apr. 30, 2010; 2 pages.
USPTO Non-Final Rejection for U.S. Appl. No. 11/857,947 dated Feb. 3, 2010; 23 pages.
USPTO Non-Final Rejection for U.S. Appl. No. 11/857,947 dated Jul. 21, 2010; 15 pages.
USPTO Non-Final Rejection for U.S. Appl. No. 11/968,145 dated Mar. 4, 2010; 11 pages.
USPTO Final Rejection for U.S. Appl. No. 11/968,145 dated Aug. 2, 2010; 6 pages.
USPTO Non-Final Rejection for U.S. Appl. No. 12/104,678 dated Jul. 2, 2010; 8 pages.
USPTO Advisory Action for U.S. Appl. No. 09/994,601 dated Mar. 23, 2010; 2 pages.
USPTO Non-Final Rejection for U.S. Appl. No. 11/818,005 dated Oct. 26, 2010; 10 pages.
USPTO Final Rejection for U.S. Appl. No. 12/132,527 dated Oct. 14, 2010; 8 pages.
USPTO Notice of Allowance for U.S. Appl. No. 09/998,848 dated Oct. 13, 2010; 4 pages.
USPTO Non-Final Rejection for U.S. Appl. No. 09/998,848 dated Jun. 21, 2010; 15 pages.
USPTO Advisory Action for U.S. Appl. No. 09/998,848 dated Feb. 24, 2010; 3 pages.
USPTO Non-Final Rejection for U.S. Appl. No. 09/989,767 dated Jul. 9, 2010; 22 pages.
USPTO Non-Final Rejection for U.S. Appl. No. 09/989,771 dated Jul. 20, 2010; 12 pages.
USPTO Advisory Action for U.S. Appl. No. 09/989,771 dated Feb. 3, 2010; 3 pages.
USPTO Miscellaneous Action for U.S. Appl. No. 10/113,581 dated Jun. 21, 2010; 6 pages.
USPTO Notice of Allowance for U.S. Appl. No. 10/113,581 dated Sep. 3, 2010; 11 pages.
USPTO Notice of Allowance for U.S. Appl. No. 12/057,149 dated Nov. 30, 2010; 7 pages.
USPTO Final Rejection for U.S. Appl. No. 12/060,176 dated Oct. 12, 2010; 22 pages.
USPTO Non-Final Rejection for U.S. Appl. No. 11/698,660 dated Dec. 13, 2010; 20 pages.
USPTO Notice of Allowance for U.S. Appl. No. 11/644,100 dated Jan. 6, 2011; 6 pages.
USPTO Non-Final Rejection for U.S. Appl. No. 11/201,922 dated Dec. 28, 2010; 14 pages.
USPTO Final Rejection for U.S. Appl. No. 11/166,622 dated Dec. 7, 2010; 12 pages.
USPTO Non-Final Rejection for U.S. Appl. No. 11/166,622 dated Jun. 22, 2010; 11 pages.
USPTO Final Rejection for U.S. Appl. No. 09/989,771 dated Jan. 4, 2011; 12 pages.
USPTO Non-Final Rejection for U.S. Appl. No. 09/975,338 dated Apr. 30, 2010; 10 pages.
USPTO Non-Final Rejection for U.S. Appl. No. 11/818,005 dated Oct. 26, 2010; 10 pages.
USPTO Final Rejection for U.S. Appl. No. 12/132,527 dated Oct. 14, 2010; 8 pages.

USPTO Non-Final Rejection for U.S. Appl. No. 12/004,833 dated Dec. 21, 2010; 8 pages.
USPTO Notice of Allowance for U.S. Appl. No. 12/058,569 dated Dec. 13, 2010; 6 pages.
USPTO Notice of Allowance for U.S. Appl. No. 12/057,149 dated Nov. 30, 2010; 7 pages.
USPTO Final Rejection for U.S. Appl. No. 12/060,176 dated Oct. 12, 2010; 22 pages.
USPTO Final Rejection for U.S. Appl. No. 11/857,947 dated Jan. 4, 2011; 14 pages.
USPTO Non-Final Rejection for U.S. Appl. No. 11/968,145 dated Jan. 5, 2011; 8 pages.
USPTO Final Rejection for U.S. Appl. No. 12/104,678 dated Dec. 3, 2010; 9 pages.
USPTO Non-Final Rejection for U.S. Appl. No. 09/989,782 dated Oct. 27, 2009; 9 pages.
USPTO Advisory Action for U.S. Appl. No. 11/779,439 dated Mar. 30, 2009; 3 pages.
USPTO Notice of Allowance for U.S. Appl. No. 10/001,478 dated Sep. 7, 2010; 10 pages.
USPTO Notice of Allowance for U.S. Appl. No. 11/818,005 dated Oct. 26, 2010; 10 pages.
USPTO Final Rejection for U.S. Appl. No. 12/132,527 dated Oct. 14, 2010; 8 pages.
USPTO Non-Final Rejection for U.S. Appl. No. 11/201,627 dated Sep. 30, 2010; 6 pages.
USPTO Final Rejection for U.S. Appl. No. 11/698,660 dated Sep. 03, 2010; 19 pages.
USPTO Advisory Action for U.S. Appl. No. 11/698,660 dated Nov. 10, 2010; 3 pages.
USPTO Non-Final Rejection for U.S. Appl. No. 11/644,100 dated Sep. 15, 2010; 10 pages.
USPTO Non-Final Rejection for U.S. Appl. No. 11/201,922 dated Jun. 11, 2010; 12 pages.
USPTO Final Rejection for U.S. Appl. No. 12/060,176 dated Oct. 12, 2010; 22 pages.
USPTO Advisory Action for U.S. Appl. No. 12/136,577 dated Oct. 29, 2010; 3 pages.
USPTO Non-Final Rejection for U.S. Appl. No. 11/644,100 dated Dec. 16, 2009; 13 pages.
USPTO Final Rejection for U.S. Appl. No. 11/166,622 dated Mar. 18, 2010; 12 pages.
USPTO Notice of Allowance for U.S. Appl. No. 12/902,137 dated Aug. 5, 2011; 7 pages.
USPTO Non-Final Rejection for U.S. Appl. No. 12/902,137 dated Mar. 11, 2011; 9 pages.

* cited by examiner

PROGRAMMABLE MICROCONTROLLER ARCHITECTURE

RELATED UNITED STATES APPLICATION

This utility application claims priority to U.S. Provisional Patent Application, Ser. No. 60/243,708, entitled "Advanced Programmable Microcontroller Device," with filing date Oct. 26, 2000, by Warren Snyder, et al., and assigned to the assignee of the present application.

BACKGROUND OF THE INVENTION

1. Field of the Invention

The present invention relates to the field of microcontrollers. Specifically, embodiments of the invention relate to a microcontroller system architecture effectuating both analog and digital programmable circuits.

2. Related Art

Microcontrollers have become commonplace in the thirty years since their introduction. They have all but replaced mechanical and electromechanical components in the area of control over "real world" activities. For applications now controlled by microcontrollers, control functions therein are now much more functional, reliable, and economical.

Major improvements in microcontroller design since their introduction have made them nearly ubiquitous in modem control applications. The in-circuit emulator improved debugging and the integration of hardware and software. Embedded application development effectuated by C and other compilers has reduced software development time and allowed much larger programs and concomitantly more complex applications. One time programmability (OTP) of microcontrollers extended their utility, particularly for highly specialized and/or low volume applications. Programmability also improved the development cycle for users of microcontrollers.

Microcontrollers have embedded processors, memories, power sources, voltage references, voltage/power and temperature sensors, timers, oscillators, and other circuits. Various microcontrollers have differing features, including capacities. The 8-bit microcontrollers are an extremely useful, common, and well-populated class.

Contemporarily, there are thousands of different 8-bit microcontrollers from a number of sources. Nevertheless, selecting a microcontroller for a particular application and/or matching a particular microcontroller to a specific application remains a challenge. First, selecting a particular microcontroller from the many available can be confusing and tedious. After a selection is made, changing design requirements, engineering solutions, and/or unexpected higher capacity requirements often require scrapping the original selection and repeating the confusing and tedious selection process.

Conventionally, these problems may be addressed by custom designing a microcontroller with a "perfect," e.g., exact, particular combination of required peripheral functionalities, and no surplusage, incorporating all needed functions, and eliminating a requirement for any external chips. This is demanding of time and resources, because it requires custom design and manufacturing operations for each selected application. It is expensive, in as much as it can take no advantage of the usual electronics industry economies of scale, which otherwise typically hold electronic prices at reasonably low levels.

Microcontrollers effectuate a wide range of applications in modem electronic installations into which they are functionally integrated. One major microcontroller utilization is the embedded system application. Most embedded system applications interface to the "real world." This real world is analog in nature, and most microcontrollers interfacing with it offer an analog to digital (A/D) converter; true analog peripherals are rare. However, many microcontroller designs with real world interfacing embedded systems require that analog signals be multiplied, filtered, or otherwise conditioned before conversion to digital. While conventional analog functional components are available for use with microcontrollers, they are custom components and still require a separate microcontroller and an effective electrical coupling and signal synchronization and transfer modality to effectuate their use therewith. This is inefficient and costly.

Microcontrollers have a number of components to effectuate device application. Such components in conventional microcontrollers have fixed functions, which a are disadvantageous in two major ways. First, in selecting a microcontroller for a particular application, it must be known in advance precisely which functions are required to effectuate that application and that this functional requirement is static. Second, specifying any particular function carries a cost, in as much as that function is static. The following example illustrates this second limitation.

A conventional microcontroller with "off the shelf" availability is selected for a particular application because it has a timer functionality, required by the application for which it is to be used. To effectuate this particular microcontroller's timer functionality, the microcontroller has two integrated timing components. However, the application at hand may be effectuated by the microcontroller if it had only a single timer component. This is wasteful of chip resources, power and computing demands, etc. Yet finding an exact, or even closer match from the finite supply of available microcontrollers with off the shelf availability is difficult and time consuming.

This limitation can be offset by negotiation with the microcontroller manufacturer for a custom designed and built chip, or the user, seeking the microcontroller for the particular application at hand may continue to search for another microcontroller with off the shelf availability, having components more closely matching the requirements of the application at hand. However, as discussed above, either of these solutions is also costly in terms of time, resources, and/or expense.

Further, microcontrollers employing conventional component technology have individual characteristic spectra of application, which are typically rather limited and static. Often, particular microcontrollers have rather precisely defined design functionalities, which are static and unchangeable, or changeable only in rather limited ways. Thus in this regard, conventional microcontrollers applications are inherently one dimensional and inflexible. This is also true of other circuits, such as an application specific integrated circuit (ASIC).

Conventional microcontrollers themselves are not reconfigurable to any convenient degree. A relatively small fraction of available conventional microcontrollers, and those implementing very general functions, have some degree of reconfigurability. However, the degree of reconfigurability is very limited. For example, one particular type of conventional microcontrollers implementing very general functions includes logic devices such as programmable gate arrays. Programmable gate arrays typically are characterized by very fine grained logic architectures.

In so far as programmable gate arrays are reconfigurable at all, their reconfiguration is a static process, requiring a programmable gate array being so reconfigured to be out of service during the process, which takes an inordinate amount of time and requires a heavy price in computational resources.

This is because the fine grain architecture of the programmable gate array being reconfigured demands thousands, for some common reconfigurations even millions of bits of information to be written, for each and every logic block requiring re-writing to effectuate the reconfiguration.

The conventional art is problematic because it generally fails to address the limitations of individual microcontroller and integrated circuit (IC) applicability and flexibility, and configurablity and programmability. Where reconfigurability is possible at all in conventional microcontrollers and ICs, it is typically achieved statically, with the microcontroller or IC out of service, to a very limited degree, and requires relatively long times and informational input to achieve. Custom designed analog-based devices are coupled with microcontrollers and/or ICs in such a way as to harmonize their operations in particular microcontroller/IC applications requiring analog functionality. Contemporary solutions to these problems using conventional resources are inadequate because of the time and effort required for custom choosing a particular conventional microcontroller/IC design for a certain application from a relatively limited field, resource costs of functionalities selected in the conventional microcontrollers/ICs selected, and the inordinate expense of custom chips, such as ASICs.

SUMMARY OF THE INVENTION

What is needed is a method of integrating a system with a microcontroller and integrated circuits (ICs) on a single chip to effectuate a single-chip system, including analog functionality, and/or a system so integrated with a microcontroller and/or other IC. What is also needed is a single-chip system which has sufficient flexibility to function in a very wide range of multiple applications, including applications wherein integrated analog functionalities are required. Further, what is needed is a method of programming and dynamically reconfiguring a single-chip system, and a single-chip system which is so programmable and dynamically reconfigurable. Further still, what is needed is a single-chip system which achieves the foregoing advantages and yet is relatively inexpensive and simple to configure, apply, use, and reconfigure.

Embodiments of the present invention provide an integrated system with a microcontroller and integrated circuits ICs on a single chip to effectuate a single-chip system, including programmable analog and digital functionality and a microprocessor, and a method of configuring such an integrated system. The present invention also provides a single-chip system which has sufficient flexibility to function in a very wide range of multiple applications, including applications wherein integrated analog functionalities are required. Further, the present invention provides a method of programming and dynamically reconfiguring a single-chip system, and a single-chip system which is so programmable and dynamically reconfigurable. Further still, the present invention provides a single-chip system which achieves the foregoing advantages and yet is relatively inexpensive and simple to configure, apply, use, and reconfigure.

Embodiments of the present invention are directed to a microcontroller device having a microprocessor, programmable memory components, and programmable analog and digital blocks. The programmable analog and digital blocks are configurable based on programming information stored in the memory components. Programmable interconnect logic, also programmable from the memory components, is used to couple the programmable analog and digital blocks as needed. The advanced microcontroller design also includes programmable input/output blocks for coupling selected signals to external pins. The memory components also include user programs that the embedded microprocessor executes. These programs may include instructions for programming the digital and analog blocks "on-the-fly," e.g., dynamically. In one implementation, there are a plurality of programmable digital blocks and a plurality of programmable analog blocks.

In one embodiment, the present invention provides a method of integrating a system with a microcontroller/IC on a single chip to effectuate a single-chip system, including programmable analog functionality. Another embodiment provides a system so integrated with a microcontroller/IC. In one embodiment, the present invention also provides a single-chip system which has sufficient flexibility to function in a very wide range of multiple applications, including applications wherein integrated analog functionalities are required. In the present embodiment, the single-chip system is capable of executing a wide range of applications requiring programmable mixed (analog and digital) signals. In the present embodiments, both digital and analog functionalities are effectuated in block components integrated with a microcontroller/IC on a single chip. These block components are complete functional units, each with a very large number of operations programmed within them.

In one embodiment, the present invention further provides a method of programming and dynamically reconfiguring a single-chip system, and a single-chin system which is so programmable and dynamically reconfigurable. The programming is effectuated, in one embodiment, by firmware executing a series of instructions run by a microprocessor component of the microcontroller/IC. In one embodiment, a new microcontroller/IC programming paradigm is effectuated, wherein a user of the single-chip system loads a configuration into the functional blocks and/or programmable interconnects electrically coupling the functional blocks with each other, with other microcontroller components, and with the outside world.

In one embodiment, the programmable interconnects configure, not only the functional blocks, but also the way in which the functional blocks intercommunicate. In one embodiment, actual connection pins of the device can be configured to communicate with different internal resources, allow intercommunication via different methods and/or modalities, and actual reconfiguration of the internal structure of the device. In one embodiment, the reconfigurability features effectuate dynamic reconfiguring and programming, with no need to take the single-chip system out of service. The single-chip system can be dynamically reconfigured "on the fly," easily and in very little time. Advantageously, these features effectuate the ability to program microcontroller/IC sequences and simultaneously program unique hardware functions that are expressible via the newly configured single-chip system.

In one embodiment, the present invention provides a single-chip system which achieves the foregoing advantages and yet is relatively inexpensive and simple to configure, apply, use, and reconfigure. The inherent great flexibility and widespread applicability of microcontroller systems of the present embodiments obviates searching, shopping, and research for the "right" microcontroller and mix of functionalities and/or design and manufacture of custom microcontroller and mix of system functionalities. Real savings in effort, time, and cost are effectuated by embodiments of the present invention.

These and other advantages of the present invention will become obvious to those of ordinary skill in the art after reading the following detailed description of the preferred embodiments, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

FIG. 12B is a schematic diagram of the switched capacitor block of FIG. 12A in accordance with one embodiment of the present invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

In the following description of an embodiment of the present invention, reference is made to an exemplary microcontroller with an integrated system incorporated into a single functional device. It is appreciated that the exemplary microcontroller is illustrative only, and that embodiments of the present invention may be facilitated on any integrated circuit. The exemplary embodiments described herein do not, and are not meant to limit the application of embodiments of the present invention to microcontrollers, or to any specific integrated circuit device or type.

Figure 1A:
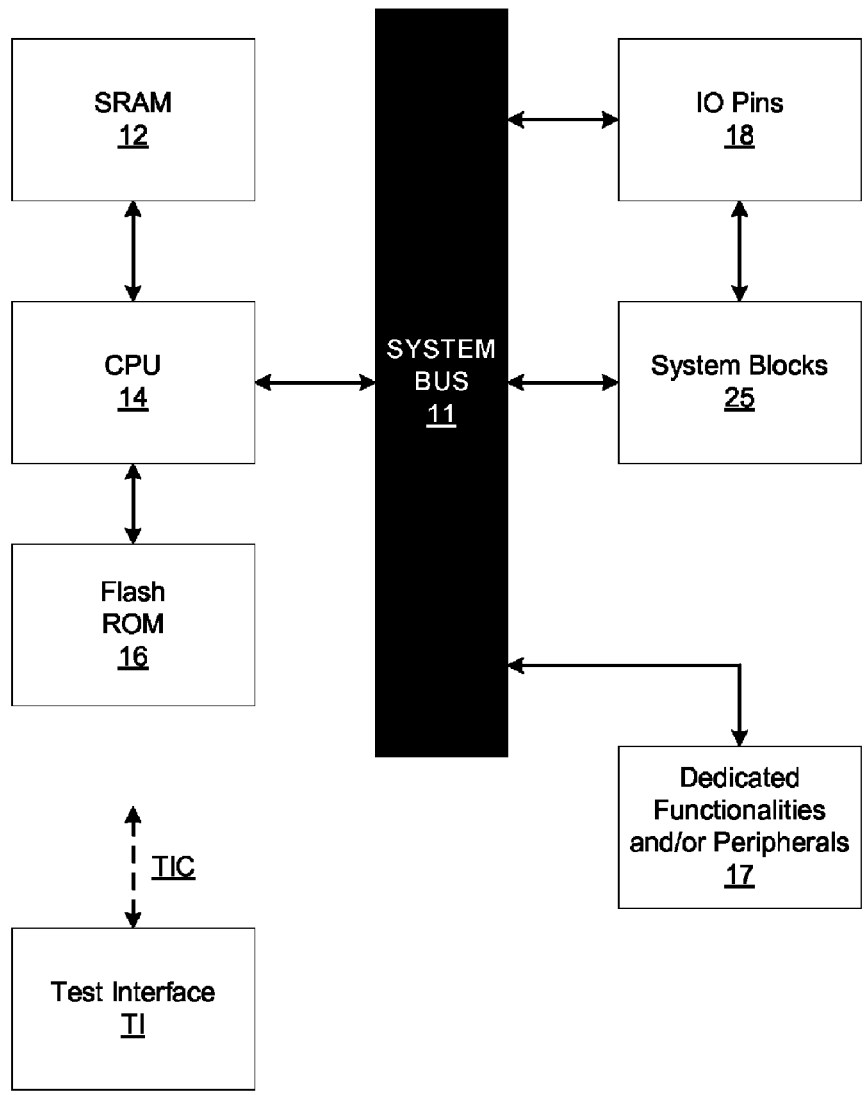
FIG. 1A is a high level block diagram showing an exemplary integrated circuit (or microcontroller) upon which embodiments of the present invention may be implemented.

FIG. 1A is a block diagram showing a high level view of an exemplary integrated circuit (or microcontroller) 10 upon which embodiments of the present invention may be implemented. In this embodiment, integrated circuit 10 includes a bus 11, and coupled to bus 11 are synchronous random access memory (SRAM) 12 for storing volatile or temporary data during firmware execution, central processing unit (CPU) 14 for processing information and instructions, flash read-only memory (ROM) 16 for holding instructions (e.g., firmware), input/output (I/O) pins providing an interface with external devices and the like, and system function blocks 25. The system function blocks 25 include both analog blocks 20, and digital blocks 100, which are further described below. A test interface TI may be coupled to integrated circuit 10 via a test interface coupler TIC, which may be detachable, to perform debugging operations during startup and initialization of the integrated circuit.

In the present embodiment, flash ROM 16 stores parameters describing microcontroller 10, allowing microcontroller 10 to be programmed during production, during system testing, or in the field. It is contemplated that microcontroller 10 may also be self-programmed remotely. System function blocks 25 are configurable system resources that can reduce the need for other microcontroller parts and external components.

Figure 1B:
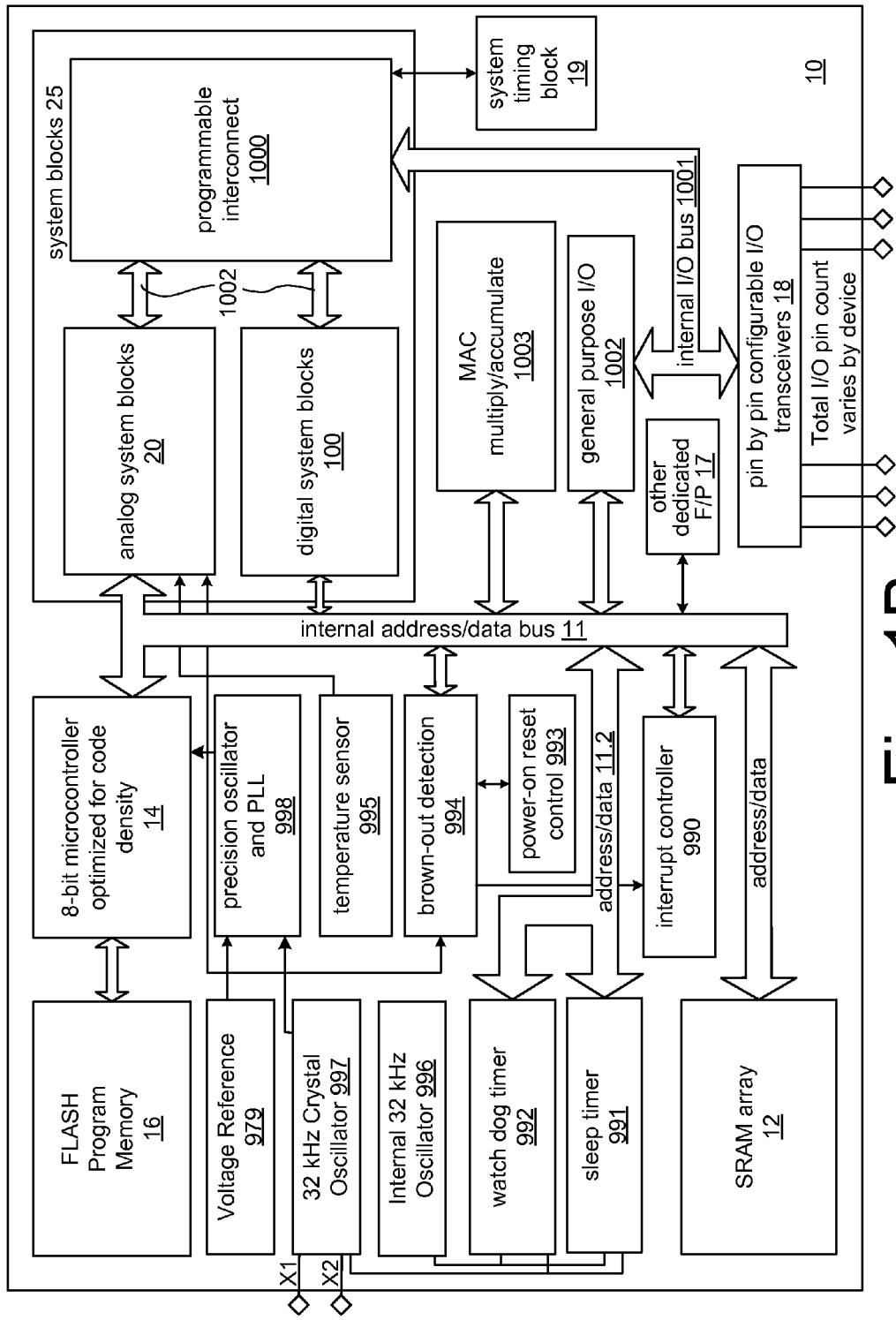
FIG. 1B is a block diagram showing in some greater detail an exemplary integrated circuit (or microcontroller) upon which embodiments of the present invention may be implemented.

With reference to FIG. 1B, an exemplary integrated circuit (or microcontroller) 10 upon which embodiments of the present invention may be implemented is shown in greater detail. It is seen that system blocks 25 are constituted by at least three (3) distinct functionalities. These functionalities include analog system blocks 20, digital system blocks 100, and programmable interconnects 1000. Further, it is seen that the digital system blocks 100 and the analog system blocks 20 are coupled to the programmable interconnect 1000 by intra-block routing channels 1002. The programmable interconnect 1000 is connected via an internal input/output (I/O) bus 1001 to pin by pin configurable I/O transceivers 18, which effectuate communicative coupling between system 10 and external modalities. The total pin count of pin by pm configurable I/O transceivers 18 may vary from one application to another, depending on the system device under consideration. A system timing block 19 is also coupled to programmable interconnect 1000.

System timing block 19 includes system timing information used, among other things, for synchronizing and otherwise effectuating interfacing between system functionalities. System timing block 19, like system blocks 25, is programmable. Advantageously, this allows system timing block 19 to generate a myriad of different time bases, as required for any particular application the system is being configured to effectuate. These time bases may be fed into analog system blocks 20 and digital system blocks 100, for use therein, via programmable interconnect 1000. Examples of analog functions requiring such time bases, executed by analog system blocks 20 include conversions, modulations, and the like. One striking example of a digital function requiring such time bases, executed by digital system blocks 100 is their universal asynchronous receiver transmitter (UART) functionality.

Figure 1C:
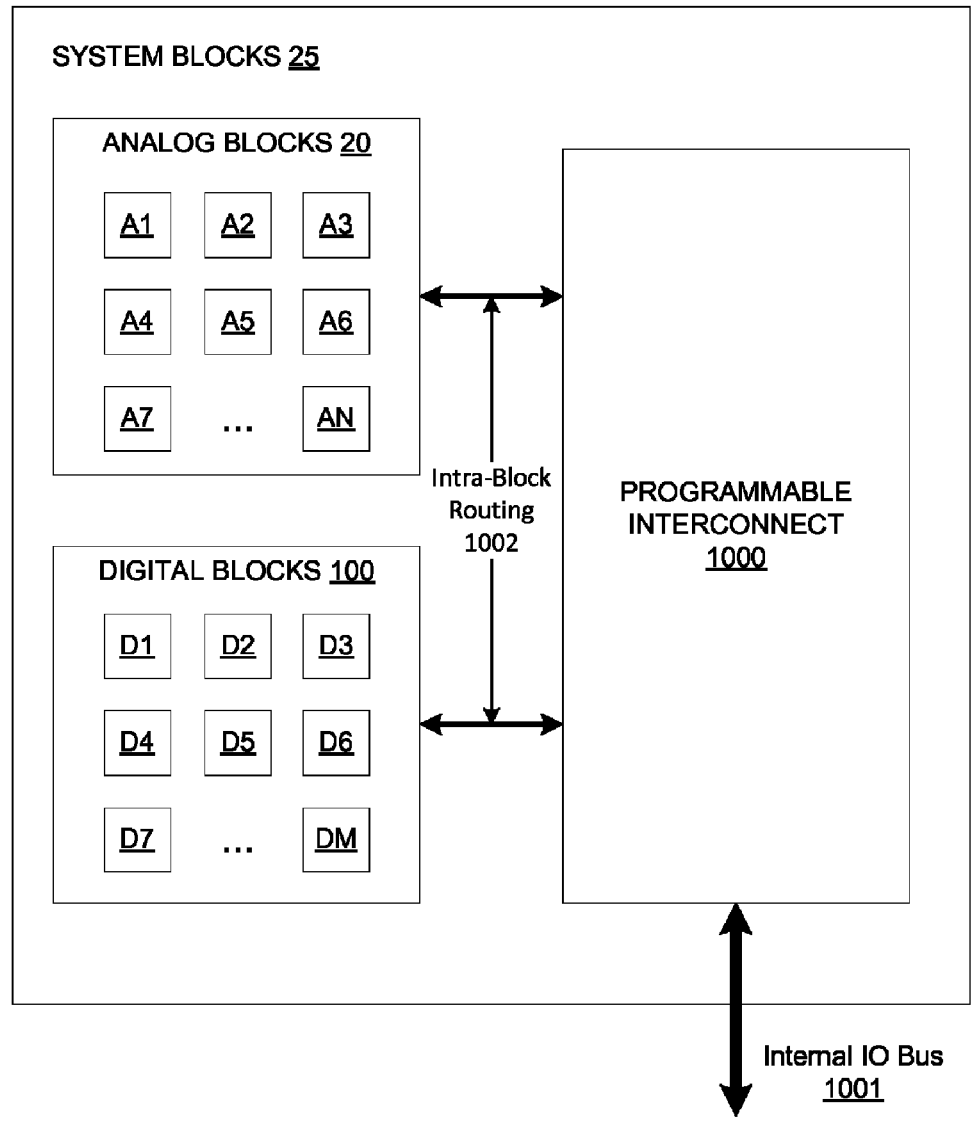
FIG. 1C is a block diagram showing in some greater detail the analog, digital, and timing blocs of an exemplary integrated circuit (or microcontroller) upon which embodiments of the present invention may be implemented.

Referring to FIG. 1C, system block 25 is depicted in greater detail. System block 25 is constituted, in one embodiment, by a distinct analog functional block 20, a distinct digital functional block 100, and a programmable interconnect 1000. Analog block 20 is seen to be constituted, in the present embodiment, by a matrix interconnecting internally N analog sub-blocks A1 through AN. The number N may be any number of analog sub-blocks required for a particular application. Likewise, digital block 100 is seen to be constituted, in the present embodiment, by a matrix interconnecting internally M digital sub-blocks D1 through DM. The number M may be any number of digital sub-blocks required for a particular application.

Figure 16:
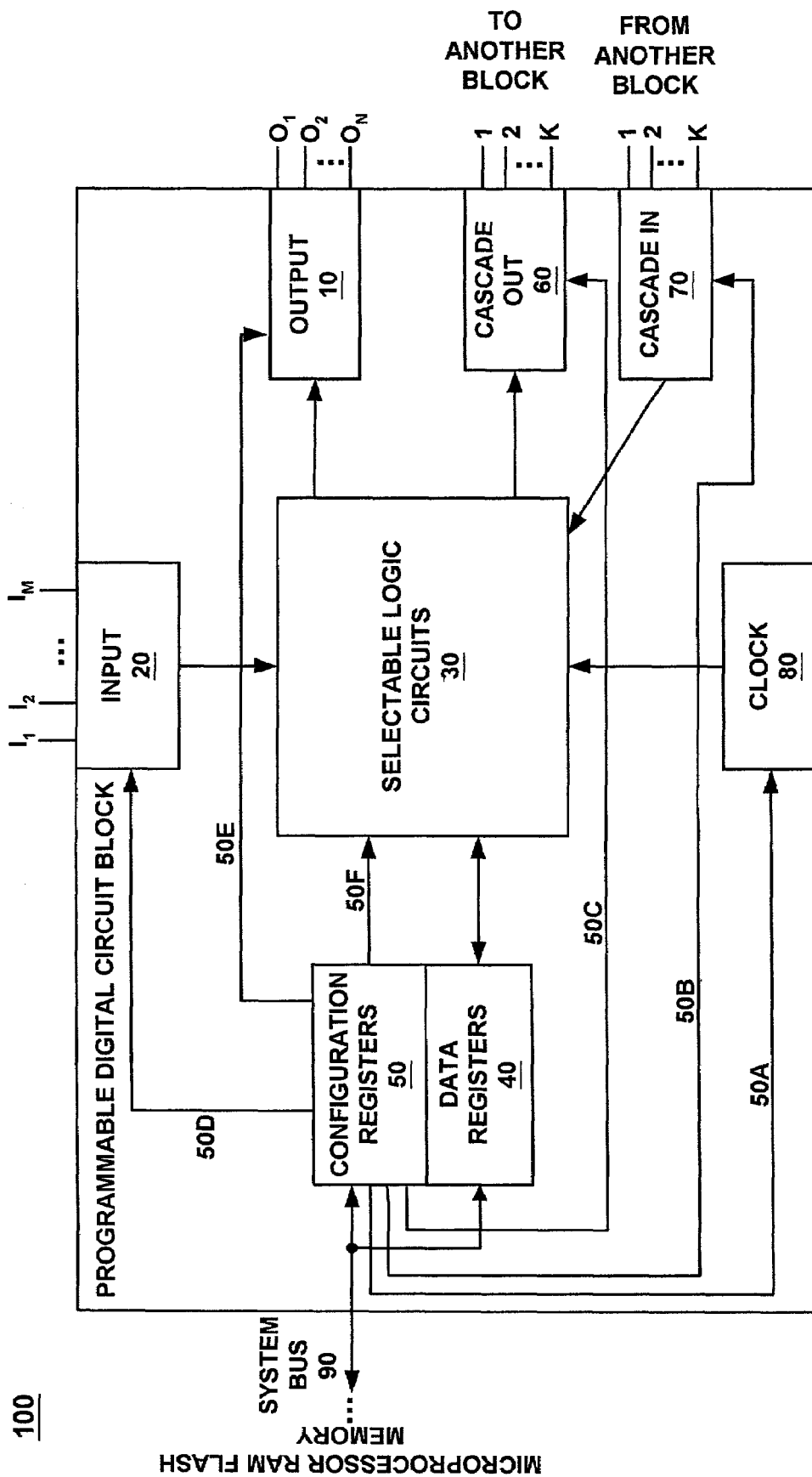
FIG. 16 illustrates a programmable digital circuit block in accordance with an embodiment of the present invention.
Figure 26:
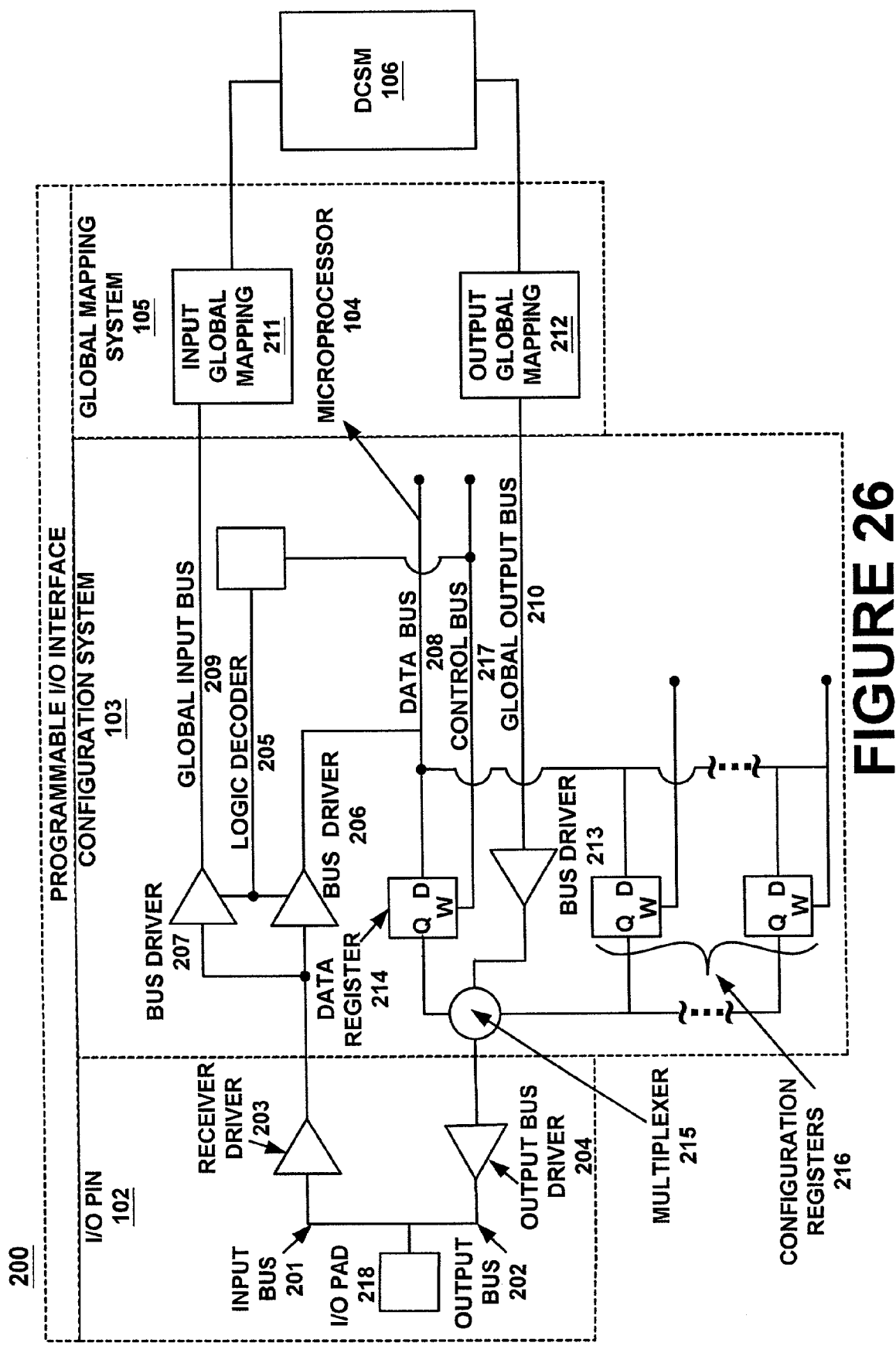
FIG. 26 is a block diagram of a configurable input/output interface as embodied by the present invention.

The internal matrices of analog blocks 20 and digital blocks 100 may be constituted, in one embodiment, partially by a routing matrix (e.g., global mapping system 105; FIG. 26). Any number of analog sub-blocks less than N may constitute registers (e.g., registers 50; FIG. 16), including configuration registers. Likewise, any number of digital sub-blocks less than M may constitute registers, including configuration registers. Configuration registers (e.g., configuration registers 50: FIG. 16), will be discussed in detail below. Analog blocks 20 and digital blocks 100 are electrically and/or communicatively coupled to programmable interconnect 1000, in the present embodiment, by intra-block routing 1002. Analog block 20 and digital block 100, having multiplicities N and M of respective sub-blocks, are effectively both pluralities of functional units with a communicatively coupling internal matrix constitution.

Thus, each individual functional unit, e.g., sub-blocks A1 through AN and D1 through DM, may communicate and interact with each and/or any other functional unit. Which functional unit communicates with which other functional unit is programmable, via the configurablity of the programmable interconnect 1000. Advantageously, this allows users to choose communicative interactions between functional units, further promoting system flexibility. It is seen that programmable interconnect 1000 has an input global mapping unit 211 and an output global mapping unit 212. The global mapping units 211 and 212 promote the configurability of the system 10 (FIGS. 1A, 1B) by mapping the communicative interaction between the functional units.

A hierarchy of programmable interconnectivity is effectuated within system 10. Pin by pin configurable I/O transceivers 18 and input and output global mapping units 211 and 212, respectively, on programmable interconnect 1000, effectuate configurable interconnectivity between the system 10 and the "outside world," as well as the microcontroller SRAM, ROM, and CPU components 12, 16, and 14, respectively (FIGS. 1A, 1B). These microcontroller components are communicated with via the system bus 11, and addressed via the programmable interconnect 1000 by the functional unit 25. Further, several sub-blocks within the analog and digital system blocks 20 and 100, respectively, are assigned addresses that are mapped onto system bus 11. Thus, the master computer system, e.g., the microcontroller, can re-write the blocks as memory functions, e.g., in SRAM 12.

Correspondingly, the memory function within each functional block 20 and 100 has specific functions allocated to them. These memory functionalities are registers (e.g., registers 50; FIG. 16) and will be discussed in detail below. To illustrate cursorily, one of the digital functional sub-blocks, e.g., DM, has a memory register location, which is that particular subblock's assigned function. If the microcontroller writes into the functional register of a sub-block, it may change the function of the sub-block to another function. This is one mechanism of functional dynamic reconfigurability, and will be discussed in greater detail below.

Other blocks affect autonomous system operations, such as interrupts. Thus, it is determined by configuring it whether a block will generate an interrupt into the computer system (e.g., the microcontroller) or not. Other registers within a block determine whether a block may accept data from the I/O, or from a neighboring or distant other block. This is the function of the configuration registers (e.g., configuration registers 50: FIG. 16), to be discussed in detail below. Writing to configuration registers changes the functional operability of a block.

Analog blocks 20 and digital blocks 100 share some similarities. However, analog blocks 20 have an added parametric setting register among its sub-blocks A1 through AN. Parametric settings effectuate functionalities related to physical parameters, such as potential voltages, current amperages, and ratios which cause amperage and/or voltage transitions to occur. Parametric settings may be varied by writing into, e.g., programming the parametric setting registers. To illustrate, if a block is implementing an A/D conversion function, a voltage value that the block generates, e.g., a signal amplitude, is detected by a set of registers. Writing to, e.g., programming the appropriate parametric setting register may cause the block to change its output signal potential amplitude.

Typically, all of the configuration settings on a digital block 100 is within a small set of registers, in one embodiment four registers per block. The registers' capacity is eight bits. Special hardware within the microcontroller load into block 100 from a table 16T within flash ROM 16 (FIGS. 1A, 1B), a configuration for as many (or as few) sub-blocks D1 through DM as necessary. Thus, within a single instruction, a configuration may be transferred from flash ROM 16 to the functional block 100.

Typically, configuration is static, and all blocks can be loaded with all of the requisite configuration register data in one operation. To change a particular subset of blocks from one configuration to another, another instruction is transferred from flash ROM 16 to the appropriate blocks. This is effectuated by a hardware subsystem 14S within the microcontroller CPU 14 that directly reads from flash ROM 16, over the internal address/system data bus 11, to the appropriate locale within system block 25. Advantageously, this informational sequencing is quite rapid, conserving time and computational resources. This hardware 14S may be thought of as a morph transmogrifier, loading new state tables to system block 25 functional units designated for a new functionality.

Further, configuration registers exist for the programmable interconnect 1000, analog block 20, digital block 100, pin by pin configurable I/O transceiver 18, and routing. Thus, every function can be assigned a configuration state, loaded, and changed as required for an exceedingly wide range of applications.

FIG. 1B depicts a more detailed view, incorporating numerous other functionalities of the exemplary integrated circuit (or microcontroller) 10, which was discussed in overview above.

One possible functionality, which may be an application of a system incorporating features of the present embodiment, is analog to digital (A/D) conversion. In performing A/D conversion, it is necessary to get signals entering on certain of the pins constituting parts of pin by pin configurable I/O transceivers 18 into the system block in the process. Owing to uncertainty in which block a user configuring the system 10 for A/D conversion will choose for performing the A/D conversion function, as well as uncertainty as to which pins the user will select for routing relevant signals, a mechanism is necessitated to achieve the requisite routing from the pin to the actual functional block inside the system; and vice versa, because a corresponding waveform will be generated in the functional block, which must be brought back out for use. Importantly, keeping in mind one advantageous feature of the present embodiment, that the design of embodiments of the present invention is not to dictate their applicability, but rather to effectuate implementation of the largest possible spectrum of applicability, the configurability of pin by pin configurable I/O transceivers 18, programmable interconnect 1000, and system blocks 25 may be crucial.

In as much as dictating a specific requisite pin locale from which a particular signal will emerge from system 10 is undesirable, a routing modality incorporating features of the present embodiment effectuate the redirection of signals to an almost arbitrary location on pin by pin configurable I/O transceivers 18. Advantageously, this simultaneously maximizes flexibility and greatly enhances user convenience and system applicability. In one embodiment, this designed inherent reconfigurability functions as an exceptionally flexible signal routing capability.

Referring again to both FIG. 1A and FIG. 1B, a fixed system bus 11 electrically and/or communicatively transfers instructions, including sequencing instructions, between the microcontroller/IC central processing unit 14 and the rest of the system. Included in these transfers are microcontroller instructions to interrogate and/or otherwise communicate with the system blocks 25.

Dedicated functionalities and/or peripherals 17 is interconnected with system bus 11. Dedicated functionalities and/or peripherals 17 may include a plethora of common functions of value to the function of system 10. A multiplier/accumulator (MAC) 1003 combines arithmetic logic functions of multiplication, counting, and storage of arithmetic results.

With reference to FIG. 1B, a clocking architecture is effectuated, in one embodiment, by a number of components of an IC/microcontroller 10, including a precision oscillator and phase locked loop (PLL) 998 which provides timing signals to CPU 14. PLL 998 receives a precision voltage reference signal from a voltage reference 999, and timing signals from a 32 kHz crystal oscillator 997. The 32 kHz crystal oscillator 997 may be coupled via external timing connection terminals X1 and X2 to a high-precision external timing reference signal generator (not shown) for a variety of applications such as calibration and synchronization, etc. Also included in the microcontroller clocking architecture are a watch dog timer 992 and a sleep timer 991, which may, in one embodiment, address the system internal address/data bus 11 via a timing address/data sub-bus 11.2. An interrupt controller 990, in one embodiment, generates interrupt signals, as required.

A power on reset control unit 993 performs functions related to power supply stability, particularly on system startup. Power on reset control unit 993 works, in one embodiment, in conjunction with a brown-out detection unit 994, which detects substandard, subnominal power system parameters, which could have deleterious effects on system and/or microcontroller operation, and may generate interrupts and/or other warning and/or protective actions accordingly. The following co-pending U.S. application is hereby incorporated by reference, Ser. No. 09/887,955, by Warren Snyder and Harold Kutz, entitled "Novel Power On Reset Circuit For A Microcontroller," filed Jun. 22, 2001, and which is assigned to the assignee of the present invention. Further, the following co-pending U.S. application is also hereby incorporated by reference, Ser. No. 09/887,923, by Warren Snyder and Harold Kutz, entitled "Novel Method and System For Interaction Between A Processor and A Power On Reset Circuit To Dynamically Control Power States In A Microcontroller," filed Jun. 22, 2001, and which is also assigned to the assignee of the present invention.

Exemplary Programmable Analog Functionality

The following co-pending US application is hereby incorporated by reference, Ser. No. 09/909,047, by Monte Mar, entitled "A Programmable Analog System Architecture," filed Jul. 18, 2001, and which is assigned to the assignee of the present invention.

The present invention provides, in one embodiment, a programmable analog system architecture that is suited for a variety of applications and that can reduce development time and expenses. The programmable analog system architecture is integrated with a microcontroller that provides sequencing and programming instructions. The present invention introduces a single chip solution that contains a set of tailored analog blocks and elements that can be dynamically configured and reconfigured in different ways to implement a variety of different analog functions.

The analog system architecture can be generally referred to as a programmable analog "system-on-a-chip" block. Such progranimable blocks can be used in those applications that typically require multiple chips that may be fabricated using different technologies. Implementation in embedded applications, including audio, wireless, handheld, data communications, Internet control, and industrial and consumer systems, is contemplated.

In the present embodiment, the analog blocks 20 are arranged on a single integrated circuit, or chip. The analog blocks 20 can be electrically coupled in different combinations to perform different analog functions. Each analog block 20 can also be configured according to the function to be performed. In the present embodiment, the analog blocks 20 include analog elements that have changeable characteristics that can be specified according to the function to be performed. Inputs received by an analog block are directed through the analog block according to the specified characteristics of the analog elements. The combination of analog blocks 20 and the characteristics of the analog elements, and hence the analog function to be performed, can be dynamically programmed. A number of registers are configurable to store programming data for the programmable digital circuit blocks.

In one embodiment, the analog blocks 20 include switched analog blocks that can be electrically coupled to and decoupled from one or more other analog blocks. That is, latches and switches can be dynamically configured so that signals can be passed from one block to another, while other blocks are bypassed. Accordingly, a set of analog blocks can be selectively combined to implement a particular analog function. Other analog functions can be implemented by selectively combining a different set of analog blocks. In one embodiment, the switched analog blocks are switched capacitor blocks. In another embodiment, two different types of switched capacitor blocks are used; the two types are distinguishable according to the type and number of inputs they receive and how those inputs are treated. In yet another embodiment, the analog blocks also include continuous time blocks.

In one embodiment, the continuous time blocks and the switched capacitor blocks are arranged in rows and columns in an array. In one such embodiment, the array includes a first row of continuous time blocks and multiple rows of switched capacitor blocks, where the first row of continuous time blocks is disposed between the switched capacitor blocks and an edge of the array. In one embodiment, the analog blocks in a column are each coupled to a respective digital bus (that is, there is a digital bus for each column of analog blocks).

The analog functions that can be performed using the system architecture and method of the present invention include (but are not limited to) an amplifier function, a digital-to-analog converter function, an analog-to-digital converter function, an analog driver function, a low band pass filter function, and a high band pass filter function. The programmable analog circuit blocks may, in one embodiment, be constituted by a matrix of n by m analog configurable system macros, n and m independently being an integer of at least two. Each of said analog configurable system macros is configured to provide one or more analog functions, which may also include gain functions, comparator functions, switched capacitor functions, filter functions, analog-to-digital conversion functions, digital-to-analog conversion functions, and amplifier functions, among others. The programmable analog circuit may, in one embodiment, be constituted by a matrix of n by m number of programmable analog circuit blocks, each coupled to an adjacent block and configured to provide at least one of a plurality of analog functions.

FIG. 1A is a block diagram showing an exemplary integrated circuit (or microcontroller) 10 upon which embodiments of the present invention may be implemented. In this embodiment, integrated circuit 10 includes a bus 11, and coupled to bus 11 are synchronous random access memory (SRAM) 12 for storing volatile or temporary data during firmware execution, central processing unit (CPU) 14 for processing information and instructions, flash read-only memory (ROM) 16 for holding instructions (e.g., firmware), input/output (I/O) pins providing an interface with external devices and the like, and analog blocks 20. The analog blocks 20 are further described below. A test interface (not shown) may be coupled to integrated circuit 10 to perform debugging operations during startup and initialization of the integrated circuit.

In the present embodiment, flash ROM 16 stores parameters describing microcontroller 10, allowing microcontroller 10 to be programmed during production, during system testing, or in the field. It is contemplated that microcontroller 10 may also be self-programmed remotely.

Analog blocks 20 are configurable system resources that can reduce the need for other microcontroller parts and external components. In the present embodiment, analog blocks 20 include an array of twelve blocks. A precision internal voltage reference provides accurate analog comparisons. A temperature sensor input is provided to the array of analog blocks to support applications like battery chargers and data acquisition without requiring external components.

In the present embodiment, there are three types of analog blocks: continuous time blocks, and two types of switched capacitor blocks (referred to herein as type A and type B). Continuous time blocks provide continuous time analog functions. Continuous time blocks are described in further detail in conjunction with FIG. 4A.

Switched capacitor blocks provide discrete time analog functions such as analog-to-digital conversion (ADC) and digital-to-analog conversion (DAC) functions. The key difference between the type A and type B switched capacitor blocks is in generating biquad filters (see FIGS. 14A and 14B below). Both type A and type B blocks can implement basic switched capacitor functions (outside of filters), and the type A block can also function as a summing amplifier. Switched capacitor blocks are described in further detail in conjunction with FIGS. 9A and 10A, below.

Analog functions supported by integrated circuit 10 comprising analog blocks include, but are not limited to: 14-bit multi-slope and 12-bit delta-sigma ADC, successive approximation ADCs up to nine bits, DACs up to nine bits, programmable gain stages, sample and hold circuits, filters (high band pass and low band pass) with programmable coefficients, amplifiers, differential comparators, and temperature sensors.

Figure 2:
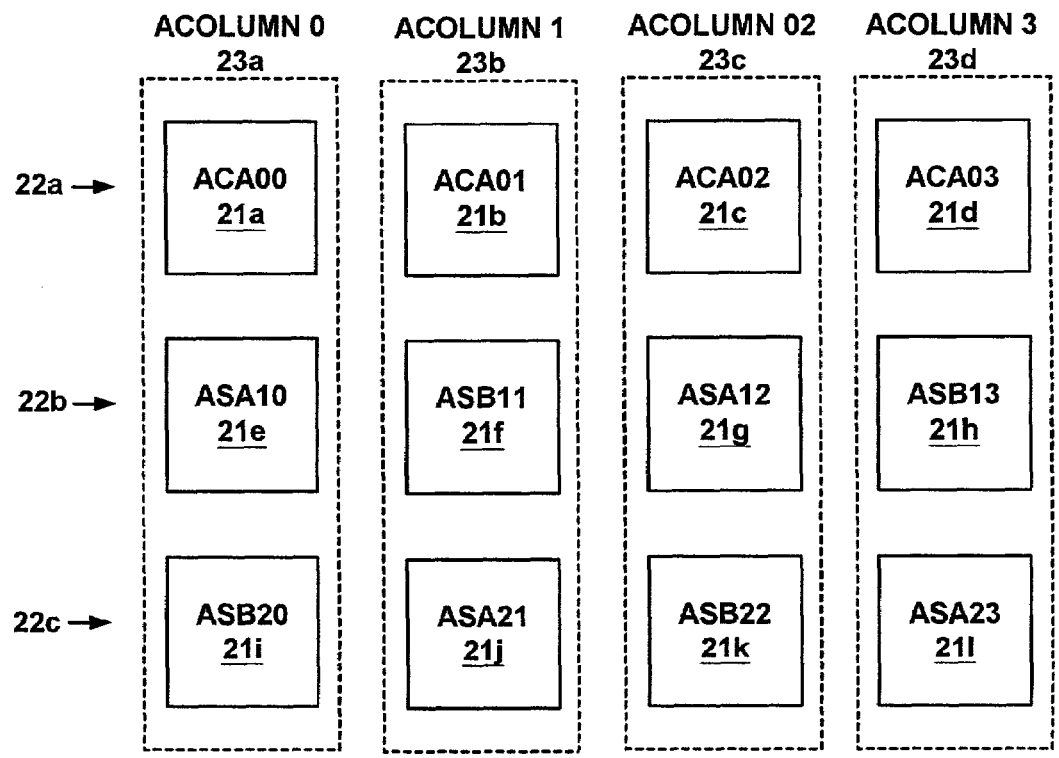
FIG. 2 shows an array of analog blocks in accordance with one embodiment of the present invention.

FIG. 2 shows an array of analog blocks 20 in accordance with one embodiment of the present invention. In this embodiment, there are twelve analog blocks 21a-21l arranged in an array of three rows 22a-22c by four columns 23a-23d. Each column 23a-d includes one of each type of analog block, e.g., a continuous time block 21a-d (designated "ACAxx"); a type A switched capacitor block 21e, 21g, 21j and 21l (designated "ASAxx"); and a type B switched capacitor block 21f, 21h, 21i, and 21k (designated "ASBxx"). Note that, in this embodiment, the type A and type B switched capacitor blocks in rows 22b and 22c are arranged in an alternating, or checkerboard, pattern.

In the present embodiment, the analog blocks 21a-l can be powered down individually to different power levels, so that it is not necessary for all of the blocks to be running at full power. In one embodiment, the analog blocks 21a-l have four power levels.

Figure 3:
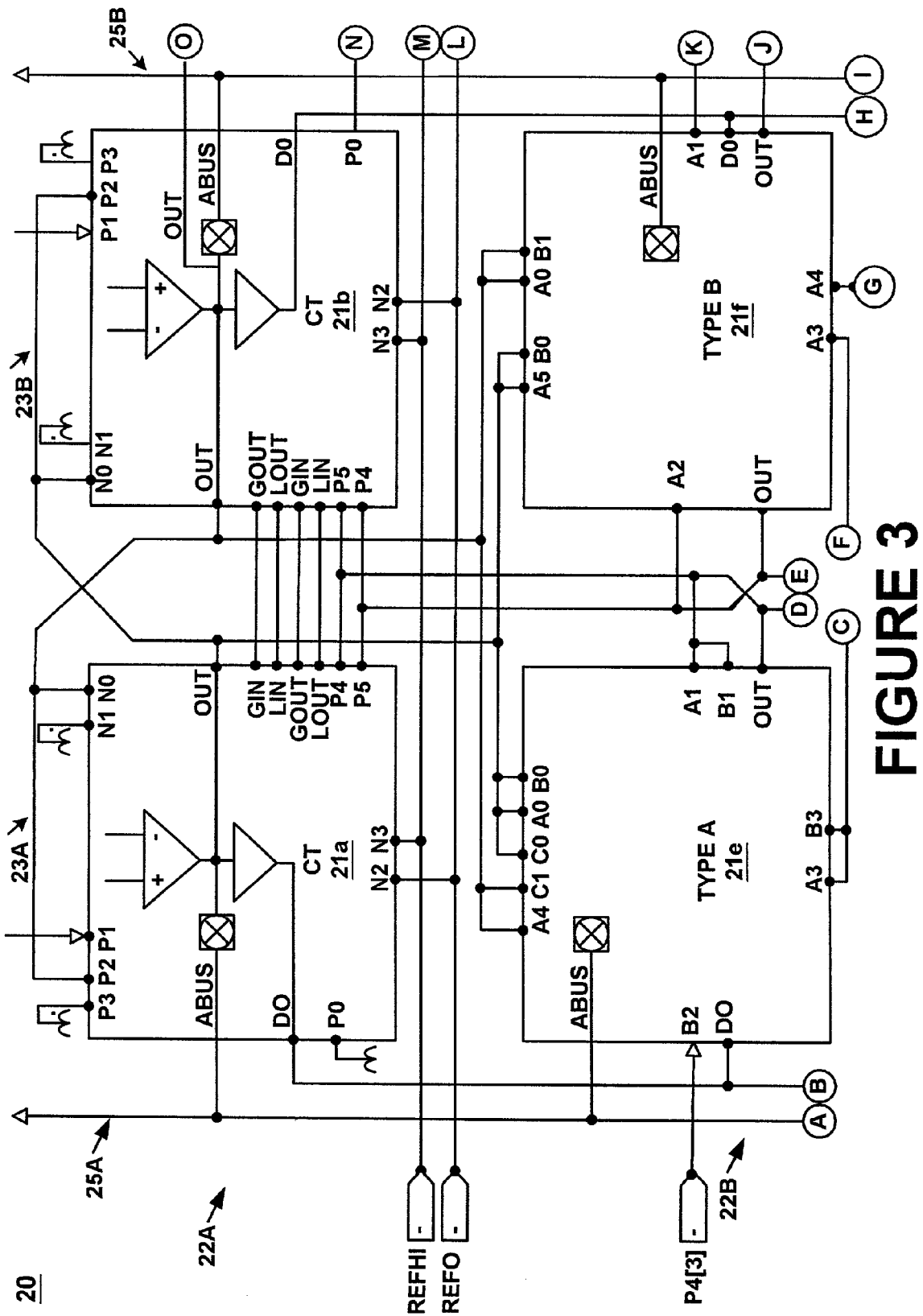
FIG. 3 shows the interconnects between analog blocks in an array in accordance with one embodiment of the present invention.
Figure 3:
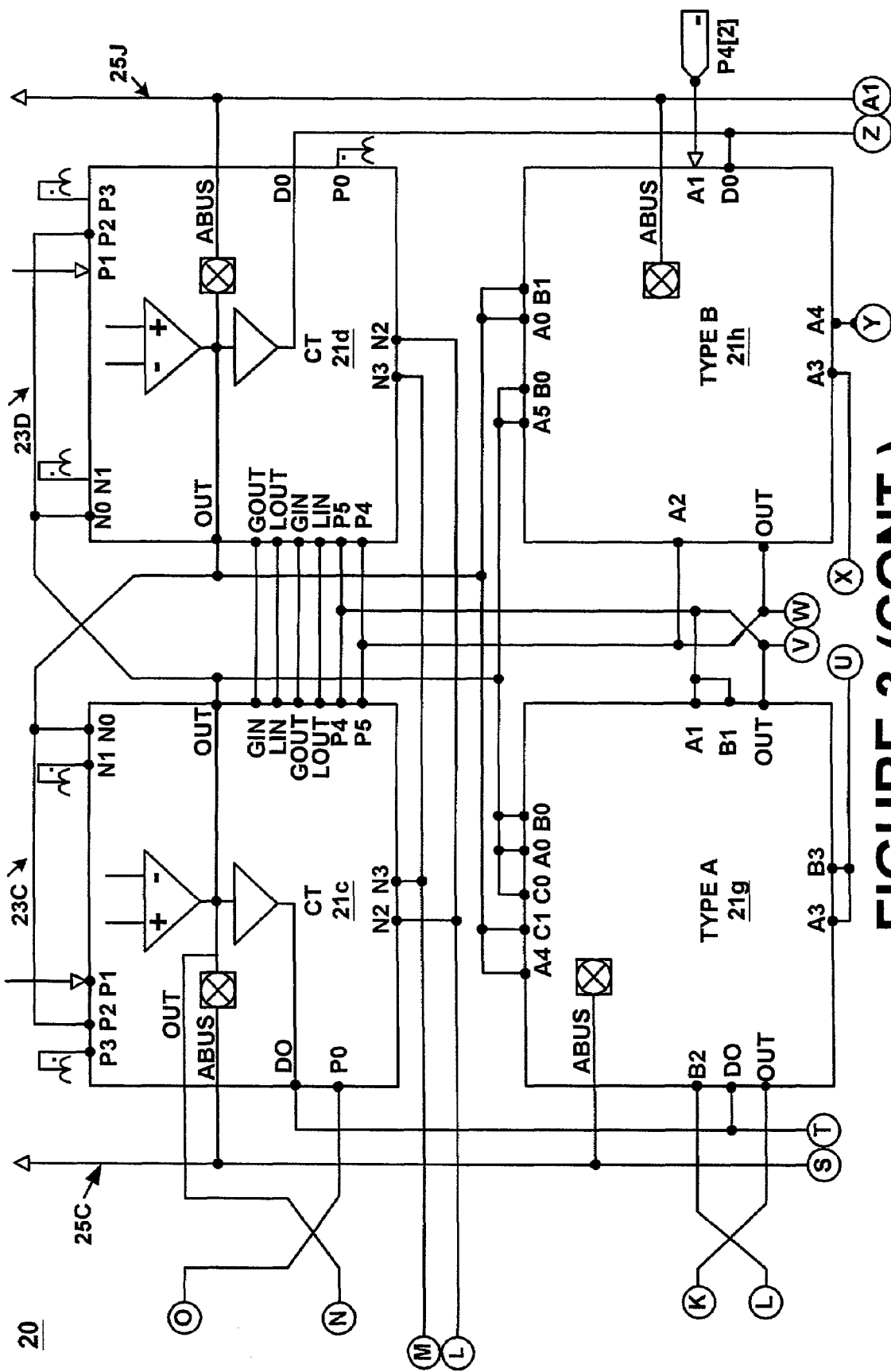
Figure 3:
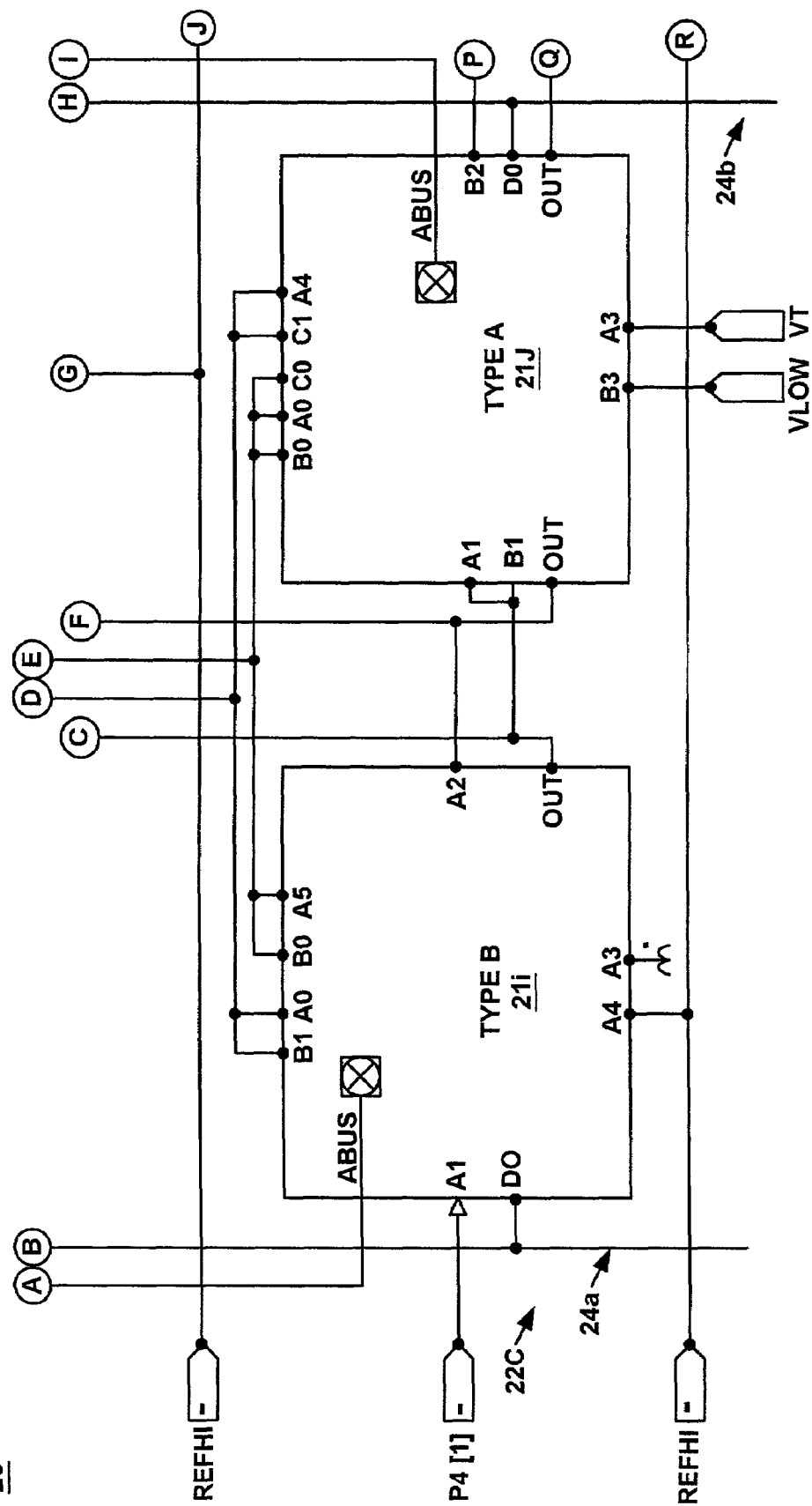
Figure 3:
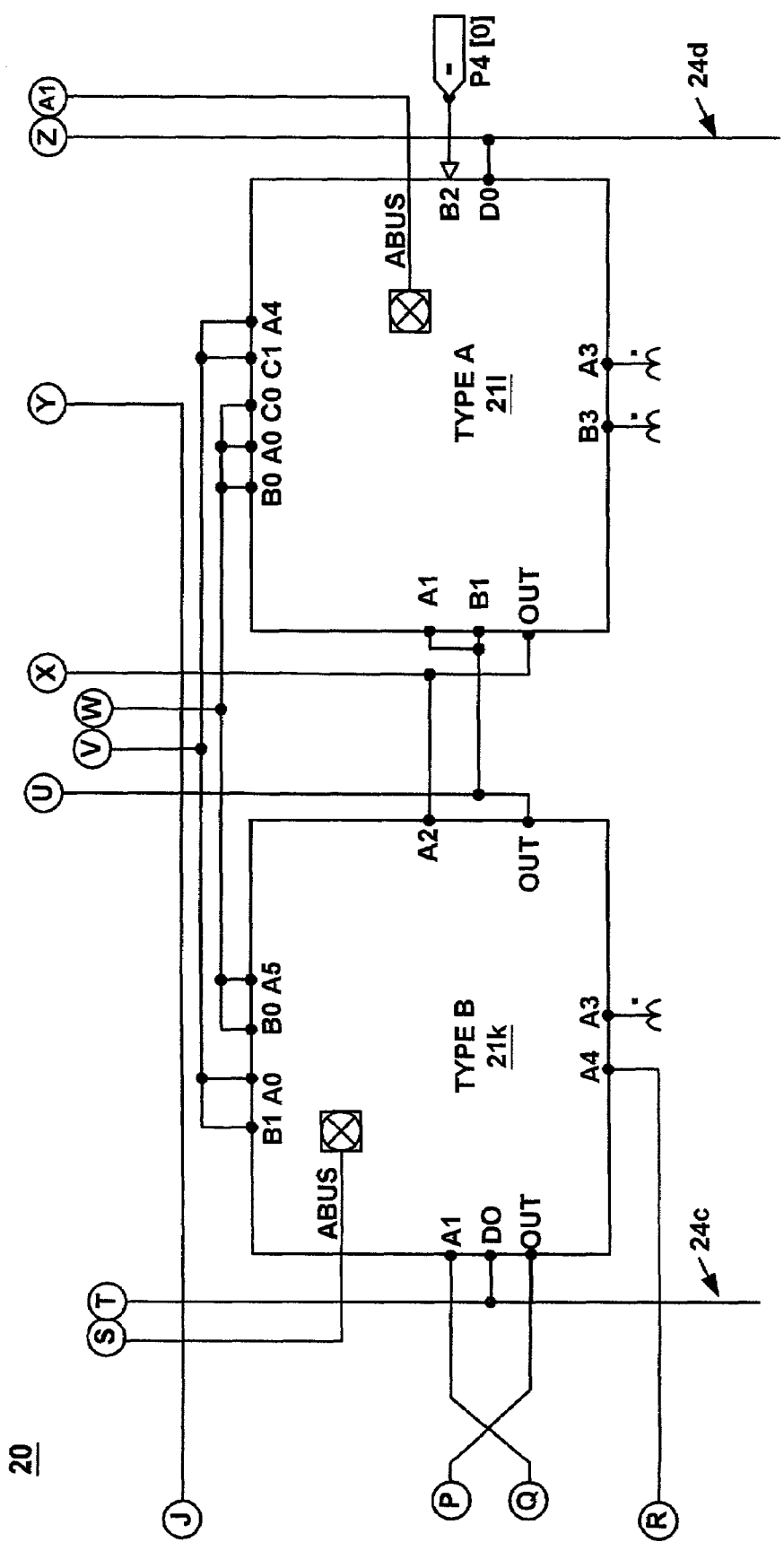

FIG. 3 shows the interconnects between analog blocks 20 in an array in accordance with one embodiment of the present invention. In this embodiment, each analog block 21a-l is interconnected with its adjacent (e.g., nearest neighbor) analog block. Note that, although the analog blocks 21a-l are interconnected, they may not be electrically coupled. The distinction between being connected and being electrically coupled is important because the analog functions performed by the analog blocks 20 are implemented by enabling certain analog blocks of the circuit and bypassing others according to user programming. That is, certain analog blocks in the array of analog blocks 20 are selectively and electrically coupled to other analog blocks according to the function to be performed. As will be seen, the analog functions are also implemented by setting characteristics of passive elements (e.g., capacitors and resistors) within each of the analog blocks 20.

In accordance with one embodiment of the present invention, different combinations of analog blocks 20 can be selected according to the user programming in order to perform different functions. In one embodiment, individual analog blocks can be enabled and bypassed, respectively, by enabling and closing appropriate switches in response to the programming. Signals are thereby routed through the analog blocks 20 by enabling and closing programmable switches, so that the signals are routed to the analog blocks necessary to accomplish the particular analog function selected. Mechanisms other than switches may be used to enable and bypass analog blocks.

In the present embodiment, for each column 23a-d, there is a respective digital bus 24a-d and a respective analog bus 25a-d coupled to each analog block in the column. Any analog block on these buses can have its output enabled to drive the buses. The analog buses 25a-d are each a gated operational amplifier (op-amp) output. The digital buses 24a-d are each a comparator output derived by buffering the operational amplifier output through an inverter. In one embodiment, reference buses (not shown) are also provided to provide a reference voltage for ADC and DAC functions.

The continuous time blocks 21a-21d can be programmed to serve as a first-order isolation buffer, if necessary. In that case, data essentially flow through the array of analog blocks 20 from top to bottom (e.g., from row 22a to row 22c). However, if the signals do not need to be buffered, then the signals can arrive directly at a switched capacitor block in one row (e.g., row 22c), then be switched to another row (e.g., row 22b).

In FIG. 3, output signals from each analog block include DO and those signals that include "out" in their designation (such as OUT, GOUT, and LOUT). Signals labeled otherwise are input signals to a block.

Figure 4A:
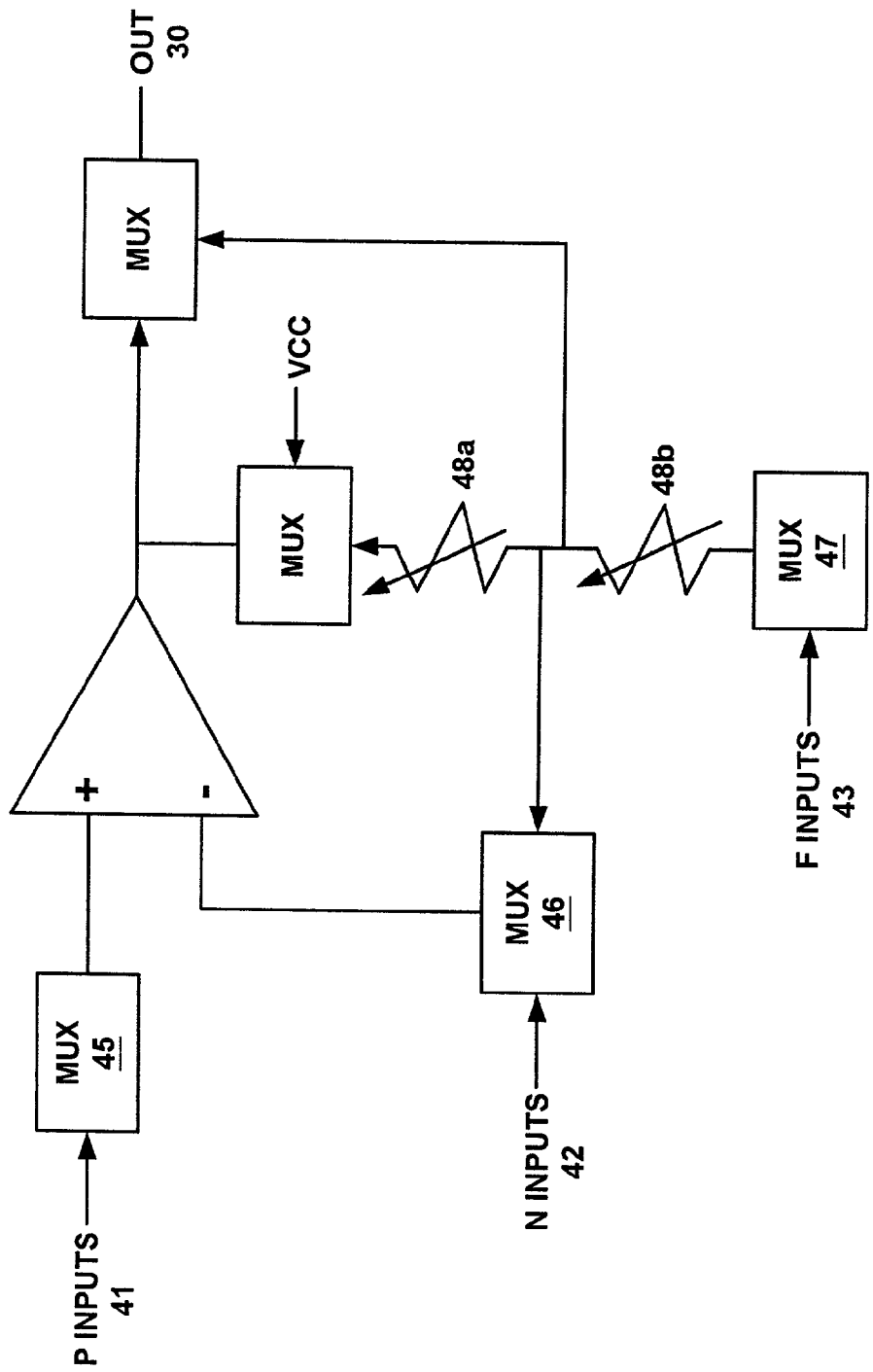
FIG. 4A is a functional block diagram of one embodiment of a continuous time block in accordance with the present invention.

FIG. 4A is a functional block diagram of one embodiment of a continuous time block 40 in accordance with the present invention. Continuous time block 40 exemplifies continuous time blocks 21a-d of FIGS. 2 and 3. Continuous time block 40 is unclocked; that is, an analog signal input to continuous time block 40 may vary with time, and the output of continuous time block 40 will reflect that (instead of sampling the input as a clocked block would).

In the present embodiment, continuous time block 40 of FIG. 4A performs basic amplifier operations. In one embodiment, one function of continuous time block 40 is to amplify and isolate analog inputs to the array of analog blocks 20 (FIG. 3), although continuous time block 40 may not always be used in this manner. Continuous time block 40 also provides the means to convert differential input voltages into single-ended signals to drive other analog blocks 20.

In the present embodiment, continuous time block 40 of FIG. 4A receives positive (P) inputs 41 at multiplexer (MUX) 45, negative (N) inputs 42 at MUX 46, and feedback (F) inputs at MUX 47. Multiplexers 45, 46 and 47 function as controlled switches for directing the inputs through continuous time block 40. It is appreciated that the inputs to continuous time block 40 are a function of the location of continuous time block 40 in the array of analog blocks 20 (FIGS. 2 and 3), and that the inputs received by continuous time block 40 depend on the particular analog function being implemented.

Continuous time block 40 also includes analog elements having characteristics that can be set and changed in response to the user's programming in accordance with the particular analog function to be implemented. In the present embodiment, continuous time block 40 includes programmable resistors 48a and 48b. In accordance with the present invention, the resistance of resistors 48a and 48b can be changed in response to the user's programming.

Figure 4B:
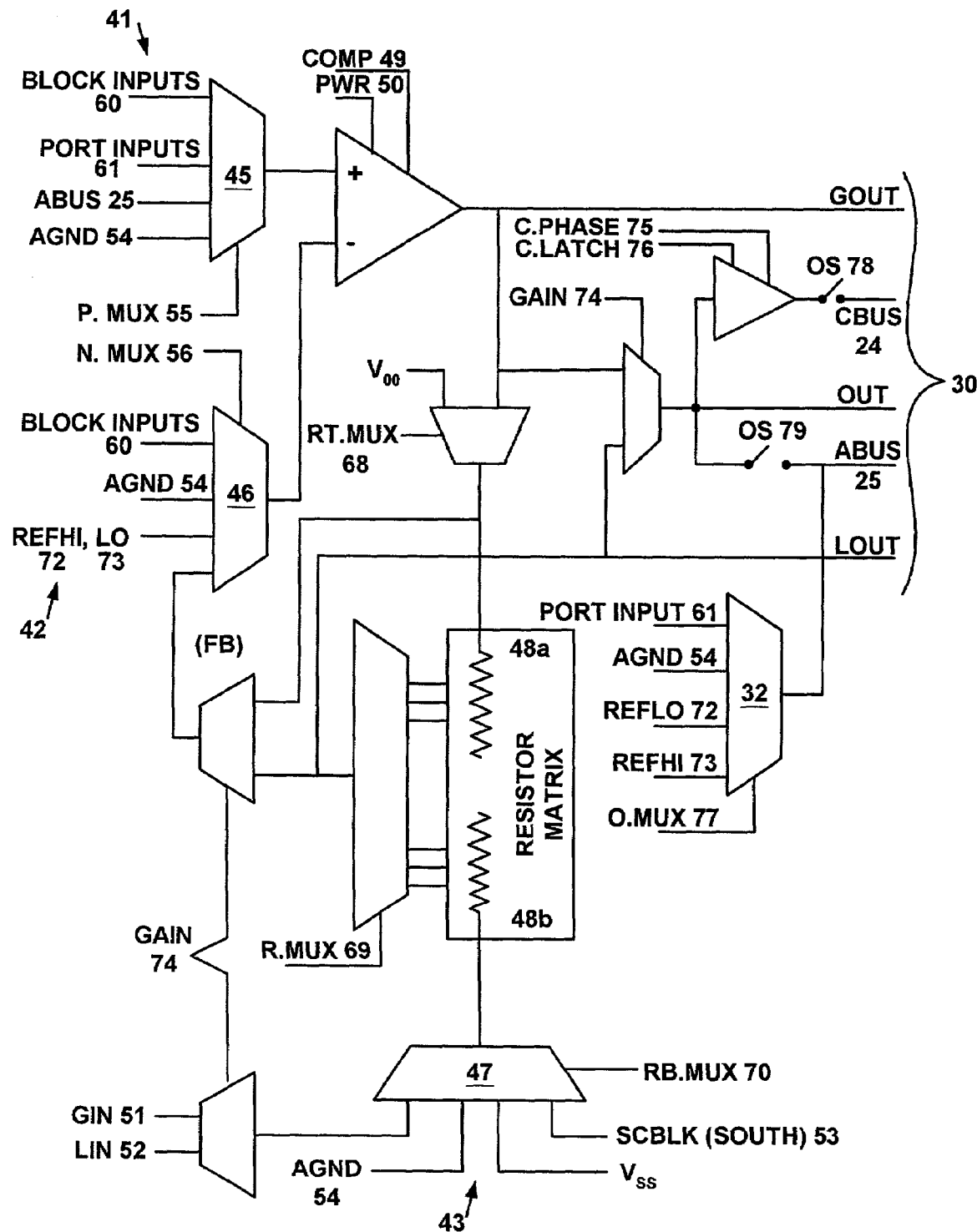
FIG. 4B is a schematic diagram of one embodiment of a continuous time block in accordance with the present invention.

FIG. 4B is a schematic diagram of one embodiment of a continuous time block 40 in accordance with the present invention. Block inputs 60 are inputs received from other analog blocks in the array of analog blocks 20 (FIG. 2). SCBLK (SOUTH) 53 is the input from a switched capacitor block below continuous time block 40 in a column 23a-d (FIG. 3). Port inputs 61 are inputs received from components and elements external to the array of analog blocks 20. ABUS 25 is the input from the analog bus (e.g., analog buses 25a-d of FIG. 3) and AGND 54 is the analog ground. CBUS 24 is the output to the digital bus (e.g., buses 24a-d of FIG. 3). Other outputs (OUT) 30.1 include GOUT, OUT and LOUT (see FIG. 3). When cascading two blocks, GOUT is used when trying to achieve a gain, and LOUT is used when trying to achieve a loss. REFLO 72 and REFHI 73 are reference voltages.

Continuing with reference to FIG. 4B, GAIN 74 controls whether the resistor string (48a, 48b) is connected around the op-amp for gain or loss (note that GAIN 74 does not guarantee a gain or loss block; this is determined by the routing of the other ends of the resistors 48a-b). GIN 51 and LIN 52 are inputs to continuous time block 40 (see also FIG. 3). P.MUX 55, N.MUX 56 and RB.MUX 70 are bit streams which control the non-inverting input MUX 45, the inverting input MUX 46, and MUX 47, respectively. R.MUX 69 is a bit stream controlling the center tap of the resistor string 48*a-b*. RT.MUX 68 is a bit stream controlling the connection of the two ends of the resistor string 48*a-b*. RT.MUX bits 68 control the top end of the resistor string 48*a-b*, which can either be connected to Vcc or to the op-amp output. RB.MUX bits 70 control the connection of the bottom end of the resistor string 48*a-b*.

With reference still to FIG. 4B, MUX 32 under control of bit stream O.MUX 77 provides a testability feature by feeding signals into continuous time block 40 that bypass the other portions of the block. COMP 49 is a bit controlling whether the compensation capacitor (not shown) is switched in or not in the op-amp. By not switching in the compensation capacitance, a fast response can be obtained if the amplifier is being used as a comparator.

PWR 50 is a bit stream for encoding the power level for continuous time block 40. C.PHASE 75 controls which internal clock phase the comparator data are latched on. C.LATCH 76 controls whether the latch is active or if it is always transparent. CS 78 controls a tri-state buffer that drives the comparator logic. OS 79 controls the analog output bus (ABUS 25). A complementary metal oxide semiconductor (CMOS) switch connects the op-amp output to ABUS 25.

Figure 5:
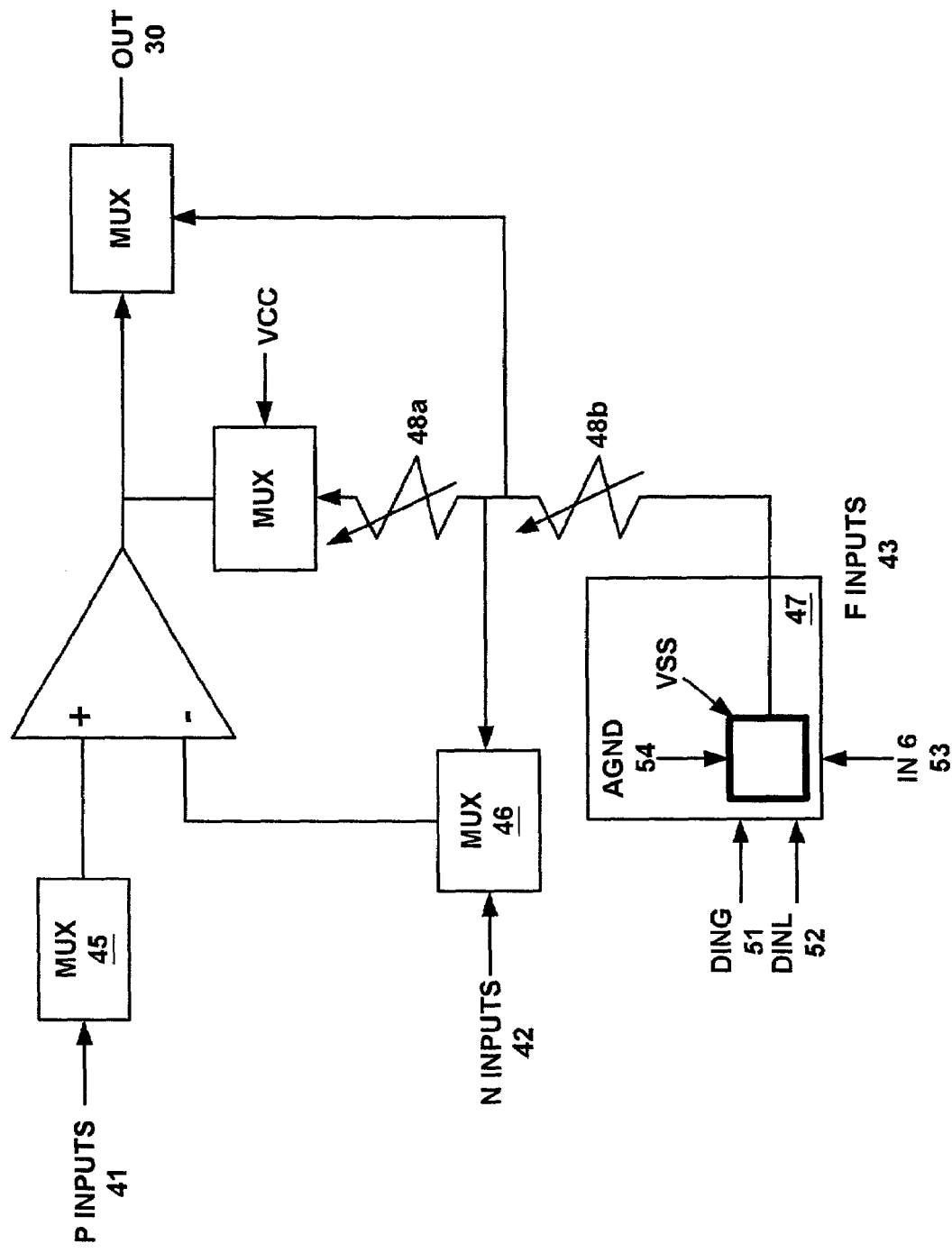
FIG. 5 illustrates the feedback inputs into a continuous time block in accordance with one embodiment of the present invention.

FIG. 5 illustrates the feedback inputs 43 into a continuous time block 40 in accordance with one embodiment of the present invention. DING 51 is GIN 51 of FIG. 4B, DINL 52 is LIN 52 of FIG. 4B, and AGND 54 is the analog (actual) ground. IN6 (SCBLK) 53 is the input from a switched capacitor block situated below continuous time block 40 in a column 23*a-d* in an array of analog blocks 20 (FIG. 3).

Figure 6:
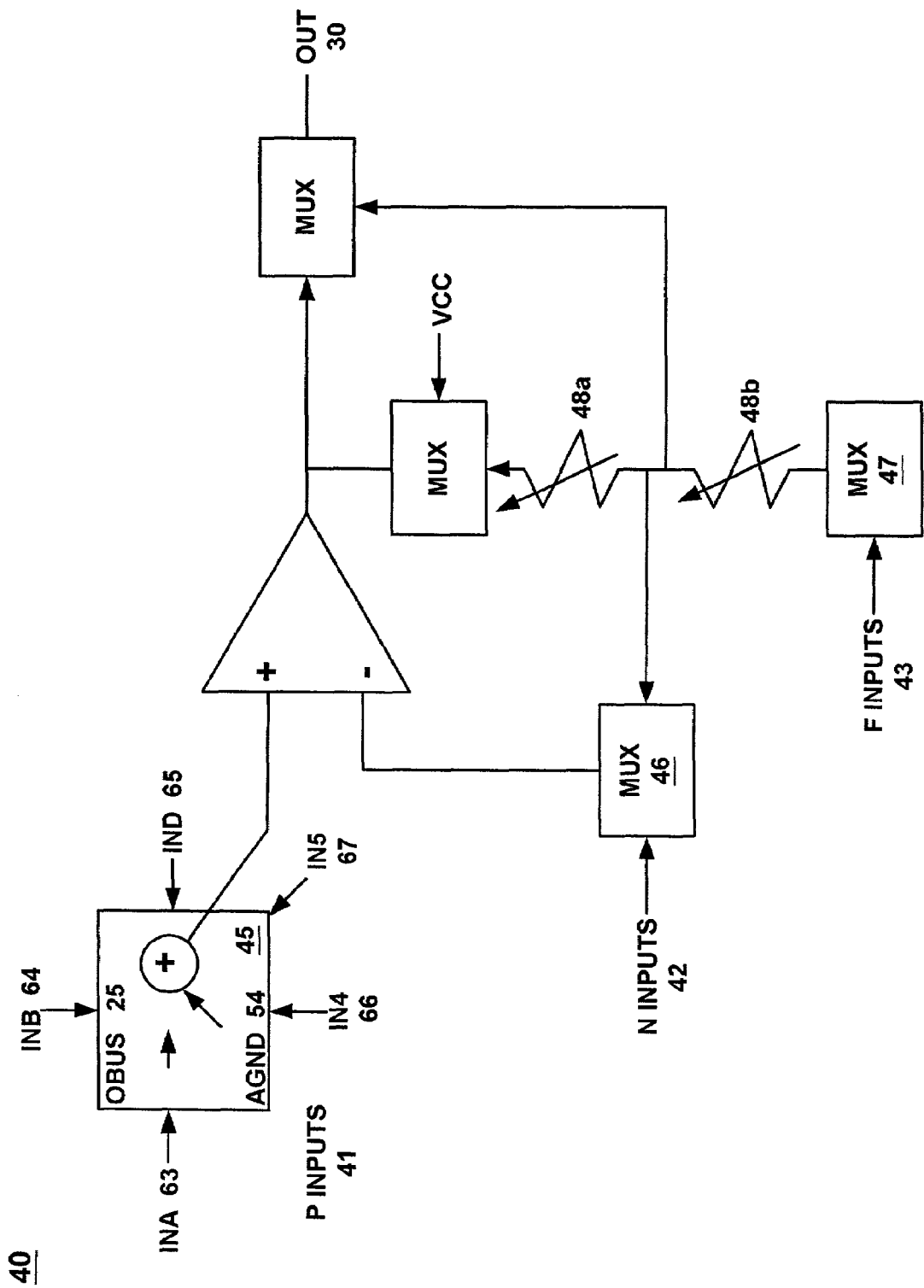
FIG. 6 illustrates the positive inputs into a continuous time block in accordance with one embodiment of the present invention.

FIG. 6 illustrates the positive inputs 41 into a continuous time block 40 in accordance with one embodiment of the present invention. AGND 54 is the analog ground, and OBUS (ABUS) 25 is the input from the analog bus (e.g., analog buses 25*a-d* of FIG. 3). INA 63 and IND 65 are the inputs from another continuous time block; that is, the continuous time blocks to either side of continuous time block 40. If continuous time block 40 is situated on the left or right edge of the array of analog blocks 20 (FIG. 3), such as in columns 23*a* or 23*d*, then only one of the inputs INA 63 or IND 65 would be present. INB 64 is the input from outside of the array of analog blocks 20. IN4 66 and IN5 67 are input from adjacent switched capacitor blocks, either in the same column as continuous time block 40 or from a switched capacitor block in an adjacent column.

Figure 7:
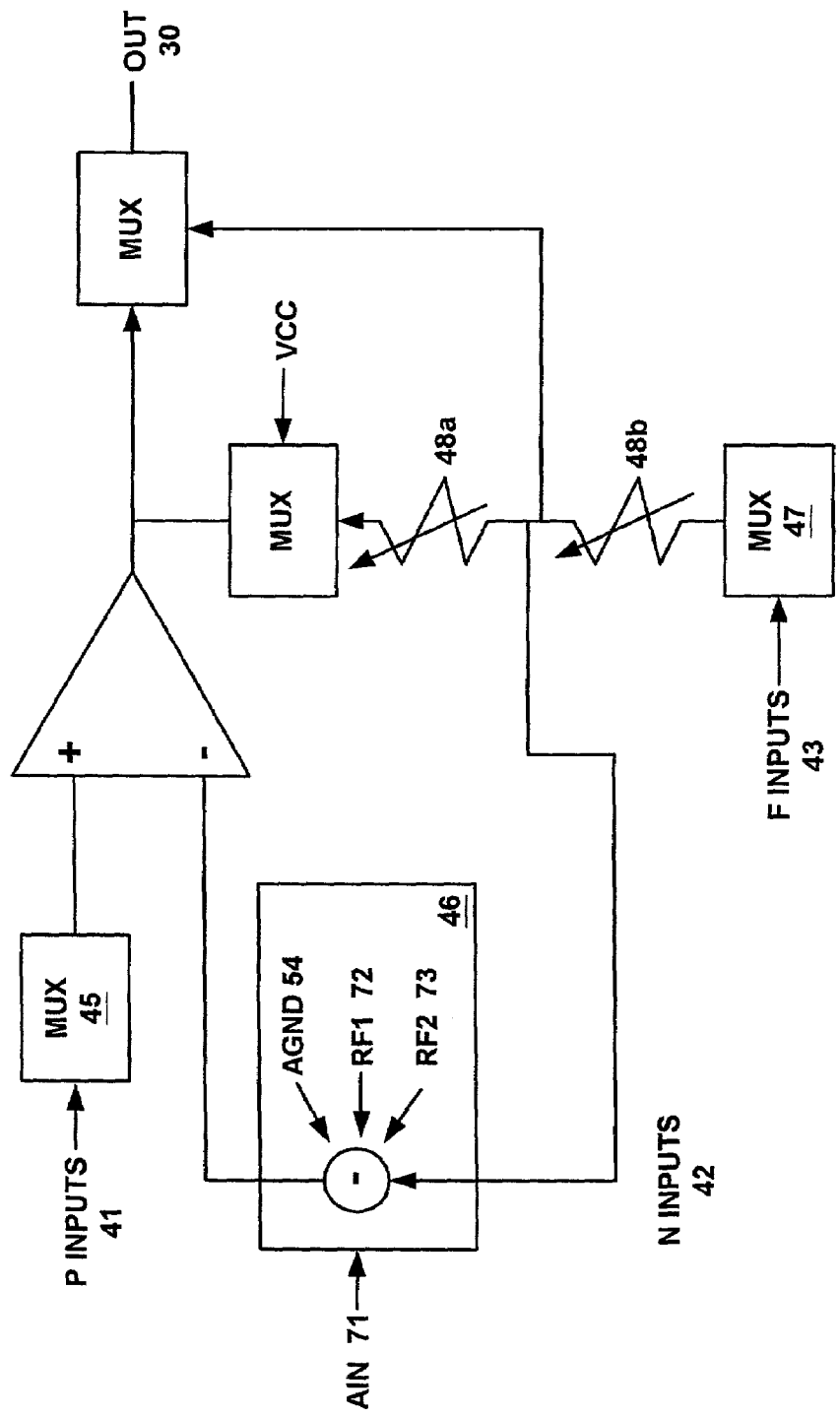
FIG. 7 illustrates the negative inputs into a continuous time block in accordance with one embodiment of the present invention.

FIG. 7 illustrates the negative inputs 42 into a continuous time block 40 in accordance with one embodiment of the present invention. AGND 54 is the analog ground, and AIN 71 is the input from an adjacent continuous time block (depending on the location of continuous time block 40 in the array of analog blocks 20 of FIG. 3, there may be more than one input from an adjacent continuous time block, as described in the preceding paragraph). RF1 (REFLO) 72 and RF2 (REFHI) 73 are reference voltages.

Figure 8A:
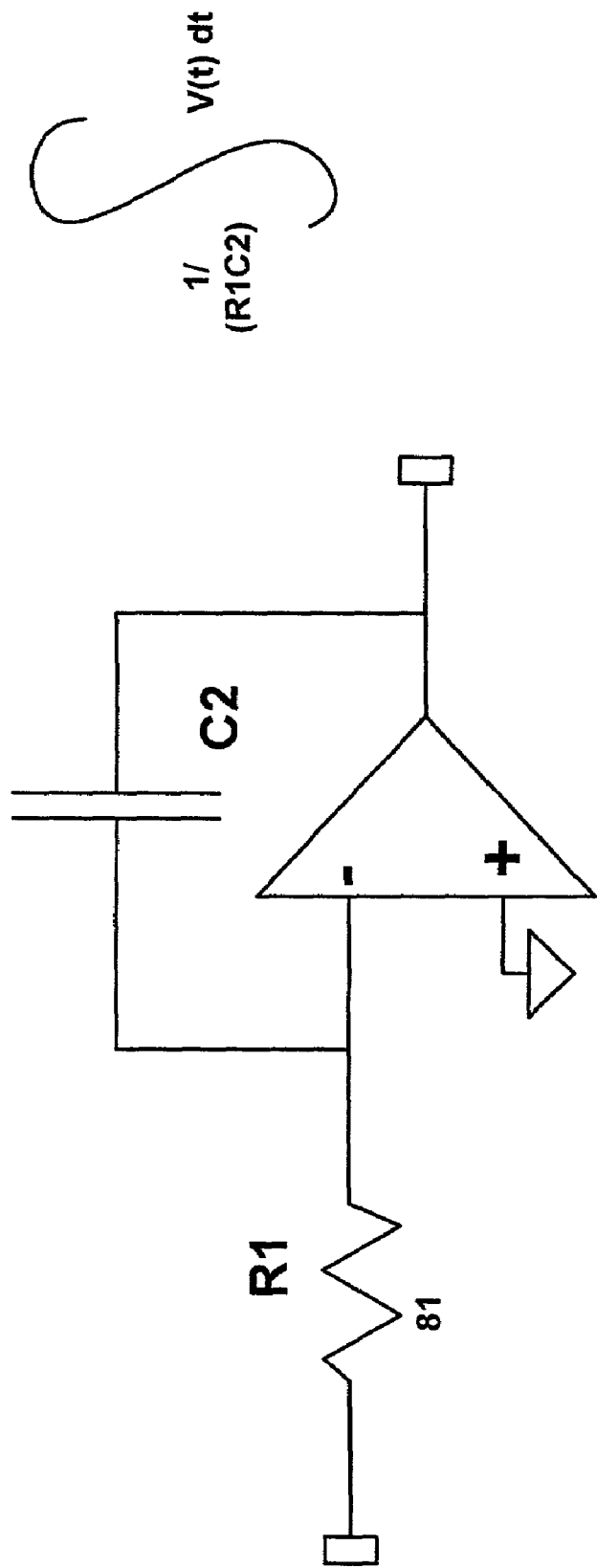
FIGS. 8A and 8B are circuit diagrams illustrating the functionality of a switched capacitor circuit by comparison to another circuit in accordance with one embodiment of the present invention.
Figure 8B:
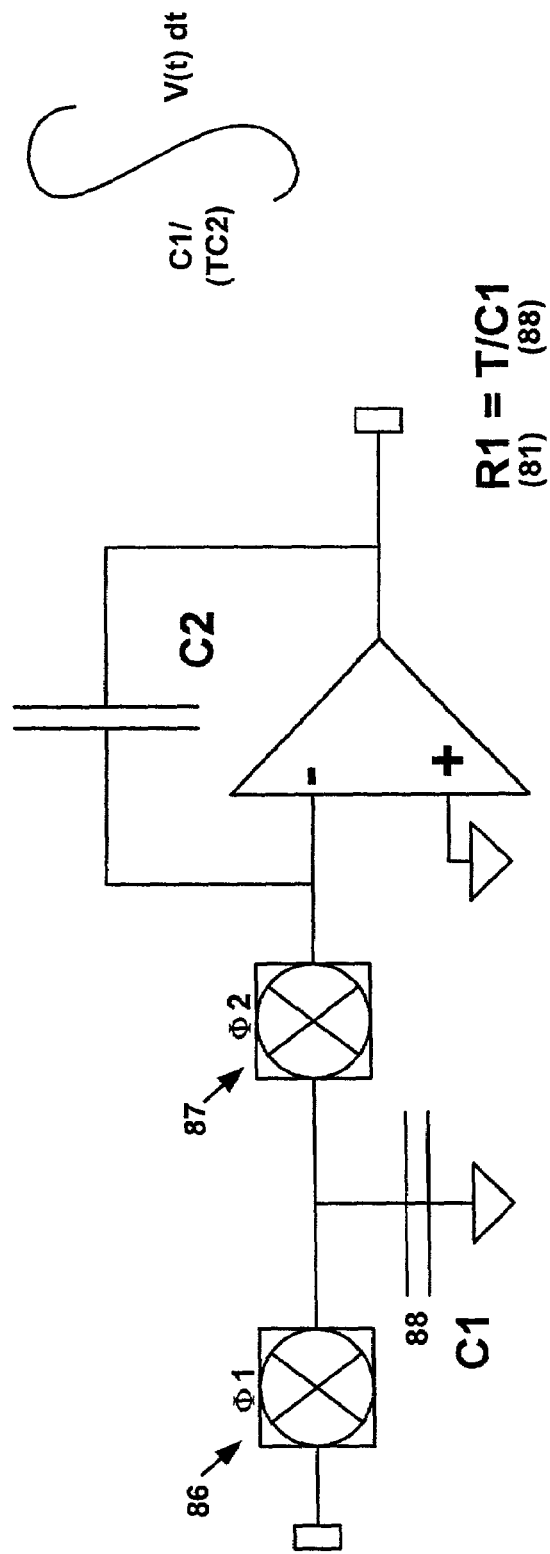

FIGS. 8A and 8B are circuit diagrams illustrating the functionality of a switched capacitor circuit 85 by comparison to another circuit 80 in accordance with one embodiment of the present invention. In FIG. 8A, an amount of current flows through resistor 81 in a time period T. Resistor 81 has a resistance value of R1. In FIG. 8B, switch 86 and switch 87 of switched capacitor circuit 85 are enabled and closed according to clock phases φ1 and φ2, respectively. Switched capacitor circuit 85 also includes a capacitor 88 with a capacitance of C1. An amount of charge will transfer through switches 86 and 87 in a time period T. In essence, the amount of charge transferred through switches 86 and 87 in time period T will appear like a current (current being charge per time). The resistance of switched capacitor circuit 85 equivalent to R1 is T/C1.

Figure 9A:
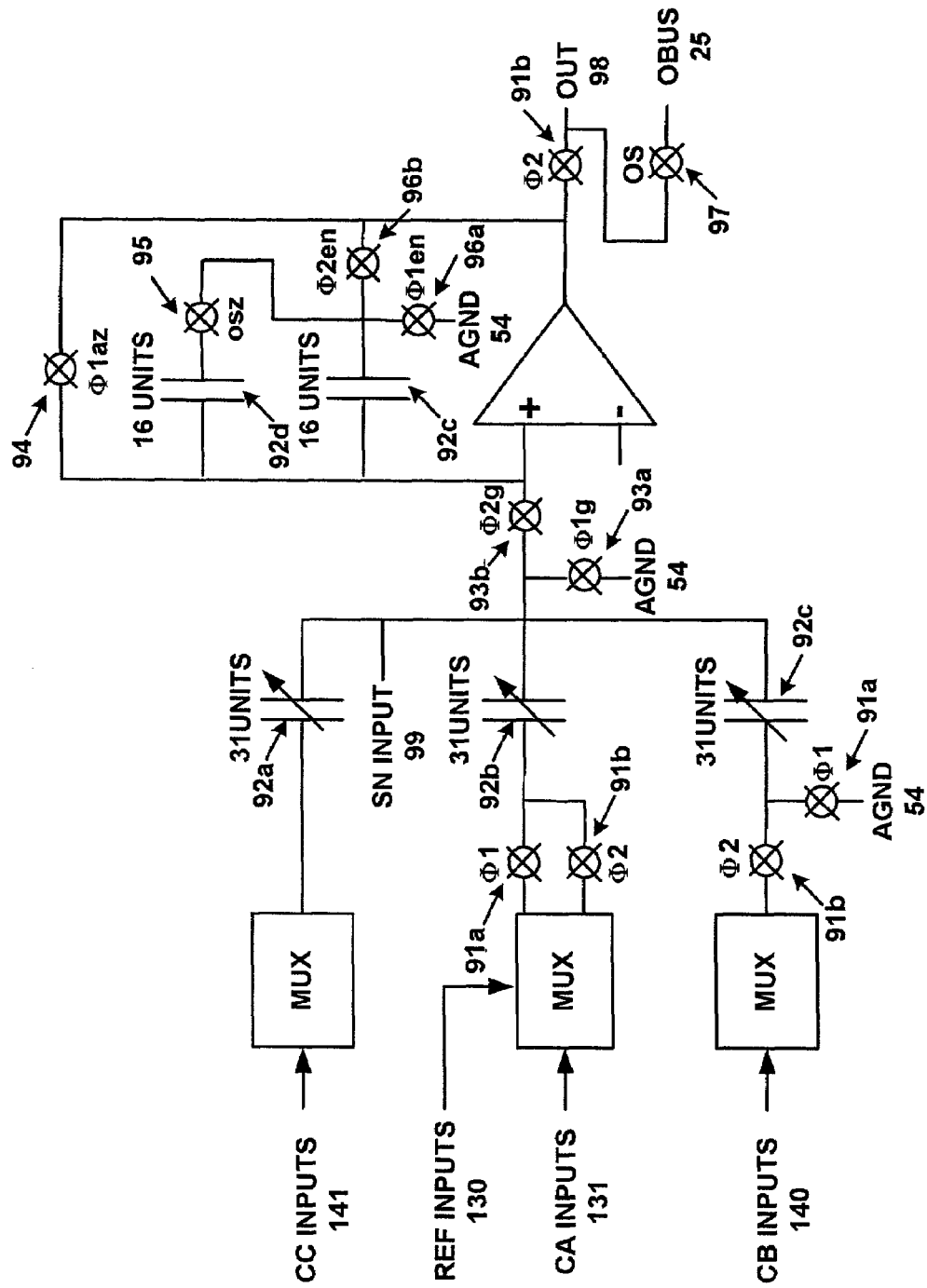
FIG. 9A is a block diagram of one embodiment of a switched capacitor block in accordance with the present invention.

FIG. 9A is a block diagram of one embodiment of a switched capacitor block 90 in accordance with the present invention. This embodiment of switched capacitor block 90 is referred to as a type A switched capacitor block. Switched capacitor block 90 exemplifies analog blocks 21*e*, 21*g*, 21*j* and 21*l* of FIGS. 2 and 3.

With reference to FIG. 9A, the present embodiment of switched capacitor block 90 receives reference (REF) inputs 130, SN input 99, and inputs from three different types of capacitor arrays, CA inputs 131, CB inputs 140 and CC inputs 141. The designations "CA," "CB" and "CC" are simply chosen to distinguish the three different types of capacitor arrays. REF inputs 130 and CA inputs 131 are described further in conjunction with FIG. 1A0, and CB inputs 140 and CC inputs 141 are described further in conjunction with FIG. 1A1. SN input 99 is a summary node of the array of analog blocks 20 (FIG. 3). It is appreciated that the inputs to switched capacitor block 90 are a function of the location of switched capacitor block 90 in the array of analog blocks 20 (FIGS. 2 and 3), and that the inputs received by switched capacitor block 90 depend on the particular analog function being implemented.

Continuing with reference to FIG. 9A, AGND 54 is the analog ground, OBUS (ABUS) 25 is the output to the analog bus (e.g., analog buses 25*a-d* of FIG. 3), and OUT 98 is an output from switched capacitor block 90 that may serve as an input to an adjacent switched capacitor block (refer to FIG. 3).

In the present embodiment, switched capacitor block 90 includes a multiplicity of switches 91*a*, 91*b*, 93*a*, 93*b*, 94, 95, 96*a*, 96*b* and 97. Each of the switches 91*a-b*, 93*a-b*, 94, and 96*a-b* is assigned to a clock phase φ1 or φ2; that is, they are enabled or closed depending on the clock phase. Switches 93*a-b*, 94, and 96*a-b* are assigned to gated clocks and function in a known manner. Switches 95 and 97 are not clocked but instead are enabled or closed depending on the user's programming.

Switched capacitor block 90 also includes analog elements having characteristics that can be set and changed in response to the user's programming in accordance with the particular analog function to be implemented. In the present embodiment, switched capacitor block 90 includes capacitors 92*a*-92*e*. In accordance with the present invention, the capacitance of capacitors 92*a-e* can be changed in response to the user's programming. In the present embodiment, the capacitors 92*a-c* are binarily weighted capacitors that allow the capacitor weights to be programmed by the user, while the capacitors 92*d-e* are either "in" or "out" (that is, they are not binarily weighted) according to the user programming. In one embodiment, the binary encoding of capacitor size for capacitors 92*a-c* comprises 31 units (plus zero) each and the encoding of capacitor size for capacitors 92*d-e* is 16 units each.

Switched capacitor block 90 is configured such that it can be used for the input stage of a switched capacitor biquad filter. When followed by a type B switched capacitor block, the combination of blocks provides a complete switched capacitor biquad (see FIGS. 14A and 14B).

Figure 9B:
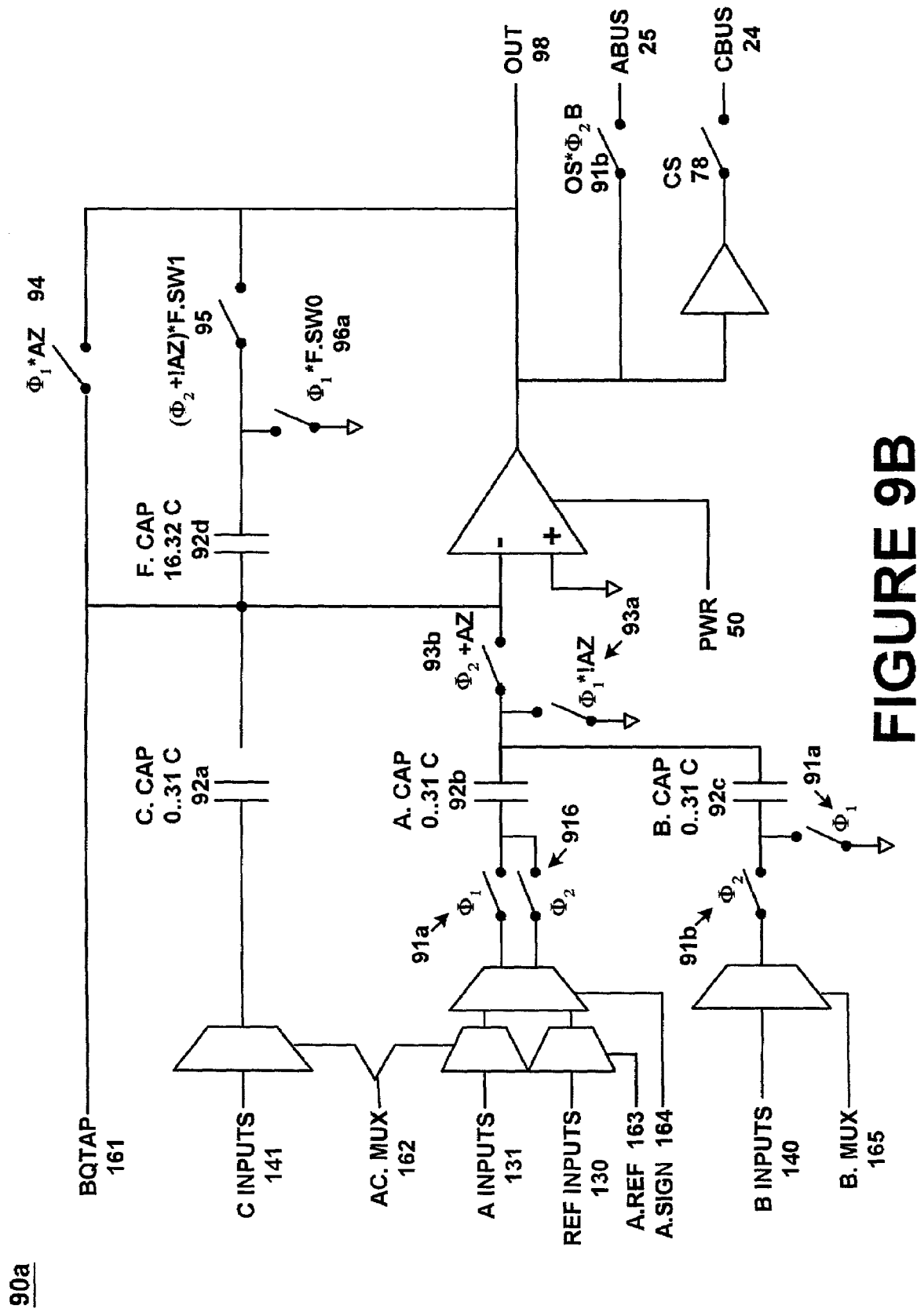
FIG. 9B is a schematic diagram of the switched capacitor block of FIG. 9A in accordance with one embodiment of the present invention.

FIG. 9B is a schematic diagram of a switched capacitor block 90*a* in accordance with one embodiment of the present invention. ABUS 25 is the output to the analog bus (e.g., buses 25*a-d* of FIG. 3). CBUS 24 is the output to the digital bus (e.g., buses 24*a-d* of FIG. 3). PWR 50 is a bit stream for encoding the power level for switched capacitor block 90*a*. CS 78 controls the output to CBUS 24.

Continuing with reference to FIG. 9B, BQTAP 161 is used when switched capacitor block 90*a* is used with a type B switched capacitor block to form a switched capacitor biquad (refer to FIGS. 14A and 14B below). AC.MUX 162 is for controlling the multiplexing of the inputs for both the C (CC) inputs 141 and the A (CA) inputs 131. A.REF 163 is for controlling the reference voltage inputs (REF 130). A.SIGN 164 controls the switch phasing of the switches on the bottom plate of the capacitor 92*b*. B.MUX 165 is for controlling the multiplexing of the inputs for the B (CB) inputs 140.

Figure 10:
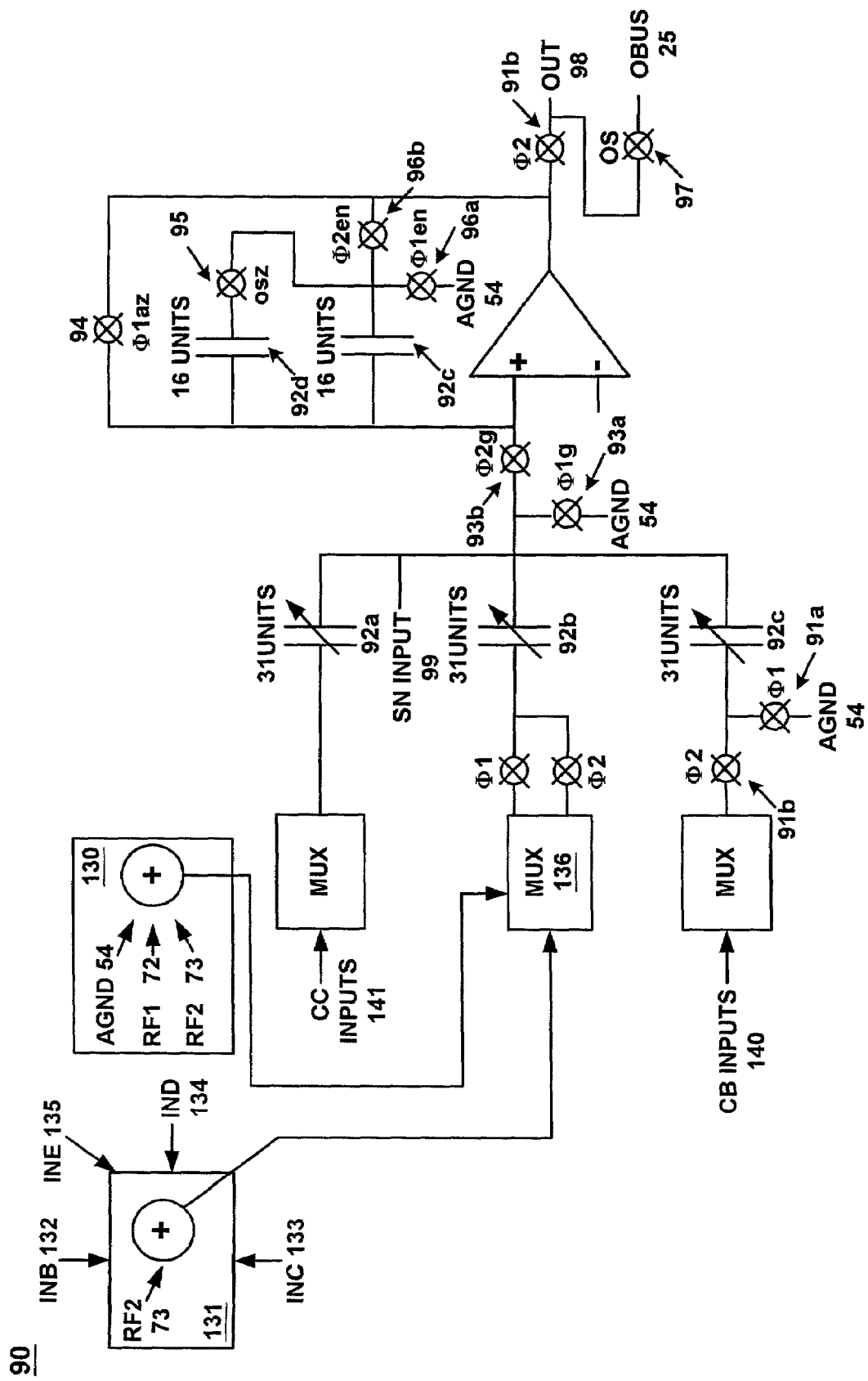
FIG. 10 shows one set of inputs into the switched capacitor block of FIG. 9A in accordance with one embodiment of the present invention.

FIG. 10 shows one set of inputs into one embodiment of a type A switched capacitor block 90 in accordance with the present invention. It is appreciated that the inputs to switched capacitor block 90 are a function of the location of switched capacitor block 90 in the array of analog blocks 20 (FIGS. 2 and 3), and that the inputs received by switched capacitor block 90 depend on the particular analog function being implemented.

Referring to FIG. 10, REF inputs 130 includes the analog ground AGND 54 and reference voltages RF1 (REFLO) 72 and RF2 (REFHI) 73. CA inputs 131 can include inputs INB 132, INC 133, IND 134 and INE 135 from a continuous time block and/or switched capacitor block adjacent to switched capacitor block 90. CA inputs 131 can also include reference voltage RF2 (REFHI) 73 from a continuous time block and/or switched capacitor block adjacent to switched capacitor block 90. MUX 136 can be programmed so that either CA inputs 131 or REF inputs 130 are sampled on clock phase $\phi$1, thereby allowing inverting or non-inverting configurations. The selection of RF1 (REFLO) 72 and RF2 (REFHI) 73 can be controlled by a comparator (not shown).

Figure 11:
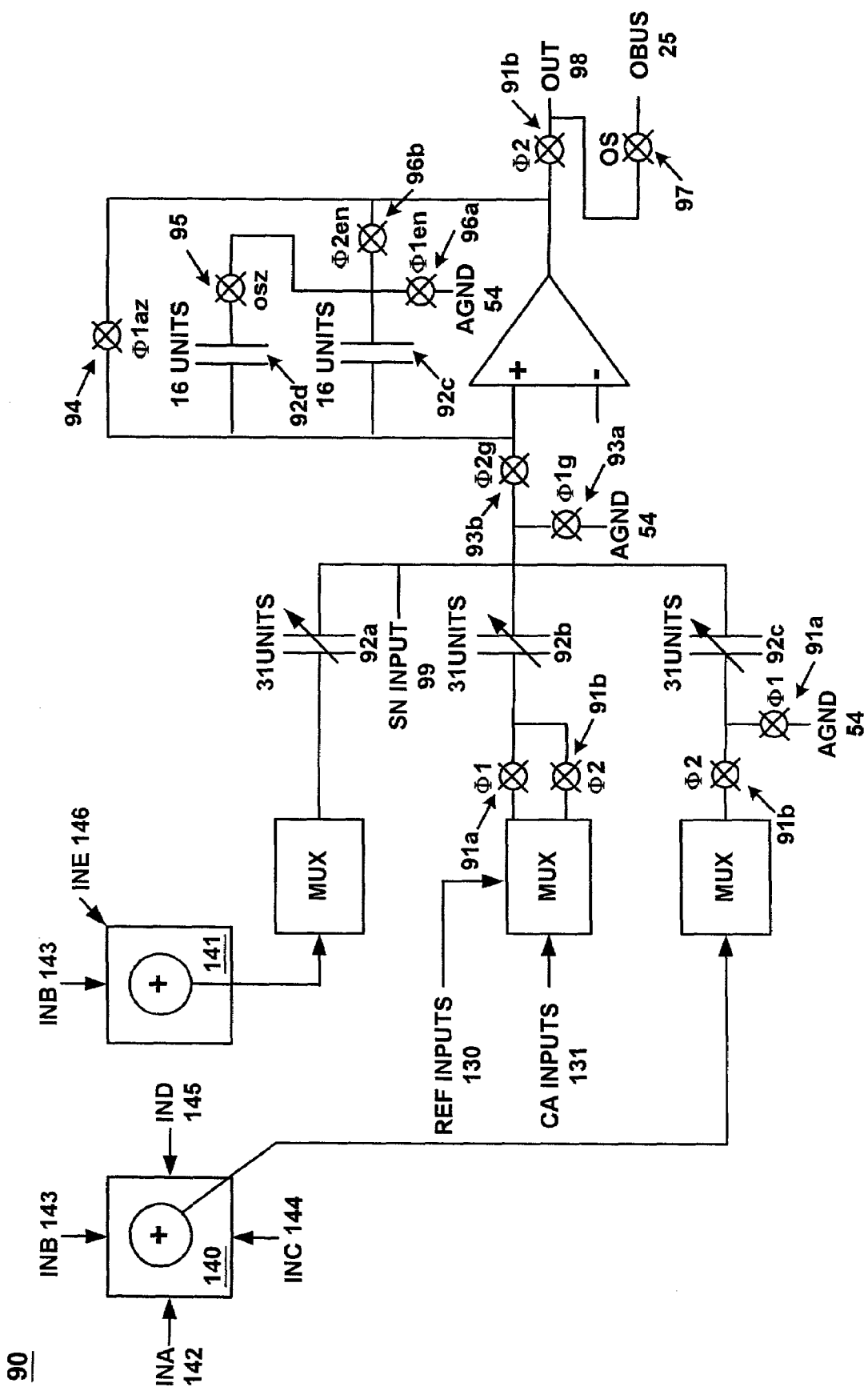
FIG. 11 shows the other set of inputs into the switched capacitor block of FIG. 9A in accordance with one embodiment of the present invention.

FIG. 11 shows the other set of inputs into the type A switched capacitor block 90 of FIG. 9A in accordance with the present invention. As previously mentioned, the inputs to switched capacitor block 90 are a function of the location of switched capacitor block 90 in the array of analog blocks 20 (FIGS. 2 and 3), and the inputs received by switched capacitor block 90 depend on the particular analog function being implemented.

With reference to FIG. 11, CB inputs 140 can include inputs INA 142, INB 143, INC 144 and IND 145 from a continuous time block and/or switched capacitor block adjacent to switched capacitor block 90. CC inputs 141 can include INB 143 and INE 146 from a continuous time block and/or switched capacitor block adjacent to switched capacitor block 90.

Figure 12A:
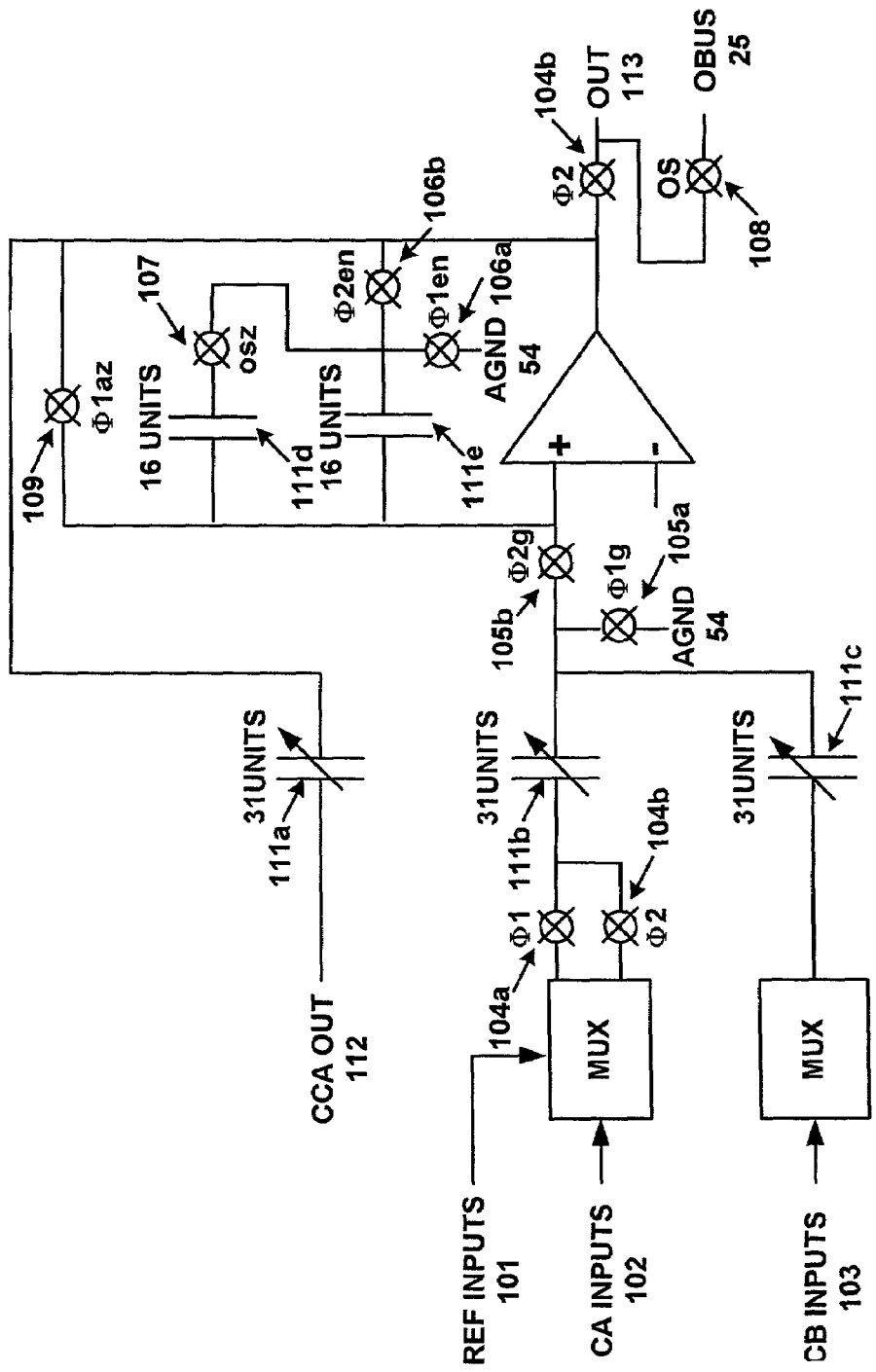
FIG. 12A is a block diagram of another embodiment of a switched capacitor block in accordance with the present invention.

FIG. 12A is a block diagram of another embodiment of a switched capacitor block 100 in accordance with the present invention. This embodiment of switched capacitor block 100 is referred to as a type B switched capacitor block. Switched capacitor block 100 exemplifies analog blocks 21*f*, 21*h*, 21*i* and 21*k* of FIGS. 2 and 3.

With reference to FIG. 12A, the present embodiment of switched capacitor block 100 receives reference (REF) inputs 101, CCAOUT outputs 112, and inputs from two different types of capacitor arrays, CA inputs 102 and CB inputs 103. The designations "CA" and "CB" are chosen to distinguish the two different types of capacitor arrays that are inputs to switched capacitor block 100, and they may be different from the CA inputs 131 and CB inputs 140 of FIG. 9A. REF inputs 101, CA inputs 102 and CB inputs 103 are described further in conjunction with FIG. 1A3. CCAOUT 112 is a non-switched capacitor feedback from the output. It is appreciated that the inputs to switched capacitor block 100 are a function of the location of switched capacitor block 100 in the array of analog blocks 20 (FIGS. 2 and 3), and that the inputs received by switched capacitor block 100 depend on the particular analog function being implemented.

Continuing with reference to FIG. 12A, AGND 54 is the analog ground, OBUS (ABUS) 25 is the output to the analog bus (e.g., analog buses 25*a-d* of FIG. 3), and OUT 113 is an output from switched capacitor block 100 that may serve as an input to an adjacent switched capacitor block (refer to FIG. 3).

In the present embodiment, switched capacitor block 100 includes a multiplicity of switches 104*a*, 104*b*, 105*a*, 105*b*, 106*a*, 106*b*, 107, 108 and 109. Each of the switches 104*a-b*, 105*a-b*, 106*a-b* and 109 is assigned to a clock phase $\phi$1 or $\phi$2; that is, they are enabled or closed depending on the clock phase. Switches 105*a-b*, 106*a-b* and 109 are assigned to gated clocks and function in a known manner. Switches 107 and 108 are not clocked but instead are enabled or closed depending on the user's programming.

Switched capacitor block 100 also includes analog elements having characteristics that can be set and changed in response to the users programming in accordance with the particular analog function to be implemented. In the present embodiment, switched capacitor block 100 includes programmable capacitors 111*a*-111*e*. In accordance with the present invention, the capacitance of capacitors 111*a-e* can be changed in response to the user's programming. In the present embodiment, the capacitors 111*a-c* are binarily weighted capacitors that allow the capacitor weights to be programmed by the user, while the capacitors 111*d-e* are either "in" or "out" (that is, they are not binarily weighted) according to the user programming. In one embodiment, the binary encoding of capacitor size for capacitors 111*a-c* comprises 31 units (plus zero) each and the encoding of capacitor size for capacitors 111*d-e* is 16 units each.

Switched capacitor block 100 is configured such that it can be used for the output stage of a switched capacitor biquad filter. When preceded by a type A switched capacitor block, the combination of blocks provides a complete switched capacitor biquad (see FIGS. 14A and 14B).

Figure 12B:
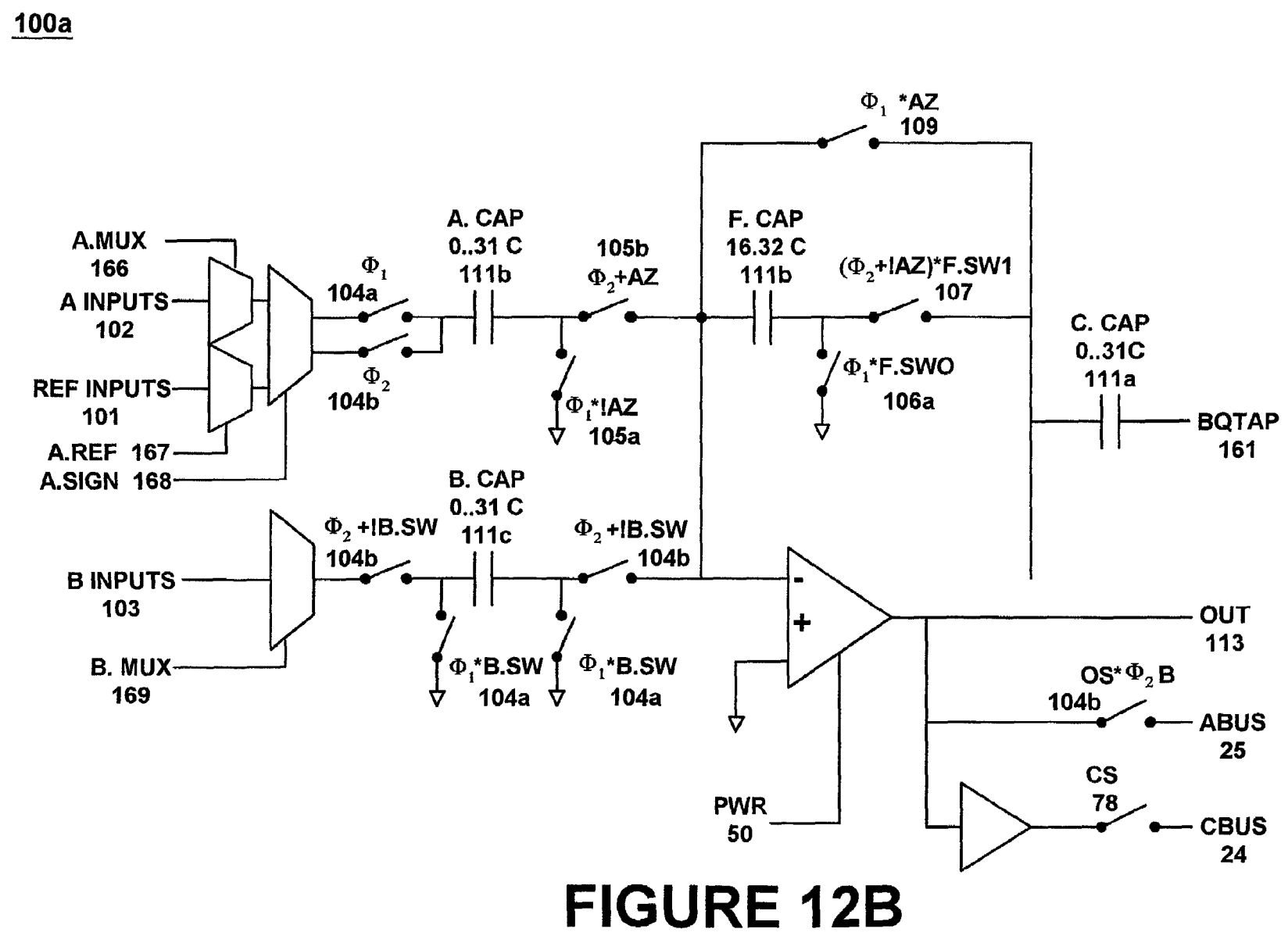

FIG. 12B is a schematic diagram of a switched capacitor block 100*a* in accordance with one embodiment of the present invention. ABUS 25 is the output to the analog bus (e.g., buses 25*a-d* of FIG. 3). CBUS 24 is the output to the digital bus (e.g., buses 24*a-d* of FIG. 3). PWR 50 is a bit stream for encoding the power level for switched capacitor block 90*a*. CS 78 controls the output to CBUS 24.

Continuing with reference to FIG. 12B, BQTAP 161 is used when switched capacitor block 100*a* is used with a type A switched capacitor block to form a switched capacitor biquad (refer to FIGS. 14A and 14B below). A.MUX 166 is for controlling the multiplexing of the inputs for the A (CA) inputs 102. A. REF 167 is for controlling the reference voltage inputs (REF inputs 101). A.SIGN 168 controls the switch phasing of the switches on the bottom plate of the capacitor 111*b*; the bottom plate samples the input or the reference. B.MUX 169 is for controlling the multiplexing of the inputs for the B (CB) inputs 103.

Figure 13:
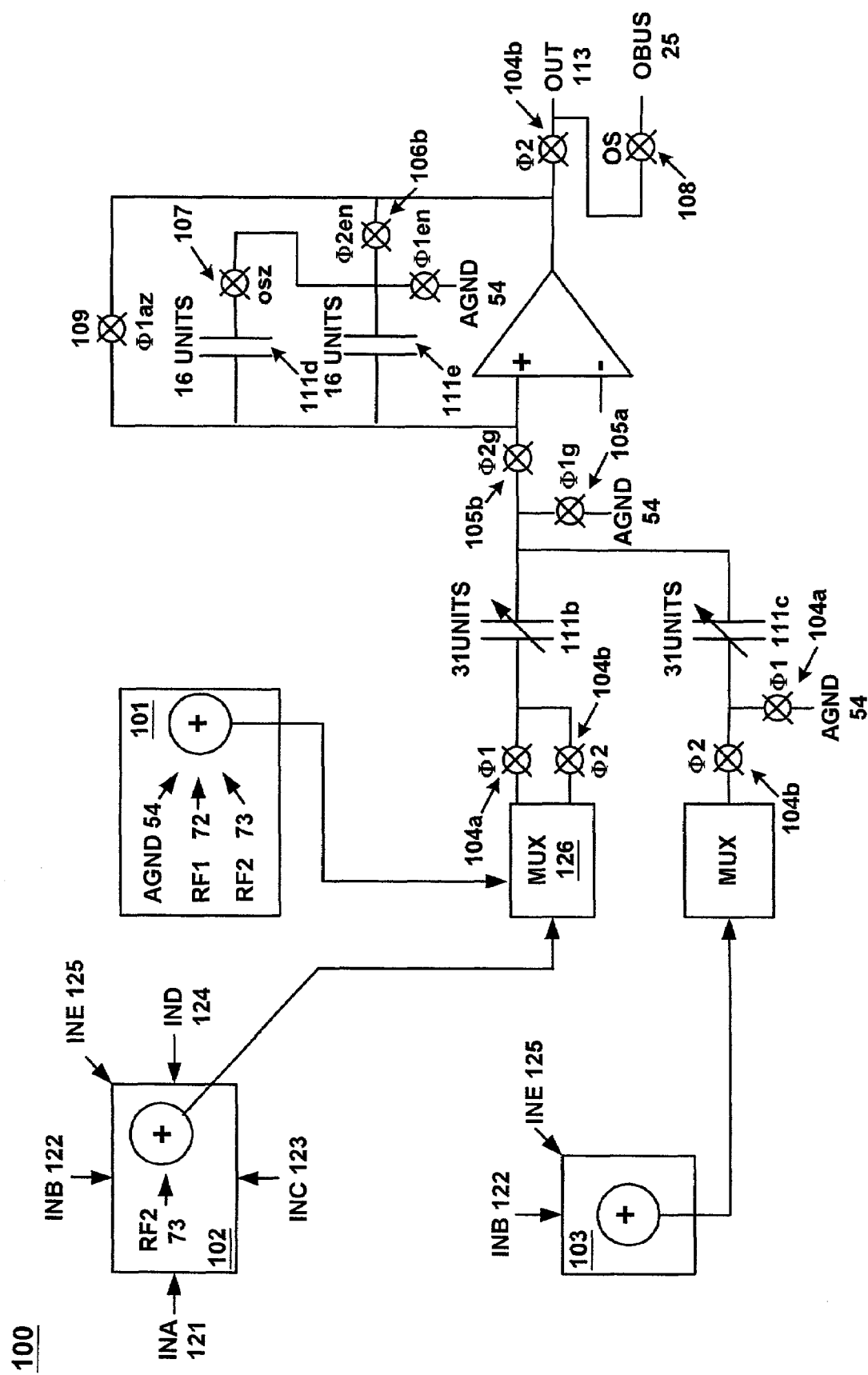
FIG. 13 shows the inputs into the switched capacitor block of FIG. 12A in accordance with one embodiment of the present invention.

FIG. 13 shows the inputs into one embodiment of a type B switched capacitor block 100 in accordance with the present invention. It is appreciated that the inputs to switched capacitor block 100 are a function of the location of switched capacitor block 100 in the array of analog blocks 20 (FIGS. 2 and 3), and that the inputs received by switched capacitor block 100 depend on the particular analog function being implemented.

With reference to FIG. 13, REF inputs 101 includes the analog ground AGND 54 and reference voltages RF1 (REFLO) 72 and RF2 (REFHI) 73. CA inputs 102 can include inputs INA 121, INB 122, INC 123, IND 124 and INE 125 from a continuous time block and/or switched capacitor block adjacent to switched capacitor block 100. CB inputs 103 can include INB 122 and INE 125 from a continuous time block and/or switched capacitor block adjacent to switched capacitor block 100. MUX 126 can be programmed so that either CA inputs 102 or REF inputs 101 are sampled on clock phase φ1, thereby allowing inverting or non-inverting configurations.

Figure 14A:
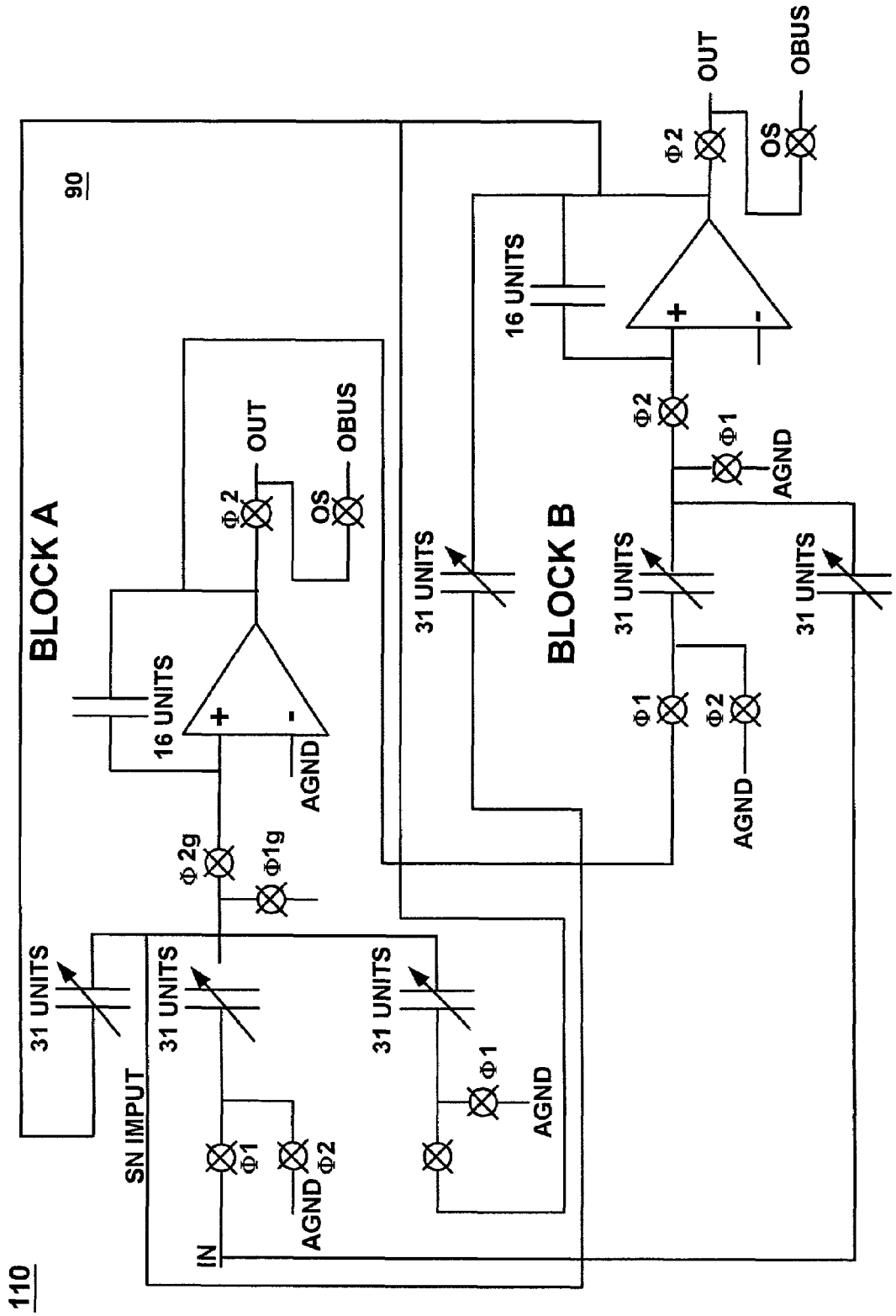
FIG. 14A is a block diagram showing one embodiment of a switched capacitor biquad in accordance with the present invention.
Figure 14B:
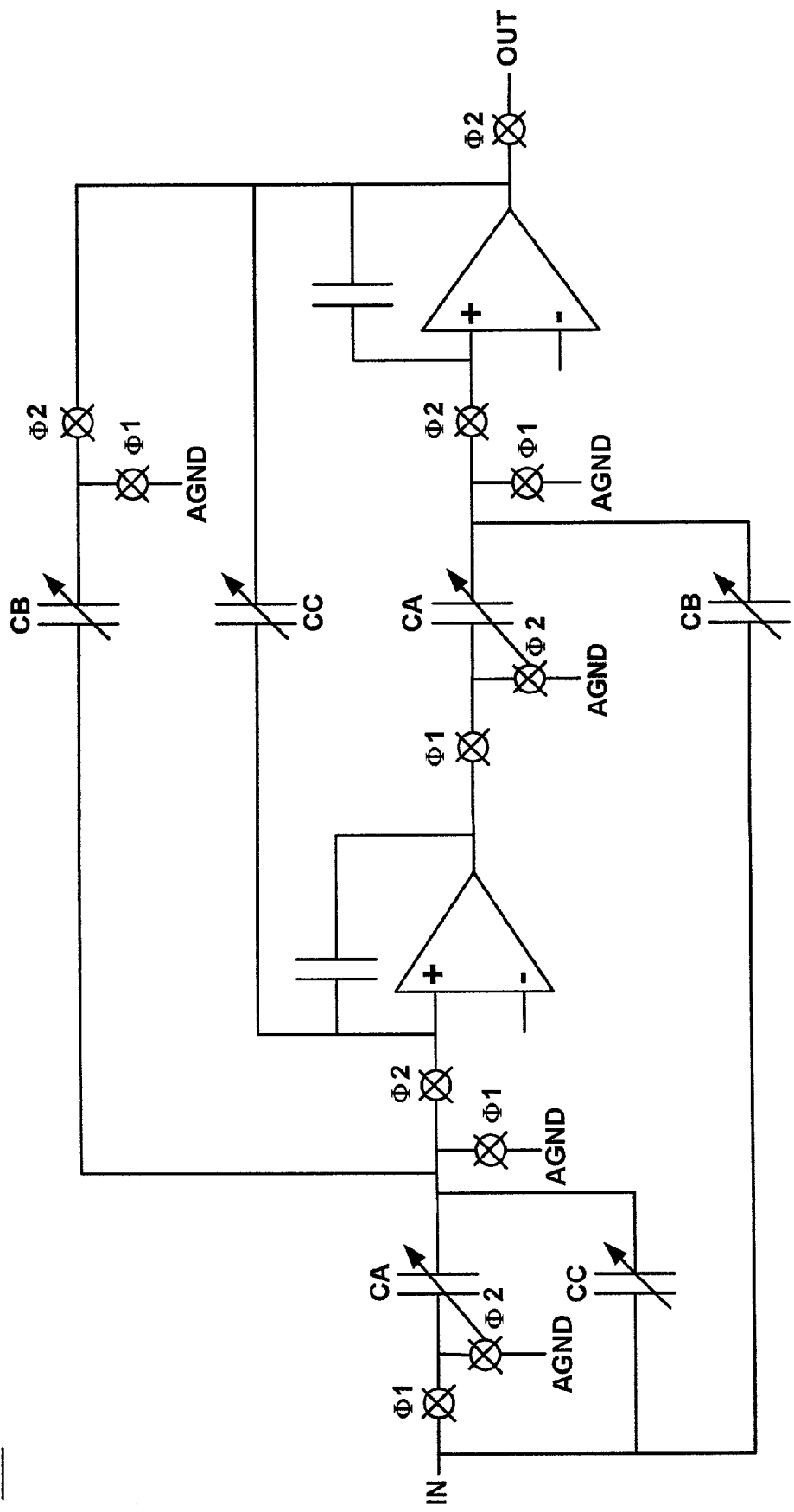
FIG. 14B is a schematic diagram showing one embodiment of a switched capacitor biquad in accordance with the present invention.

FIGS. 14A and 14B are diagrams showing one embodiment of a switched capacitor biquad 110 in accordance with the present invention. FIG. 14A shows the basic interconnection between a type A switched capacitor block 90 and a type B switched capacitor block 100. FIG. 14B is a schematic of a switched capacitor biquad 110 resulting from the interconnection of switched capacitor block 90 and switched capacitor block 100.

Figure 15:
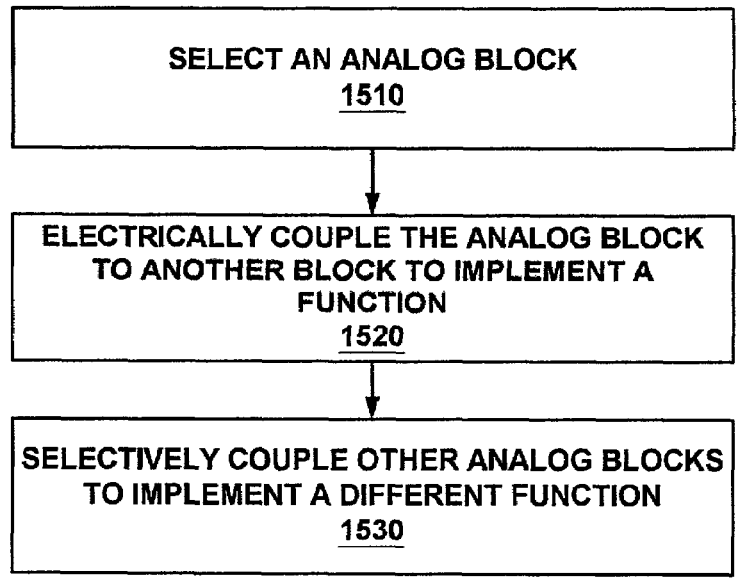
FIG. 15 is a flowchart of the steps in a process for implementing multiple functions using a single integrated circuit in accordance with one embodiment of the present invention.

FIG. 15 is a flowchart of the steps in a process 1500 for implementing multiple functions using a single integrated circuit (e.g., integrated circuit 10 of FIG. 1A) in accordance with one embodiment of the present invention.

As described above, integrated circuit 10 includes a plurality of analog blocks 20 (FIGS. 2 and 3) that can be electrically coupled in different combinations to perform different functions. In step 1510 of FIG. 15, according to the user's programming, an analog block is selected from analog blocks 20.

In step 1520, the selected analog block is selectively and electrically coupled to one or more of the other analog blocks 20, depending on the particular analog function to be implemented and according to the user's programming. Certain analog blocks may be bypassed (not used) in the resultant circuit. Characteristics of elements in the analog blocks 20 can also be specified according to the user's programming, also depending on the particular analog function to be implemented.

In step 1530, the analog blocks 20 are reconfigured to perform a different analog function (e.g., a different combination of the analog blocks 20 can be selectively and electrically coupled to perform another function).

Exemplary Programmable Digital Functionality

The following co-pending U.S. application is hereby incorporated herein by reference, Ser. No. 09/909,045, by Warren Snyder, entitled "Digital Configurable Macro Architecture," filed Jul. 18, 2001, and which is assigned to the assignee of the present invention. Further, the following co-pending U.S. application is also hereby incorporated herein by reference, Ser. No. 09/909,109, by Warren Snyder, entitled "Configuring Digital Functions In A Digital Configurable Macro Architecture," filed Jul. 18, 2001, and which is also assigned to the assignee of the present invention.

A new digital configurable macro architecture is described. The digital configurable macro architecture is well suited for microcontroller or controller designs. In particular, the foundation of the digital configurable macro architecture is a programmable digital circuit block. In an embodiment, programmable digital circuit blocks are 8-bit circuit modules that can be programmed to perform any one of a variety of predetermined digital functions by changing the contents of a few registers therein, unlike a FPGA which is a generic device that can be programmed to perform any arbitrary digital function. Specifically, the circuit components of the programmable digital circuit block are designed for reuse in several of the predetermined digital functions such that to minimize the size of the programmable digital circuit block. The programmable digital circuit blocks can be configured, for example, as timers, counters, serial communication ports, cyclic redundancy generators/checkers (CRC), or pseudo random sequence generators (PRS). The user selects the digital function that is needed and configures the programmable digital circuit block accordingly.

The programmable digital circuit blocks can be configured to be coupled in series or in parallel to handle more complex digital functions. For example, a 24-bit timer can be designed by coupling three 8-bit programmable digital circuit blocks that have been individually configured as 8-bit timers. Additionally, a first programmable digital circuit block that is configured as a CRC generator can feed a second programmable digital circuit block that is configured as a serial output communication port. A variety of mathematical functions such as addition, multiplication, exponential, logarithmic, arithmetic and floating point operations, and a plethora of other mathematical functions may be effectuated herein.

More importantly, the configuration of the programmable digital circuit block is determined by its small number of configuration registers. This provides much flexibility. In particular, the configuration of the programmable digital circuit block is fast and easy since changes in configuration are accomplished by changing the contents of the configuration registers, whereas the contents are generally a small number of configuration data bits. Thus, the programmable digital circuit block is dynamically configurable from one predetermined digital function to another predetermined digital function for real-time processing. The function of the registers described herein may be effectuated, in one embodiment, by latches.

FIG. 16 illustrates a programmable digital circuit block 100 in accordance with an embodiment of the present invention. The programmable digital circuit block 100 is the foundation of a new digital configurable macro architecture of the present invention. The digital configurable macro architecture is well suited for microcontroller or controller designs.

The design of the programmable digital circuit block 100 in the digital configurable macro architecture was developed after examining and studying conventional microcontrollers to determine the types of digital functions that were implemented within various conventional microcontrollers. It was discovered that there were not very many different types of digital functions demanded in microcontroller applications. Furthermore, it was determined that these different types of digital functions had many circuit components in common. Moreover, it was determined that the digital functions were generally implemented as 8-bit or multiples of 8-bits because their length was generally based on the length of standard buses. This led to the development of the programmable digital circuit blocks 100, the building block of the digital configurable macro architecture.

In an embodiment, the programmable digital circuit block 100 is an 8-bit circuit module that can be programmed to perform any one of a variety of predetermined digital functions (which are useful in microcontroller applications) by changing the contents of a few configuration registers 50 therein, unlike a FPGA which is a generic device that can be programmed to perform any arbitrary digital function. Specifically, the circuit components of the programmable digital circuit block 100 are designed for reuse in several of the predetermined digital functions such that to minimize the size of the programmable digital circuit block 100. Hence, the programmable digital circuit block 100 is highly efficient in terms of die area. In an embodiment, the programmable digital circuit block 100 can be configured as a timer, a counter, a pulse width modulator (PWM), a cyclic redundancy generator/checker (CRC), a pseudo random sequence generator (PRS), a dead zone delay, a UART (universal asynchronous receiver-transmitter) transmitter, a UART (universal asynchronous receiver-transmitter) receiver, a SPI (serial peripheral interface) Master, or a SPI (serial peripheral interface) Slave.

In another embodiment, the programmable digital circuit block 100 can be configured as a timer, a counter, a pulse width modulator (PWM), a cyclic redundancy generator/checker (CRC), a pseudo random sequence generator (PRS), or a dead zone delay, whereas the digital communication functions (e.g., UART and SPI) are eliminated to further reduce the size of the programmable digital circuit block 100. In particular, the user selects the digital function that is needed and configures the programmable digital circuit block 100 accordingly. It should be understood that the programmable digital circuit block 100 can be designed to implement other digital functions.

In as much as a design can have an array of programmable digital circuit blocks 100, configurable to be coupled together in series or in parallel to handle more complex digital functions or to increase precision, a number of capabilities become achievable. As in the example recited above wherein a 24-bit timer can be designed by coupling three 8-bit programmable digital circuit blocks 100 that have been individually configured as 8-bit timers, other similar capabilities are achieved. For example, an 8-bit timer can be extended to 16- or 32-bit digital functions by similarly coupling multiple programmable digital circuit blocks 100 together. And in another example above, the capability of a first programmable digital circuit block configured as a CRC generator feeding a second programmable digital circuit block to configure a serial output communication port, illustrates achieving the advantages of reducing device programming and increasing its performance.

The configuration of the programmable digital circuit block 100 is determined by its configuration registers 50. The programmable digital circuit block 100 generally has one or more configuration registers 50. Importantly, a significant level of flexibility is thus achieved, in as much as the configuration of the programmable digital circuit block 100 may be made quickly, simply, and dynamically. It is achieved in one embodiment, by changing the contents of the configuration registers 50, which are generally a small number of configuration data bits. This dynamic configurability/reconfigurability between predetermined digital functions enables programmable digital circuit block 100 to effectuate, in one embodiment, real-time processing. In contrast, FPGAs need to have their look-up tables re-programmed in order to have them implement a new digital function, a time-consuming task that is not done in real-time processing.

Referring to FIG. 16, in an embodiment the programmable digital circuit block 100 includes one or more configuration registers 50, one or more data registers 40, a plurality of selectable logic circuits 30, one or more configurable inputs 20, one or more configurable outputs 10, one or more cascade outputs 60, one or more is cascade inputs 70, a clock input 80, and a system input 90. It should be understood that the programmable digital circuit block 100 can have other designs including lengths other than 8-bits.

The configuration registers 50 are programmed via the system bus 90. Any device, such as a microprocessor using data stored in a RAM or flash memory, can program (or write to) the configuration registers. The configuration registers 50 receive and store a plurality of configuration data corresponding to any one of the plurality of predetermined digital function described above. The programmed configuration registers 50 configure the programmable digital circuit block 100 to perform any one of the predetermined digital functions based on the configuration data. Moreover, the configuration registers 50 can be dynamically programmed with the configuration data for real-time processing. In addition, the configuration data includes (1) bits for indicating one of the predetermined digital functions and configuring the selectable logic circuits 30, (2) bits for configuring and selecting the configurable inputs 20 and the configurable outputs 10 and the clock input 80, (3) bits for indicating the mode of the predetermined digital function (e.g., parity, no parity, etc.), (4) bits for indicating the length of the predetermine digital function if several programmable digital circuit block 100 are coupled together (e.g., 8-bit, 16-bit, 24-bit, etc.), and (5) bits for indicating and configuring the interface between adjacent programmable digital circuit blocks 100 that are coupled together (e.g., configuring and selecting the cascade inputs 70 and the cascade outputs 60 for serial or parallel interfacing).

In general, the number of bits in the configuration data is sufficiently small to enable the configuration registers 50 to be programmed on-the-fly so that the programmable digital circuit block 100 can be dynamically configured and interfaced. Thus, the programmable digital circuit blocks 100 can be configured as a timer for a first length of time, re-configured as a counter for a second length of time, reconfigured as a PWM for a third length of time, and so on, for real-time processing. For example, it is possible for a single register write to configure the programmable digital circuit block 100 from a timer to a PWM or to a counter or to a CRC generator or etc. Some number of registers are configurable to store programming data for the programmable digital circuit blocks.

The connections 50A-50F between the configuration registers 50 and other components of the programmable digital circuit block 100 enable the configuration registers 50 to properly configure the programmable digital circuit block 100 to any one of the predetermined digital functions and to properly interface the programmable digital circuit block 100 with other programmable digital circuit blocks in series or in parallel.

Continuing with FIG. 16, the selectable logic circuits 30 are tailored such that they have a minimum set of circuit resources that can be programmed by the configuration registers 50 to implement any one of a variety of predetermined digital functions, unlike the FPGA where a substantial amount of circuit resources may remain unused. In particular, the design and structure of the selectable logic circuits 30 are dependent on the predetermined digital functions such that to minimize the size of the programmable digital circuit block 100. The fixed number of digital functions for the programmable digital circuit block 100 substantially influences the design of the programmable digital circuit block 100, providing cost savings and improving performance. The configuration registers 50 configure and select any of the selectable logic circuits 30 to perform one of the predetermined digital functions based on the configuration data. More importantly, the selectable logic circuits 30 are reused in several of the predetermined digital functions as will be illustrated below, ensuring the size efficiency of the programmable digital circuit block 100. In an embodiment, the selectable logic circuits 30 include a plurality of logic gates.

Moreover, the selectable logic circuits 30 realize any one of the variety of predetermined digital functions by using the data registers 40 to receive data, load data, capture data, etc. Thus, the data registers 40 are also reused in several of the predetermined digital functions as will be illustrated below.

Again referencing FIG. 16, the cascade outputs 60 and the cascade inputs 70 are selected and configured according to the configuration data. The cascade outputs 60 allow the programmable digital circuit block 100 to output signals for directly interfacing with adjacent or neighboring programmable digital circuit blocks. The cascade inputs 70 allow the adjacent or neighboring programmable digital circuit blocks to send signals that directly interface and are received by the programmable digital circuit block 100. Specifically, the cascade outputs 60 and the cascade inputs 70 enable multiple programmable digital circuit blocks to seamlessly interface to handle more complex digital functions or to increase precision as described above (e.g., 32-bit timer, CRC generator and SPI Master, 24-bit counter, etc.).

Figure 17:
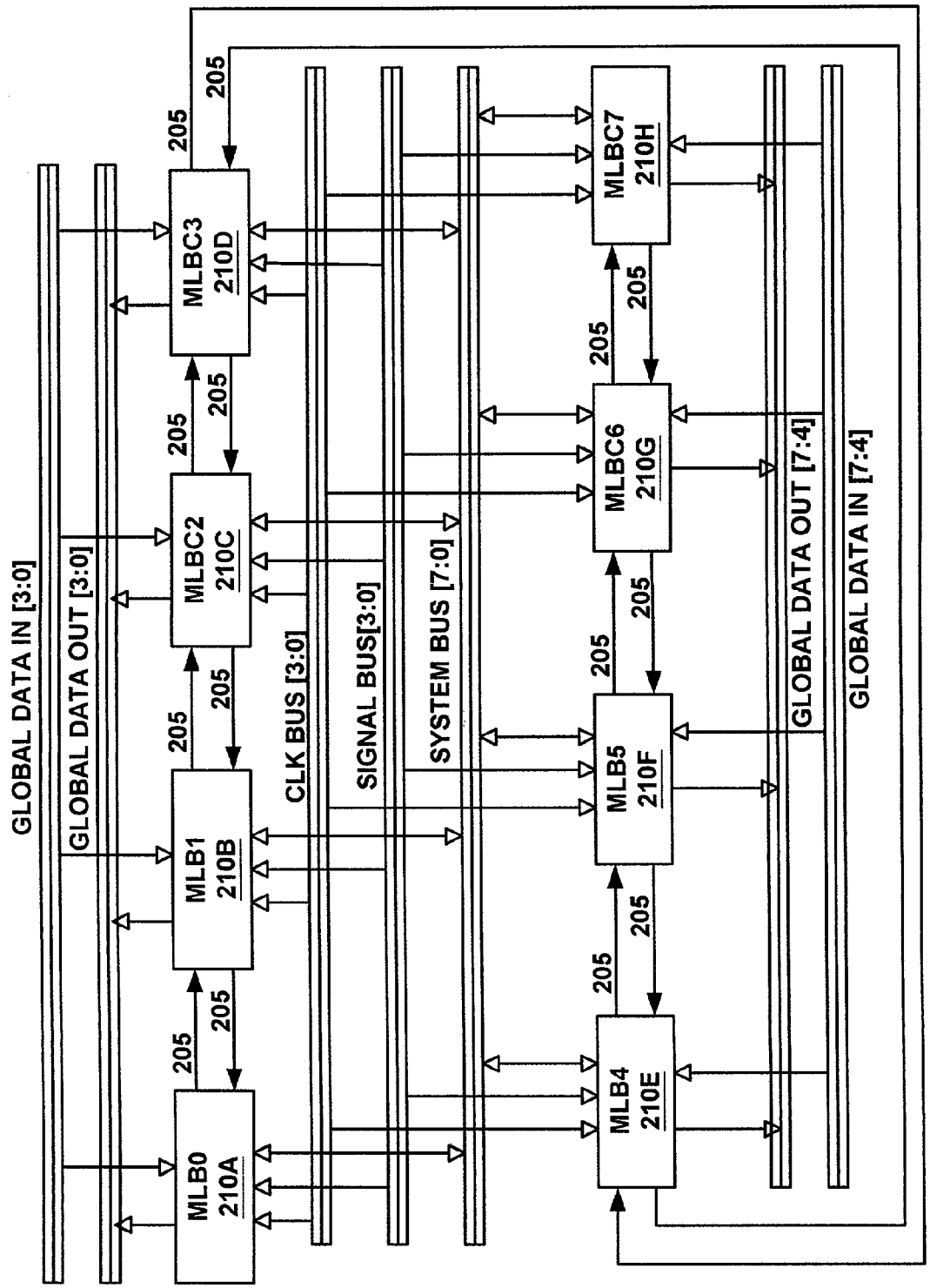
FIG. 17 illustrates a block diagram of an exemplary programmable digital device having a plurality of programmable digital circuit blocks in accordance with an embodiment of the present invention.

FIG. 17 illustrates a block diagram of an exemplary programmable digital device 200 having a plurality of programmable digital circuit blocks 210A-210H in accordance with an embodiment of the present invention. The plurality of programmable digital circuit blocks 210A-210H includes a first group and a second group. The first group includes the programmable digital circuit blocks 210A-210B and 210E-210F. Moreover, each programmable digital circuit block of the first group can be configured as a timer, a counter, a pulse width modulator (PWM), a cyclic redundancy generator/checker (CRC), a pseudo random sequence generator (PRS), or a dead zone delay. The second group includes the programmable digital circuit blocks 210C-210D and 210G-210H. Moreover, each programmable digital circuit block of the second group can be configured as a timer, a counter, a pulse width modulator (PWM), a cyclic redundancy generator/checker (CRC), a pseudo random sequence generator (PRS), a dead zone delay, a UART (universal asynchronous receiver-transmitter) transmitter, a UART (universal asynchronous receiver-transmitter) receiver, a SPI (serial peripheral interface) Master, or a SPI (serial peripheral interface) Slave.

As illustrated in FIG. 17, adjacent or neighboring programmable digital circuit blocks are interfaced via cascade lines 205 (input or output) as described above.

The cascade lines 205 enable the programmable digital circuit blocks 210A-210H to seamlessly interface to handle more complex digital functions or to increase precision. For example, a 32-bit counter can be designed by coupling four 8-bit programmable digital circuit blocks that have been individually configured as 8-bit counters. Similarly, the 8-bit counter can be extended to 16- or 24-bit digital functions by coupling multiple programmable digital circuit blocks together. Additionally, a first programmable digital circuit block that is configured as a CRC generator can feed a second programmable digital circuit block that is configured as a serial output communication port, reducing device programming and increasing performance.

Moreover, the exemplary programmable digital device 200 includes a signal bus for digitized analog signals, a clock bus, a system bus for programming the programmable digital circuit blocks 210A-210H, and a plurality of global data buses for transmitting data to/from the programmable digital circuit blocks 210A-210H.

Figure 18:
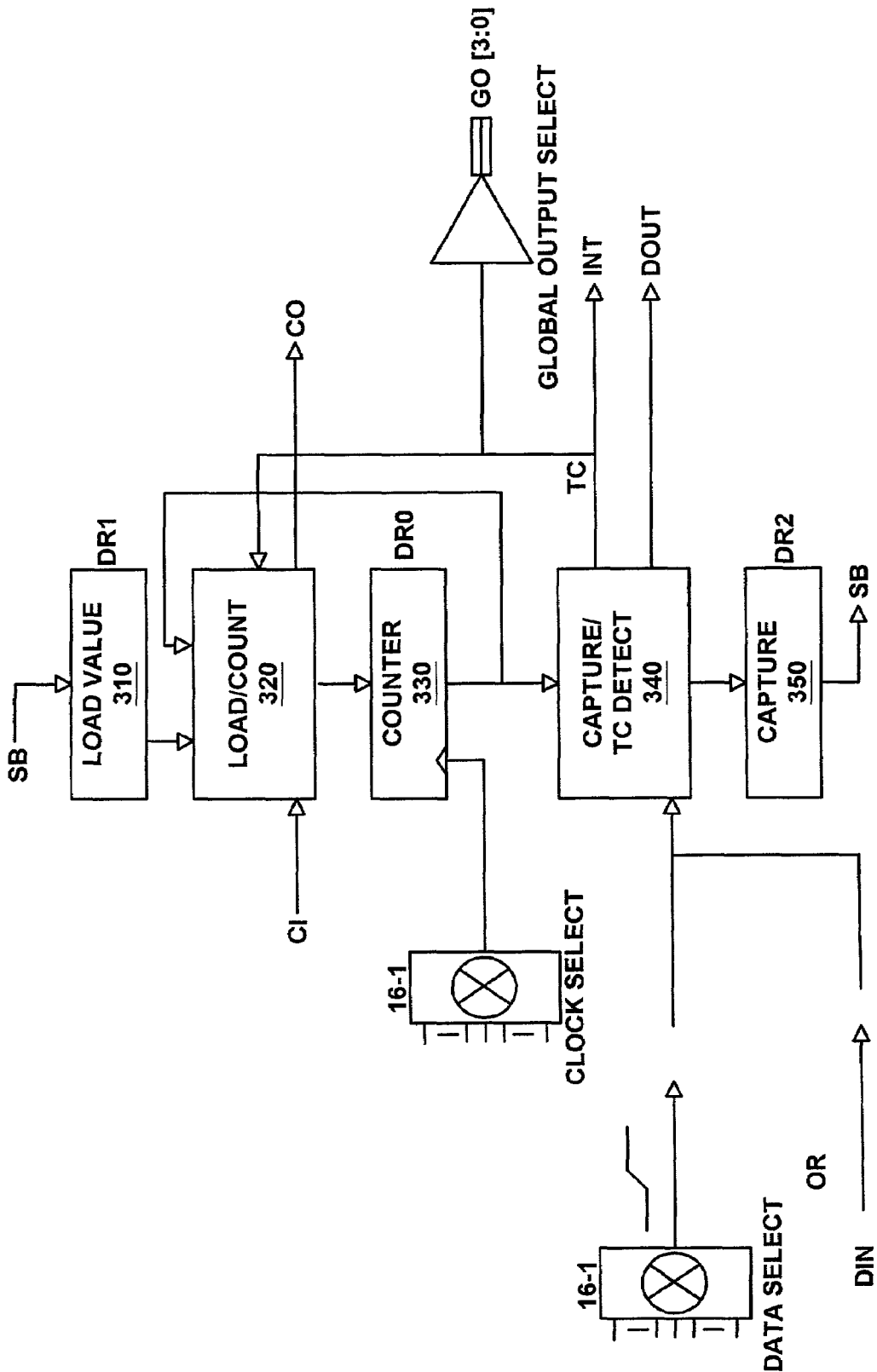
FIG. 18 illustrates a block diagram of a timer configuration of a programmable digital circuit block in accordance with an embodiment of the present invention.
Figure 19:
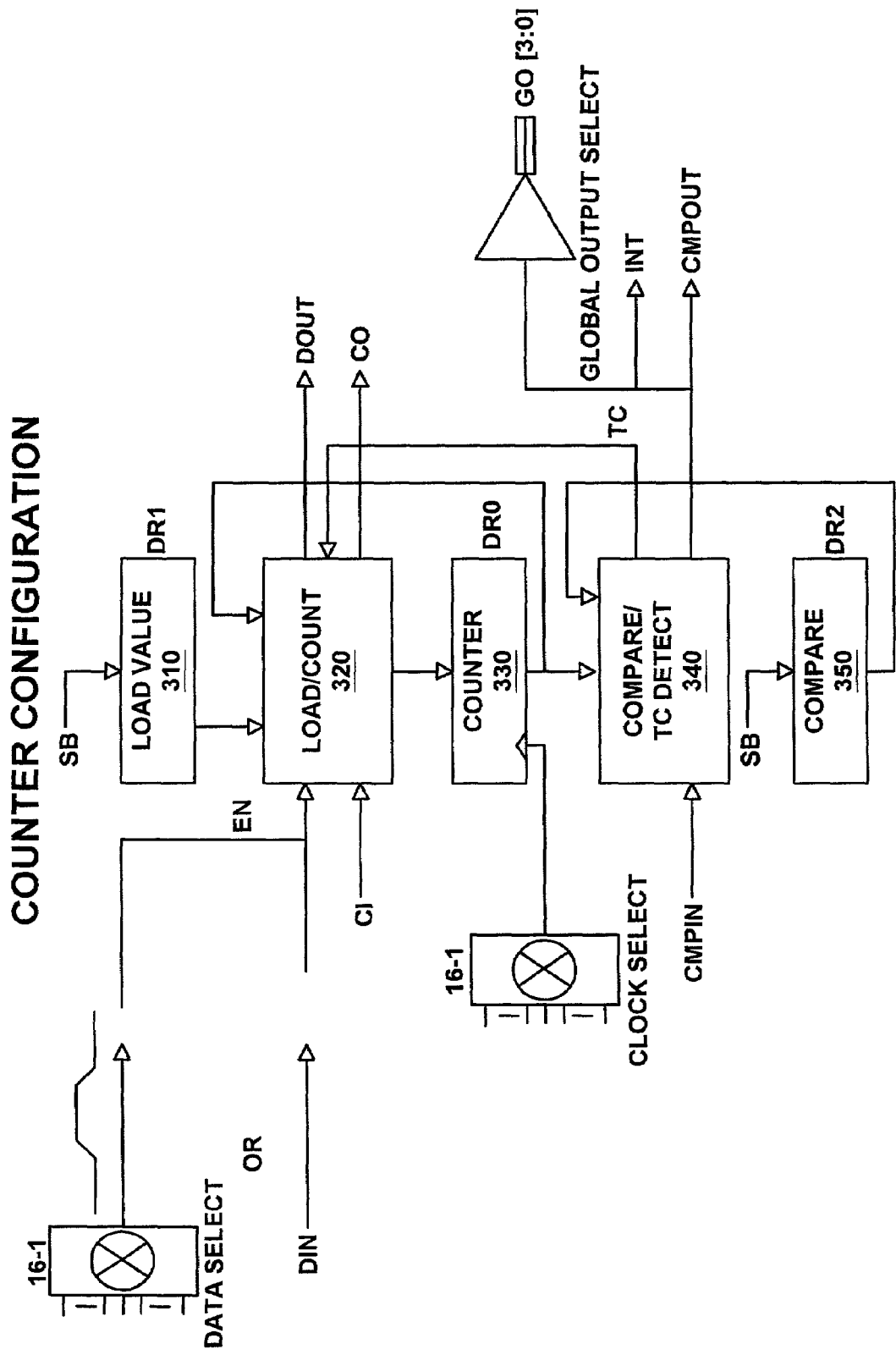
FIG. 19 illustrates a block diagram of a counter configuration of a programmable digital circuit block in accordance with an embodiment of the present invention.
Figure 20:
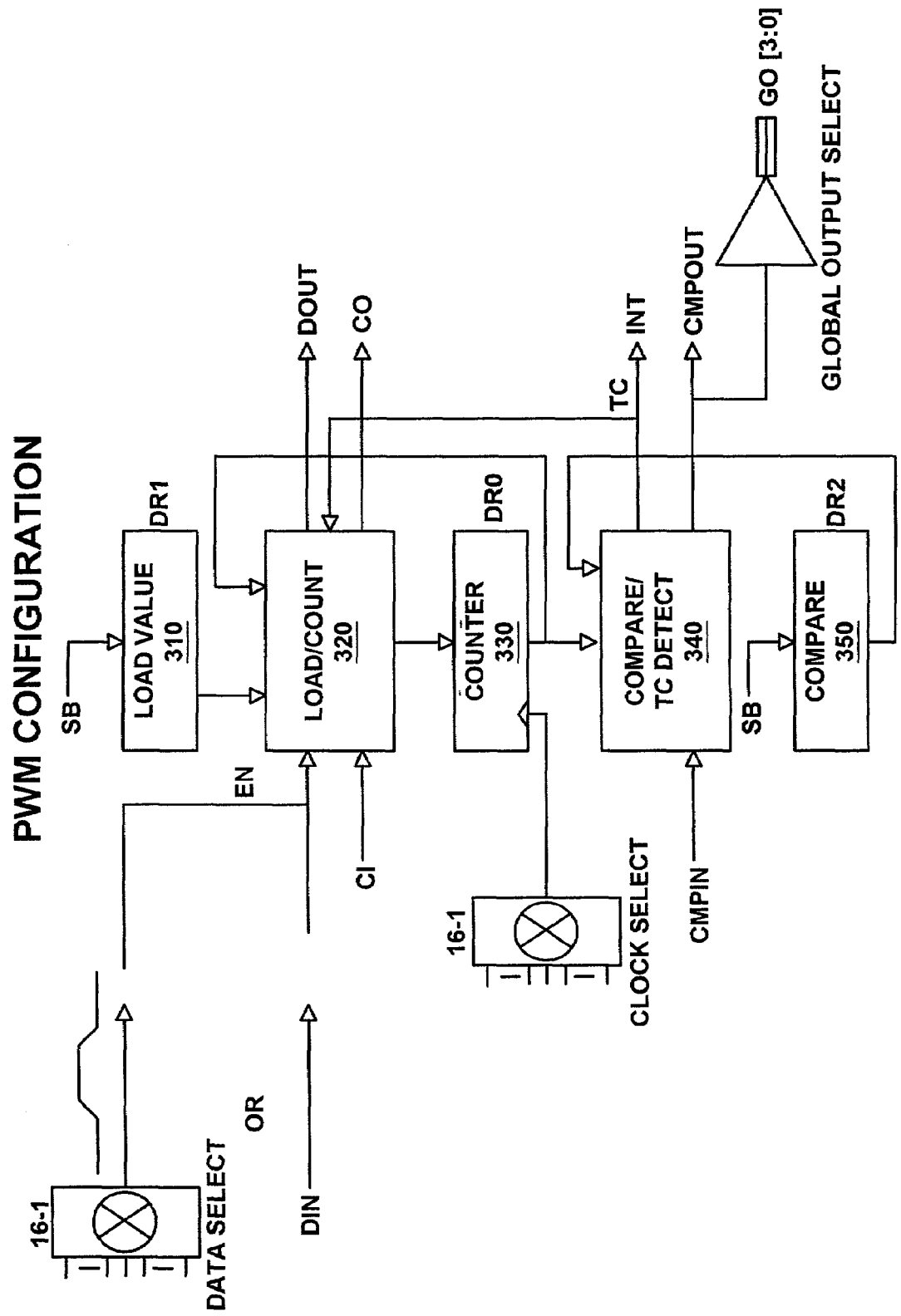
FIG. 20 illustrates a block diagram of a pulse width modulator (PWM) configuration of a programmable digital circuit block in accordance with an embodiment of the present invention.

FIG. 18 illustrates a block diagram of a timer configuration of a programmable digital circuit block in accordance with an embodiment of the present invention. FIG. 19 illustrates a block diagram of a counter configuration of a programmable digital circuit block in accordance with an embodiment of the present invention. FIG. 20 illustrates a block diagram of a pulse width modulator (PWM) configuration of a programmable digital circuit block in accordance with an embodiment of the present invention.

As illustrated in FIGS. 18-20, the selectable logic circuits 320 and 340 are reused for the timer, counter, and PWM configurations. Moreover, the first data register 310, the second data register 330, and the third data register 350 of the programmable digital circuit block are reused for the timer, counter, and PWM configurations. In essence, the configuration data loaded onto the configuration registers determines how the data registers 310, 330, and 350 are to be used, what operation is to be performed on the data by the selectable logic circuits 320 and 340, where the input data is selected from (e.g., system bus (SB), signal bus, global bus, etc.), where the output data is transmitted, what clock signal is to be used, what are the cascade inputs (e.g., DIN, CI, etc.) from other programmable digital circuit blocks, what are the cascade outputs (e.g., DOUT, CO, etc.) to other programmable digital circuit blocks, when to generate an interrupt (INT), and what is the data flow within the programmable digital circuit block so that the programmable digital circuit block can properly perform any one of the predetermined digital functions.

Figure 21:
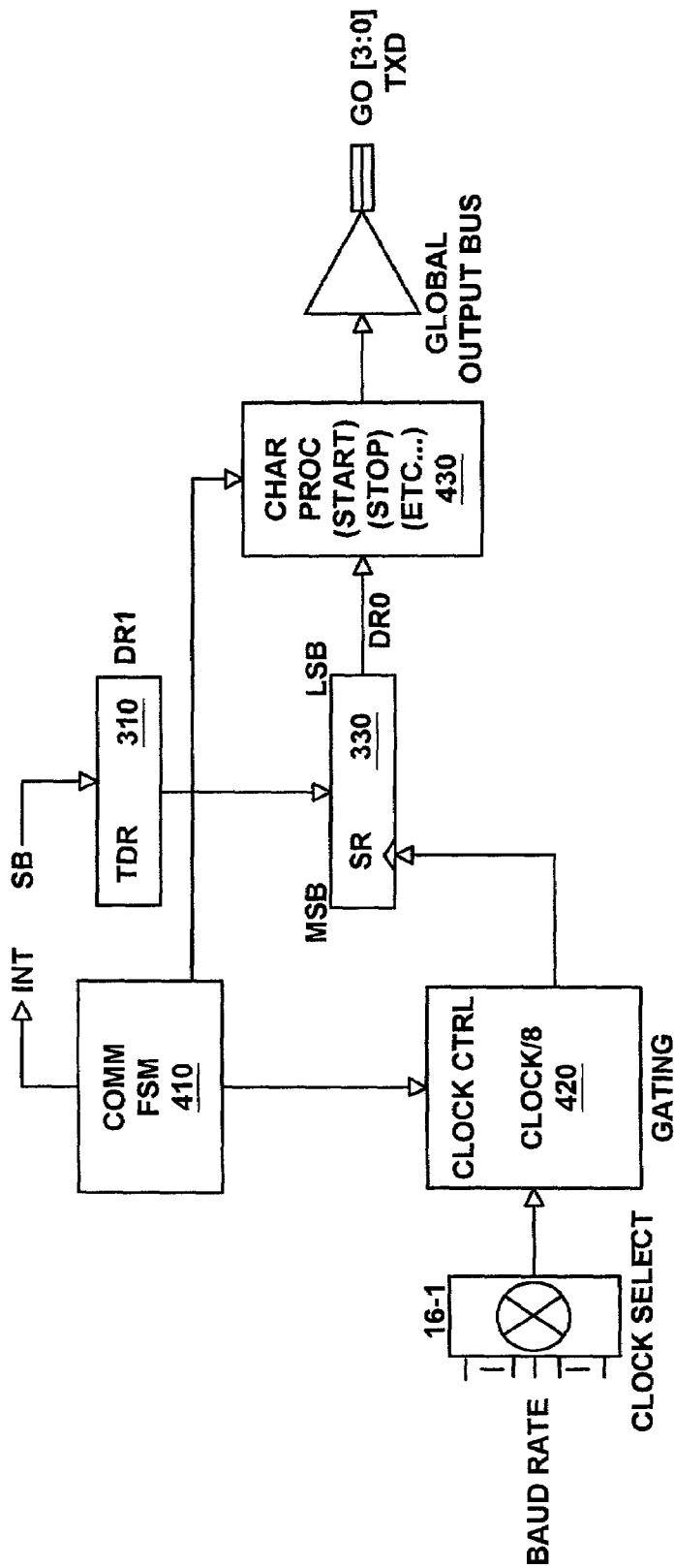
FIG. 21 illustrates a block diagram of a UART transmitter configuration of a programmable digital circuit block in accordance with an embodiment of the present invention.
Figure 22:
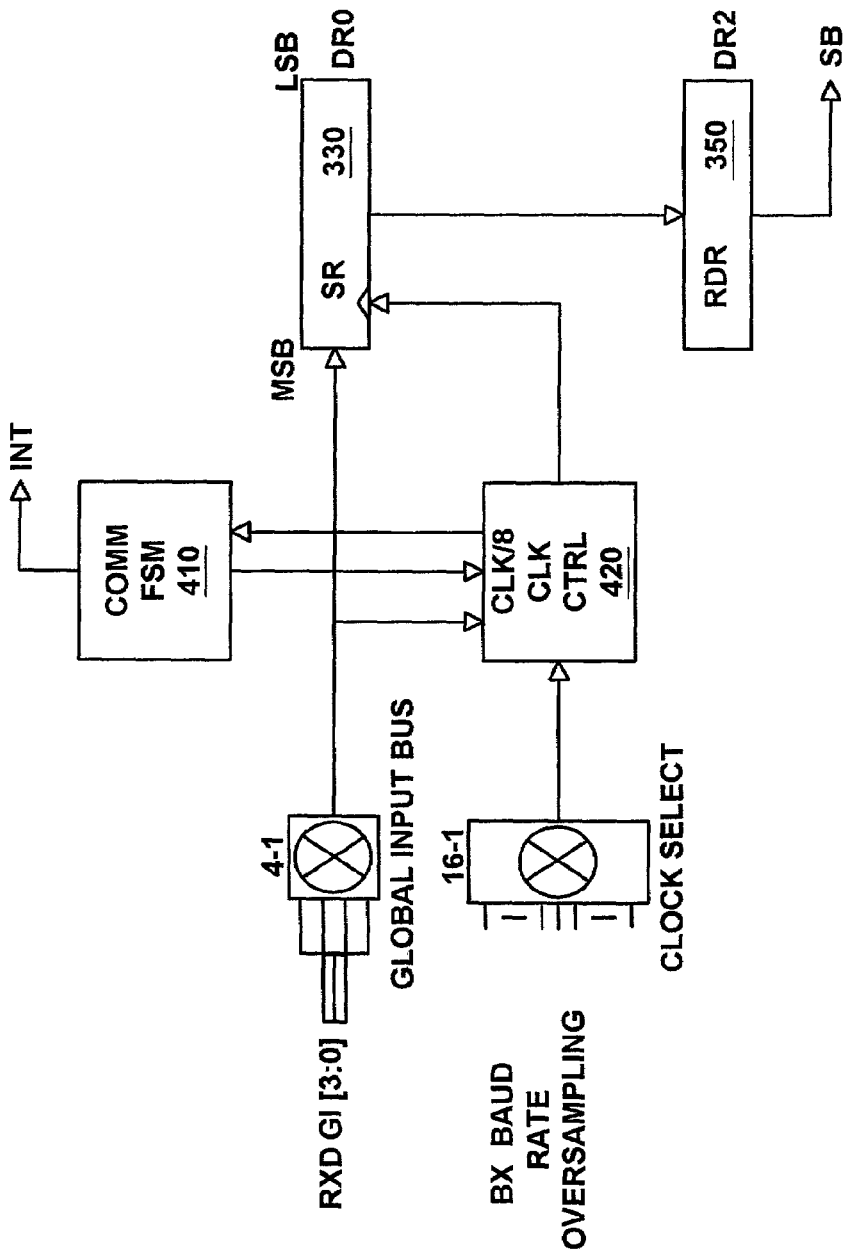
FIG. 22 illustrates a block diagram of a UART receiver configuration of a programmable digital circuit block in accordance with an embodiment of the present invention.
Figure 23:
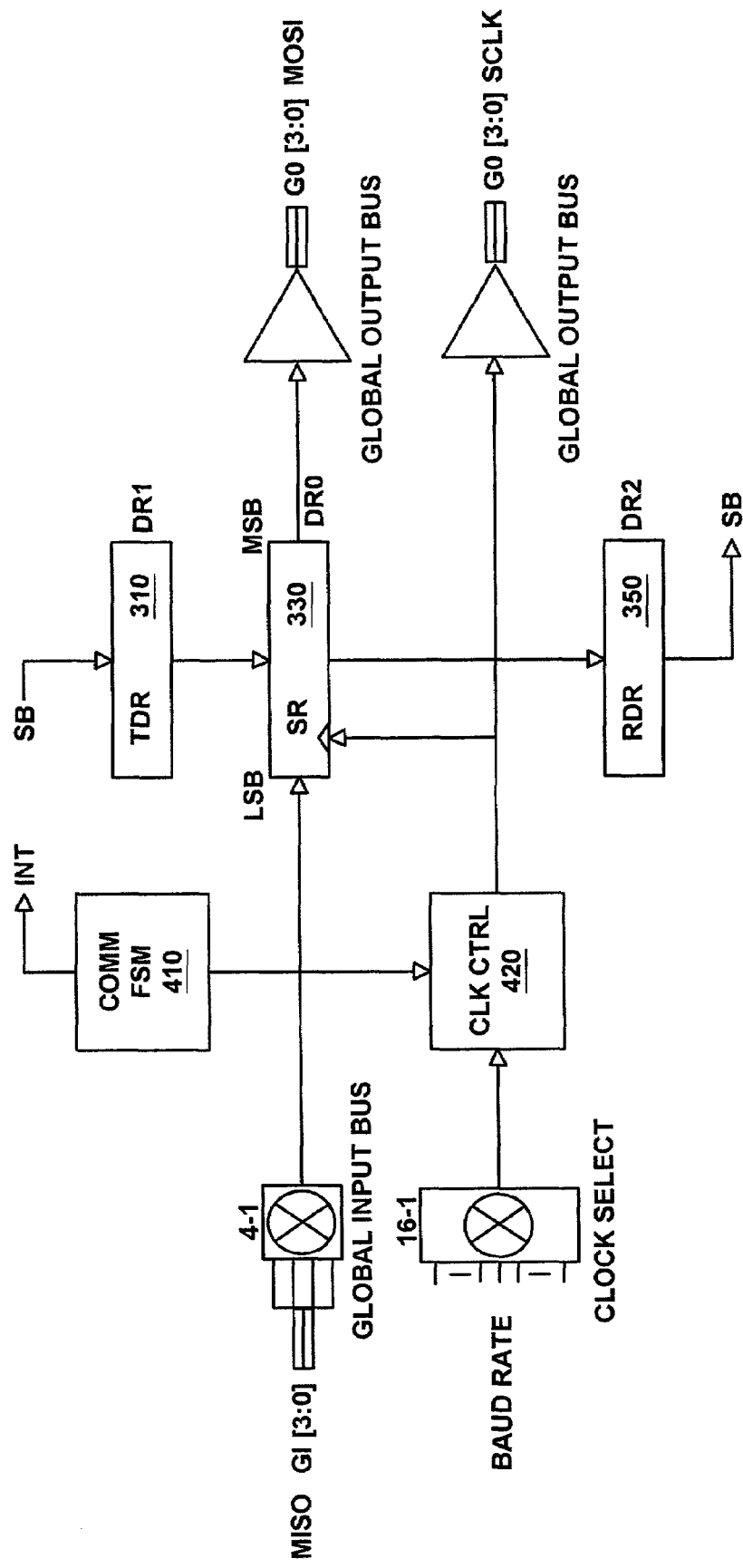
FIG. 23 illustrates a block diagram of a SPI Master configuration of a programmable digital circuit block in accordance with an embodiment of the present invention.
Figure 24:
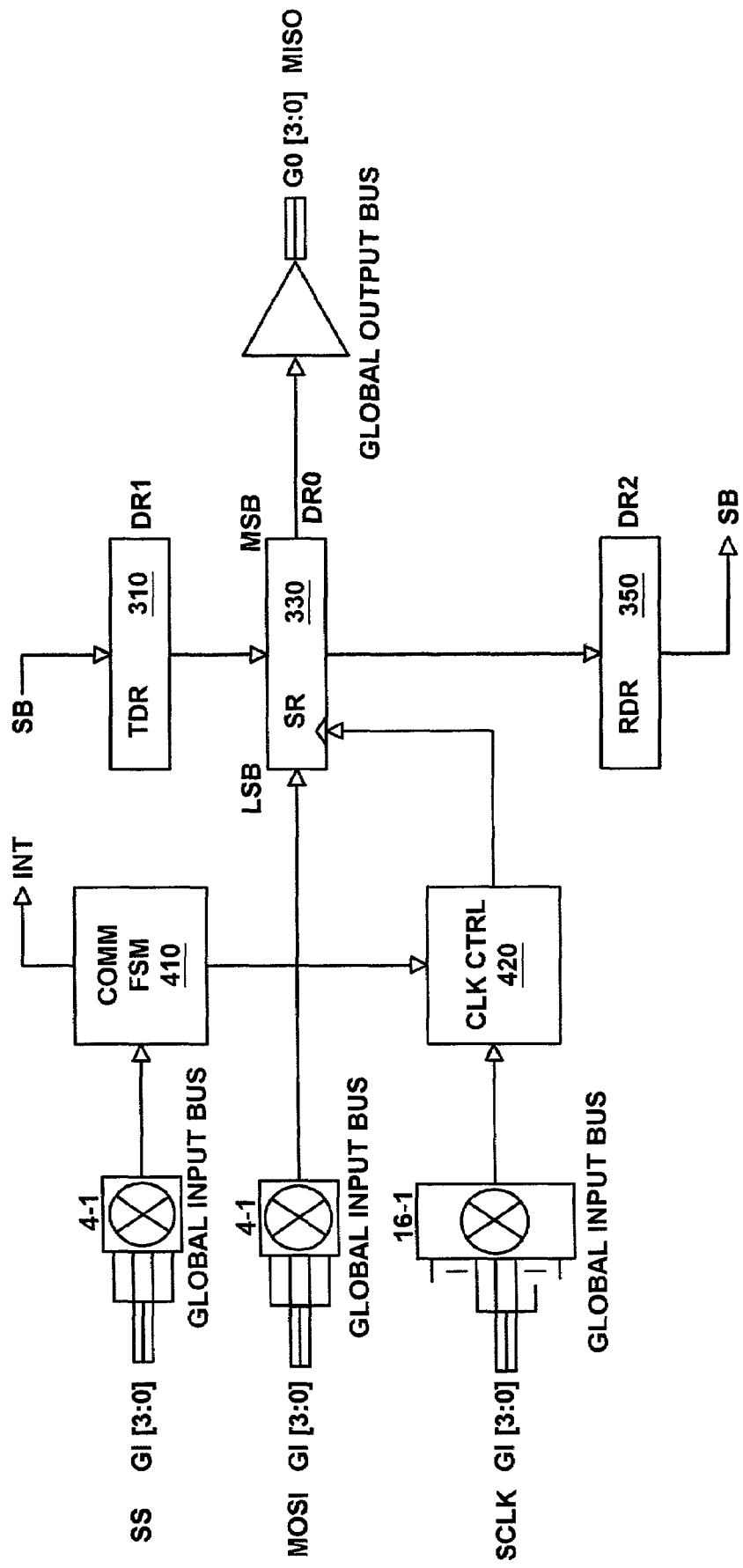
FIG. 24 illustrates a block diagram of a SPI Slave configuration of a programmable digital circuit block in accordance with an embodiment of the present invention.

FIG. 21 illustrates a block diagram of a UART transmitter configuration of a programmable digital circuit block in accordance with an embodiment of the present invention. FIG. 22 illustrates a block diagram of a UART receiver configuration of a programmable digital circuit block in accordance with an embodiment of the present invention. FIG. 23 illustrates a block diagram of a SPI Master configuration of a programmable digital circuit block in accordance with an embodiment of the present invention. FIG. 24 illustrates a block diagram of a SPI Slave configuration of a programmable digital circuit block in accordance with an embodiment of the present invention.

As illustrated in FIGS. 21-24, the selectable logic circuits 410 and 420 are reused for the UART transmitter, the UART receiver, the SPI Master, and the SPI Slave configurations. Moreover, the first data register 310, the second data register 330, and the third data register 350 of the programmable digital circuit block are reused in several of the UART transmitter, the UART receiver, the SPI Master, and the SPI Slave configurations. However, the selectable logic circuit 430 is used in the UART transmitter configuration of FIG. 21 since the UART protocol requires that particular protocol bits (e.g., start bits, stop bits, etc.) to be generated by the UART transmitter.

FIGS. 18-24 illustrate that the programmable digital circuit block can be configured fast and easily. Furthermore, FIGS. 18-24 illustrate that the programmable digital circuit block is highly efficient in terms of die area.

In a programmable digital circuit according to one embodiment, at least three programmable digital circuit blocks are coupled in series and/or in parallel. Each programmable digital circuit block is (i) controlled by an n-bit register or look-up table containing programming information including a cascading bit and (ii) configured to provide at least one of a plurality of mathematical functions, wherein the cascading bit determines whether a particular programmable digital circuit block is coupled is series with an adjacent programmable digital circuit block, and when programmed, the programmable digital circuit provides at least one digital system function.

Exemplary Mapping & Configurability Functionality

The following co-pending U.S. application is hereby incorporated herein by reference, Ser. No. 09/953,423, by Warren Snyder, entitled "a Configurable Input/Output Interface For A Microcontroller," filed Sep. 14, 2001, and which is assigned to the assignee of the present invention.

One embodiment of the present invention provides a configurable input/output interface which allows designers to specify which resource on the microcontroller device will be accessible to a given I/O pin. Furthermore, embodiments of the present invention can access the rest of the microcontroller device functions through a configurable interface and can be reconfigured dynamically (e.g., per clock cycle). The present invention provides a configurable input/output interface which gives designers the flexibility to easily create customized configurations which incur no NRE and require no unusual design skills.

The present invention is an input/output (I/O) pin with a configurable interface to a microprocessor, and to a global mapping which determines access to functional units on the microcontroller. The I/O pin can be selectively coupled to the global mapping or to the microprocessor on each clock cycle. The mapping configuration selectively couples a different functional unit or units of the microcontroller to access the I/O pin on each clock cycle. The interface between the I/O pin and the rest of the system can be dynamically configured by software created or modified by a user, or by hardware. The present invention facilitates repositioning pin locations on a microcontroller because it is a software modification rather than a hardware modification. The present invention further enables the microcontroller functions to be configured by the user rather than by the microcontroller vendor.

Figure 25:
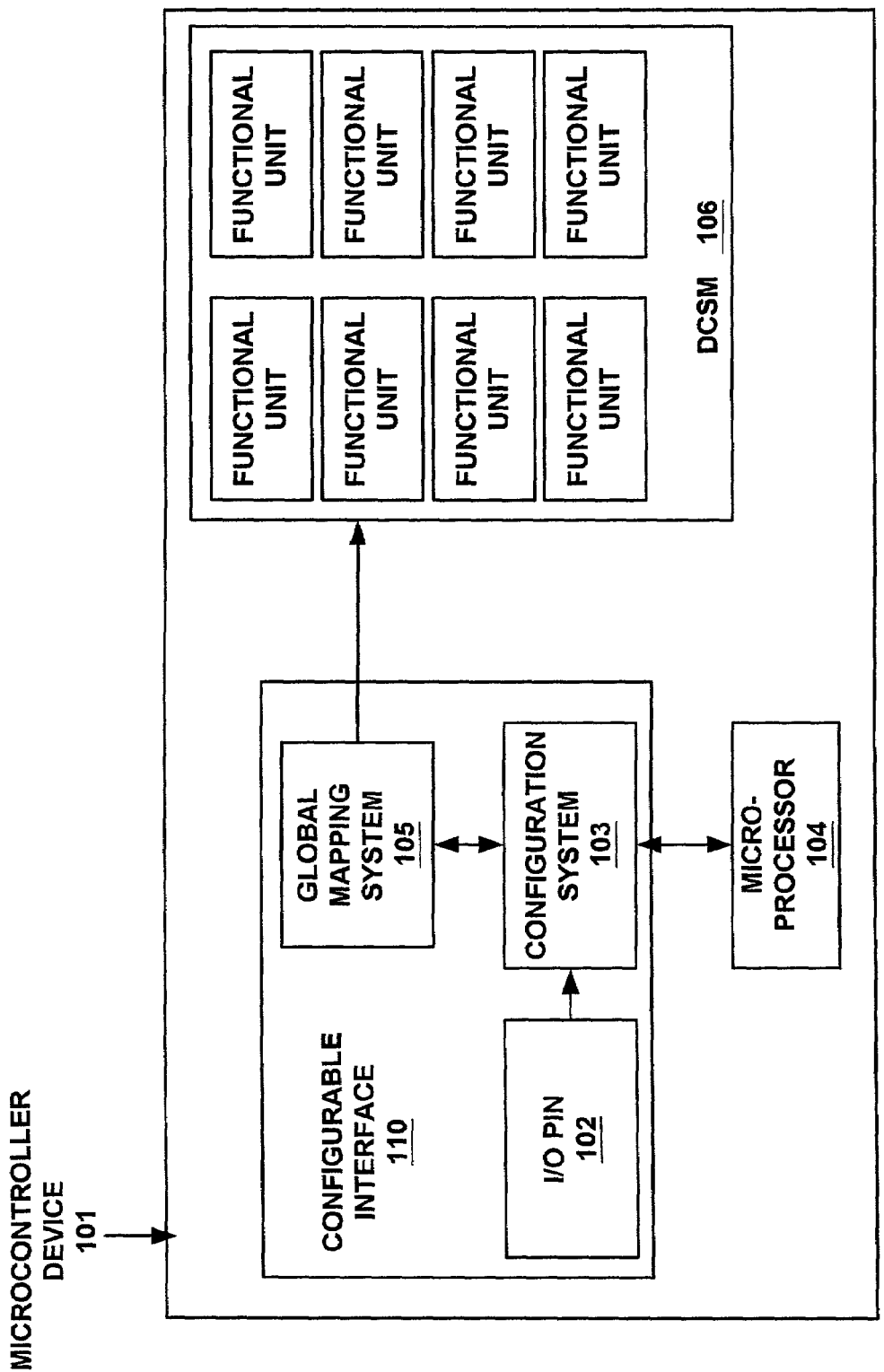
FIG. 25 is a block diagram of a microcontroller device with a configurable input/output interface as embodied by the present invention.

FIG. 25 is a block diagram showing a microcontroller device 101 having a configurable interface 110 consisting of input/output (I/O) pin 102, configuration system 103, and global mapping system 105. Configuration system 103 can, depending upon its configuration, selectively couple I/O pin 102 with either a microprocessor 104 or global mapping system 105. Global mapping system 105 is coupled with a plurality of functional units of Digital Configurable System Macro (DCSM) 106. Global mapping system 105 selectively couples I/O pin 102 with a selected functional unit or units of DCSM 106.

The functional units of DCSM 106 are programmable digital and analog units which can be configured and connected by a user as needed to create a customized microcontroller device. The digital units can be timers, controllers, serial communications units, Cycle Redundancy Check (CRC) generators, Universal Asynchronous Receiver/Transmitters (UARTs), etc. For functions that require higher precision or counting, the digital units can be combined. The analog units are programmable operational amplifier circuits which can be interconnected to create a desired amplifier circuit. Typical peripherals that can be created are amplifiers, programmable gain, digital to analog converters, analog to digital converters, analog drivers, and high-, low-, and band-pass filters, etc. Higher order user modules such as modems, complex motor control, and complete sensor signal chains can be created from these building blocks. The ability to program microcontroller device 101 to suit a particular application necessitates a reconfigurable I/O interface which is provided by the present invention.

FIG. 26 is a block diagram of a configurable input/output interface 200 for a microcontroller as embodied by the present invention. For purposes of clarity, the following discussion will utilize the block diagram of FIG. 26 with flow chart 300 of FIG. 27, to describe one embodiment of the present invention.

In one embodiment, I/O pin 102 and configuration system 103 are integrated into a pin unit. A plurality of these integrated pin units are combined to create a port. However, each of the pin units in a port is still operable to be addressed individually by global mapping system 105. In one embodiment, 8 of these integrated pin units comprise each port. However, while the present embodiment recites an 8-pin port, the present invention is well suited to utilize ports with other numbers of pins as well. An 8 pin port is recited so that disproportionate amounts of addressing resources are not used by the I/O interfaces.

Figure 27:
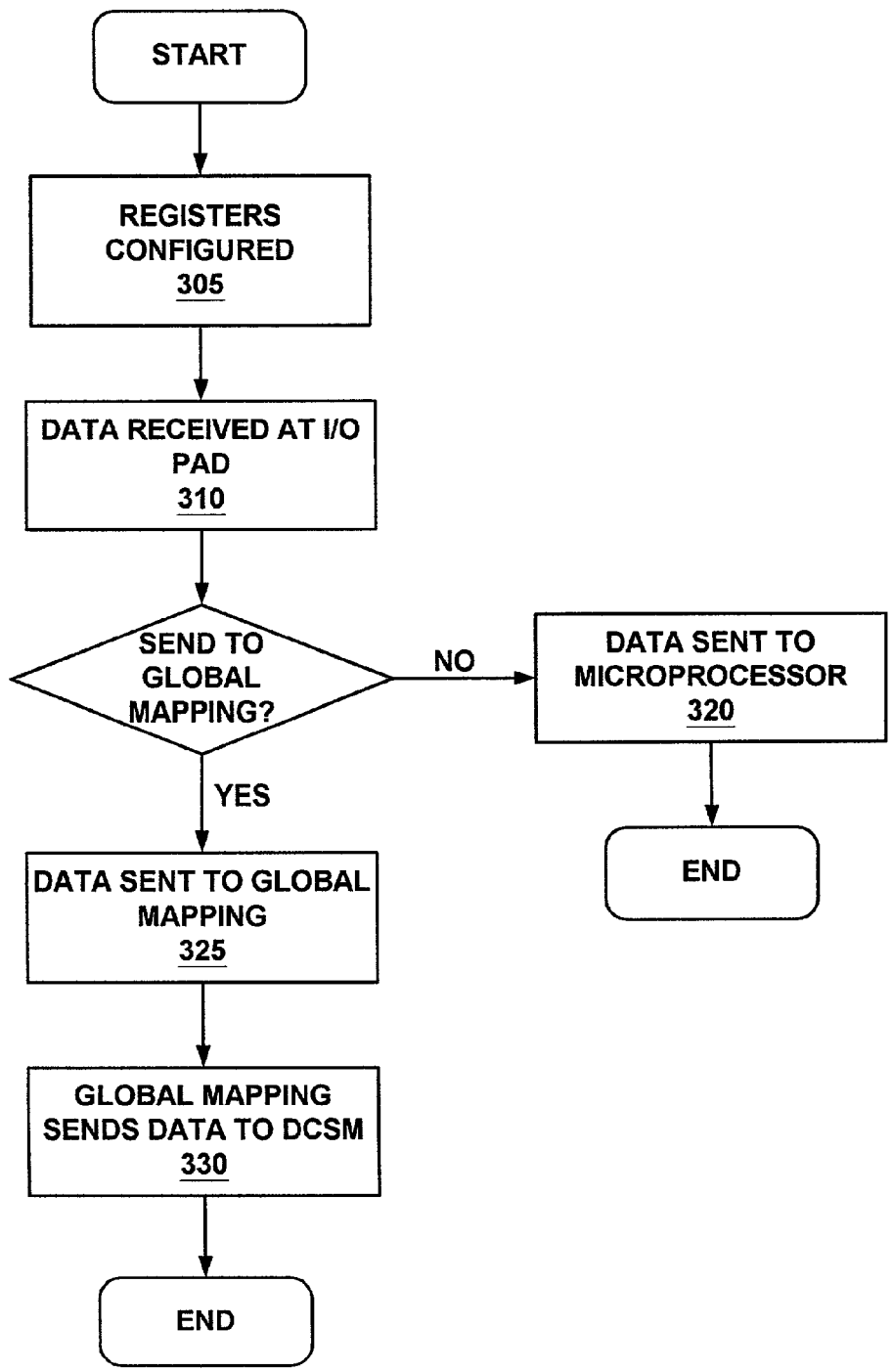
FIG. 27 is a flowchart of a process 300 for using a configurable input/output interface for a microcontroller to input data as embodied by the present invention.

With reference to FIG. 26 and to step 305 of FIG. 27, the registers of configuration system 103 and global mapping system 105 are configured. For an input operation, these registers are in logic decoder 205 and the input global mapping 211. This configuration information can be sent from microprocessor 104 (shown in FIG. 265). However, the configuration of the global mapping is not exclusively limited to the microprocessor. Other mechanisms on microcontroller 101 which are capable of changing the configuration bits, such as a state machine, flash bits, or static RAM, can be used to change the configuration.

Global mapping system 103 is maintained by a control program which supplies the logic to selectively couple I/O pin 102 with functional units of DCSM 106. The programming of the control program is done by the user which allows greater flexibility than using a pre-determined mapping scheme provided by a silicon vendor. The control program also facilitates reconfiguring pin assignment because it is now a software modification rather than a hardware modification.

Customer firmware initializes a particular mapping by writing the configuration to registers associated with the global map. The configuration of the mapping can be changed at any time (e.g., per clock cycle). The global mapping system allows, for example, 4 separate functional units on DCSM 106 to send 4 different signals through the same I/O pin by coupling a particular signal from a functional unit of the DCSM to the I/O pin from cycle to cycle. In another example, a single clock signal can be simultaneously coupled to 4 different I/O pins. This facilitates interfacing with resources on microcontroller device 101 in multiple ways, either from a single or multiple pin configuration.

With reference to FIG. 26 and to step 310 of FIG. 27, data is received at I/O pad 218, and directed through receiver driver 203 by way of input bus 201.

With reference to FIG. 26 and to step 315 of FIG. 27, a logic operation is performed to determine whether data is sent to global mapping system 105 or to microprocessor 104. Depending on the configuration of logic decoder 205 done in step 305, the data is sent either to input global mapping 211 of global mapping system 105 or to microprocessor 104. A signal from control bus 217 indicates to logic decoder 205 which bus driver to enable.

With reference to FIG. 26 and to step 320 of FIG. 27, the data is sent to microprocessor 104 and process 300 ends at this point. Bus driver 206 couples I/O pad 218 to data bus 208, thus giving microprocessor 104 access to the circuit.

With reference to FIG. 26 and to step 325 of FIG. 2700, data is sent to input global mapping 211. This is the result of logic decoder 205 being configured by the control program to send the data to global mapping system 105 in step 305. Bus driver 207 couples I/O pin 102 to global input bus 209 and thus to input global mapping 211.

With reference to FIG. 26 and to step 330 of FIG. 27, input global mapping 211 sends the data to the DCSM 106 and process 300 ends at this point. Global mapping 211 is configured by the control program in step 305 to send the data to a specific functional unit or units of DCSM 106.

Figure 28:
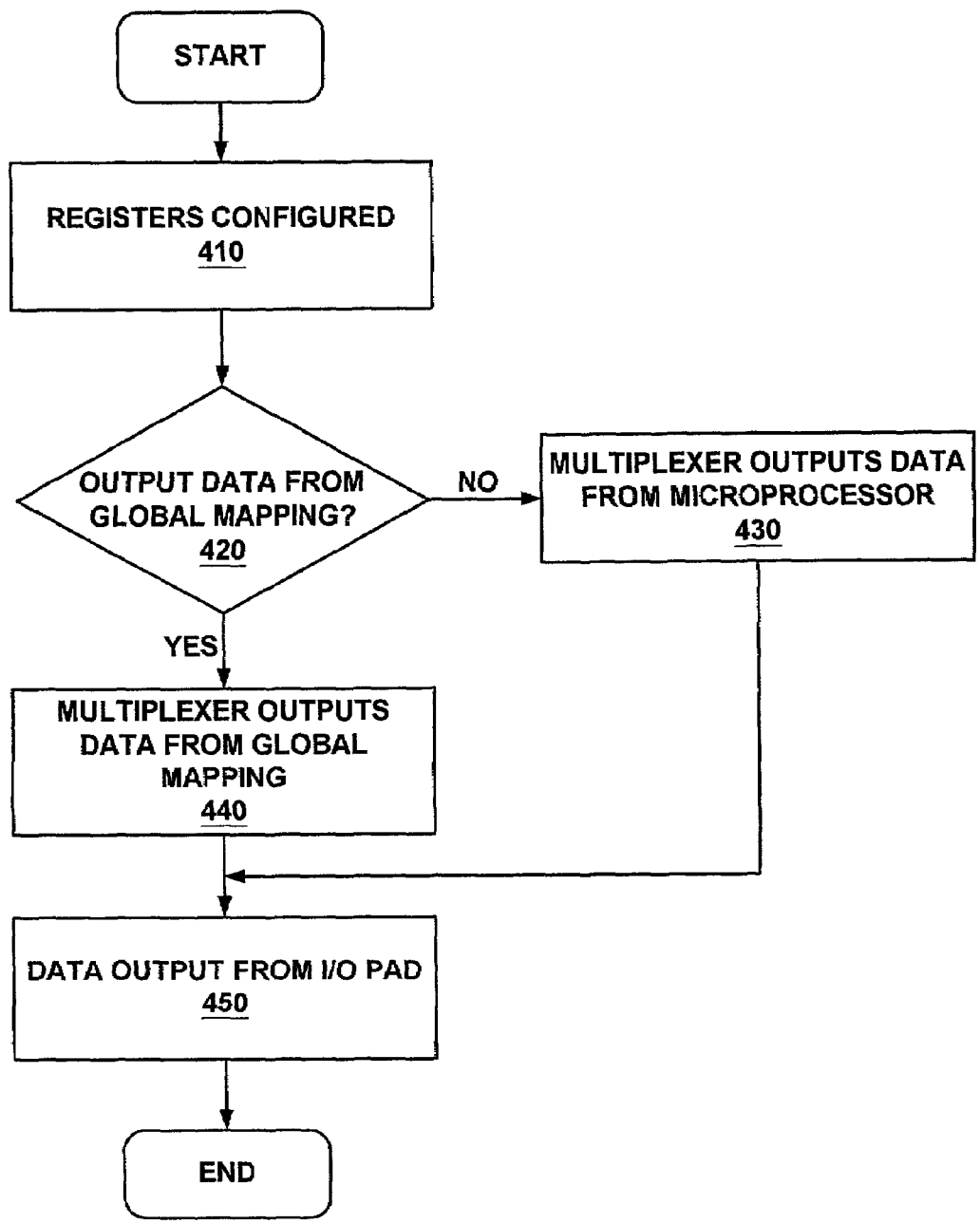
FIG. 28 is a flowchart of a process 400 for using a configurable input/output interface for a microcontroller to output data as embodied by the present invention.

FIG. 28 is a flowchart of a process 400 for using a configurable input/output interface for a microcontroller to output data as embodied by the present invention. For purposes of clarity, the following discussion will utilize the block diagram of FIG. 26 with flow chart 400 of FIG. 28, to describe one embodiment of the present invention.

Referring to FIG. 26 and to step 410 of FIG. 28, the registers of configuration system 103 and global mapping system 105 are configured. For an output operation, the registers are the configuration registers 216 and the output global mapping 212 registers. Again, a control program configures configuration registers 215 and output global mapping 212 to selectively couple I/O pin 102 with a functional unit or units of DCSM 106 or with microprocessor 104. The configuration can be done by microprocessor 104, or any mechanism on microcontroller 101 which is capable of changing the configuration bits, such as a state machine, flash bits, or static RAM, and can be changed at any time (e.g., per clock cycle).

Configuration registers 216 can also be configured to provide a variety of system functions for the I/O interface of the present invention and which can be reconfigured at any time (e.g., per clock cycle). For example, configuration registers 216 provide the capability for programmable pull-up or pull-down resistors, programmable interrupts per pin (e.g., positive edge triggered, negative edge triggered, or triggered on any change), programmable interrupt polarities and modes, and programmable drive strength. In one embodiment of the present invention, there are 8 configuration registers for each I/O pin allowing a maximum of 256 functions which could be defined for each pin. However, 2 or more registers can be used to control a particular pin function. For example, 2 registers can be used for the I/O driver to provide 4 drive strength levels, 2 registers used for interrupt polarity, etc. Thus the present invention is well suited to various register configurations to provide more or less system functions as needed.

Referring to FIG. 26 and to step 420 of FIG. 28, a logic operation takes place where multiplexer 215 reads the configuration information held in configuration registers 216 and selectively couples data from either microprocessor 104 or output global mapping 212 to output bus 202.

With reference to FIG. 26 and to step 430 of FIG. 28, multiplexer 215, as a result of the configuration of registers 216, couples data register 214 to output bus driver 204 and output bus 202. In so doing, data held in data register 214 from microprocessor 104 will be output later in process 400. A signal from control bus 217 will enable data register 214 to shift the data out to multiplexer 215.

With reference to FIG. 26 and to step 440 of FIG. 26, multiplexer 215, as a result of the configuration of registers 215, couples output global mapping 212 to output bus 102 through bus driver 213. This allows data from a functional unit or units of DCSM 106 to be output later in process 400. Global output bus 210 couples output global mapping 212 with output bus driver 213, and multiplexer 215.

With reference to FIG. 26 and to step 450 of FIG. 28, data selected at step 420 of FIG. 28 is output from I/O pad 218 and process 400 ends at this point.

A global routing matrix (e.g., global mapping system 105; FIG. 26) is configured to couple the I/O blocks to the programmable digital and programmable analog circuit blocks. Further, a system macro routing matrix (e.g., intra-block routing channels 1002, configuration system 103; FIGS. 2, 26, respectively) is configured to couple a subset of the programmable digital circuit blocks to the programmable analog circuit blocks.

Exemplary Circuit and System
Exemplary Circuit

It is appreciated that an exemplary circuit (e.g., circuit 10; FIG. 1A) incorporating an embodiment of the present invention herein may be an integrated circuit of any type, such as microcontrollers. Such a circuit will have a microprocessor (e.g., CPU 14; FIG. 1A), and a number of programmable analog circuit blocks (e.g., analog blocks 20; FIG. 1B). The circuit will also have some number of programmable digital circuit blocks (e.g., digital blocks 100; FIG. 1B) coupled, directly or indirectly, to at least one of the programmable analog circuit blocks. Further, the analog and digital blocks are coupled, directly of indirectly, to the microprocessor, for example, via a system bus (e.g., bus 11; FIGS. 1A, 1B). The exemplary circuit will have at least one of its programmable digital circuit blocks configured to provide at least one of a number of mathematical functions, and at least one of its analog circuit blocks configured to provide at least one of some number of analog functions.

In the exemplary circuit, at least one of the programmable digital circuit blocks is coupled to at least one of another of the digital circuit blocks. Further, in the exemplary circuit, at least one of the programmable analog circuit blocks is coupled to at least one of another of the analog circuit blocks. This enables the exemplary circuit to effectuate at least one analog and/or digital system function.

A programmable memory (e.g., flash ROM 16, registers 50; FIGS. 1B, 16, respectively), coupled therein to the programmable analog and digital circuit blocks contains data for programming at least one of the programmable digital circuit blocks and at least one of the analog circuit blocks. The programmable memory may be effectuated in registers and/or latches (e.g., registers 50: FIG. 16), within the analog and digital blocks and elsewhere, such as in programmable interconnects between the circuit blocks, and in programmable I/O pin arrays. Programmable memory is also available in the exemplary circuit herein within a program memory, such as flash ROM (e.g., flash ROM 16; FIG. 1). This programmable memory is erasable, which may be executed electrically.

A number of input and/or output blocks (e.g., pin by pin configurable I/O transducers 18; FIG. 1B) are coupled directly or indirectly to at least one of the programmable memory, the digital circuit blocks, the analog circuit blocks, and the microprocessor. At least one of the input and/or output blocks sends signals to the microprocessor. At least one of the input and/or output blocks sends signals to the analog and to the digital circuit blocks. At least one of the input and/or output blocks (I/O blocks) sends signals to the programmable memory. Further, at least one of the analog circuit blocks sends signals to at least one of the digital circuit blocks. At least one of the I/O blocks sends signals to the programmable memory, and at least one of the I/O blocks sends signals to the microprocessor.

In the present exemplary circuit, a number of registers are configured to store programming data for the programmable digital circuit blocks. Some number of latches are configured to store programming data for the programmable analog circuit blocks.

A global routing matrix (e.g., global mapping system 105; FIG. 26) is configured to couple the I/O blocks to the programmable digital and programmable analog circuit blocks. Further, a system macro routing matrix (e.g., intra-block routing channels 1002, configuration system 103; FIGS. 2, 26, respectively) is configured to couple a subset of the programmable digital circuit blocks to the programmable analog circuit blocks.

Programmable digital blocks may programmatically communicate with other programmable digital blocks. Programmable analog blocks may programmatically communicate with other analog blocks. Further, programmable digital blocks and programmable analog blocks may programmatically intercommunicate.

The programmable analog circuit blocks may, in one embodiment, be constituted by a matrix of n by m analog configurable system macros, n and m independently being an integer of at least two. Each of said analog configurable system macros is configured to provide one or more analog functions, which may include gain functions, comparator functions, switched capacitor functions, filter functions, analog-to-digital conversion functions, digital-to-analog conversion functions, and amplifier functions, among others. The programmable analog circuit, constituted by a matrix of n by m number of programmable analog circuit blocks, each coupled to an adjacent block and configured to provide at least one of a plurality of analog functions. In the exemplary circuit herein, at least two of the number of programmable digital circuit blocks are coupled in series to provide a digital system function.

In the programmable digital circuit according to one embodiment, at least three programmable digital circuit blocks are coupled in series and/or in parallel. Each programmable digital circuit block is (i) controlled by an n-bit register or look-up table containing programming information including a cascading bit and (ii) configured to provide at least one of a plurality of mathematical functions, wherein the cascading bit determines whether a particular programmable digital circuit block is coupled is series with an adjacent programmable digital circuit block, and when programmed, the programmable digital circuit provides at least one digital system function.

Exemplary System

Thus, an exemplary system (e.g., system 10; FIGS. 1A, 1B) is effectuated by the exemplary circuit herein. The exemplary system is constituted by a microcontroller (e.g., as effectuated by bus 11, SRAM 12, ROM 16, and microprocessor 16, etc.; FIGS. 1A, 1B), a subsystem constituted by a functionality (e.g., SoC blocks 25; FIGS. 1A; 1B) coupled (e.g., via system bus 11; FIGS. 1A, 1B) to the microcontroller, and a coupling mechanism (e.g., pin by pin configurable I/O transceivers 18; FIG. 1B) coupled to the subsystem. The functionality is configurable to selectively execute a first function (e.g., analog and/or digital) according to an input of a first type (e.g., a function-designating configuration setting). The coupling mechanism is configurable to implement a connectability state for the system by which the system is connectable to an external entity according to an input of a second type (e.g., a pin activation/deactivation, and/or pin function designating program). The functionality, as configured herein, may perform digital function, an analog function, or a mix of analog and digital functions.

The system is further constituted by an interconnecting mechanism, and the functionality further constituted by a first sub-functionality (e.g., analog system blocks 20; FIGS. 1B, 1C) performing the analog functions and a second sub-functionality (e.g., digital system blocks 100; FIGS. 1B, 1C) performing the digital functions. The interconnecting mechanism is configurable to interconnect the first sub-functionality and the second sub-functionality according to an input of a third type, e.g., an intrafunctionality (e.g., within system block 25; FIGS. 1A, 1B, 1C) interconnection configuring program.

Further, the exemplary system herein is constituted in part by a timing functionality (e.g., system timing block 19; FIG. 1B), which is configurable to generate a number of time bases according to an input of a fourth type (e.g., a time base selection configuration setting).

Exemplary Method of Configuration of Functions

Figure 29:
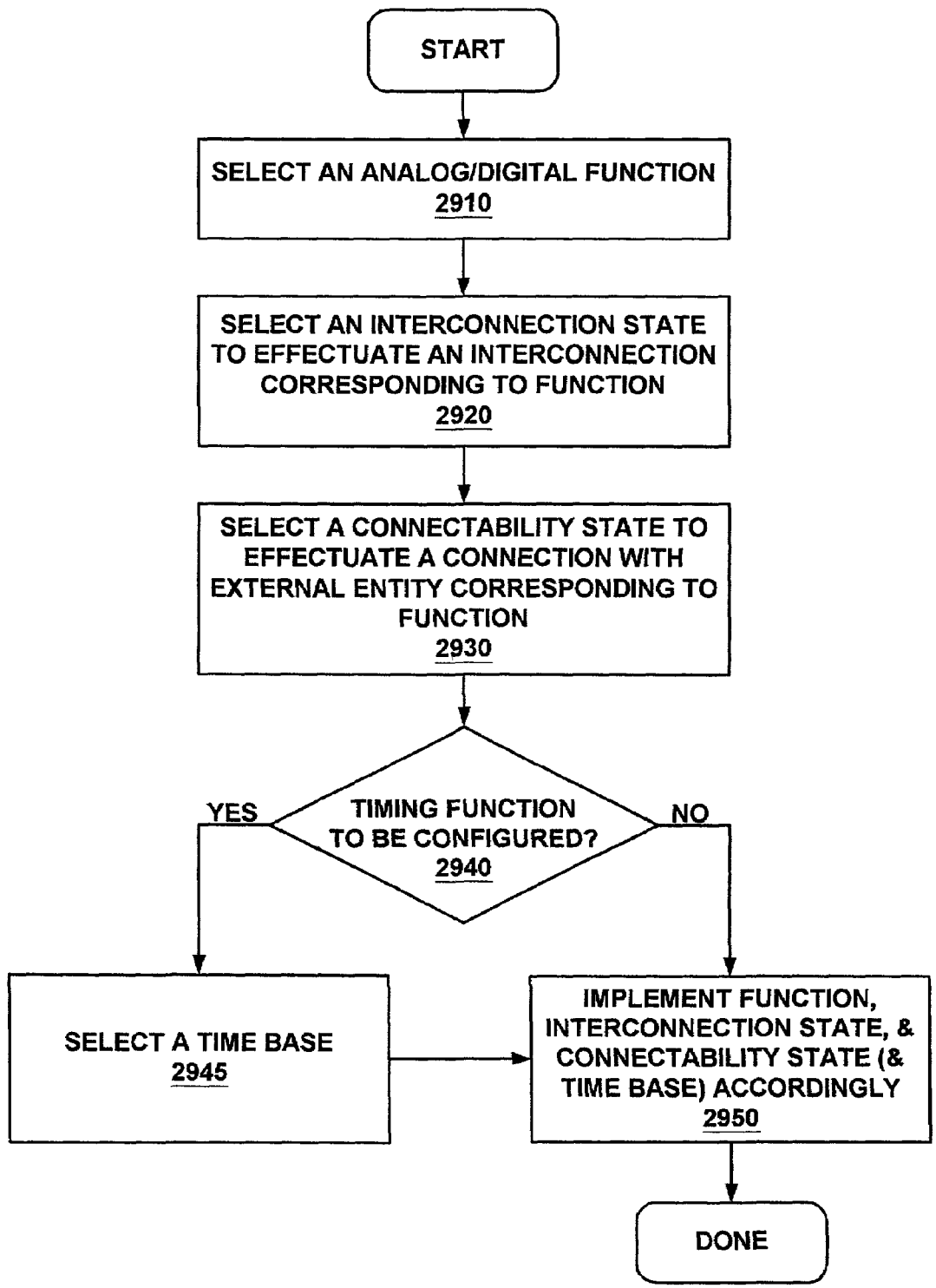
FIG. 29 is a flowchart of a process 2900 for configuring a system, in accordance with one embodiment of the present invention.

With reference to FIG. 29, a process 2900 for configuring a system (e.g., system 10; FIG. 1B) is described. Beginning in step 2910, an analog and/or digital function is selected. This function may be effectuated in part by one or more functional units, e.g., functionalities, which may, in one embodiment, be analog and digital functionalities (e.g., analog and digital system blocks 20 and 100, respectively; FIG. 1B).

In step 2920, an interconnection state between analog and digital functionalities, and between the functionalities and the rest of the system, including an integrated circuit, which in one embodiment may be a microcontroller, is selected. The interconnection state is one capable of effectuating the selected function. The interconnection state may be set within a programmable interconnecting mechanism (e.g., programmable interconnect 1002; FIG. 1B).

A connectability state is then selected; step 2930. The connectability state is one capable of effectuating a functional connection with an external entity, which can be any other system, electronic device, communication medium, or any other functional entity outside of the system. The connectability state may be set within a programmable, e.g., configurable, electrical and/or communicative coupling mechanism (e.g., pin by pin configurable I/O transceivers; FIG. 1B). In one embodiment, an exemplary connectability state may be achieved by activating certain connection pins, ports, and/or other mechanism components by coupling them to particular signal sources, such as the analog and digital functionalities, within the system. In one embodiment, an exemplary connectability state may be achieved by activating certain connection pins, ports, and/or other mechanism components, and deactivating others.

In step 2940, it is determined whether or not a timing function is to be configured. Process 2900 proceeds as determined by the outcome of this decision.

If in step 2940, it is decided that a timing function is to be configured, a time base is selected in step 2945. The time base, in one embodiment, may be any of a myriad of possible timing and/or other periodic signals of various waveforms, generated by a system timing functionality (e.g., system timing block 19; FIG. 1B). The time base may be provided for use by any of the analog and digital functionalities in performance of their configured function, wherein the selected function requires a timing reference of a particular frequency, period, amplitude, and/or waveform.

For example, in certain functional situations, a digital functionality may be configured to perform a UART function, which would require a particular time base input from the system timing functionality. In another example, an analog functionality may be configured to perform a conversion and/or modulation function, which would also require a particular time base input from the system timing functionality.

After selection of a time base (step 2945), or if it was determined in step 2940 that no timing function was to be configured, process 2900 proceeds via step 2950, wherein the selected function, interconnection state, and connectability state (and time base, if selected in step 2945) are implemented. The implementation of the function, interconnection state, and connectability state (and time base, if selected in step 2945) may, in one embodiment, be implemented simultaneously. In another embodiment, the may be implemented sequentially. In yet another embodiment, they mat be implemented by a combination of simultaneous and sequential actions. Process 2900 is complete upon full, successful execution of step 2950.

Process 2900 may be implemented by any effective mechanism for effectuating a user input upon the system, including, but not limited to, generation and transmission of appropriate electrical, electronic, optical, digital, analog, and/or any other communicative signals provided to the system by any effective external agent, such as a computer system or any other signal generating and inputting system. Thus, process 2900 may be implemented by a programmed agent operating automatically and executing a program to effectuate process 2900 and its corresponding purposes.

In summary, the present invention provides an integrated system with a microcontroller and integrated circuits (ICs) on a single chip to effectuate a single-chip system, including analog and digital functionality, and a method of configuring such an integrated system. The present invention also provides a single-chip system which has sufficient flexibility to function in a very wide range of multiple applications, including applications wherein integrated analog functionalities are required. Further, the present invention provides a method of programming and dynamically reconfiguring a single-chip system, and a single-chip system which is so programmable and dynamically reconfigurable. Further still, the present invention provides a single-chip system which achieves the foregoing advantages and yet is relatively inexpensive and simple to configure, apply, use, and reconfigure.

Embodiments of the present invention are directed to a microcontroller device having a microprocessor, programmable memory components, and programmable analog and digital blocks. The programmable analog and digital blocks are configurable based on programming information stored in the memory components. Programmable interconnect logic, also programmable from the memory components, is used to couple the programmable analog and digital blocks as needed. The advanced microcontroller design also includes programmable input/output blocks for coupling selected signals to external pins. The memory components also include user programs that the embedded microprocessor executes. These programs may include instructions for programming the digital and analog blocks "on-the-fly," e.g., dynamically. In one implementation, there are a plurality of programmable digital blocks and a plurality of programmable analog blocks.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

An embodiment of the present invention, a programmable microcontroller architecture, is thus described. While the present invention has been described in particular embodiments, it should be appreciated that the present invention should not be construed as limited by such embodiments, but rather construed according to the below claims.

What is claimed is:

1. A microprocessor circuit, comprising:
a plurality of programmable analog circuit blocks wherein said analog circuit blocks are dynamically programmable and configurable to perform one or more of a plurality of various analog function and wherein said plurality of programmable analog circuit blocks comprises a matrix of n by m, n and m independently being an integer of at least two;
each of said plurality of programmable analog circuit blocks is configured to provide one or more analog function and wherein said plurality of programmable analog circuit blocks are configured to be individually at different power levels;
a plurality of programmable digital circuit blocks configured to provide at least one of a plurality of digital functions, wherein each programmable digital circuit block is configurable to perform any one of said digital functions upon being configured with a single register write operation;
a routing matrix configured to couple a subset of said plurality of programmable analog circuit blocks to a first subset of said plurality of programmable digital circuit blocks, at least a first one of said programmable analog circuit blocks being coupled to at least a first one of said programmable digital circuit blocks; and
a programmable non-volatile memory coupled directly or indirectly to said plurality of programmable digital circuit blocks and said plurality of programmable analog circuit blocks, said programmable memory comprising data for programming at least one of said programmable digital circuit blocks and at least one of said plurality of programmable analog circuit blocks.

2. The circuit as recited in claim 1, wherein when programmed, each of said plurality of programmable analog circuit blocks provides at least one of said plurality of analog functions.

3. The circuit of as recited in claim 1, wherein when programmed, each programmable digital circuit blocks provides at least one of said digital functions.

4. The circuit as recited in claim 2, wherein when programmed, said plurality of programmable analog circuit blocks and said plurality of programmable digital circuit blocks provides at least one digital and/or analog function.

5. The circuit as recited in claim 1, wherein when programmed, said routing matrix couples a second one of said subset of said plurality of programmable analog circuit blocks to a second one of said subset of said plurality of programmable digital circuit blocks.

6. The circuit as recited in claim 1, wherein each of said plurality of programmable analog circuit blocks is configured to provide one or more analog functions selected from the group consisting of a gain function, a comparator function, a switched capacitor function, a filter function, an analog to digital conversion function, a digital to analog conversion function, and an amplifier function.

7. The circuit as recited in claim 1, wherein at least two of said plurality of programmable digital circuit blocks are coupled in series to provide a digital system function.

8. A microcontroller means, comprising:
a plurality of programmable analog means wherein said analog means are dynamically programmable and configurable to perform one or more of a plurality of various analog functions and wherein said plurality of programmable analog means comprises a matrix of n by m, n and m independently being an integer of at least two;
each of said plurality of programmable analog means is configured to provide one or more analog functions and wherein said plurality of programmable analog means are configured to be individually at different power levels;
a plurality of programmable digital means configured to provide at least one of a plurality of digital means, wherein each programmable digital means is configured to perform any one of said digital function upon being configured with a single register write operation;
a routing means configured to couple a subset of said plurality of programmable analog means to a first subset of said plurality of programmable digital means, at least a first one of said programmable analog means being coupled to at least a first one of said programmable digital means; and a programmable non-volatile memory means coupled directly or indirectly to said plurality of programmable digital means and said plurality of programmable analog means, said programmable memory means comprising data for programming at least one of said programmable digital means and at least one of said plurality of programmable analog means.

9. The microcontroller means as recited in claim 8, wherein when programmed, each of said plurality of programmable analog means provides at least one of said plurality of analog function.

10. The microcontroller means as recited in claim 8, wherein when programmed, each programmable digital means provides at least one of said digital function.

11. The microcontroller means as recited in claim 8, wherein when programmed, said plurality of programmable analog means and said plurality of programmable digital means provideds at least one digital and/or analog function.

12. The microcontroller means as recited in claim 8, wherein when programmed, said routing means couples a second one of said subset of said plurality of programmable analog means to a second one of said subset of said plurality of programmable digital means.

13. The circuit as recited in claim 8, wherein each of said programmable analog means is configured to provide one or more analog means selected from the group consisting of a gain means, a comparator means, a switched capacitor means, a filter means, an analog to digital conversion means, a digital to analog conversion means, and an amplifier means.

14. The circuit as recited in claim 8, wherein at least two of said plurality of programmable digital means are coupled in series to provide a digital system function.

15. A microcontroller circuit, comprising:

a microprocessor;

a plurality of programmable analog circuit blocks wherein said programmable analog circuit blocks are dynamically programmable and configurable to perform one or more of a plurality of various analog functions and wherein said plurality of programmable analog circuit blocks comprises a matrix of n, by m, n and m independently being an integer of at least two;

each of said plurality of programmable analog circuit blocks is configured to provide one or more analog function and wherein said plurality of programmable analog circuit blocks are configured to be individually at different power levels;

a plurality of programmable digital circuit blocks configured to provide at least one of a plurality of digital functions, wherein each programmable digital circuit block is configurable to perform any one of said digital functions upon being configured with a single register write operation;

a routing matrix configured to couple a subset of said plurality of programmable analog circuit blocks to a first subset of said plurality of programmable digital circuit blocks, at least a first one of said programmable analog circuit blocks being coupled to at least a first one of said programmable digital circuit blocks; and a programmable non-volatile memory coupled directly or indirectly to said plurality of programmable digital circuit blocks and said plurality of programmable analog circuit blocks, said programmable memory comprising data for programming at least one of said programmable digital circuit blocks and at least one of said plurality of programmable analog circuit blocks.

16. The circuit as recited in claim 15, wherein when programmed, each of said plurality of programmable analog circuit blocks provides at least one of said plurality of analog functions.

17. The circuit as recited in claim 15, wherein when programmed, each programmable digital circuit block provides at least one of said digital functions.

18. The circuit as recited in claim 15, wherein when programmed, said plurality of programmable analog circuit blocks and said plurality of programmable digital circuit blocks provides at least one digital and/or analog function.

19. The circuit as recited in claim 15, wherein when programmed, said routing matrix couples a second one of said subset of said plurality of programmable analog circuit blocks to a second one of said subset of said plurality of programmable digital circuit blocks.

20. The circuit as recited in claim 15, wherein each of said plurality of programmable analog circuit blocks is configured to provide one or more analog functions selected from the group consisting of a gain function, a comparator function, a switched capacitor function, a filter function, an analog to digital conversion function, a digital to analog conversion function, and an amplifier function.

21. The circuit as recited in claim 15, wherein at least two of said plurality of programmable digital circuit blocks are coupled in series to provide a digital system function.

* * * * *